US008003934B2

(12) United States Patent
Hieke

(10) Patent No.: US 8,003,934 B2
(45) Date of Patent: Aug. 23, 2011

(54) METHODS AND APPARATUS FOR ION SOURCES, ION CONTROL AND ION MEASUREMENT FOR MACROMOLECULES

(75) Inventor: Andreas Hieke, Cupertino, CA (US)

(73) Assignee: Andreas Hieke, Cupertino, CA (US)

( * ) Notice: Subject to any disclaimer, the term of this patent is extended or adjusted under 35 U.S.C. 154(b) by 0 days.

(21) Appl. No.: 11/517,622

(22) Filed: Sep. 8, 2006

(65) Prior Publication Data
US 2007/0075240 A1    Apr. 5, 2007

Related U.S. Application Data

(63) Continuation-in-part of application No. 11/063,485, filed on Feb. 22, 2005, now Pat. No. 7,138,642, application No. 11/517,622, and a continuation-in-part of application No. 11/063,801, filed on Feb. 22, 2005, now abandoned.

(60) Provisional application No. 60/547,259, filed on Feb. 23, 2004, provisional application No. 60/547,302, filed on Feb. 23, 2004, provisional application No. 60/619,113, filed on Oct. 15, 2004, provisional application No. 60/798,377, filed on May 5, 2006, provisional application No. 60/802,941, filed on May 23, 2006.

(51) Int. Cl.
*H01J 3/14* (2006.01)

(52) U.S. Cl. ........ 250/288; 250/281; 250/282; 250/286; 250/423 R; 250/424

(58) Field of Classification Search ............... 250/281, 250/282, 286, 288, 423 R, 424
See application file for complete search history.

(56) References Cited

U.S. PATENT DOCUMENTS

| 4,963,736 | A |   | 10/1990 | Douglas et al. |   |
|---|---|---|---|---|---|
| 5,510,613 | A |   | 4/1996 | Reilly et al. |   |
| 5,729,014 | A |   | 3/1998 | Mordehai et al. |   |
| 5,739,530 | A |   | 4/1998 | Franzen |   |
| 5,818,055 | A |   | 10/1998 | Franzen |   |
| 6,107,623 | A | * | 8/2000 | Bateman et al. | 250/282 |
| 6,107,628 | A |   | 8/2000 | Smith et al. |   |
| 6,140,638 | A |   | 10/2000 | Tanner et al. |   |
| 6,153,880 | A | * | 11/2000 | Russ et al. | 250/292 |
| 6,225,047 | B1 |   | 5/2001 | Hutchens et al. |   |
| 6,331,702 | B1 | * | 12/2001 | Krutchinsky et al. | 250/281 |

(Continued)

FOREIGN PATENT DOCUMENTS
EP         0964427 A2    12/1999
(Continued)

OTHER PUBLICATIONS

ISA/US; International Search Report and Written Opinion for International Application No. PCT/US05/05662, 8 pages, Aug. 22, 2006.

(Continued)

*Primary Examiner* — David A Vanore
*Assistant Examiner* — Michael Maskell
(74) *Attorney, Agent, or Firm* — Jones IP Group

(57) ABSTRACT

Disclosed are methods, apparatus, systems, processes and other inventions relating to: ion sources with controlled electro-pneumatic superposition, ion source synchronized to RF multipole, ion source with charge injection, optimized control in active feedback system, radiation supported charge-injection liquid spray, ion source with controlled liquid injection as well as various embodiments and combinations of each of the foregoing.

29 Claims, 66 Drawing Sheets

U.S. PATENT DOCUMENTS

| | | |
|---|---|---|
| 6,515,280 B1 | 2/2003 | Baykut |
| 6,545,268 B1 | 4/2003 | Verentchikov et al. |
| RE38,138 E * | 6/2003 | Holkeboer et al. ............ 250/282 |
| 6,583,408 B2 | 6/2003 | Smith et al. |
| 6,627,883 B2 * | 9/2003 | Wang et al. .................... 250/292 |
| 6,674,071 B2 | 1/2004 | Franzen et al. |
| 6,707,037 B2 | 3/2004 | Whitehouse |
| 6,717,130 B2 * | 4/2004 | Bateman et al. ............. 250/282 |
| 6,791,078 B2 | 9/2004 | Giles et al. |
| 6,803,565 B2 | 10/2004 | Smith et al. |
| 6,914,241 B2 | 7/2005 | Giles et al. |
| 6,946,653 B2 | 9/2005 | Weinberger et al. |
| 6,949,739 B2 | 9/2005 | Franzen |
| 6,967,325 B2 | 11/2005 | Smith et al. |
| 6,977,371 B2 | 12/2005 | Bateman et al. |
| 6,979,816 B2 | 12/2005 | Tang et al. |
| 7,138,642 B2 | 11/2006 | Hieke |
| 7,205,537 B2 * | 4/2007 | Nikolaev ...................... 250/292 |
| 2002/0063206 A1 * | 5/2002 | Bateman et al. ............. 250/281 |
| 2002/0125421 A1 * | 9/2002 | Yoshinari et al. ............. 250/281 |
| 2002/0175278 A1 * | 11/2002 | Whitehouse ................. 250/281 |
| 2003/0136905 A1 | 7/2003 | Franzen |
| 2004/0031920 A1 | 2/2004 | Giles et al. |
| 2004/0089803 A1 | 5/2004 | Foley |
| 2004/0129876 A1 | 7/2004 | Franzen |
| 2004/0195503 A1 | 10/2004 | Kim et al. |
| 2004/0211897 A1 | 10/2004 | Kim et al. |
| 2004/0227071 A1 | 11/2004 | Giles et al. |
| 2004/0251411 A1 | 12/2004 | Bateman et al. |
| 2005/0194543 A1 | 9/2005 | Hieke |
| 2005/0199820 A1 | 9/2005 | Eastham |
| 2005/0258354 A1 | 11/2005 | Baba et al. |
| 2005/0269519 A1 | 12/2005 | Kim et al. |
| 2006/0076484 A1 | 4/2006 | Brown et al. |

FOREIGN PATENT DOCUMENTS

| | | |
|---|---|---|
| WO | WO 99/30351 | 6/1999 |
| WO | WO 00/77822 A3 | 12/2000 |
| WO | WO 02/097857 A1 | 12/2002 |

OTHER PUBLICATIONS

Bondarenko, P.V. et al., "A New Electrospray-Ionization Time-Of-Flight Mass Spectrometer With Electrostatic Wire Ion Guide", Intl. J. Mass Spectrom. Ion Processes, 160, 241-258, 1997.

Hieke, A., "GEMIOS—a 84-Bit multi-physics Gas and Electromagnetic Ion Optical Simulator", Proceedings of the 51.sup.st Conference on Mass Spectrometry and Allied Topics, Jun. 8-12, 2003, Montreal, PQ, Canada.

Hieke, A., Theoretical and Implementational Aspects of an Advanced 3D Gas and Electromagnetic Ion Optical Simulator Interfacing with ANSYS Multiphysics, Proceedings of the International Congress on FEM Technology, pp. 1.6:13, Nov. 12-14, 2003, Postdam, Germany.

Hieke, A., "Development of an Advanced Simulation System for the Analysis of Particle Dynamics in Laser based Protein Ion Sources", Proceedings of the 2004 NSTI Nanotechnology Conference and Trade Show Nanotech 2004, Mar. 7-11, 2004, Boston, MA, U.S.A.

Krutchinsky, A.N. et al., Orthogonal Injection of Matrix-Assisted Laser Desorption/Ionization Ions Into A Time-Of-Flight Spectrometer Through A Collisional Damping Interface, Rapid Communic. Mass Spectrom., 12, 508-518, 1998.

Loboda, et al., "A tandem quadrupole/time-of-flight mass spectrometer with a matrix-assisted laser desorption/ionization source: design and performance"; Rapid Communic. Mass Spectrom., 14:1047-1057, 2000.

Tsybin, Y.O. et al., "Improved Low-Energy Electron Injection Systems for High Rate Electron Capture Dissociation in Fourier Transform Ion Cyclotron Resonance Mass Spectrometry", Rapid Communic. Mass Spectrom., 15, 1849-1854, 2001.

* cited by examiner

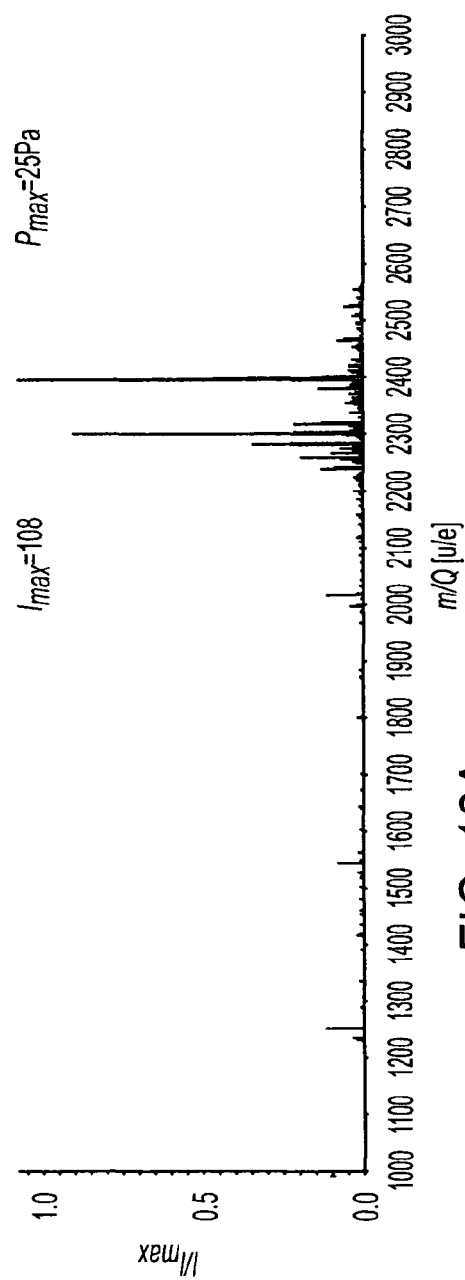
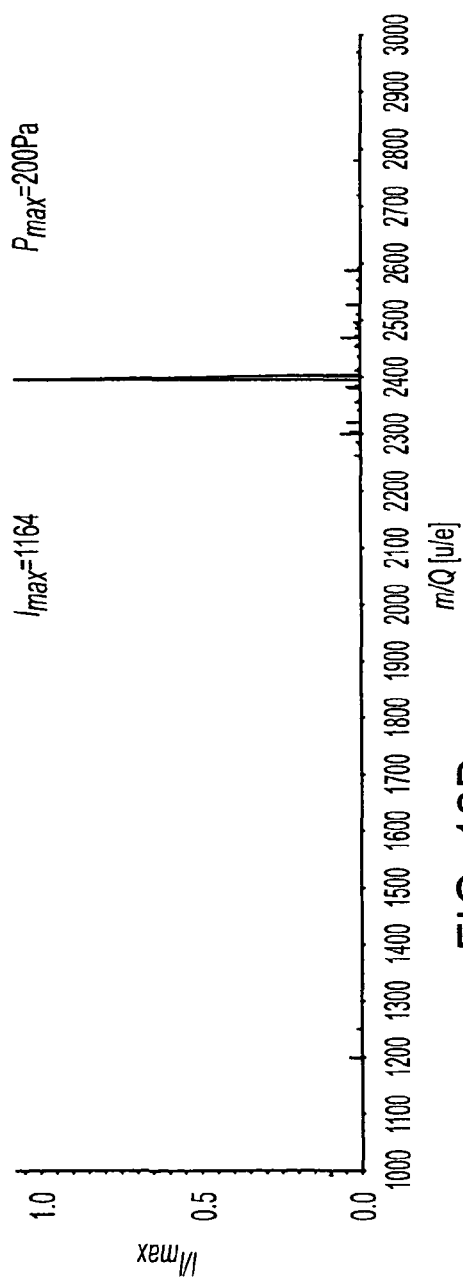
FIG. 12A
FIG. 12B

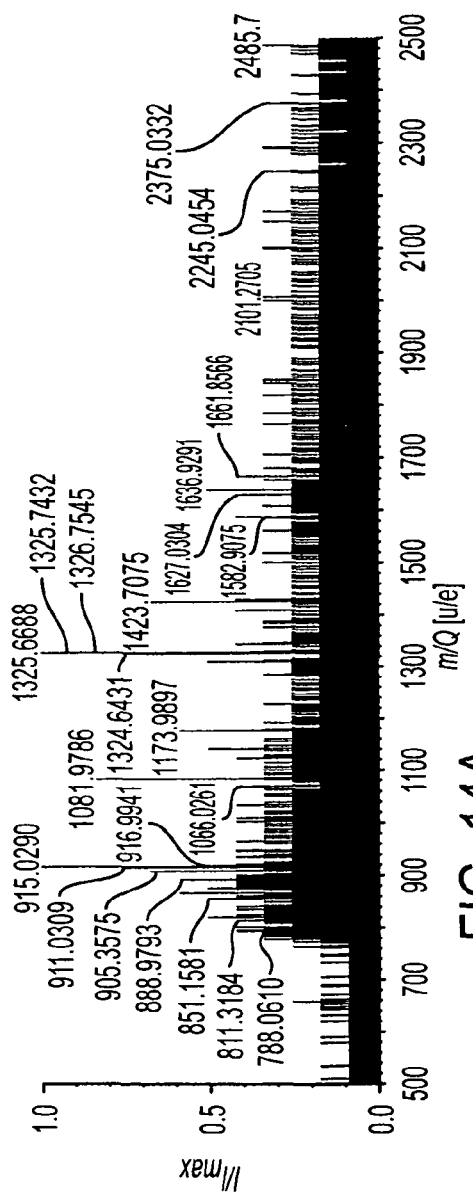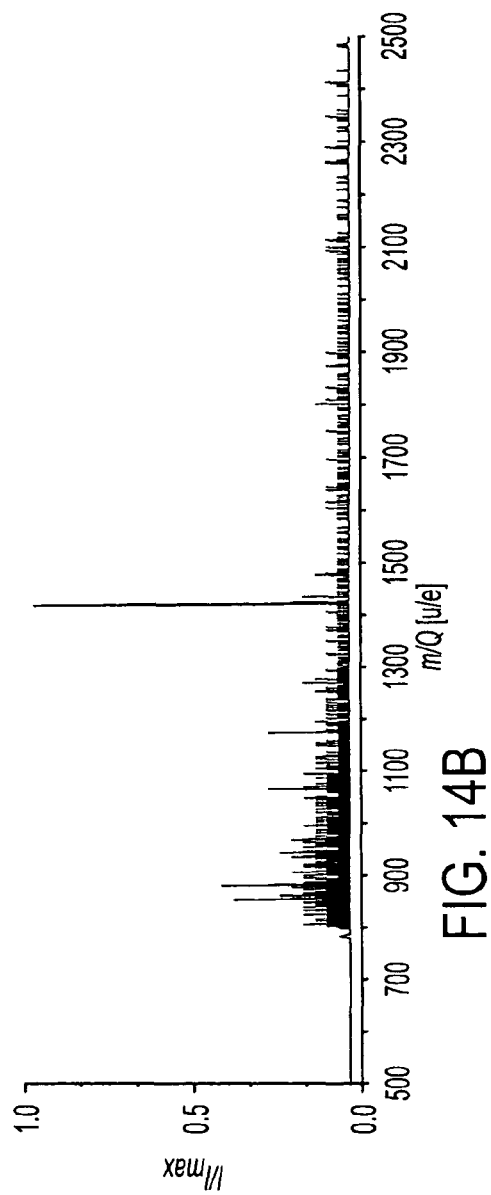
FIG. 14A
FIG. 14B

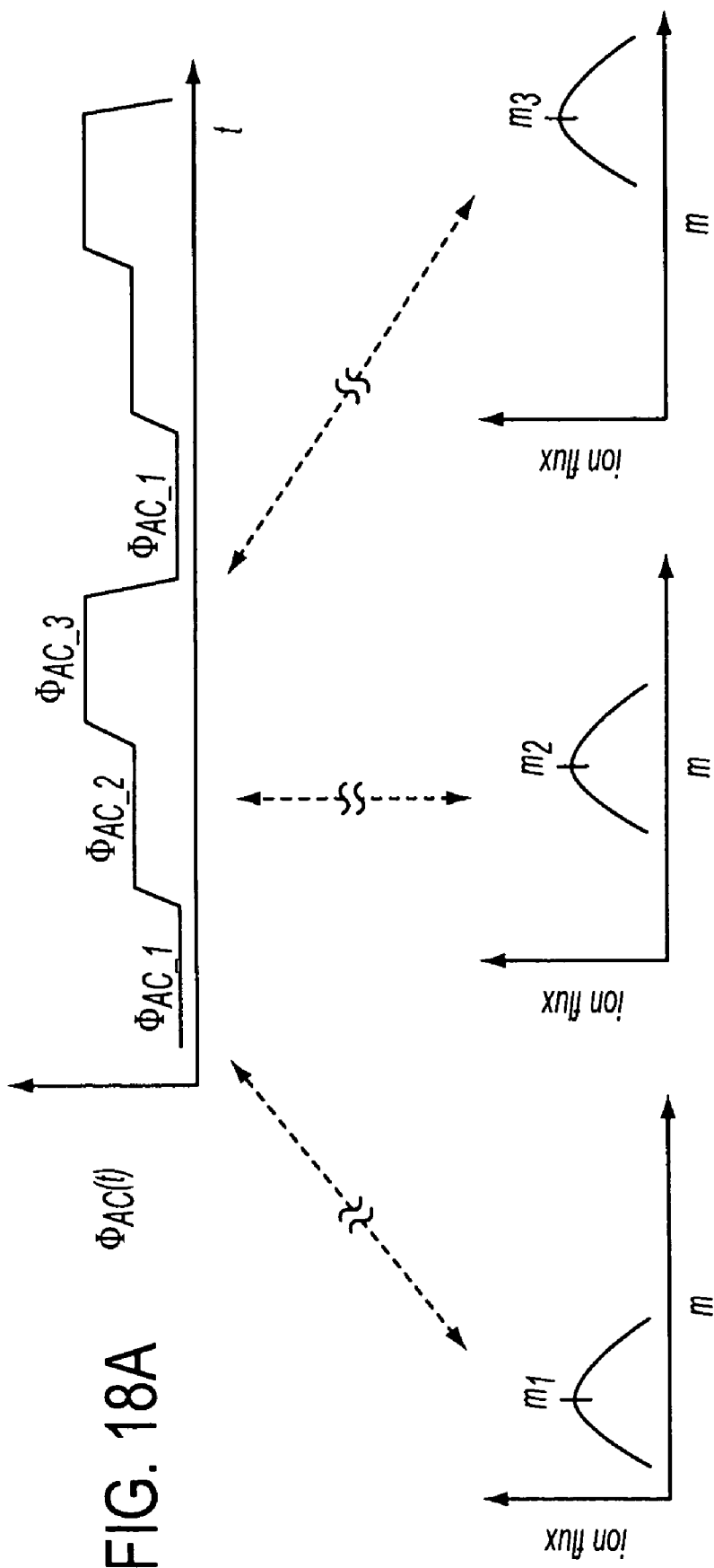

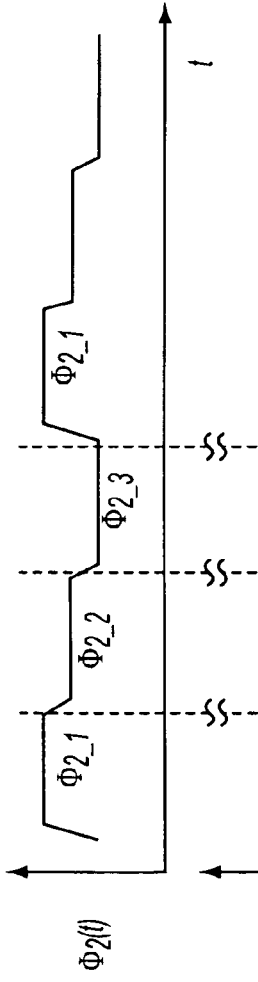
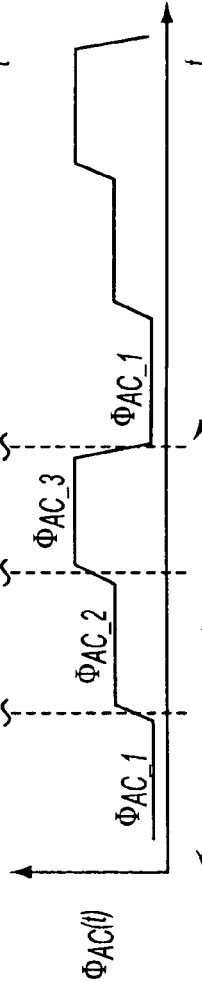
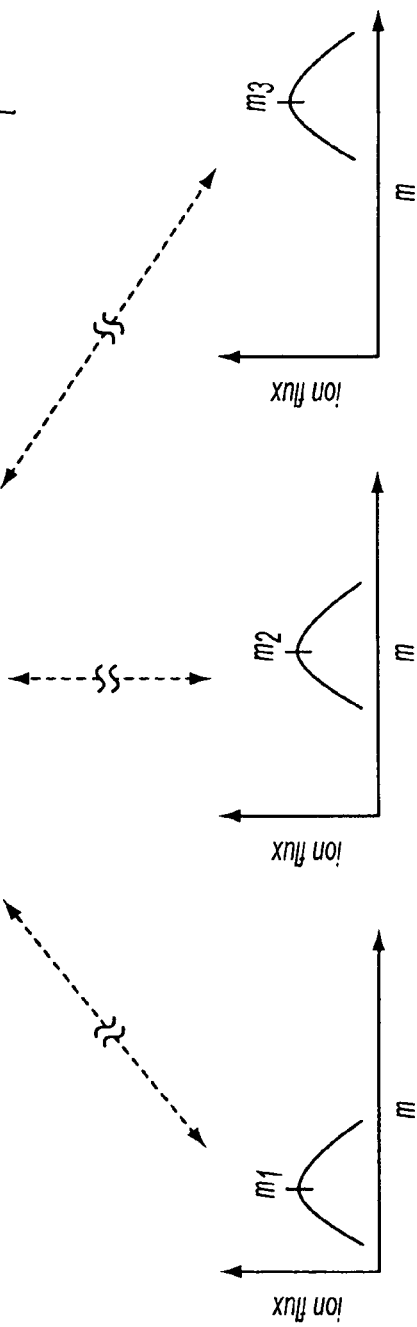
FIG. 18E
FIG. 18F
FIG. 18G
FIG. 18H
FIG. 18I
FIG. 18J

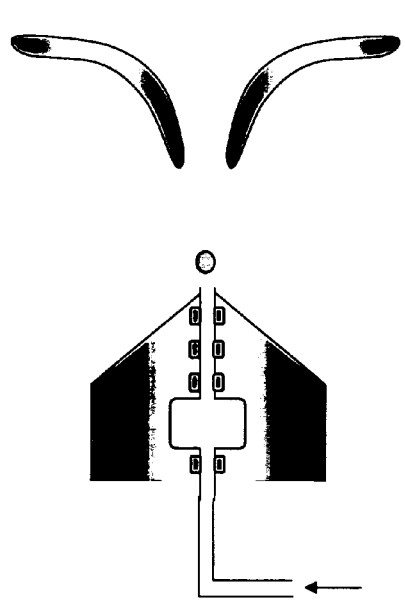
FIG. 47A
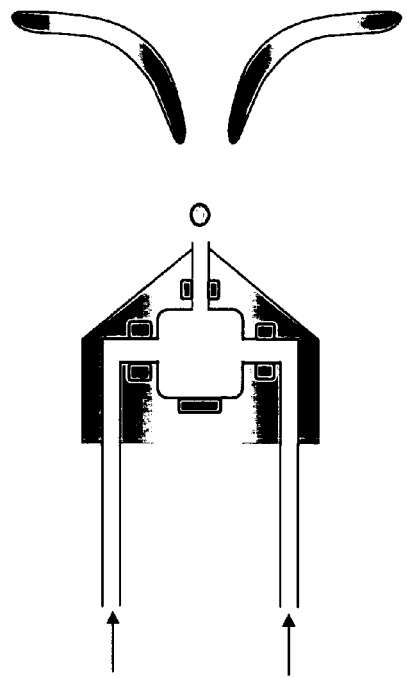
FIG. 47B
FIG. 47C
FIG. 47D
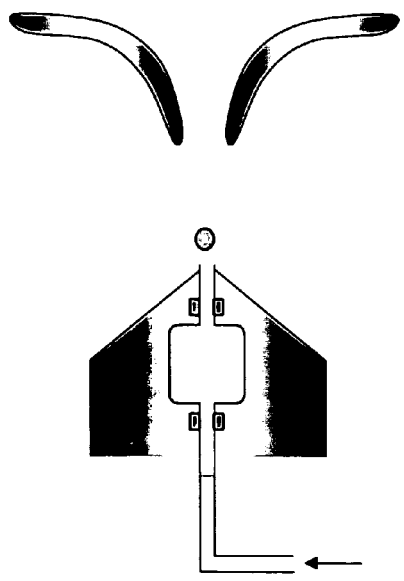

METHODS AND APPARATUS FOR ION SOURCES, ION CONTROL AND ION MEASUREMENT FOR MACROMOLECULES

CROSS-REFERENCE TO RELATED APPLICATIONS

This application is a continuation-in-part of U.S. patent application Ser. No. 11/063,485, filed Feb. 22, 2005 now U.S. Pat. No. 7,138,642, which claims the benefit of U.S. patent application Ser. No. 60/547,259, filed Feb. 23, 2004. This application is also a continuation-in-part of U.S. patent application Ser. No. 11/063,801, filed Feb. 22, 2005 now abandoned, which claims the benefit of U.S. patent application Ser. No. 60/547,302, filed Feb. 23, 2004, and U.S. patent application Ser. No. 60/619,113, filed Oct. 15, 2004. This application further claims priority to U.S. patent application Ser. No. 60/798,377, filed May 5, 2006, and U.S. patent application Ser. No. 60/802,941, filed May 23, 2006. In addition, this application is related to the following three U.S. patent applications filed Sep. 7, 2006: (1) U.S. patent application Ser. No. 60/843,105 entitled "Advanced ion source for macromolecules;" (2) U.S. patent application Ser. No. 60/843,106 entitled "Ion source with controlled liquid injection;" and (3) U.S. patent application Ser. No. 60/843,205 entitled "Computer controlled active feedback system for LDI/ES ion source with electro-pneumatic superposition." All aforementioned applications are incorporated herein by reference in their entirety.

FIELD OF THE INVENTION

This invention is in the field of chemical and biochemical analysis, and relates particularly to methods and apparatus for controlling and improving ion current in an ion transmission device in a mass spectrometer apparatus.

BACKGROUND OF THE INVENTION

The sensitivity of an ion analytical instrument, such as a mass spectrometer, depends in part upon the efficiency with which the coupled ion source generates ions from the analytical sample and then delivers those ions to the instrument for analysis. Matrix Assisted Laser Desorption and Ionization (MALDI)/Laser Desorption Ionization (LDI) and Electrospray ion sources have become an essential and enabling building block in modern mass spectrometry of biological macromolecules (e.g. proteins, peptides and sugars etc.). Both methods were awarded the Nobel Prize in Chemistry in 2002 and revolutionized the application of mass spectrometers in life science, in particular in proteomics but also in functional genomics and metabolomics and drug discovery.

One of the ultimate goals of life science (including disciplines such as proteomics) is the prediction of disease based on molecular information. To achieve this goal, highly efficient and sensitive ion sources as well as mass spectrometers with sufficient mass accuracy and reliability have to be available. Highly sensitive ion sources are needed in view of factors such as the following:

1. The human proteome is estimated to contain >$10^6$ protein species.
2. These proteins are thought to occur at an extremely large range of abundance ($\approx 10^{10}$).
3. Typically purification/selective binding are required which further reduces sample abundance.
4. Many purification methods impact ionization efficiencies negatively.
5. Frequently only very small sample amounts in low concentrations are available (mg or less, a few $10^3$ cells).
6. Investigations face combinatorial complexity from factors such as the very high number of measurements required, and the fact that Investigations limited by time.

It can be assumed that the discovery of biomarkers and the ability to predict diseases is currently hindered and limited by the unreliability with which distinctive patterns in mass spectra can be found, at least partially as a result of imperfections and limitation of the current ion source technology. This is one of the remaining obstacles for mass spectrometry to move from being an instrument in biochemical labs to an everyday tool in clinics and hospitals. Beside the application in life science and medicine, rapid and sensitive detection of organic and inorganic compounds will, unfortunately, become more common in the form of screening for biological agents and residues of explosives.

One specific variant of MALDI is sometimes referred to as Surface Enhanced Laser Desorption Ionization (SELDI) in which the matrix is already pre-deposited on the target surface. We will henceforth refer to MALDI and SELDI commonly as MALDI, or in general, as LDI. Electrospray (ES) has a number derivatives or of what can be considered variants such as Electrohydrodynamic ionization, Aerospray ionization, ACPI, and Thermospray ionization and which shall also be considered as included in the following.

Fundamentally, both LDI and ES methods suffer from a number of problems which limit their practical application, including aspects such as sensitivity, usefulness as quantitative tools, and usefulness in biomarker discovery.

One significant problematic factor is that of molecular fragmentation. Due to the high laser power densities LDI/MALDI ion sources eject ions with substantial translational and internal temperatures which frequently results in molecular fragmentation and decay thereby limiting the available ion life time for analysis. Such ion fragmentation also reduces sensitivity and, importantly, reduces the 'fidelity' or clarity of mass spectra which limits or prevents further data analysis, e.g. for biomarker discovery and analysis: Correlation of data from mass spectra with medical conditions of living or dead, human, animal or plant subjects from which analyzed samples were taken.

In MALDI ion sources typically a UV laser (sometimes IR) is fired at the crystals in the MALDI spot with typical pulse duration on the order of $t_{LP} \approx 10^{-9}$ to $10^{-8}$ s. The matrix molecules in the spot absorb the electromagnetic laser energy and are thought to protect the sample molecules. This, however, is only achieved to a very limited extent.

Originally, LDI/MALDI ion sources have been operated under vacuum conditions at pressures where sample ion—background gas collisions are negligible. Later, ion sources operating at elevated pressure or Atmospheric Pressure MALDI (AP MALDI) have been introduced for convenience in terms of sample handling as well as collisional cooling.

Experiments carried out in the early 90's indicated improved ion transmission within gas-filled multipole ion guides due to "collisional cooling": Repeated collisions of ions with gas molecules reduce the temperature of the ions and also cause the ion beam to collapse axially inside RF multipole ion guides.

This collisional cooling effect was subsequently utilized in MALDI ion sources themselves. Simple versions of so called elevated pressure and Atmospheric Pressure MALDI (AP MALDI) ion sources have been described beginning in the late '90. However, their ion-optical design is poor and a pneumatic design is effectively non-existent due to the lack of appropriate computational design tools capable of modeling the flow field as well as the electro-pneumatic interactions (ion-neutral collisions).

A second significant problematic factor in conventional mass spectrometry involves inefficiency. LDI/MALDI is a highly inefficient means to generate ions from a sample which results in a general lack of sensitivity of this method as well as very poor performance in terms of true quantitative sample analysis. In addition, sample preparation techniques strongly influence the characteristics of the obtained mass-spectrometric data in a mostly unpredictable manner.

In LDI/MALDI ion sources molecules in the sample spot absorb the electromagnetic laser energy and it is thought that primarily the matrix is ionized by this event. The matrix is then thought to transfer part of their charge to the analyte (e.g. a protein), thus ionizing them while (to a limited extent) still protecting them from the disruptive energy of the laser. Ions observed after this process are quasimolecular ions that are typically ionized by the addition of a proton to $[M+H]^+$ or the removal of a proton $[M-H]-$. MALDI generally produces singly-charged ions, but multiply-charged ions such as $[M+2H]2+$ have been observed specifically in conjunction with IR lasers.

However, if one thoroughly analyzes the budget of ions in a mass spectrometer it becomes apparent that the total ionization efficiency of MALDI is incredibly weak. For example, if a sample of 1 pmol ($6 \cdot 10^{23} \cdot 10^{-12} = 6 \cdot 10^{11}$) of stable biological macromolecules with a mass on the order of $m=10^3$ u is introduced into a commercially available high-end MALDI triple-quadrupole—Time-of-Flight (TOF) instrument an ion count on the order $10^4$ can be expected. It is known that the total ion transmission efficiency of that particular type of mass spectrometer (including detector efficiency, duty cycle, quadrupole transmission etc.) is on the order of $10^{-2}$. This means that approximately only $10^6$ ions are transmitted from the MALDI ion source into the mass spectrometer.

Since the sample contains $6 \cdot 10^{11}$ molecules the ionization efficiency is on the order of $10^6/6 \cdot 10^{11} \approx 1.6 \cdot 10^{-6}$. Approximately only one sample molecule in one million becomes an ion and is transmitted into the mass spectrometer. Even if this approximation would underestimate the ionization efficiency by one order of magnitude it is still apparent that a fundamental shortcoming of state-of-the-art MALDI is the lack of ionization efficiency. Further improvements in mass spectrometer performance can be helpful but have by far less potential than improvements on the ion sources and aspects such as ionization efficiency.

In conventional MALDI ion sources the available time for ionization is approximately only on the order of the duration of the laser pulse or slightly above ($t \approx 10^1$ ns). Thereafter, the plume expands and electrons and protons are rapidly extracted from the plume due their substantially lower mass-to-charge ratio m/q compared to sample ions of interest with a typical range of m/q≈$10^2$ u/e to $10^6$ u/e.

The creation and transfer of free charges to sample molecules in a conventional MALDI process can in fact be considered a byproduct.

A third level of problematic considerations involve the electrospray process itself. In Electrospray ion sources a liquid, in which the sample molecules are dissolved, is pressed through a capillary. It is generally assumed that the sample molecules are already in an ionized state inside the liquid and upon leaving the capillary the liquid forms a mist (or aerosol) of very small droplets containing such ionized sample molecules ("nebulization") which, due to coulombic forces, eventually releases individual ionized sample molecules of varying charge state. The exact mechanism of the ion formation is a matter of scientific debate.

There are several fundamental problems in Electrospray ion sources. First, the nebulization and ionization depends on large number of parameters such as, sample concentration, degree of dissociation, liquid flow rate, liquid conductivity, liquid surface tension, capillary diameter, liquid pressure, electric field, gas flow fields, gas temperature fields, gas pressure fields, etc. . . . Stable nebulization and ionization can be difficult to achieve. Moreover, a single or a plurality of droplets can not intentionally be created at a specific point in time with specific initial velocity and direction. Further The total ionization efficiency is also very low (although generally assumed to be better than conventional MALDI) since it depends to some extend on physical characteristics of the initial droplets and their creation, such as net charge, which are at least partially influenced by or in fact based on random processes/natural fluctuation.

A fourth problem is that thus far ES ion source designs have been considerably suboptimal since the combined influence of the electric fields and gas flow fields has not been addressed with sufficient accuracy due to the lack of appropriate computational tools.

A fifth level of problematic considerations involve operational limitations. Both advanced LDI and ES ion sources are inherently difficult to operate due to the complexity of the ion source behavior, the number of parameters that can be adjusted, and the limited available time during measurements. A typical user of such ion sources (connected to mass spectrometers) can not be expected to perform such correcting adjustments in an optimal and rapid fashion.

Thus there is a need to address this problem by providing an automated, active control and feedback system which performs the desired operations.

SUMMARY OF THE INVENTION

Aspects of the present invention provide methods, apparatus, systems, processes and other inventions relating to: ion sources with controlled electro-pneumatic superposition, ion source synchronized to RF multipole, ion source with charge injection, optimized control in active feedback system, radiation supported charge-injection liquid spray, and ion source with controlled liquid injection, as well as various embodiments and combinations of each of the foregoing.

The disclosed inventions address these and other problems by providing the following solutions.

Disclosed herein are ion sources based controlled superposition of electric and pneumatic fields which enables extraordinary performance in terms of ion survivability and ion guidance and transmission. In contrast to state-of-the-art devices, gas pressure and gas flow velocities are not considered as global quantities but as spatially distributed fields. In this new class of ion optical electro-pneumatic devices, the balance between electrical and collisional forces on ions varies spatially in a controlled fashion by utilizing elements which act as electrodes and have also aerodynamic functionality, i.e. "electro-pneumatic elements."

Disclosed herein is a method to increase total ion transmission from ion sources based on controlled superposition of electric and pneumatic fields whereby the operation of the ion source is synchronized to the operation of a RF multipole to which the ion source transmitting ions and the RF multipole using ramped or stepped mass ranges.

Disclosed herein are LDI/MALDI ion sources with Charge-Injection. Such Charge-Injection LDI/MALDI (CIN-LDI/CIN-MALDI) ion source technology achieves orders of magnitude higher sample ionization efficiency by exposing the ejected neutral sample molecules to a controlled and directed low energy charge injection ion beam of stable low molecular weight ions (including protons) originating from an ion gun with specific kinetic energy.

Disclosed herein are ion sources wherein at a single or a plurality of droplets containing sample molecules (1) a low energy charge injection ion beam of stable low molecular weight ions (including protons) originating from an ion gun is controlled and directed with specific kinetic energy and (2) a beam of electromagnetic radiation is directed. The fundamental advantage of this configuration is that it allows to substantially increase the net charge state of the droplet(s) as well as their temperature/evaporation rate, effectively independent of an energy transfer with a optionally present background gas.

Disclosed herein are ion sources wherein the droplet formation of liquids or liquid crystals containing sample molecules is largely independent of the pressure and rate with which the liquid is supplied, the degree of dissociation of the sample molecules, the electric conductivity of the liquid, and the electric field at the capillary tip from which the droplets are released. Such ion sources enable electrically controlled formation and ejection of droplets of specific size and with specific initial velocity.

Disclosed herein is a method of optimizing the operation of an ion source utilizing electro-pneumatic superposition, the source being in ion communication with a mass spectrometer, wherein an active control system analyzes data generated during operation of the mass spectrometer and active control system derives and generates signals from the data analysis, and providing these signals as feedback to control the operation of the ion source.

Ion Sources with Controlled Electro-pneumatic Superposition

Aspects of the present invention provide apparatus and methods in which controlled superposition of gas flow fields and electrostatic fields within an ion source can effect rapid collisional cooling with improved collection, collimation, and output of ions, as well as other effects. The high efficiency injection of unfragmented ions into ion analytical instruments to which the source may be operably coupled can increase significantly the sensitivity of the analytical apparatus.

In one aspect, the invention provides a device for outputting ions, an ion source device. In some embodiments, the device may comprise a first housing and a second housing. In such embodiments, the first housing may comprise at least one pneumatic element that segregates the space within the first housing into a gas reservoir and an ion expansion chamber, the gas reservoir being in axisymmetric gas communication with the ion expansion chamber and in gas communication with the exterior of the first housing. A second housing of such embodiments may comprise at least one pneumatic element that segregates the space within the second housing into an axial trajectory region and a gas sink region, the gas sink region being in axisymmetric gas communication with the axial trajectory region and in gas communication with the exterior of the second housing. The first housing expansion chamber of some embodiments may be axially aligned with and in gas and ion communication with the second housing axial trajectory region; the second housing axial trajectory region may be in axial alignment with and in ion communication with an ion outlet of the device. In some embodiments the elements, including electro-pneumatic elements, within the first and second housing may not be axisymmetric or may be only partially axisymmetric. In some embodiments they may be generally axisymmetric.

Ions introduced into or generated within the ion expansion chamber may be guided, during operation of the device, along the device axis from the expansion chamber through the axial trajectory region to the ion outlet predominantly by pneumatic fields in the first housing and predominantly by electrostatic fields in the second housing.

In some embodiments, the first housing may comprise a plurality of pneumatic elements that segregate the space within the first housing into a gas reservoir and an ion expansion chamber, the gas reservoir being in axisymmetric gas communication with the ion expansion chamber and in gas communication with the exterior of the first housing. Similarly, the second housing may comprise a plurality of pneumatic elements that segregate the space within the second housing into an axial trajectory region and a gas sink region, the gas sink region being in axisymmetric gas communication with the axial trajectory region and in gas communication with the exterior of the second housing.

In order to generate superposed pneumatic and electrostatic fields in a first portion of the ion trajectory, the first housing may further comprise at least one electrically conductive element; at least a portion of at least one of the first housing pneumatic elements may be electrically conductive. In some embodiments, at least a portion of a plurality of the first housing pneumatic elements may be electrically conductive. In a subset of these embodiments, each of the plurality of first housing pneumatic elements may be electrically conductive. The first housing electrically conductive elements, if present, may be capable of creating an electrostatic field that is capable of affecting ion trajectory in the expansion chamber.

In order to generate superposed pneumatic and electrostatic fields in a second portion of the ion trajectory, the second housing may further comprise at least one electrically conductive element.

In some embodiments, at least a portion of at least one of the second housing pneumatic elements may be electrically conductive. Often, at least a portion of a plurality of the second housing pneumatic elements may be electrically conductive. In a subset of these latter embodiments, each of the plurality of second housing pneumatic elements may be electrically conductive. The second housing electrically conductive elements, when present, may be capable of creating an electrostatic field capable of guiding ions axially through the axial trajectory region to a device outlet that communicates the axial trajectory region with the exterior of the second housing.

The ion source device of the present invention may include means for introducing ions into or generating ions within the expansion chamber. The means can, for example, comprise engagement means or guides for a laser desorption ionization probe upon which an analytical sample may be disposed, the engagement means being capable of positioning a laser desorption ionization probe so as to display at least one surface thereof to the expansion chamber. In some of these embodiments, the probe engagement means may be in physical and electrical contiguity to an electrically conductive element. The engagement means may include a probe holder, or other suitable device known in the art.

In addition, the first housing may comprise at least one symmetrically disposed gas inlet, typically a plurality of separately disposed gas inlets, that communicate the gas reservoir with the exterior of the first housing. The gas inlet(s) may be so shaped and so disposed that the gas pressure inside the gas reservoir is, for the most part, spatially constant, and on average only negligible gas flow speeds occur inside the gas reservoir as compared to gas flow speeds in the expansion chamber. In some embodiments, for example, the gas inlets may comprise means to baffle inward streaming gas flow to facilitate the achievement of such pressure and flow characteristics.

Analogously, the second housing may comprise at least one, typically a plurality of, symmetrically disposed gas outlets that communicate the gas sink region with the exterior of the second housing.

In some embodiments, one or two completely open sides of the second housing may act as the gas outlets.

In various embodiments, the second housing may further comprise additional gas flow guiding means (pneumatic elements) which help maintain axisymmetrically outwardly directed gas flow out of the sink region, although at some point during the spatial transition from the gas sink region to the exterior of the second housing, spatial symmetry may be broken.

Typically, the collective gas flow resistance of the gas outlets is lower than the collective gas flow resistance of the gas inlets. In some embodiments, the plurality of gas outlets may be communicably connected to means, disposed outside the second housing, for adjusting outward gas flow. In some embodiments, the plurality of gas inlets may be communicably connected to means, disposed outside the first housing, for adjusting inward gas flow.

In certain embodiments, one or more of the at least one first housing pneumatic elements may be so shaped and so disposed that maximal constriction to axisymmetric gas flow between the gas reservoir and expansion chamber is located proximal to the expansion chamber.

The gas communication between the gas reservoir and expansion chamber can be either continuously or periodically axisymmetric.

The first and second housings can be separately constructed, and sealingly engaged, or of integral construction.

In some embodiments, the ion source device can be operably coupled to an ion analytical instrument. In some embodiments, the ion source device may be so coupled to the analytical instrument as to permit gas to be evacuated through the second housing gas outlets from the ion analytical instrument's ion source-proximal region, such as from a multipole in the instrument's ion-source proximal region.

The present invention further provides, in another aspect, an ion source device. The device may comprise ion generating means, first ion guidance means, and second ion guidance means. The first ion guidance means may be configured to establish electrostatic fields and ion-guiding pneumatic fields, the ion-guiding pneumatic fields predominating over electrostatic fields during use; the second ion guidance means may be configured to establish ion-guiding electrostatic fields and pneumatic fields, the ion-guiding electrostatic fields predominating over pneumatic fields during use.

During operation, ions generated by the ion generating means may be guided by the pneumatically dominant first ion guidance means and then by the electrostatically dominant second ion guidance means along the device axis to a device outlet.

The first ion guidance means of some embodiments may be disposed in a first housing, the second ion guidance means in a second housing, the first housing being in axial ion and gas flow communication with the second housing. As noted above, and further described herein below, the first and second housings can be of integral construction.

In some embodiments, the first ion guidance means may comprise at least one electropneumatic element, the at least one electropneumatic element segregating the space within the first housing into a gas reservoir and an ion expansion chamber, the gas reservoir being in axisymmetric gas communication with the ion expansion chamber. In some of these embodiments, the first ion guidance means may comprise a plurality of electropneumatic elements, the plurality of electropneumatic elements segregating the space within the first housing into a gas reservoir and an ion expansion chamber, the gas reservoir being in axisymmetric gas communication with the ion expansion chamber.

In some embodiments, at least one of the electropneumatic elements may be so shaped and so disposed within the first housing as to create radially inwardly-directed axisymmetric gas flow when the gas reservoir is at a higher pressure than the expansion chamber. In a subset of these embodiments, each of the electropneumatic elements may be so shaped and so disposed within the first housing as to create radially inwardly-directed axisymmetric gas flow when the gas reservoir is at a higher pressure than the expansion chamber.

In certain embodiments, at least one of the electropneumatic elements may be so shaped and so disposed that gas flowing radially inwardly from the gas reservoir to the expansion chamber encounters maximal constriction axisymmetrically proximal to the expansion chamber.

In some embodiments, the second ion guidance means may comprise at least one electropneumatic element, the at least one electropneumatic element segregating the space within the second housing into an axial trajectory region and a gas sink region, the axial trajectory region being in axisymmetric gas communication with the gas sink region. In a subset of these embodiments, the second ion guidance means may comprise a plurality of electropneumatic elements, the plurality of electropneumatic elements segregating the space within the second housing into an axial trajectory region and a gas sink region, the axial trajectory region being in axisymmetric gas communication with the gas sink region.

At least one, often each of a plurality, of the electropneumatic elements may be so shaped and so disposed within the second housing as to create radially outward-directed axisymmetric gas flow when the axial trajectory region is at a higher pressure than the gas sink region. In some embodiments, the second ion guidance means may further comprise gas flow guiding means (pneumatic elements) that help maintain axisymmetrically outwardly directed gas flow out of the sink region, although at some point during the spatial transition from the gas sink region to the exterior of the second housing spatial symmetry may be broken.

The first housing may comprise at least one, typically a plurality of, symmetrically disposed gas inlets that communicate the gas reservoir with the exterior of the first housing, and the second housing may comprise at least one large gas outlet, typically a plurality of gas outlets, that communicate the gas sink region with the exterior of the second housing, with the collective gas flow resistance of the second housing gas outlets being lower than the collective gas flow resistance of the first housing gas inlets.

In some embodiments, the means for introducing or generating ions acts to generate ions within the expansion chamber. Such ion-generating means may include, in some embodiments, laser desorption ionization means.

The laser desorption ionization means can comprise laser desorption ionization probe engagement means, the engagement means being capable of positioning a laser desorption ionization probe so as to display at least one surface thereof to the expansion chamber. In some of these embodiments, the probe engagement means may be in electrical contiguity with an electrically conductive element within the first housing.

In some laser desorption ionization means, the laser desorption ionization means can further comprise a mirror that directs laser light to the surface of a laser desorption ionization probe substantially along the device axis. This mirror may also allow observation of the sample, such as by video or other optical systems. Alternatively, the laser desorption ionization means may include a first mirror that directs laser light to the probe surface, and may further include one or more additional mirrors that may be used for video or optical observation of the sample on the probe.

In a further aspect, the invention provides analytical apparatus, comprising an ion source device according to the present invention, operably coupled to an ion analytical instrument.

The ion analytical instrument can, in some embodiments, comprise at least one multipole radio-frequency (RF) ion guide, such as a quadrupole ion guide. In some of these embodiments, the operative coupling of the ion source device to the ion analytical instrument permits the ion source device to draw gas proximally outward from the RF multipole during use.

The ion analytical instrument can usefully comprise at least one mass analyzer, and even a plurality of mass analyzers.

In another aspect, the invention provides methods of increasing the collimated output of ions from an ion source device, and thus methods of increasing the sensitivity of ion analytical instruments to which such ion source devices may optionally be operably coupled.

The methods comprise guiding ions introduced into or generated within the source along the device axis to an ion source outlet using superposed electrostatic and axisymmetric pneumatic fields. Ion-guiding pneumatic fields predominate in their effects on ion motion over electrostatic fields in a first portion of the ion trajectory and ion-guiding electrostatic fields predominate in their effects on ion motion over pneumatic fields in a second portion of the ion trajectory.

In some embodiments, the pneumatic fields may be generated by establishing radially-inward axisymmetric and radially-outward axisymmetric gas flows in axial succession.

In such embodiments, the ion source device can usefully be an ion source device of the present invention.

In some of these embodiments, the magnitude of the gas flows may be controlled in part by controlling gas flows into the gas reservoir, and/or by controlling gas flows out of the gas sink region. In some embodiments, controlling gas flows out of the gas sink region may comprise controlling outwardly directed pumping of gas from the gas sink region.

In embodiments of the methods of this aspect of the invention, electrostatic fields may be generated by applying an electrical potential to each of a plurality of electrically conductive elements in the ion source device.

In some embodiments, the potential applied to at least one of the plurality of electrically conductive elements may change, typically under computer control, between the time of ion introduction into or generation within the device and ion output from the ion source device. In a subset of these embodiments, the potential applied to a plurality of electrically conductive elements may change between the time of ion introduction into or generation within the device and ion output from the ion source device.

Such change in potential can be used to facilitate ion focusing and guidance. Such change in potential can also be used to facilitate injection of ions into an RF multipole of an analytical instrument that is optionally coupled to the ion source device. In the latter case, the potential applied to at least one of the plurality of the electrically conductive elements may be ramped coordinately with AC potential stepping of an RF multipole of an ion analytical instrument to which the source is operably coupled.

The methods of the present invention may further comprise a subsequent step of performing at least one analysis on at least one species of ion output from the ion source device. For example, the analysis may comprise determining the mass to charge ratio of at least one ion species.

The methods of the present invention may, other embodiments, further comprise the subsequent steps of: selecting at least one ion species output from the ion source device; fragmenting the at least one selected ion species; and performing at least one analysis on at least one product ion resulting from fragmenting the at least one selected ion.

The analysis may, for example, be determining the mass to charge ratio of the at least one product ion, or performing a complete product ion scan.

The methods of the present invention may further comprise, before the step of guiding ions to the ion source device outlet, the step of: introducing ions into or generating ions within the ion source device.

Introducing or generating ions may comprise, in certain embodiments, generating ions by laser desorption ionization of an analytical sample. In certain of these embodiments, the analytical sample may comprise proteins, and the ions to be guided are ions generated from the proteins. In such embodiments, the methods may further comprise the antecedent step, before generating ions, of capturing proteins from an inhomogeneous mixture on a surface of a laser desorption ionization probe.

Ion Source Synchronized to RF Multipole

Aspects of the present invention also relate to the field of chemical and biochemical analysis, and relate to methods and apparatus for controlling and improving ion current in an ion transmission device in a mass spectrometer apparatus.

The present invention solves these and other needs by providing an apparatus with an ion source and an ion transmission device, wherein the ion source and the ion transmission device are in ion communication. The ion current of the ion source may be controlled by coordination of the operating parameters of the ion source with the operating parameters of the ion transmission device.

In a first aspect, the present invention provides a method for controlling the ion current of an ion transmission device by coordinating the respective operating parameters of the ion transmission device with the ion source.

In another aspect, a method of the present invention is a method for controlling the ion current of an ion transmission device, wherein an ion source is in ion communication with and provides ions to the ion transmission device, the method may comprise coordinating a value for each of at least one operating parameter of the ion source with a value for each of at least one operating parameter of the ion transmission device.

The step of coordinating may include setting the ion source operating parameters with values that are predetermined, or selected from a set of predetermined values. The predetermined values for the ion source operating parameters may be predetermined for providing ions of a given mass range from the ion source to the ion transmission device. The predetermined values for the ion source operating parameters may also be predetermined to provide ions of all mass ranges from the ion source to the ion transmission device.

In certain embodiments, an apparatus of the present invention or methods practiced therewith may include an ion transmission device that provides ions to a mass spectrometer, an ion mobility spectrometer, or a total ion current measuring device.

In certain embodiments, the step of coordinating may comprise setting values of the ion transmission device operating parameters and the ion source operating parameters, wherein the both of the respective values are predetermined for the given mass range of ions.

In certain embodiments, the step of coordinating may comprise setting a first set of values of the ion transmission device operating parameters and setting a first set of values of the ion source operating parameters, wherein said first set of values for the ion source are predetermined based on the first set of values of the ion transmission device operating parameters. In certain embodiments, this method may further comprise the steps of setting a second set of values of the ion transmission device operating parameters and setting a second set of values of the ion source operating parameters, wherein said second set of values for the ion source are predetermined based on the second set of values of the ion transmission device operating parameters.

In certain embodiments, the step of coordinating may comprise determining the values of the ion transmission device operating parameters and then setting values of the ion source operating parameters, wherein said values for the ion source are predetermined based on the values determined for the ion transmission device operating parameters.

In certain embodiments, an apparatus of the present invention or methods practiced therewith may include an ion transmission device that may comprise a multipole radio-frequency ion guide. In such embodiments, examples of ion transmission device operating parameters include the amplitude and frequency of the alternating current potential of the multipole ion guide electrodes. Ion transmission device operating parameters may also include the amount of DC potential that may be applied to the multipole radio-frequency ion guide with the AC potential. In certain embodiments, an apparatus of the present invention or methods practiced therewith may include an ion transmission device that may comprise an electrostatic ion guide or an electromagnetic ion guide.

In certain embodiments, an apparatus of the present invention or methods practiced therewith may include an ion source that may comprise a laser desorption/ionization ion source, a chemical ionization ion source, an electron impact ionization ion source, a photoionization ion source or an electrospray ionization ion source. These and other suitable ion sources known in the art, such as other known methods of generating ions from an analyte sample, may be used with or included in the present invention.

In certain embodiments, an apparatus of the present invention or methods practiced therewith may include an ion source that may comprise at least one electrode capable of affecting the potential experienced by ions in the ion source. In certain embodiments, at least one of the ion source operating parameters includes the direct current potential of at least one of the ion source electrodes. In certain embodiments, at least one of the ion source operating parameters includes an alternating current potential of at least one of the ion source electrodes.

In certain embodiments of the present invention, the step of coordinating may comprise setting values of the ion transmission device operating parameters and setting values of the ion source operating parameters, wherein at least one of the values of the ion source operating parameters is calculated based on at least one of the values of the ion transmission guide operating parameters.

In certain embodiments, an apparatus of the present invention or methods practiced therewith may include an ion transmission device that may comprise a multipole radio-frequency ion guide, and at least one of the ion transmission guide operating parameters includes the amplitude and frequency of the radio-frequency alternating current potential of the multipole ion guide electrodes.

In certain embodiments of the present invention, the step of coordinating may comprise monitoring in real-time at least one of the operating parameters of the ion transmission device. In certain embodiments of the present invention, the potential applied to the at least one of the electrodes of the ion transmission device may be monitored in real-time.

In certain embodiments of the present invention in which the ion source and the ion transmission device are in signal communication with a controller, the step of coordinating may comprise configuring the controller to set at least one of the values of the ion source operating parameters, wherein said at least one set values are predetermined based on at least one of the values of the ion transmission device operating parameters as determined by the controller. In certain embodiments in which the ion source operating parameters are predetermined for a given mass range, the ion current may be improved for the given mass range. In certain embodiments, the given mass range may be user-defined.

In certain embodiments of the present invention in which the ion source and the ion transmission device are in signal communication with a controller, the step of coordinating may comprise configuring the controller to set at least one of the values of the ion source operating parameters, wherein said at least one set values are predetermined based on a given mass range. In certain embodiments of the present invention, the given mass range is user-defined.

In certain embodiments of the present invention in which the ion source and the ion transmission device are in signal communication with a controller, the step of coordinating may comprise configuring the controller to set at least one of the values of the ion source operating parameters, wherein the at least one of said set values are calculated based on at least one of the values of the ion transmission device operating parameters.

In certain embodiments of the present invention in which the ion source and the ion transmission device are in signal communication with a controller, the step of coordinating may comprise configuring the controller to set at least one of the values of the ion source operating parameters, wherein said at least one set values are predetermined for a given mass range of ions, and whereby the controller is capable of coordinating the respective values of the operating parameters of the ion source and the ion transmission device for the given mass range.

In certain embodiments of the present invention in which the ion source and the ion transmission device are in signal communication with a controller, the step of coordinating may comprise configuring the controller to set at least one of the values of the ion source operating parameters, wherein at least one of said set values are calculated based on at least one of the values of the ion transmission device operating parameters, and whereby the controller is capable of coordinating the respective values of the operating parameters of the ion source and the ion transmission device.

In certain embodiments of the present invention in which the ion source and the ion transmission device are in signal communication with a controller, the step of coordinating may comprise configuring the controller to set at least one of the values of the ion source operating parameters, wherein said at least one set values are based on the values of the ion transmission device operating parameters, and whereby the controller is capable of coordinating the respective values of the operating parameters of the ion source and the ion transmission device.

In another aspect, the present invention provides an apparatus for controlling the ion current of an ion transmission device therein.

An apparatus of the present invention may comprise an ion source, an ion transmission device in ion communication therewith, and a controller configured to coordinate respective values of the operating parameters of the ion source and the ion transmission device. In certain embodiments, the controller may comprise a digital computer and/or memory. In certain embodiments, the controller may be in signal communication with the ion source and the ion transmission device of the apparatus. In certain embodiments, the controller may be configured to coordinate the value of at least one ion source operating parameter with the value of at least one ion transmission device operating parameter.

In certain embodiments of the apparatus, the controller, when coordinating the respective values of the operating parameters, may be configured to determine at least one of the values of the ion transmission device operating parameters and set at least one of the values of the ion source operating parameters, wherein the values set for the ion source operating parameters are selected from a set of predetermined values based on the values determined for the ion transmission device operating parameters. In some embodiments, the controller may comprise memory in which the set of predetermined values are stored.

In certain embodiments of the apparatus, the controller, when setting the values of the ion source operating parameters, may be configured to calculate at least one of the values of the ion source operating parameters, wherein said calculation is based on at least one of the values of the ion transmission device operating parameters.

In certain embodiments of the apparatus, the controller, when coordinating the respective values of the operating parameters, may be configured to set at least one of the values of the ion transmission device operating parameters and set at least one of the values of the ion source operating parameters, wherein said set values of the ion source operating parameters are predetermined for providing ions of a given mass range from the ion source to the ion transmission device. In certain embodiment, the given mass range may be user-defined.

In certain embodiments of the apparatus, the ion source may be a laser desorption/ionization ion source, a chemical ionization ion source, an electron impact ionization ion source, a photoionization ion source, an electrospray ionization ion source, or a plasma desorption ion source.

In certain embodiments of the apparatus, the ion source may comprise at least one electrode capable of affecting the potential experienced by ions in the ion source. The ion source operating parameters may include the magnitude of a direct current potential of at least one of the ion source electrodes. The ion source operating parameters may also include the frequency and amplitude of an alternating current potential of at least one of the ion source electrodes.

In certain embodiments of the apparatus, the ion transmission device may comprise a multipole radio-frequency ion guide. The ion transmission device operating parameters may include the amplitude of a radio-frequency alternating current potential of the multipole radio-frequency ion guide electrodes. The multipole radio-frequency ion guide may include a quadrupole ion guide, a hexapole ion guide, or an octopole ion guide.

In certain embodiments of the apparatus, the ion source may comprise systems and components for providing a gas flow field, such as are known in the art.

In certain embodiments, the apparatus may further comprise one or more mass analyzers. Suitable mass analyzers may include a quadrupole mass filter, a reflectron, a time-of-flight mass analyzer, an electric sector time-of-flight mass analyzer, a triple quadrupole apparatus, a Fourier transform ion cyclotron resonance mass analyzer, a magnetic sector mass analyzer, or other suitable mass analyzers known in the art. It is understood that the present invention embraces embodiments in which the apparatus does not include a mass analyzer component with the ion source and ion transmission device. In some embodiments, the apparatus may be a tandem mass spectrometer.

In certain embodiments of the apparatus, one or mass analyzers may be in ion communication with the ion transmission device. The mass analyzer may be disposed at either the entry or the exit of said ion transmission device. In some embodiments, one or more optional intervening components may be disposed between the ion transmission device and the mass analyzer, wherein the optional intervening component may allow and/or facilitate ion communication between the mass analyzer and the ion transmission device.

In certain embodiments of the apparatus, the ion transmission device may include a mass analyzer. For example, in some embodiments the apparatus of the present invention may comprise an ion source in ion communication with an ion transmission device, wherein the ion transmission device is a mass analyzer. In other embodiments, the ion transmission device may include one or more mass analyzers and one or more ion guides, such as a multipole ion guide. In these embodiments, the mass analyzer and the ion guide function together as an ion transmission device.

In certain embodiments, the apparatus may further comprise an ion current measuring device or an ion mobility spectrometer. The apparatus may also further comprise an ion detector.

In still another aspect, the present invention provides an apparatus that includes an ion source in ion communication with an ion transmission device, and a system for coordinating the respective operating parameters of the ion source and the ion transmission device. In certain embodiments of the apparatus, the coordinating system may comprise a component for determining at least one of the values of the ion transmission device operating parameters.

In certain embodiments of the apparatus, the coordinating system may comprise a component for setting at least one of the values of the ion source operating parameters, wherein at least one of the values set for the ion source operating parameters is based on at least one of the values determined for the ion transmission device operating parameters.

In certain embodiments, the apparatus may further comprise a system for the mass analysis of ions, wherein the coordination system improves the sensitivity of said system for ion mass analysis.

Charge Injection

Aspects of certain embodiments of the inventive CIN-LDI/CIN-MALDI ion source system include a low energy charge injection ion beam (CIN-beam) of stable low molecular weight ions (including protons) originating from an ion gun, the ion beam being controlled and directed with specific kinetic energy by electric and/or magnetic fields into the plume of a laser pulse-desorbed sample containing sample ions and neutral sample molecules and/or onto the sample itself. Low energy collisions occur between neutrals and CIN-beam ions (CIN-ions) which attach to the neutral sample molecules thereby increasing the total sample ionization efficiency of the ion source and the sample ions then being extracted by electric fields. The system as a whole represents an optimized ion-optical and/or electro-pneumatic ion-optical configuration for high resolution mass spectrometry.

In some embodiments, the ion gun may feed ions into an ion trap to accumulate CIN-ions which are then pulsed into the LDI/MALDI region.

In some embodiments, the CIN-beam may be pulsed or modulated in a pulse-like arbitrarily time-dependent manner, synchronized with the laser and acceleration potentials on the electrodes in the CIN-LDI/CIN-MALDI ion source are turned off or floated during the CIN ion injection but turned on thereafter to extract created sample ions.

In some embodiments, the initial kinetic energy of the CIN-ions may be sufficient to reach the sample target with CIN-ion—sample interaction predominately occurring at the sample surface or its immediate proximity.

In some embodiments the initial kinetic energy of the CIN-ions may be insufficient to reach the sample target, causing them to reverse their trajectories thereby largely increasing the collision probability with neutrals thereby having most of the ionization of the neutral sample molecules occurring in a region adjacent to the sample.

In various embodiments, the CIN-beam may be either DC or pulsed. In some of the pulsed embodiments, the pulsed CIN-beam is synchronized to the MALDI laser(s) pulse(s). In some embodiments with several CIN-beam pulses, the pulses are similarly synchronized to the MALDI laser(s) pulse(s)

Some embodiments of the inventive CIN-LDI/CIN-MALDI ion source system may operate with pulsed or arbitrarily time-dependent electric potentials on the main electrodes of the ion source or attached or joint ion analytical instrument In some embodiments, the inventive CIN-LDI/CIN-MALDI ion source system may operate at elevated pressures to achieve collisional sample ion cooling. In some cases, the collisional cooling is based on electro-pneumatic superposition. In some embodiments, the system operates with pulsed gas flow fields. In still other embodiments, the system operates with pulsed or arbitrarily time-dependent electric potentials on the main electrodes of the ion source or attached of joint ion analytical instrument In some embodiments of the inventive CIN-LDI/CIN-MALDI ion source system, the CIN-ion source may be a separable and detachable component of the CIN-MALDI ion source. In other embodiments, the CIN-ion source is an integral part of the CIN-MALDI ion source.

In some embodiments of the inventive CIN-LDI/CIN-MALDI ion source system, the CIN-LDI/CIN-MALDI may be attached to an ion analytical instrument. In other embodiments, it is attached to a MS (e.g. linear TOF, refectron TOF, quadrupole, ion trap [incl Orbitrap], Fourier transform ion cyclotron resonance MS, etc.), MS-MS (e.g. triple-quad TOF, TOF-TOF, trap-TOF etc.), or any other tandem mass spectrometer or MSn instrument or combination thereof. In still other embodiments, it may be connected to a quadrupole or multi-pole with the CIN-beam being injected into the ion source on the axis of the quadrupole or multi-pole. In still other embodiments, it may be connected to a tetrahedral ion trap (patent to be filed separately)

In some embodiments of inventive CIN-LDI/CIN-MALDI ion source system, the CIN-LDI/CIN-MALDI ion source may be a separable device attached an ion analytical instrument. In the other embodiments, it may be an integral part of an ion analytical instrument.

In some embodiments of the inventive CIN-LDI/CIN-MALDI ion source system, the CIN-beam and laser beam may be simultaneously scanned over the sample and/or chip.

Optimized Control

Aspects of the present invention relate to systems and methods for optimizing the control of an ion source utilizing electro-pneumatic superposition connected to a mass spectrometer by feedback from operational data and to optimizing results obtained by a mass spectrometer or other instrumentation receiving ions from the ion source.

Aspects of embodiments of the present invention relate to systems and methods that optimize the control of ion sources employing electro-pneumatic superposition, the ion sources being operably connected to a mass spectrometer. Methods and systems of control include collecting and analyzing data from the mass spectrometer during its operation, generating signals from the data analysis, and providing the signals as feedback to control various aspects of the operation of the ion source. Data from which informative feedback signals are generated may include the mass spectrum data from a sample being analyzed, and may also include data from sensors reporting conditions from the locale of the ion source, as well as data from other sources.

The ion source of mass spectrometers controlled by embodiments of these systems and methods may include ion sources of the laser desorption ionization type as well as the electrospray type. Some embodiments of the ion source may make use of charge injection (CIN-LDI/CIN-MALDI), and may further make use of two-dimensional sample chips.

Objectives of the optimization of the control of the ion source include optimally guiding ions, cooling ions collisionally, and optimally guiding droplets containing sample ions. Optimizing control may be effected by various approaches, for example, by changing the multiplicity of the gas reservoir pressures used to supply gas to the ion source region in which the electro-pneumatic superposition occurs, or by controlling changing the total gas flow to the ion source region in which the electro-pneumatic superposition occurs. Optimizing control may further be effected by changing the electric potentials on electro-pneumatic elements.

Optimizing control may further be effected by changing the mechanical arrangement of electro-pneumatic elements such as angles or gap-width by means of active drives such as stepper motors. Optimizing control may still further be effected by changing the timing behavior of the electric or pneumatic parameters. Optimizing control may even still further be effected by changing the operation of a pump connected to the ion source or the gas flow to said pump by means of a throttling valve.

Embodiments of the presently described active control system may assume various configurations, for example, they may be integrated into the control system of the ion source, they may be integrated in the control system of the mass spectrometer, or they may be stand-alone devices.

Embodiments of the active control system may make use of information obtained throughout the entire mass spectrometric data acquisition process to provide feedback information to optimize the performance of the ion source, or they may make use only of information obtained during an initial phase of the mass spectrometric data acquisition process. In these embodiments, the active control system is providing feedback in real time. Other embodiments of the active control system may make use of stored information, which may also be encoded in the sample itself or on a bio-chip.

Embodiments of the active control system may make use of an algorithm that derives variously from any of the control signals provided to the ion source from the total ion count, from the signal to noise ratio in the mass spectrum, and/or from the amount of fragment or cluster ions in the mass spectrum.

Radiation Supported Charge-Injection Liquid Spray

Aspects of the present invention relate to systems and methods for improving the sensitivity of ion sources based on spraying liquids, and improving their usefulness as a quantitative tool, when connected to a mass spectrometer or other equipment.

Described herein are various aspects of embodiments of a "Radiation supported Charge-Injection Liquid Spray" (RCIN-LS) device and associated methods of operation. In broad terms, these embodiments are devices for outputting ions where (1) droplets of a liquid (or liquid crystal) containing sample molecules are generated, (2) one or more low energy charge injection ion beam(s) (CIN-beam) of stable low molecular weight ions (including protons) originating from an ion gun is controlled and directed with specific kinetic energy by electric and/or magnetic fields onto one or more droplets, thereby increasing the net charge of said droplets, and/or (3) having the droplets exposed to a single or a plurality of controlled and directed beam(s) of electromagnetic radiation (such as optical, UV, IR [including laser]; microwave) in order to control its (their) temperature and evaporation rate both influences (2 and 3) combined increasing the total sample ionization efficiency and ionization uniformity (across different molecular species) of the device/ion source.

CIN- and EM-beam variations include methods and devices where (1) beams may be deflected, (2) beams may be synchronized, and/or (3) beams may be controlled by video/timing.

Variations of the charge-injection aspect of the RCIN-LS ion source and connected devices may include any of the following:

1. The ion gun feeds ions into an ion trap to accumulate CIN-ions which are then pulsed into the ES region.
2. The CIN-beam is pulsed or pulse-like arbitrarily time-dependent modulated, synchronized with the droplet formation and acceleration potentials on the electrodes in the ion source are turned off or floated during the CIN ion injection but turned on thereafter to extract created droplets and/or sample ions with pulsed or arbitrarily time-dependent electric potentials on the main electrodes of the ion source or attached or joint ion analytical instrument with pulsed or arbitrarily time-dependent electric potentials on the main electrodes of the RCIN-LS ion source.
3. The CIN-ion gun is a separable and detachable component of the RCIN-LS ion source, or the CIN-ion gun being an integral part of the RCIN-LS ion source.
4. The RCIN-LS ion source is either (1) a separable device attached an ion analytical instrument or (2) being an integral part of an ion analytical instrument.
5. The ion analytical instrument may be any of various types, including
   a. Any of various mass spectrometer types, including linear TOF, refectron TOF, quadrupole, ion trap.
   b. A Fourier transformed ion cyclotron resonance mass spectrometer, or Orbitrap.
   c. A MS-MS (for example, triple-quad TOF, TOF-TOF, trap-TOF, etc.), or any other tandem mass spectrometer or MS$^n$ instrument or combination thereof.
6. The RCIN-LS ion source may be connected to a RF multi-pole with the CIN-beam being injected into the ion source on the axis of multi-pole.
7. The RCIN-LS ion source may be connected to a tetrahedral ion trap (per patent application being filed separately).

Variations of the EM-beam aspect of the ion source may include any one or more of the following:

1. may be IR, UV, or visible Laser.
2. may be any of known variants of solid state or gas phase lasers, OPO lasers.
3. semiconductor lasers such as laser-diodes or arrays thereof.
4. may be intense incandescent lamps, arc, glow discharges etc.
5. may be exposure to microwave or Terahertz electromagnetic radiation.
6. may include electronically controlled deflection.
7. may include electronically controlled attenuation.
8. may include electronically controlled synchronization.
9. may hit a single or multiple droplets.

Variations of the general RCIN-LS ion source design may include any one or more of the following:

1. The droplet formation/nebulization, droplet guidance, and ion guidance is supported by electro-pneumatic superposition by means of electro-pneumatic elements which create specifically designed electric fields as well as gas flow fields.
2. The liquid containing sample molecules is dispensed utilizing "controlled liquid ejection" by means of a inkjet printer like mechanism, with any of the following variations:
   a the droplet generation/ejection is synchronized with the charge injection.
   b a single packet of CIN ions is directed a at a single droplet.
   c a single packet of CIN ions is directed a at multiple droplet.
3. The design may have an active control system operate the ion source and optimize its performance, the active control system having knowledge/data from previously performed modeling and/or (a) reduced order model(s) based said modeling and using such knowledge/data to perform/optimize the ion source control.
4. The design may have an active control system operate the ion source and optimize its performance, the active control system analyzing mass spectrometric data and such data to derive control signal for the ion source
5. The droplets may be exposed to synchronized and pulsed electric fields of high strength to support ionization.

Ion Source with Controlled Liquid Injection

Aspects of the present invention relate to means which improve sensitivity of ion sources based on spraying liquids and their usefulness as quantitative tool when operably connected to a mass spectrometer or other device.

Aspects and embodiments of the presently described invention relate to apparatus and methods to make the droplet formation largely independent of the pressure and rate with which the liquid is supplied, the degree of dissociation of the sample molecules, the electric conductivity of the liquid, and the electric field at the capillary tip from which the droplets are released. More particularly, embodiments of the invention may include an ion source wherein the liquid containing sample molecules is dispensed from a capillary-like or needle-like hallow structure, or at least a small opening by means of a mechanism (an "Inkjet printer like mechanism") that enables electrically controlled formation and ejection of droplets of specific size and with specific initial velocity.

Embodiments of the inventive apparatus may include ejection heads for dispensing a liquid, which may include any one or more of the following elements and features:

1. a liquid reservoir to which the sample-containing liquid or liquid crystal is fed,
2. the liquid or liquid crystal leaving the reservoir through a small nozzle-like or tube-like opening with a typical diameter smaller than a typical dimension of said reservoir,
3. the liquid and/or gas pressure in the reservoir being controlled by a electrically driven means (such as piezoelectric, electrostatic, electromagnetic, electro-optically) such that single droplets or a plurality of droplets of predominantly of a specific size is formed and ejected with a specific velocity at times determined by the driving electric signal,
4. having a plurality of ejection heads to increase throughput,
5. having a plurality of ejection heads to enable different droplet size, the heads being fed from one or more reservoirs,
6. having an active control system analyze obtained mass spectra and to choose optimal droplet size, initial velocity and/or timing (frequency),
7. having the control/timing of the droplet ejection synchronized with electric fields created by electrodes or electro-pneumatic elements inside the ion source to optimize droplet guidance, nebulization, ionization and ion guidance,
8. the ejection head(s) being simultaneously an electrode(s) and/or electro-pneumatic element(s),
9. having the ejection head(s) controllably generate a single droplet or multiple droplets to be used for executing mass analysis,
10. the ejection head(s) being part of a micro-fluidic chip being inserted in the ion source
11. mixing droplets in flight,
12. axial or radial droplet injection, and
13. injection of droplets in region of very high electric field strength sufficient to cause ion extraction.

The mass spectrometer and operational context for the embodiments of the ejection heads may include an instrument that utilizes electro-pneumatic superposition, charge injections, as well as radiation supported charge-injection. The mass spectrometer may further make use of an active computer controlled feedback system that analyzes mass spectra data or data from sensors that report from the vicinity of the ion source to optimize the ion source operation. The ion source, itself, may be either a separable device attached to an ion analytical instrument or an integral part of an ion analytical instrument. The ion analytical instrument may be any of various types, including (a) any of various mass spectrometer types, including linear TOF, refectron TOF, quadrupole, ion trap, (b) a Fourier transformed ion cyclotron resonance mass spectrometer, or Orbitrap, or (c) A MS-MS (for example, triple-quad TOF, TOF-TOF, trap-TOF, etc.), or any other tandem mass spectrometer or MSn instrument or combination thereof.

BRIEF DESCRIPTION OF THE DRAWINGS

This section of the document addresses the subject of an "ion source with controlled superposition of electrostatic and gas flow fields", and describes features and embodiments illustrated in FIGS. 1-14 within the following list of figures.

FIGS. 12A and 12B show MALDI experiments performed at different operational pressures during use of an embodiment of an ion source device according to the present invention.

FIGS. 14A and 14B show MALDI experiments using a conventional MALDI ion source and an embodiment of an ion source device according to the present invention.

FIG. 18A-18J are representative graphs that depict, in principle, the prophetic relationship between the applied AC potential and the mass distribution of the ion current in an ion transmission device of an embodiment of the present invention, and further depict an exemplary coordination of an ion source and an ion transmission device in an embodiment of the present invention.

FIG. 42B also shows an embodiment wherein only one domain is supplied with gas, and other domains are evacuated, and the gas flow is predominantly in the same direction as the droplet and sample ion motion

FIGS. 47A-D show schematic representations of different configurations for the capillaries, reservoirs and pressure actuators.

DETAILED DESCRIPTION

Aspects of the present invention provide methods, apparatus, systems, processes and other inventions relating to: ion sources with controlled electro-pneumatic superposition, ion source synchronized to RF multipole, ion source with charge injection, optimized control in active feedback system, radiation supported charge-injection liquid spray, ion source with controlled liquid injection as well as various embodiments and combinations of respective elements of some and/or each of the foregoing in additional embodiments.

Ion Sources with Controlled Electro-pneumatic Superposition

Aspects of apparatus and methods of certain embodiments of the present invention rely upon the controlled superposition of gas flow fields and electrostatic fields within an ion source to effect rapid collisional cooling with improved collection, collimation, and output of ions. The high efficiency injection of unfragmented ions into ion analytical instruments to which the source may be operably coupled can significantly increase the sensitivity of the instrument.

In a first aspect, certain embodiments of the invention provide an ion source device.

According to aspects of some embodiments of the present invention, in a first region of an ion source, radially-inward axisymmetric gas flow creates ion-guiding gas flow (pneumatic) fields that predominate in their effects on ion motion over electrostatic fields during operation of the device. This collision-dominated first region effects rapid collisional cooling as well as ion capture and trajectory collimation. In the second region of the source, ion-guiding electrostatic fields predominate in their effects on ion motion over gas flow fields created by radially-outward axisymmetric gas flow during use. In this electrostatically-dominated second region, ions are separated from the gas and electrostatically guided toward subsequent ion analytical instruments; the electrostatic fields are such that negligible collisional heating occurs.

Figure 1A:
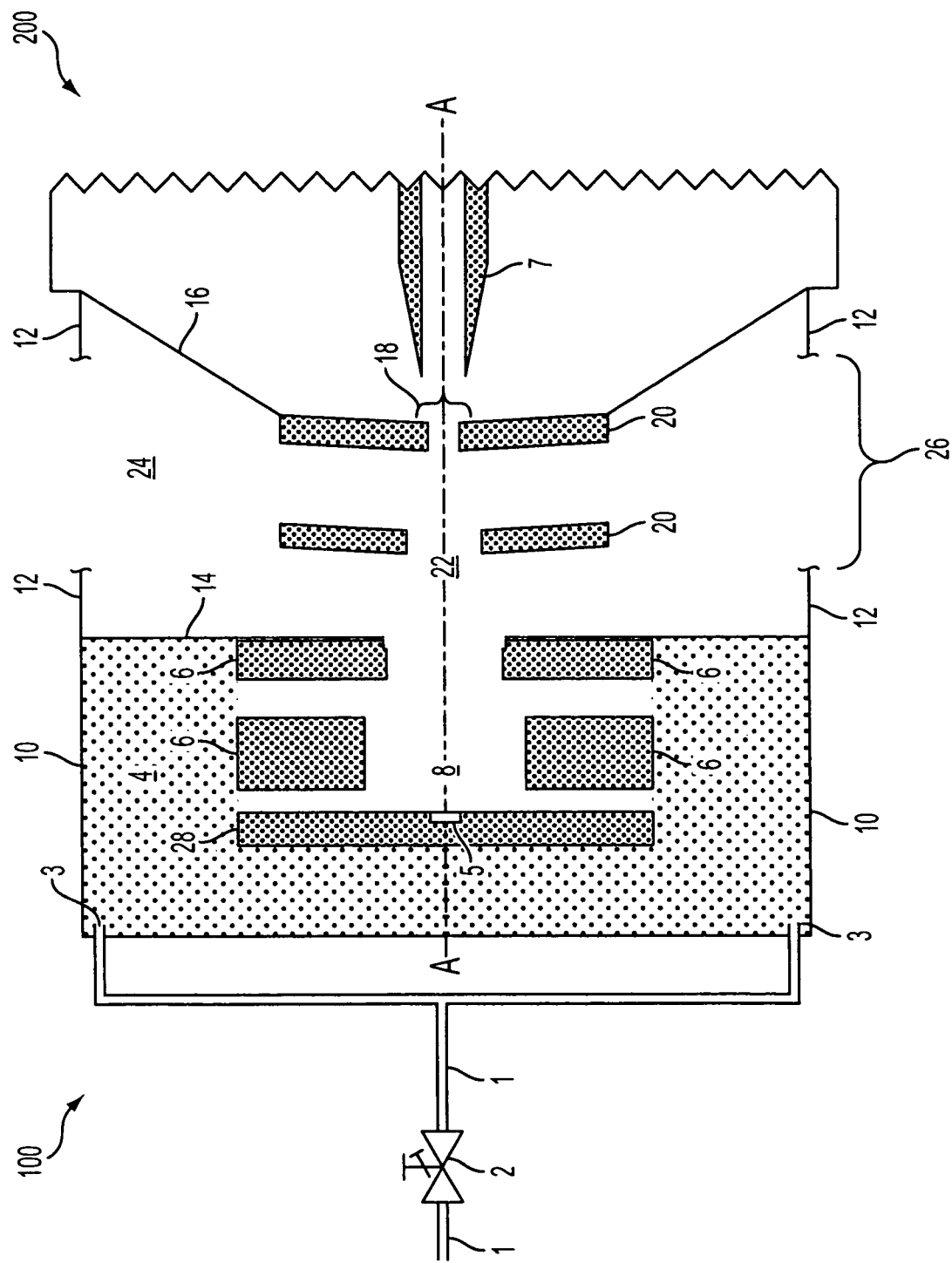
FIG. 1A is a schematic axial cross-section of an embodiment of an ion source device according to the present invention, operably engaged to the initial portion of a multipole-containing ion analytical instrument.

FIG. 1A is a schematic cross-section of an embodiment of an ion source device according to aspects of the present invention. The cross-section is taken along device axis A-A, defined by ion introduction or generation means 5 on the proximal end and ion outlet 18 on the distal end of ion source 100. In FIG. 1A, ion source 100 is shown operably engaged at its distal end to the proximal end of analytical instrument 200, shown in partial cross-section, and axis A-A is shown extending into first multipole 7 of analytical instrument 200.

Ion source 100 may comprise first housing 10 and second housing 12. First housing 10 is sealingly engaged to second housing 12 through interface partition 14, which partition provides, however, for axial communication of gas and ions between first and second housings, as further described below. First housing 10 and second housing 12 can be separately constructed and subsequently fused, with either or both contributing to interface partition 14, or can be of integral construction.

First housing 10 may comprise at least one pneumatic element 6 that segregates the space within first housing 10 into gas reservoir 4 and ion expansion chamber 8. In typical embodiments, first housing 10 may comprise a plurality of pneumatic elements 6, the plurality of pneumatic elements segregating the space within the first housing into gas reservoir 4 and ion expansion chamber 8.

The one or more pneumatic elements 6 are so shaped and so disposed within housing 10 as to cause gas reservoir 4 to be in axisymmetric gas communication with ion expansion chamber 8.

First housing 10 further may comprise at least one, typically a plurality of, gas inlets 3 that communicate gas reservoir 4 with the exterior of first housing 10. Gas inlets 3 are preferably positioned symmetrically in housing 10; in embodiments in which housing 10 is cylindrical, gas inlets 3 can usefully be axisymmetrically arranged in housing 10. Symmetrical disposition of gas inlets 3 provides maximum isotropy of gas pressure in gas reservoir 4.

Gas inlets 3 are typically also designed to minimize turbulence at the point of gas entry into gas reservoir 4: in some embodiments, for example, gas inlets 3 are baffled.

Gas present in gas reservoir 4 during use of the ion source is schematized by stippling in FIG. 1A.

Second housing 12 may comprise at least one pneumatic element 20 that segregates the space within the second housing into axial trajectory region 22 and gas sink region 24. In typical embodiments, second housing 12 may comprise a plurality of pneumatic elements 20, the plurality of pneumatic elements segregating the space within the first housing into axial trajectory region 22 and gas sink region 24. The one or more pneumatic elements 20 are so shaped and so disposed within second housing 12 as to cause axial trajectory region 22 to be in axisymmetric gas communication with gas sink region 24.

Second housing 12 further may comprise at least one, typically a plurality of, gas outlets 26 that communicate gas sink region 24 with the exterior of second housing 12. Gas outlets 26 are preferably positioned symmetrically in second housing 12; in embodiments in which housing 12 is cylindrical, gas outlets 26 can usefully be axisymmetrically arranged in housing 12. Symmetrical disposition of gas outlets 26 provides maximum symmetry in radially outward gas flow fields during use.

In various embodiments (not shown in FIG. 1A), the second housing may further comprise additional gas flow guiding means (pneumatic elements) which help maintain axisymmetrically outwardly directed gas flow out of the gas sink region, although at some point during the spatial transition from the gas sink region to the exterior of the second housing, spatial symmetry may be broken.

With continued reference to FIG. 1A, expansion chamber 8 is axially aligned with and in gas and ion communication with axial trajectory region 22. Axial trajectory region 22 is in axial alignment with and in ion communication (and optionally also in gas communication) with ion outlet 18 of device 100. In the embodiment shown in FIG. 1A, axial trajectory region 22 and ion outlet 18 are in axial alignment with multipole 7 of ion analytical instrument 200, with partition 16 and distal-most pneumatic elements 20 forming a sealing engagement with ion analytical instrument 200.

In order to establish electrostatic fields capable of acting upon ions introduced into expansion chamber 8, housing 10 optionally, but typically, may comprise at least one electrically conductive element.

In the embodiment shown in FIG. 1A, for example, element 28 can be an electrically conductive element.

Typically, at least a portion of at least one of the pneumatic elements 6 in housing 10 is electrically conductive; the electropneumatic element contributes to both gas flow (i.e., pneumatic) fields and electrostatic fields during use. In the schematized embodiment shown in FIG. 1A, electrically conductive element 28 can also be such an electropneumatic element 6.

In various embodiments, at least a portion of a plurality of pneumatic elements 6 in housing 10 is electrically conductive, the plurality of electropneumatic elements contributing to both pneumatic fields and electrostatic fields during use. In the schematized embodiment shown in FIG. 1A, electrically conductive element 28 can be one of the plurality of such electropneumatic elements 6.

In certain embodiments, all of a plurality of pneumatic elements 6 in housing 10 are electrically conductive, the plurality of electropneumatic elements contributing to both pneumatic fields and electrostatic fields during use. In the schematized embodiment shown in FIG. 1A, electrically conductive element 28 can be one of the plurality of such electropneumatic elements 6.

Analogously, in order to establish electric, typically electrostatic, fields capable of acting upon ions introduced into axial trajectory region 22, and optionally capable of acting upon ions within expansion chamber 8, housing 12 further may comprise at least one electrically conductive element.

Typically, at least a portion of at least one of pneumatic elements 20 in housing 12 is electrically conductive; the electropneumatic element contributes to both gas flow (i.e., pneumatic) fields and electrostatic fields during use.

In various embodiments, at least a portion of a plurality of pneumatic elements 20 in housing 12 is electrically conductive, the plurality of electropneumatic elements contributing to both pneumatic fields and electrostatic fields during use.

In certain embodiments, all of a plurality of pneumatic elements 20 in housing 12 is electrically conductive, the plurality of electropneumatic elements contributing to both pneumatic fields and electrostatic fields during use.

In certain embodiments, the potentials applied to the electrically conductive elements of ion source 100 can usefully be ramped coordinately with AC potential stepping of an RF multipole of an ion analytical instrument to which the source is operably coupled, as further described and claimed in the commonly owned patent application entitled "Methods And Apparatus For Controlling Ion Current In An Ion Transmission Device", the disclosure of which is incorporated herein by reference in its entirety.

Figure 1B:
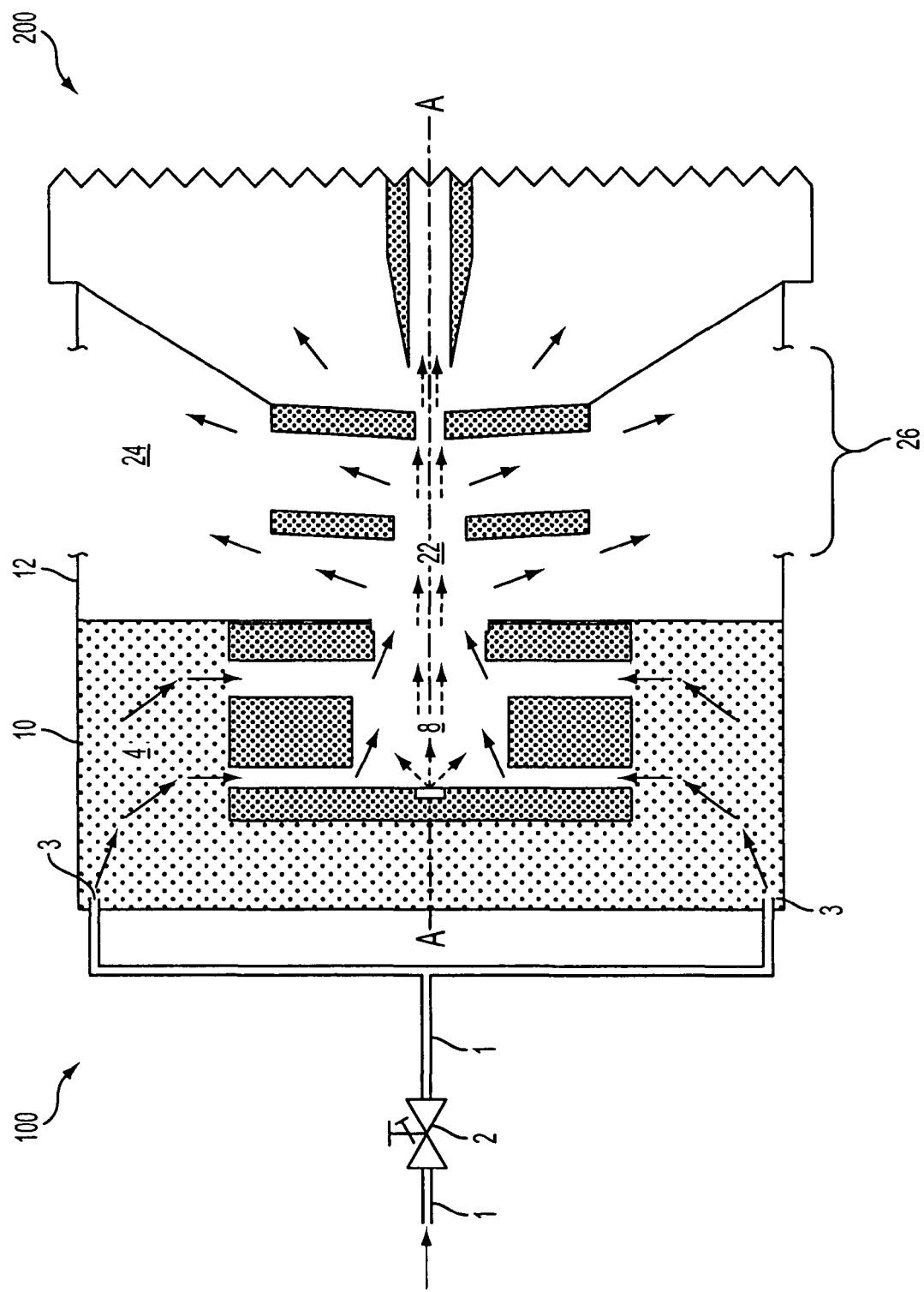
FIG. 1B schematizes exemplary gas flow and ion trajectories during operation of the ion source device of FIG. 1A, with exemplary gas flows shown in solid arrows and exemplary ion trajectories shown in dashed arrows.

FIG. 1B. schematizes exemplary gas flow and ion trajectories during operation of the ion source device of FIG. 1A, with exemplary gas flows shown in solid arrows and exemplary ion trajectories shown in dashed arrows.

Gas, from either a dedicated reservoir (not shown) or directly or indirectly from atmosphere, is routed through gas line 1 to gas inlets 3 of first housing 10 by maintaining gas sink region 24 within second housing 12 at lower pressure than gas reservoir 4, as for example by outward pumping at gas outlet 26 of second housing 12.

The gas can usefully be selected, for example, from the group consisting of atmospheric gas, conditioned atmospheric gas, nitrogen, and noble gases, such as argon. Conditioning of atmospheric gas can include, e.g., removal of moisture using a moisture trap and/or removal of particulates using one or more filters of various porosity.

Usefully, gas line 1 includes one or more flow adjustment means 2, such as one or more throttling valves, disposed between the gas source and gas inlets 3 of housing 10, permitting the resistance to inward gas flow to be adjusted.

Optionally, flow adjustment means 2 may be actively controlled by an electronic feedback system which measures the gas pressure in gas reservoir 4 at one or more points and adjusts the gas flow through line 1 such that the pressure in reservoir 4 is maintained with high accuracy at a constant value, even if operating conditions and or pumping power might fluctuate.

Gas reservoir 4 is maintained at a pressure that is typically subatmospheric, but greater than that in gas sink region 24. As a result, gas flows radially inward between pneumatic (optionally, electropneumatic) elements 6 into expansion chamber 8.

For the most part, the gas pressure inside gas reservoir 4 is spatially constant. On average only negligible gas flow speeds occur inside the gas reservoir as compared to gas flow speeds in the expansion chamber, as shown in the gas flow velocity magnitude contour plot of FIG. 5, further described herein below. In some embodiments, the gas inlets comprise means to baffle inward streaming gas flow to facilitate the achievement of such pressure and flow characteristics.

Figure 4A:
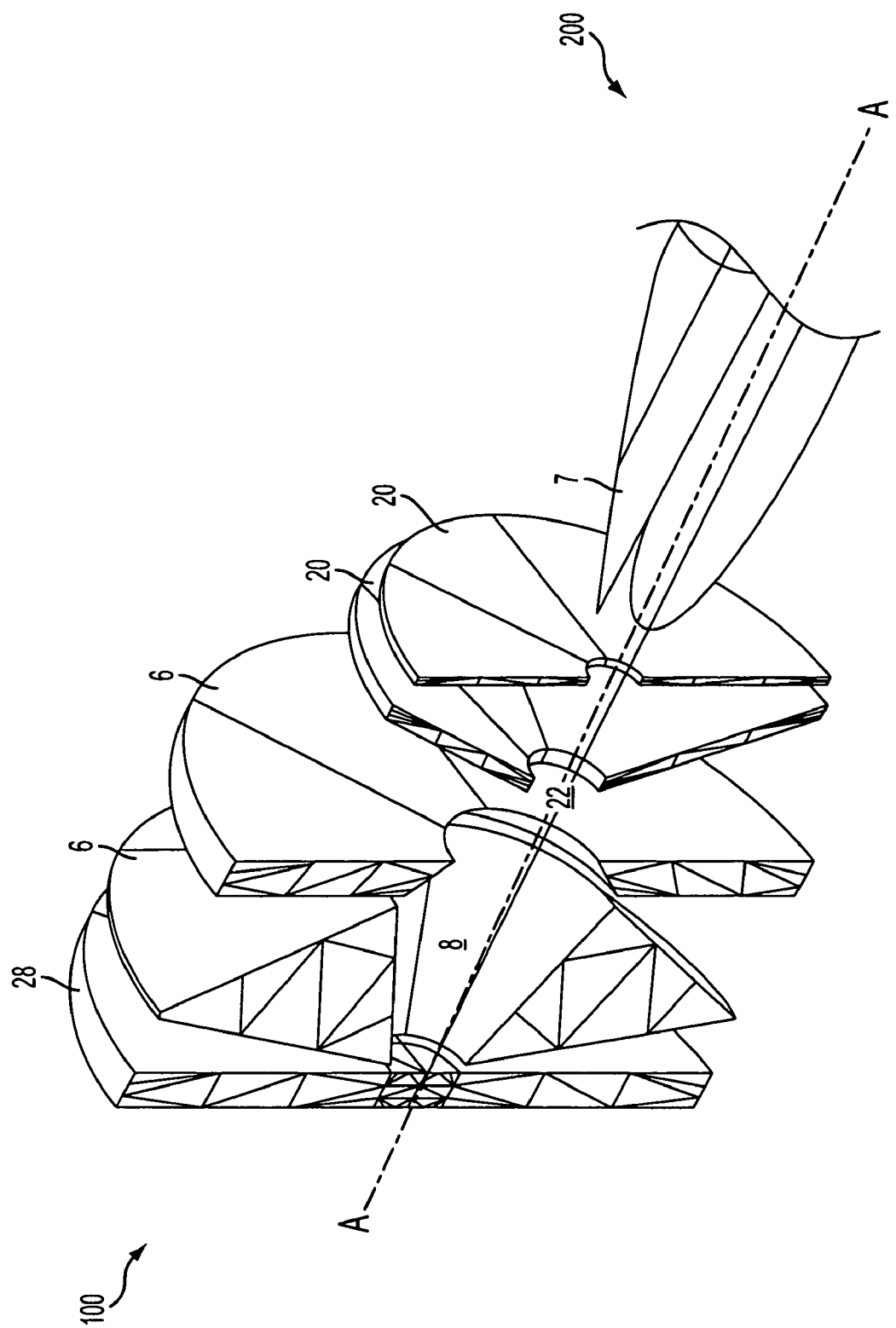
FIG. 4A is a perspective view of an axial cross-section of an embodiment of an ion source device according to aspects of the present invention, showing the pneumatic (optionally, electropneumatic) elements in operable alignment but without enclosing housings, and further showing the pneumatic (optionally, electropneumatic) elements in operable alignment with a multipole of an ion analytical instrument.
Figure 4B:
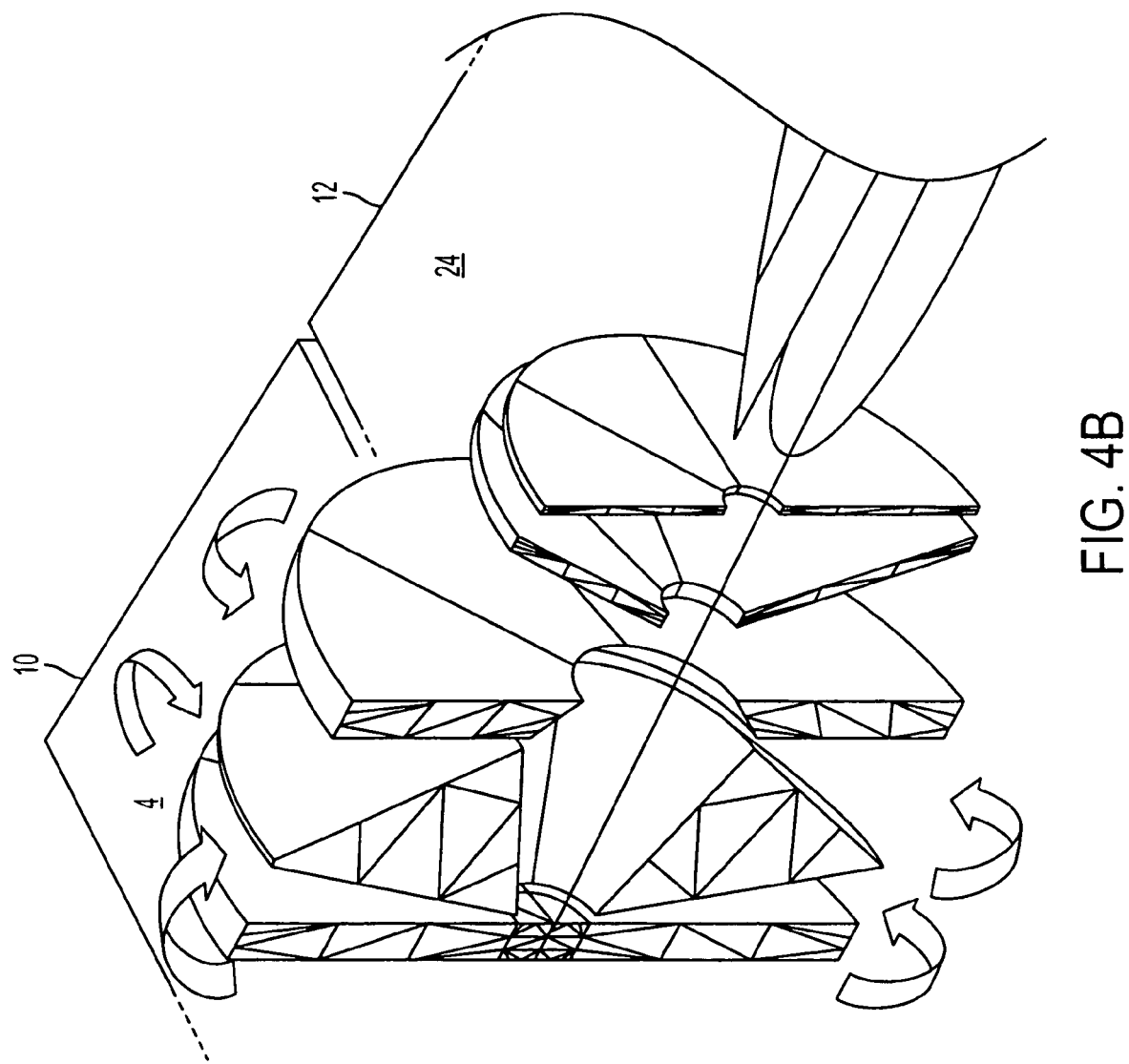
FIG. 4B is a perspective view of an axial cross-section of the pneumatic (optionally, electropneumatic) elements of FIG. 4A, with a portion of the first housing schematized and with stippled arrows schematizing the radially inward axisymmetric gas flow from the gas flow reservoir toward the expansion chamber that occurs within the first housing during use. In this embodiment, the points of maximal constriction to radially inward axisymmetric gas flow are located at the points most proximal to the expansion chamber.

The radially inward axisymmetric flow of gas from gas reservoir 4 into expansion chamber 8 is further illustrated in FIG. 4B, which presents a perspective view of an axial cross-section of device 100 with a portion of first housing 10 and second housing 12 schematized; stippled arrows schematize the radially inward axisymmetric gas flow from the gas flow reservoir toward the expansion chamber within first housing 10.

With reference to FIG. 1B, ion trajectories in expansion chamber 8, exemplified by dashed arrows, are shaped principally by the above-described gas flow fields, which predominate in their effects on ion motion over any electrostatic fields that may also be extant in housing 10 during use.

Gas then flows from expansion chamber 8 into axial trajectory region 22, radially outward axisymmetrically through pneumatic (optionally, electropneumatic) elements 20, through gas sink region 24, and thence through at least one, typically through a plurality of, symmetrically disposed gas outlets 26.

In typical embodiments, the collective gas flow resistance of second housing gas outlets 26 is lower than the collective gas flow resistance of first housing gas inlets 3. In a typical embodiment, the difference in gas flow resistance is accomplished by using outlets having greater collective cross sectional area than the collective cross sectional area of the gas inlets.

In various embodiments, the gas flow through either or both of gas inlet(s) 3 and gas outlet(s) 26 are adjustable during device use.

Although not shown in FIGS. 1A and 1B, gas flow outlets 26 of second housing 12 may, in certain embodiments, be in gas flow communication with means, disposed outside housing 12, for adjusting outward gas flow. Such means include, for example, one or more variable or constant flow resistors, throttling valves, or controllable pumps disposed outside housing 12; the flow adjustment means can be used to set the minimum pressure inside gas sink region 24 and/or to influence the gas flow vector field within housing 12.

Figure 1C:
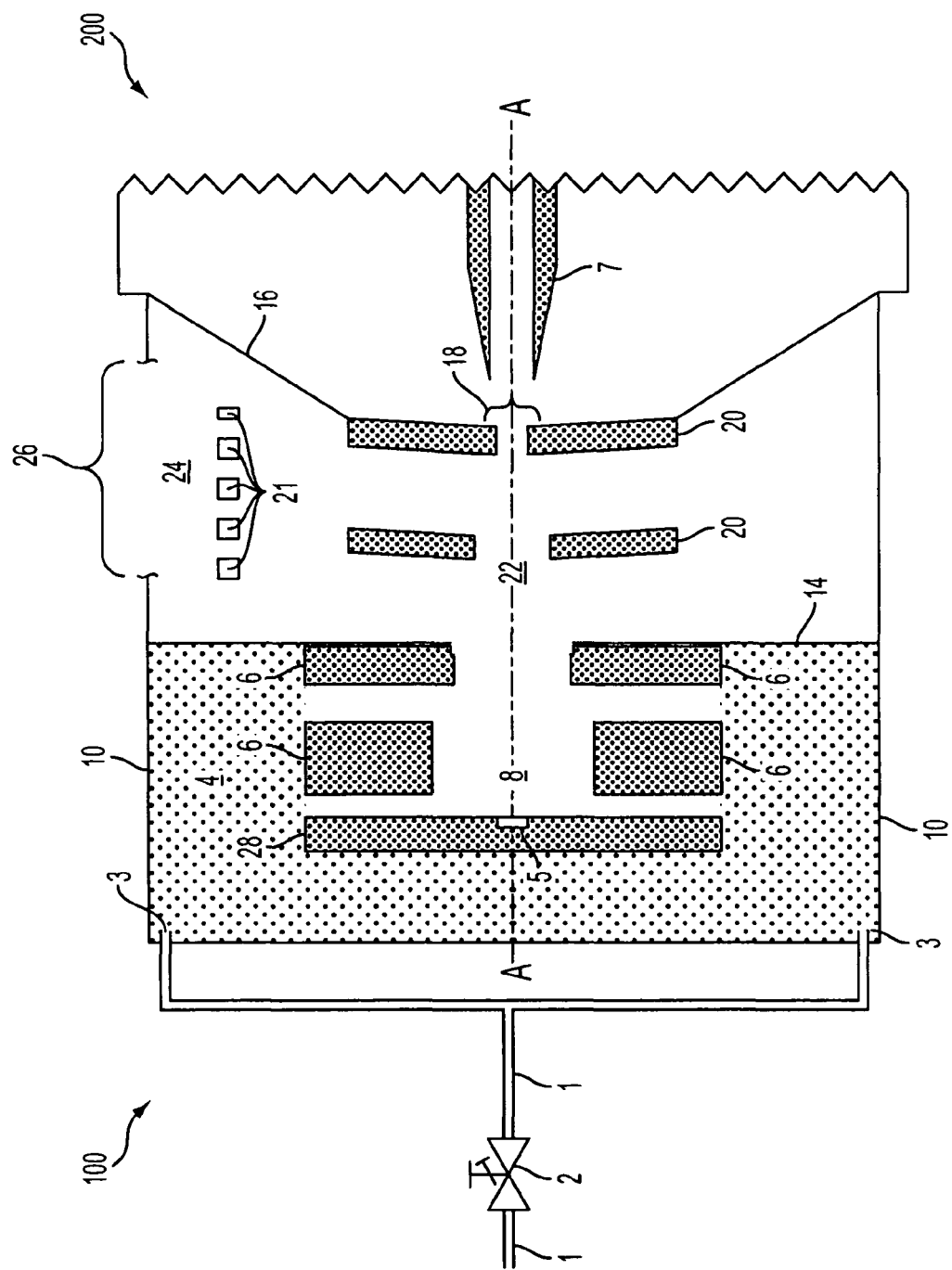
FIG. 1C is a schematic axial cross-section of another embodiment of an ion source device according to the present invention, operably engaged to the initial portion of a multipole-containing ion analytical instrument. In this embodiment, additional pneumatic elements compensate for the asymmetric outward gas flow through a single, asymmetrically disposed, gas outlet.

Furthermore, in various embodiments such as that schematized in FIG. 1C, second housing 12 may comprise additional pneumatic elements 21 that help maintain axisymmetrically outwardly directed gas flow out of gas sink region 24, notwithstanding a break in symmetry from the gas sink region to the exterior of the second housing. For example, in the embodiment of FIG. 1C, a single gas outlet 26 is disposed asymmetrically in second housing 12; notwithstanding the lack of symmetry in gas flow outwards through second housing 12, additional pneumatic elements 21 so baffle outward air flow as to maintain axisymmetric gas flow through most of gas sink region 24.

As exemplified in FIG. 1B, ion trajectories in axial trajectory region 22 are little affected by the radially outward axisymmetric gas flow fields in second housing 12. The radially outward axisymmetric gas flow vectors have little defocusing effect on the ion trajectories in this region because the spatially varying gas pressures are significantly lower than the pressure in expansion chamber 8, and because ion trajectories are dominated in axial trajectory region 22 by electrostatic forces.

Figure 2:
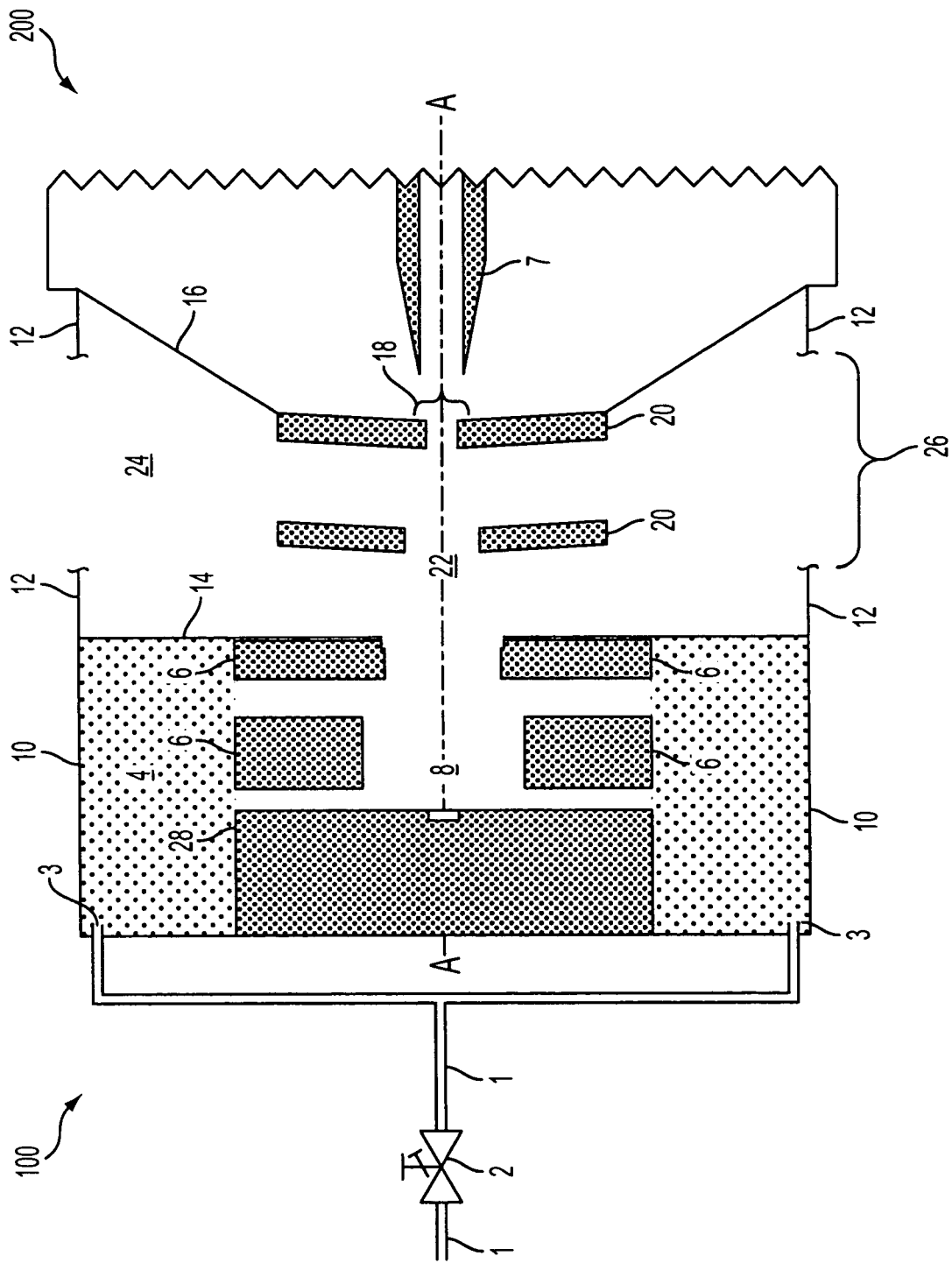
FIG. 2 is a schematic axial cross-section of another embodiment of an ion source device according to the present invention, operably engaged to the initial portion of a multipole-containing ion analytical instrument.

FIG. 2 is a schematic axial cross-section of another embodiment of an ion source device according to the present invention, operably engaged to the initial portion of a multipole-containing ion analytical instrument.

In the embodiment of FIG. 2, element 28 extends proximally into contiguity with housing 10. Gas inlets 3 are, as in the embodiment shown in FIGS. 1A and 1B, symmetrically disposed, maintaining maximum isotropy of gas pressure in gas reservoir 4. As in the embodiment of FIGS. 1A and 1B, pneumatic (optionally, electropneumatic) elements 6 are so shaped and so disposed as to effect radially inward, axisymmetric gas flow from gas reservoir 4 into expansion chamber 8 during use.

Figure 3:
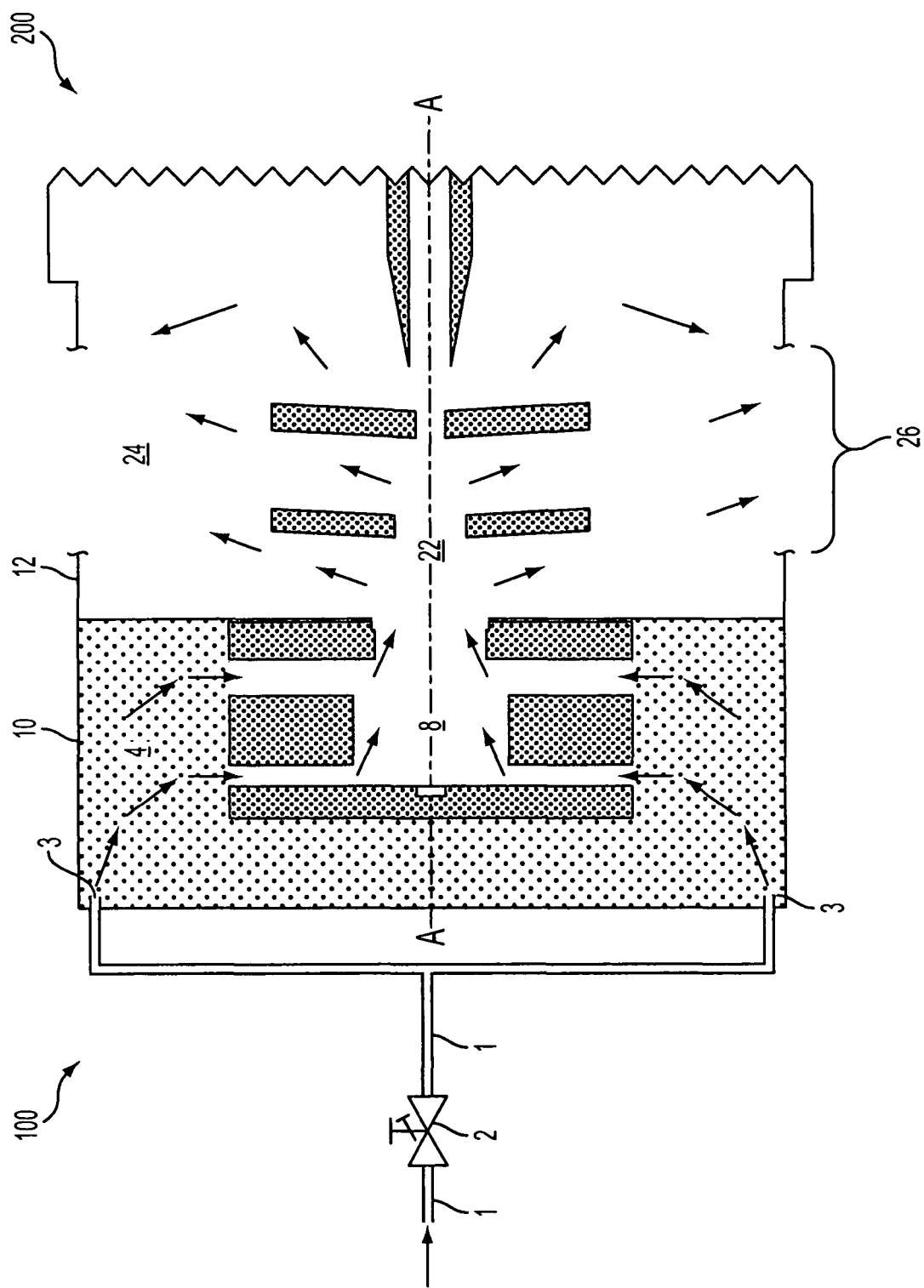
FIG. 3 is a schematic axial cross-section of another embodiment of an ion source device according to the present invention, operably integrated into the initial portion of a multipole-containing ion analytical instrument.

FIG. 3 is a schematic axial cross-section of a further embodiment of an ion source device according to the present invention. In this embodiment, the ion source is coupled to an ion analytical instrument in a geometry that permits gas additionally to be evacuated through gas outlets 26 from the ion analytical instrument's multipole region.

Figure 4C:
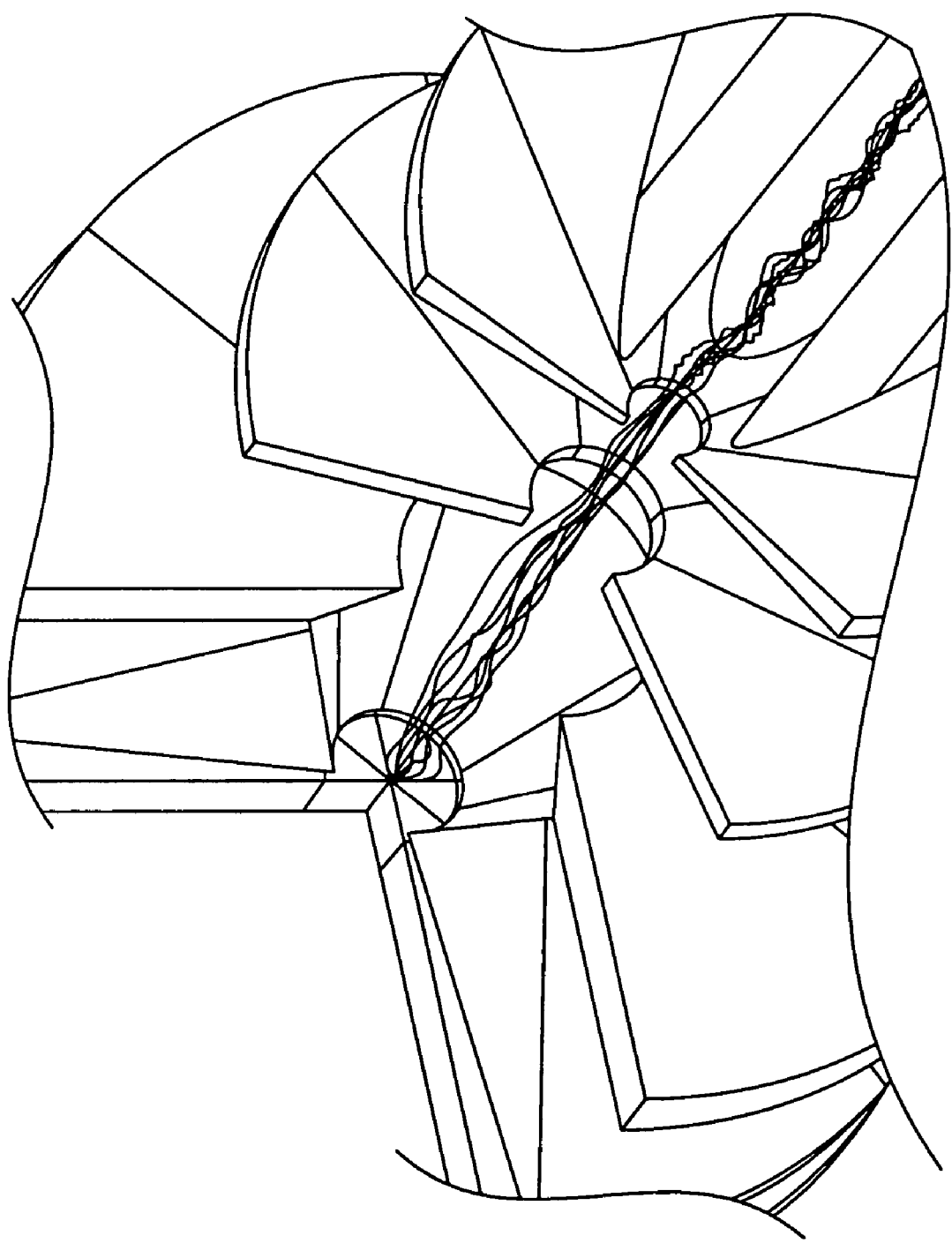
FIG. 4C is a perspective view of an axial cross-section of an embodiment of an ion source device according to aspects of the present invention, showing electropneumatic elements in operable alignment with one another and with a multipole of a subsequent ion analytical instrument, and further showing mathematically-modeled ion trajectories.

FIGS. 4A-4C are perspective views of an axial section through embodiments of an ion source according to the present invention. Element 28 (optionally electrically conductive, optionally an electropneumatic element), pneumatic (optionally, electropneumatic) elements 6, and pneumatic (optionally, electropneumatic) elements 20 of ion source device 100 are shown operationally aligned with multipole 7 of ion analytical instrument 200. In FIGS. 4A and 4C, housings 10 and 12 are omitted; in FIG. 4B, a portion of each of housings 10 and 12 is schematized.

As in FIGS. 1A and 1B, FIGS. 4A-4C show a single element 28, which can optionally be an electrically conductive element 28 or an electropneumatic element 6; two pneumatic (optionally, electropneumatic) elements 6; and two pneumatic (optionally, electropneumatic) elements 20. The number of electrically conductive and pneumatic elements is not critical to the invention, however, and there may be fewer or greater numbers of electrically conductive and pneumatic (optionally, electropneumatic) elements in various embodiments.

In the embodiments of FIGS. 4A-4C and FIGS. 5-9, the pneumatic elements (optionally, electropneumatic elements) 6 are so shaped and so disposed that the point of greatest constriction to radially inward axisymmetric gas flow—between element 28 and proximal pneumatic element 6, and also between the proximal and distal pneumatic elements 6—is in immediate proximity to ion expansion chamber 8. In some embodiments the point of greatest constriction is in a facilitating general proximity to the ion expansion chamber.

The flow resistance beyond these points of greatest constriction—i.e., within ion expansion chamber 8, axial trajectory region 22, gas sink region 24, and gas outlets 26—is much lower than the flow resistance at the points of closest constriction.

Figure 5:
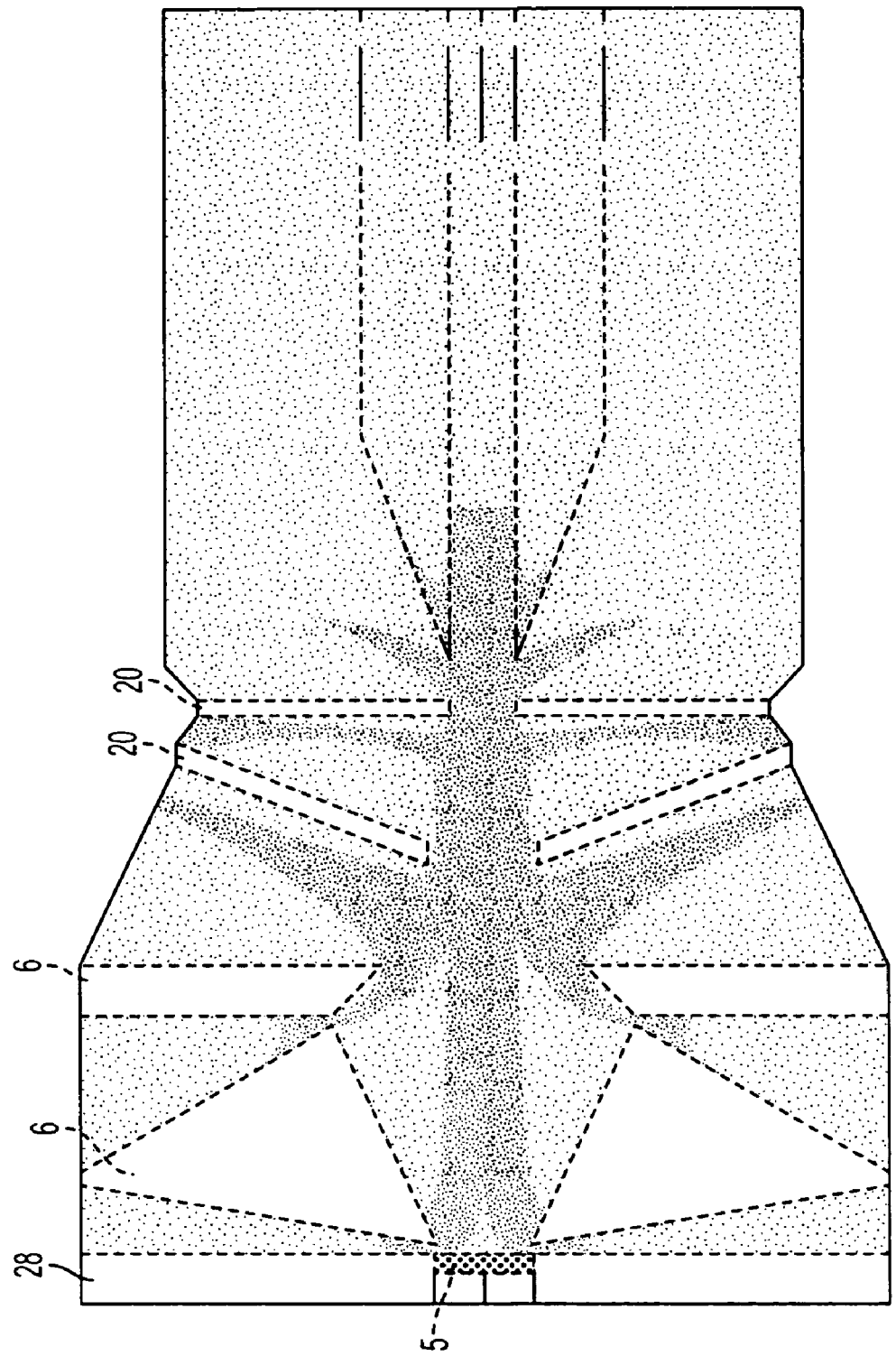
FIG. 5 shows a mathematically modeled contour plot of gas flow velocity magnitude during use of an embodiment of an ion source device according to the present invention.
Figure 6:
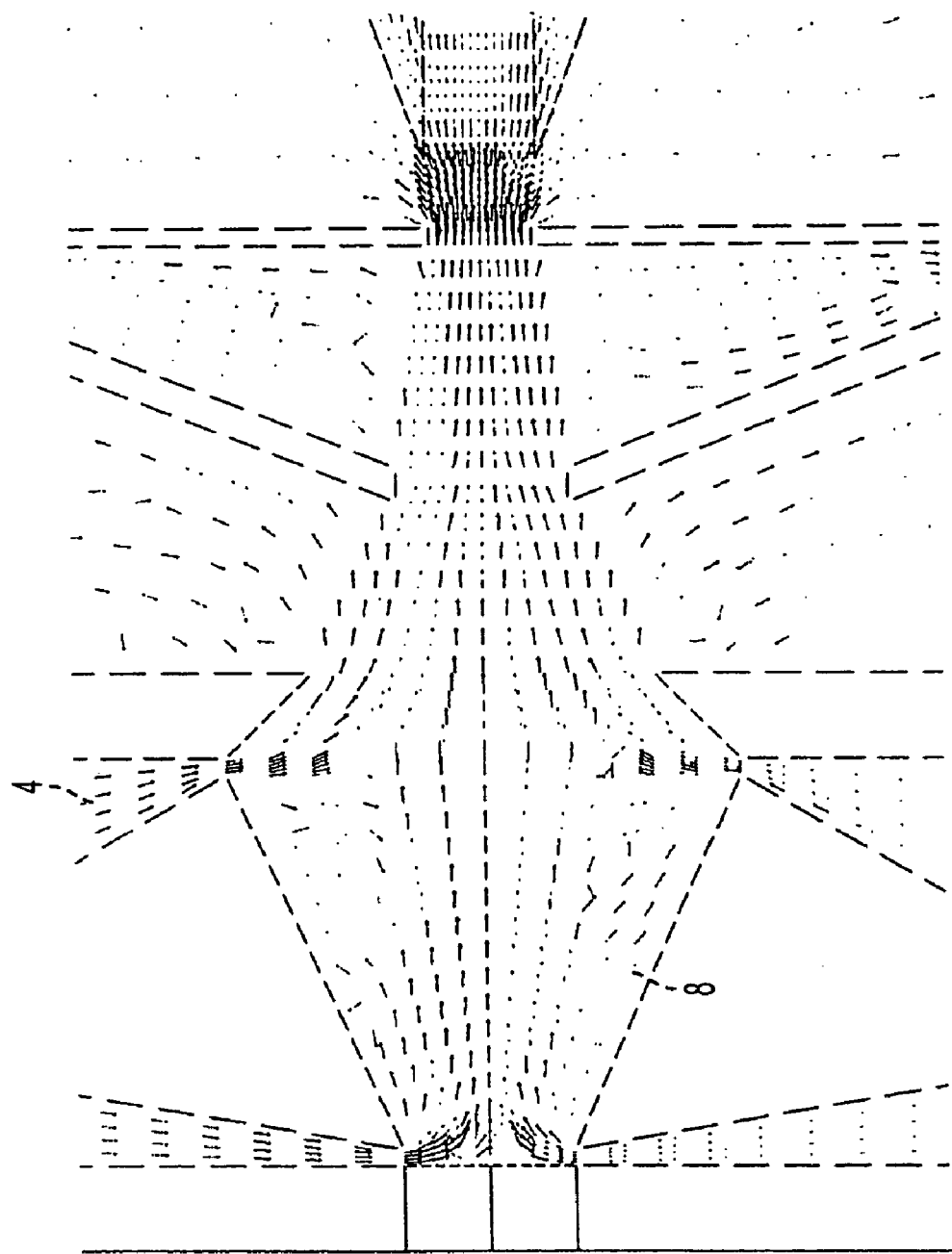
FIG. 6 shows a mathematically modeled vector plot of gas flow velocity during use of an embodiment of an ion source device according to the present invention.

As a result, high gas expansion velocities occur radially inward into expansion chamber 8, as further shown in the simulations shown in FIGS. 5 and 6. In some embodiments, the magnitude of the velocity vectors just after the point of greatest constriction may be generally from 100 to 300 m/sec although lower or higher magnitudes may also be used. In some other embodiments, the magnitude of the velocity vectors just after the point of greatest constriction may be from 250 to 300 m/sec. In these embodiments, this high speed gas flow impacts the ion plume.

The simulation depicted in FIGS. 5 and 6 (as well as in the others of FIGS. 4C-10) were performed using methods such as those described in the following references, incorporated herein by reference in their entireties: Andreas Hieke, "GEMIOS—a 64-Bit multi-physics Gas and Electromagnetic Ion Optical Simulator", Proceedings of the 51st Conference on Mass Spectrometry and Allied Topics (Jun. 8-12 2003, Montréal, PQ, Canada); Andreas Hieke "Theoretical and Implementational Aspects of an Advanced 3D Gas and Electromagnetic Ion Optical Simulator Interfacing with ANSYS Multiphysics", Proceedings of the International Congress on FEM Technology, pp. 1.6.13 (Nov. 12-14 2003, Potsdam, Germany); Andreas Hieke, "Development of an Advanced Simulation System for the Analysis of Particle Dynamics in LASER based Protein Ion Sources", Proceedings of the 2004 NSTI Nanotechnology Conference and Trade Show Nanotech 2004 (Mar. 7-11, 2004, Boston, Mass., U.S.A.).

FIG. 5 is an axial section of a mathematically modeled contour plot of gas flow velocity magnitudes during use of an embodiment of an ion source device according to the present invention that is similar to the embodiments schematized in FIGS. 4A-4C; darker regions indicate higher velocity gas flow. FIG. 6 is an axial section of a mathematically modeled vector plot of gas flow velocity during use of an embodiment of an ion source device similar to the embodiments schematized in FIGS. 4A-4C.

The pressure in gas reservoir 4 is chosen such that, for a given resistance to radially inward, axisymmetric gas flow, the pressure and velocity distribution in expansion chamber 8 pneumatically collects and cools effectively all of the ions ejected from the ion introduction or generation means, such as ions present in plume ejected from a laser desorption ionization probe.

Figure 7:
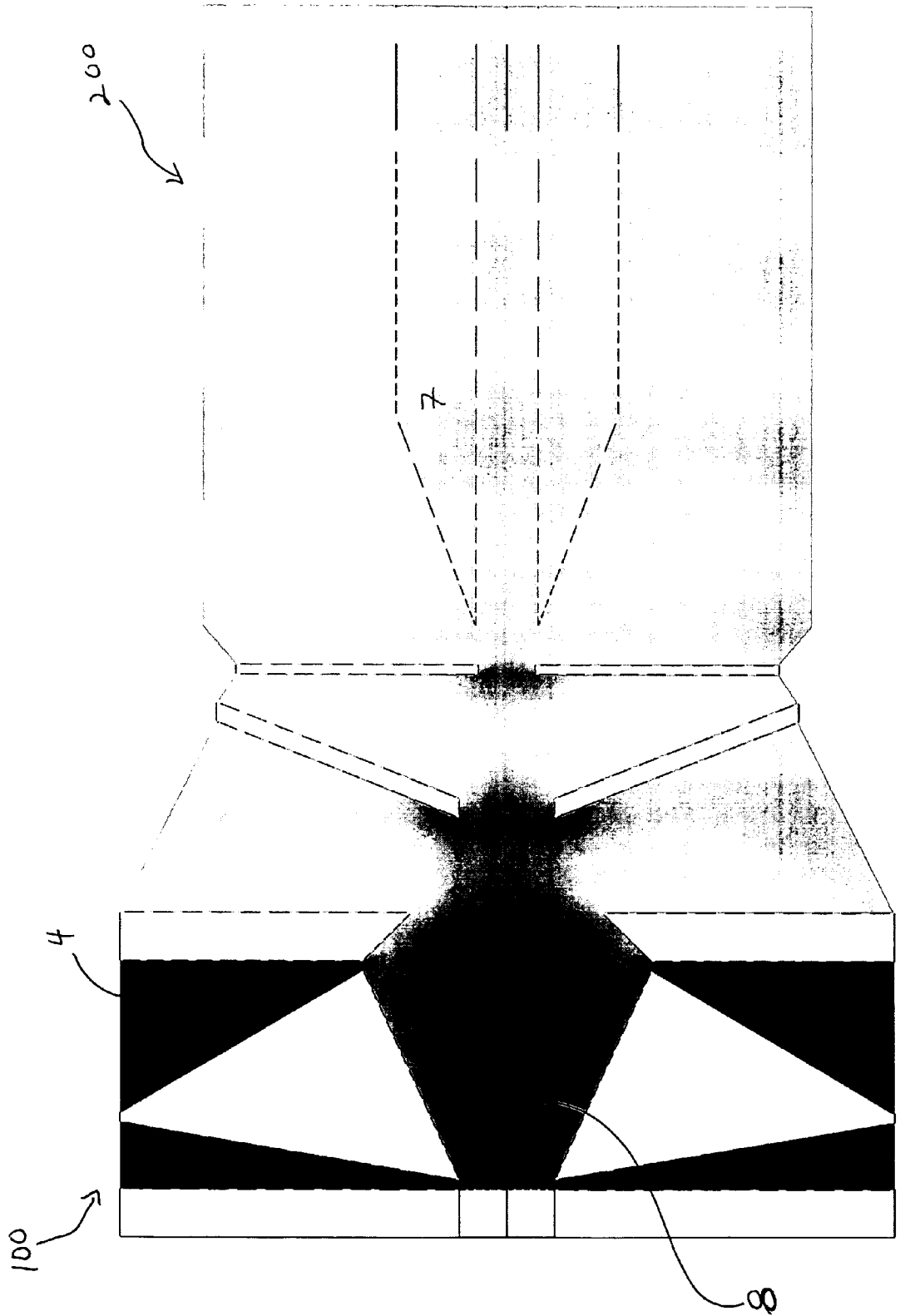
FIG. 7 shows a mathematically modeled contour plot of the distribution of gas pressure during use of an embodiment of an ion source device according to the present invention.

FIG. 7 shows a mathematically modeled contour plot of the distribution of gas pressures during use of an embodiment of an ion source device according to the present invention similar to the embodiments schematized in FIGS. 4A-4C; higher pressures are in darker shades. As can be seen, the pressure throughout gas reservoir 4 is essentially constant, with a dramatic drop in pressure occurring upon entry to expansion chamber 8. As can also be seen, pressures within ion source 100 are effectively decoupled from that in RF multipole 7 of ion analytical instrument 200. There is a variety of pressure differentials that can be utilized in various embodiments between gas reservoir 4 and the expansion chamber 8. In some embodiments the pressure in the gas reservoir 4 may be as little as only twice the dominant pressure in the expansion chamber 8 to which the ions are exposed. In other embodiments, the pressure in the gas reservoir 4 may be 5, 10, 20, or 50 or more times the dominant pressure in the expansion chamber 8. In one prototype embodiment the pressure in the gas reservoir 4 was about 10 times the dominant pressure in the expansion chamber 8. In that prototype embodiment the pressure in the gas reservoir was adjusted, with the embodiment operating successfully, to be from about 25 to 400 Pa and operated more successfully at between 100 and 300 Pa.

Figure 8:
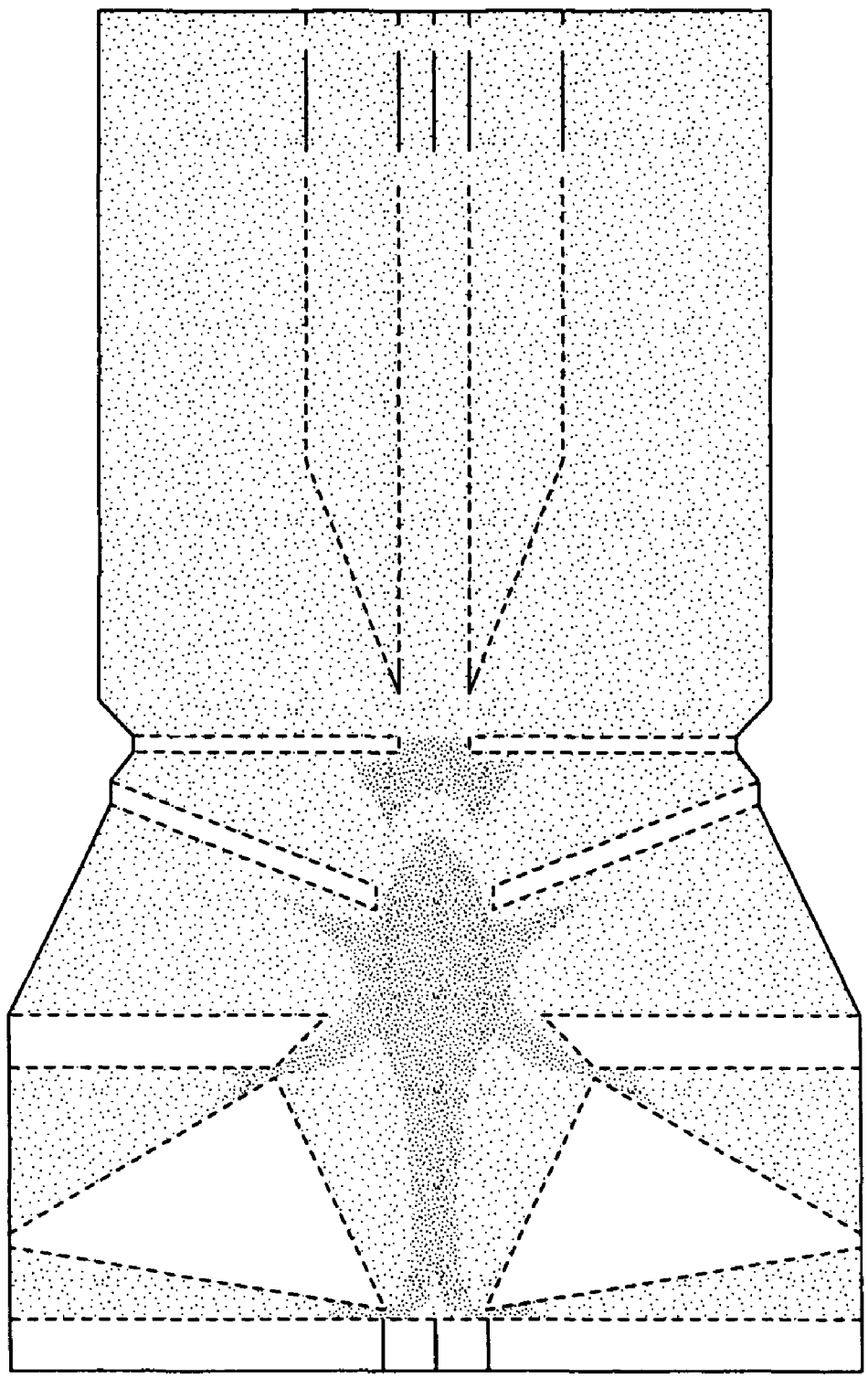
FIG. 8 shows a mathematically modeled contour plot of the mathematical product of the gas flow velocity magnitude and gas pressure, demonstrating predominance of collisional effects in the first housing during use of an embodiment of an ion source device according to the present invention.

FIG. 8 shows a contour plot of the mathematical product of the modeled gas flow velocity magnitude and gas pressures—providing a measure of collisional effects—in an embodiment of an ion source device according to the present invention similar to the embodiments shown in FIGS. 4A-4C. The contour plot demonstrates the predominance of collisional effects in the pneumatically dominant first phase of ion guidance, confirming that rapid collisional cooling is effected in ion source devices according to the present invention. A rapid cooling of the ions is accomplished. In some embodiments the ions are cooled to approximately the gas temperature in the order of $10^{-5}$ seconds or less from the point in time at which the ions are ejected from the sample by effect of the laser pulse. In other embodiments, the ions are cooled to approximately the gas temperature in less than $10^{-4}$ seconds from the point in time at which the ions are ejected from the sample by effect of the laser pulse. Additionally, in other embodiments the ions can be cooled in one microsecond or less. In certain embodiments, the gas temperature in the expansion region 8 is in a range of from 250 to 300 K, although higher and lower temperatures can be used. The often significant temperature drop of the gas passing through the constrictions results in highly cooled gas which supports the collisional cooling of the sample ions.

Figure 9:
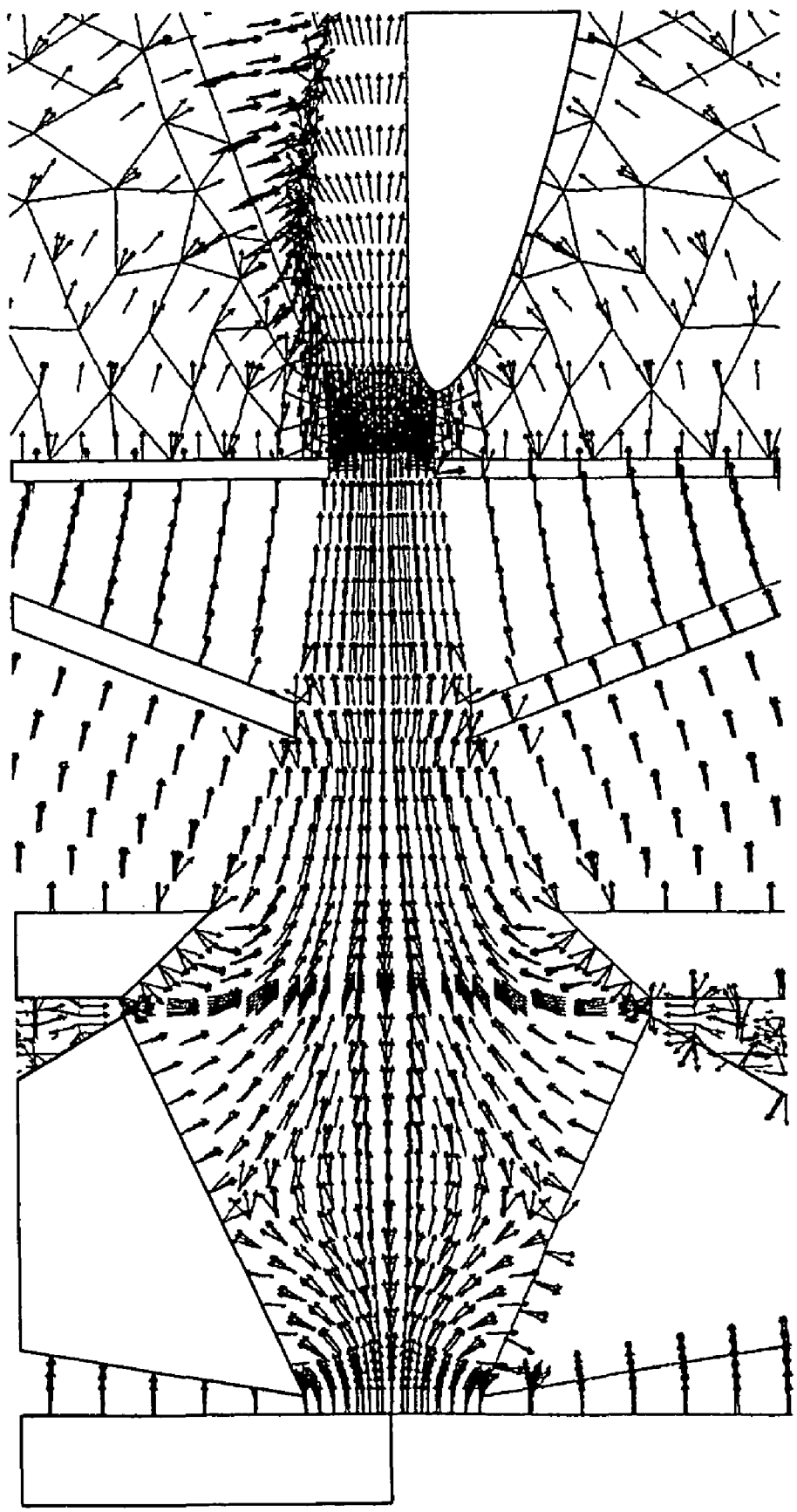
FIG. 9 shows a mathematically modeled vector plot of the electric field at one set of potentials during use of an embodiment of an ion source device according to the present invention.

FIG. 9 shows a mathematically-modeled vector plot of the electrostatic fields during operation of an embodiment of an ion source device of the present invention that is similar to the embodiments shown in FIGS. 4A-4C, at one set of electrical potentials.

Figure 10:
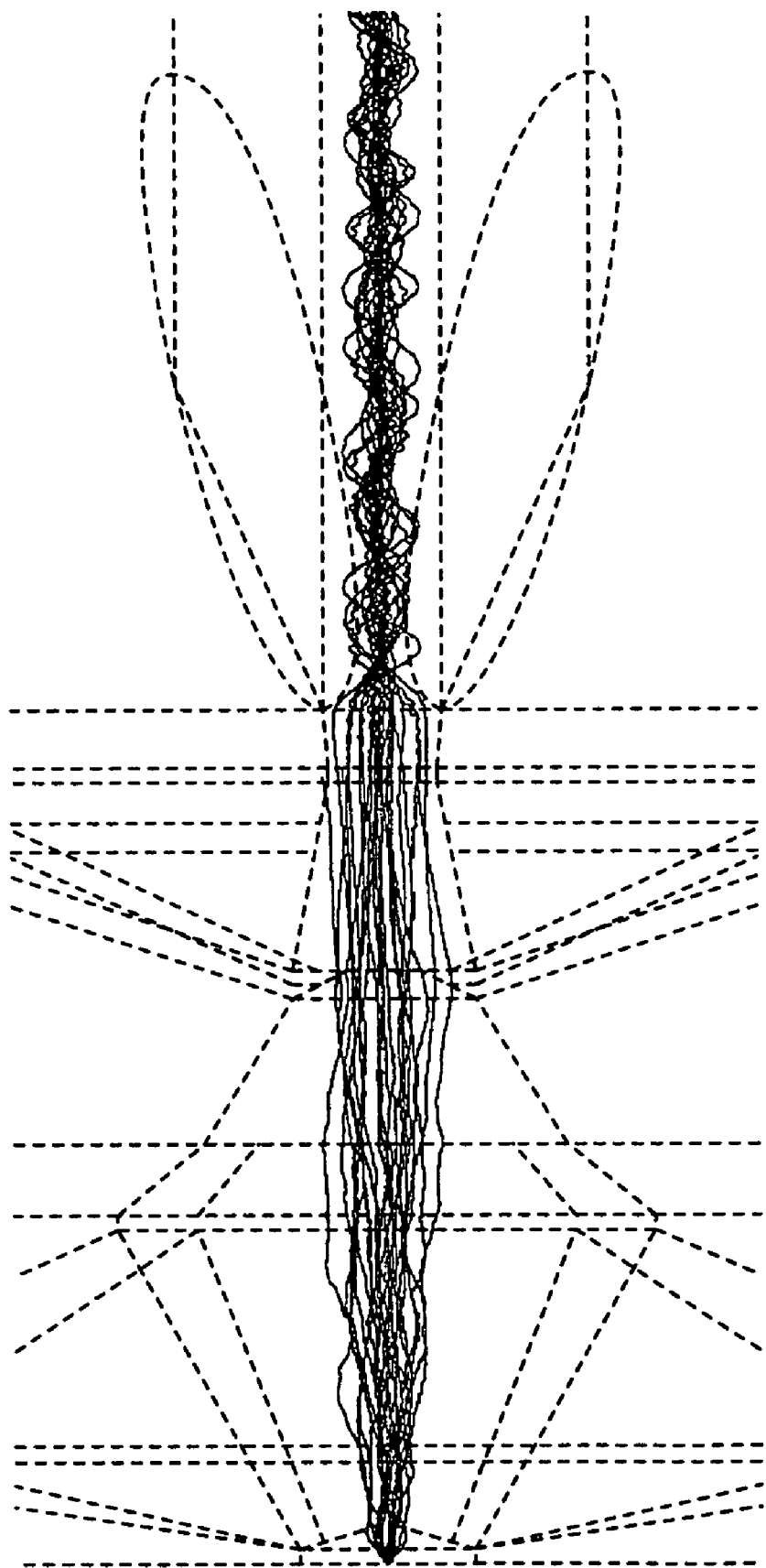
FIG. 10 shows mathematically modeled ion trajectories for one set of operating conditions during use of an embodiment of an ion source device according to the present invention.

FIG. 10 shows modeled ion trajectories for one set of operating conditions of an embodiment of an ion source device according to the present invention, the embodiment being similar to the embodiments shown in FIGS. 4A-4C, demonstrating electropneumatic capture and axial guidance of ions ejected from the ion introduction or generation means, including ions ejected in an off-axis direction. FIG. 4C shows modeled ion trajectories in perspective view.

As described herein, the extent of ion cooling that occurs in an ion source device of the present invention may be controlled by the gas pressure in the gas reservoir, the configuration of the pneumatic and/or electropneumatic elements in the device, etc. Accordingly, operating the device at an elevated pressures, such that the gas pressures and/or velocities in the ion expansion chamber are correspondingly increased, may result in more rapid collisional cooling of ions introduced in this chamber.

However, one effect that may result from this increased pressure is clustering between ions and matrix material in the device. Such clustering may be undesirable, as the apparent mass and/or charges of the ions may be affected, thereby resulting in problems in subsequent analysis of these ions.

To counter this clustering, the ions may be subjected to a moderate amount of collisional heating in a controlled fashion. This heating may be effected by increasing the ion velocities in either or both the first and the second housings, the heating resulting from increasing the collision rate between the ions and the gases therein.

The ion velocities may be increased by increasing the electric field magnitudes within either or both the first and the second housings in various embodiments of the present invention. For example, by applying appropriate potentials to one or more of the electrostatic and/or electropneumatic elements in the device, the ion velocities are increased, thereby resulting in a moderate amount of collision heating. The appropriate amount of collisional heating may be determined empirically, for example, by increasing the collision heating when the device is being operated at an elevated pressure until the extent of ion/matrix clustering has been reduced to an acceptable level.

As described above, the advantages of an ion source device of the present invention result from, inter alia, controlled superposition of the electrostatic fields and pneumatic fields within the device. The extent of superposition of these two fields is a result of factors such as the physical configuration of the device (e.g., the pneumatic, electrostatic, and electropneumatic elements) and the operating parameters of the device, such as the gas pressures and velocities, and the potentials applied to one or more of the conductive elements.

Referring to FIGS. 12A and 12B, experimental results using an ion source embodiment of the present invention is depicted. In these examples, the ion source is used to generate ions from about 10 fmol of a peptide (amino acid residues 661-681 of epithelial growth factor receptor) using a MALDI probe. For each experiment, the ion count for each detected ion was determined (I) and plotted as its ratio of the maximum ion count (Imax).

FIG. 12A depicts the results of the experiment when performed at a gas pressure of 25 Pa, whereas FIG. 12B depicts the results at a gas pressure of 200 Pa. At the higher pressure, the same ion device produced not only a higher overall ion transmission as indicated by the Imax, but also a lower amount of fragmentation of the expected ion peak. In contrast, the experiment at the lower pressure resulted in a lower ion transmission and a higher degree of ion fragmentation.

Therefore, although collisional cooling occurred in both examples, the superposition of the electrostatic and pneumatic gas fields in the experiment of FIG. 12B was more effective, thus resulting in both improved ion transmission and a lower degree of ion fragmentation.

Figure 13:
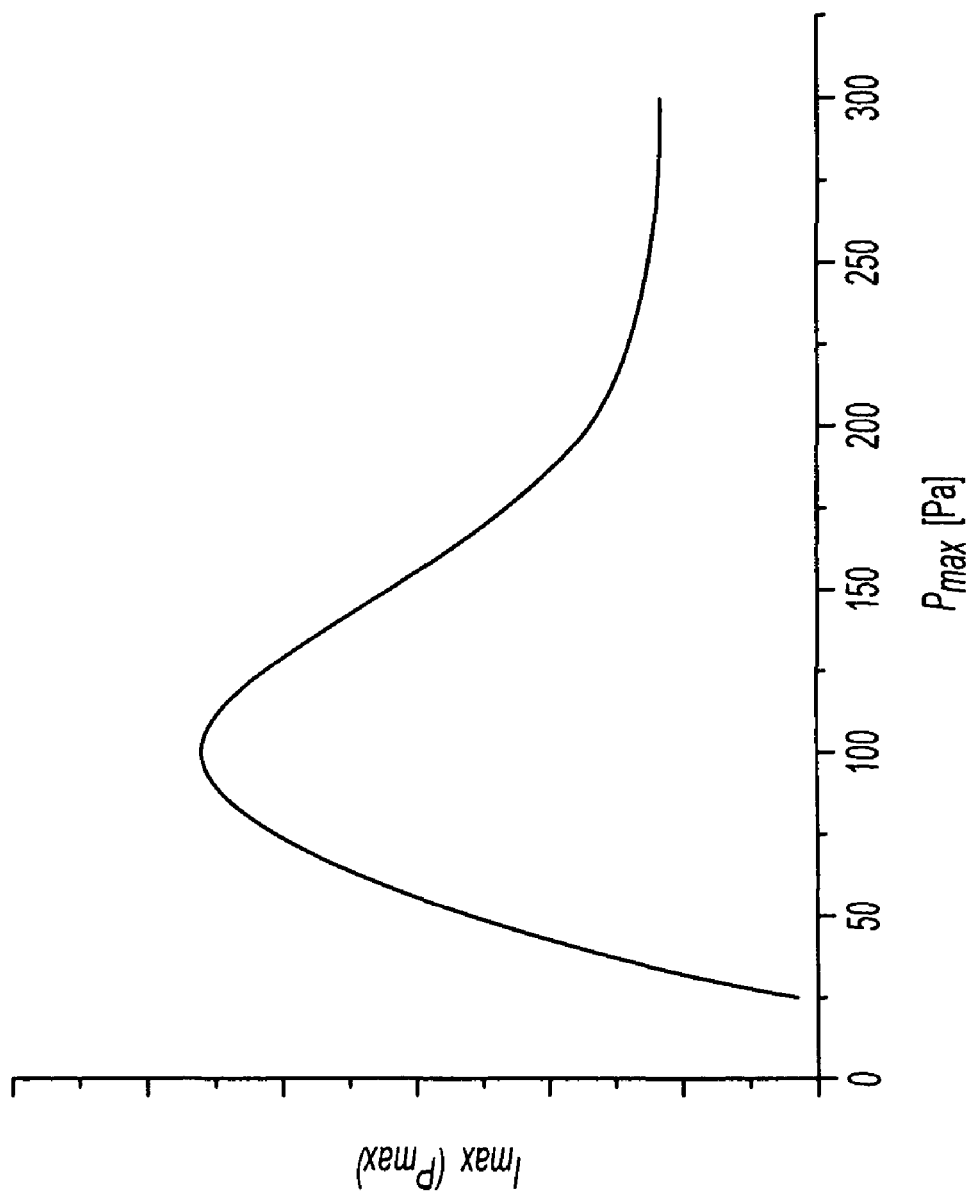
FIG. 13 shows mathematically modeled dependence between the maximal ion count and the operational pressure during use of an embodiment of an ion source device according to the present invention.

Referring to FIG. 13, the pressure dependence on superposition is shown. Here, a prophetic experiment in which the maximal ion count (Imax) is shown to be dependent on the operating pressure in a given embodiment of the present invention. Accordingly, it is desirable to determine the optimum operating pressure when using a given ion device. This optimum pressure may be determined either experimentally, empirically, theoretically, or some combination thereof.

Referring to FIGS. 14A and 14B, the importance of the superposition during use of an ion source of the present invention is further demonstrated. In these examples, each ion source is used to generate ions from about 10 fmol of a peptide (phosphorylated protein kinase C substrate having the amino acid sequence TSTEPQYQPGENL with an expected mass of 1423 Daltons) using a MALDI probe. For each experiment, the ion count for each detected ion was determined (I) and plotted as its ratio of the maximum ion count (Imax).

In FIG. 14A, the experiment is performed using a prior art MALDI ion source. As is evident from these results, extensive ion fragmentation due to insufficient cooling is apparent. The expected peak of about 1423 mass unit is not even visible as the predominant peak.

In contrast, FIG. 14B depicts the experiment performed using an ion source of the present invention having improved collisional cooling. Here, both the expected mass peak is clearly visible and relatively ion fragmentation has occurred compared to the prior art MALDI source.

As described above, each of the various embodiments of an ion source device according to the present invention may comprise ion introduction or generation means, first ion guidance means, and second ion guidance means.

The ion introduction or generation means can, for example, be laser desorption ionization means. In laser desorption ionization embodiments, ion introduction or generation means 5 can comprise laser desorption ionization probe engagement means, the engagement means being capable of positioning a laser desorption ionization probe so as to display at least one surface thereof to expansion chamber 8. Probe engagement means 5 can, in some embodiments, be in physical and electrical contiguity with an electrically conductive element 28, as suggested by the schematic shown in FIGS. 1-3: in use, electrically conductive element 28, probe engagement means 5, and the laser desorption ionization probe engaged therein can be commonly set to an electrical potential that contributes to an electrostatic field capable of acting upon ions introduced into expansion chamber 8 from the engaged probe.

Figure 11:
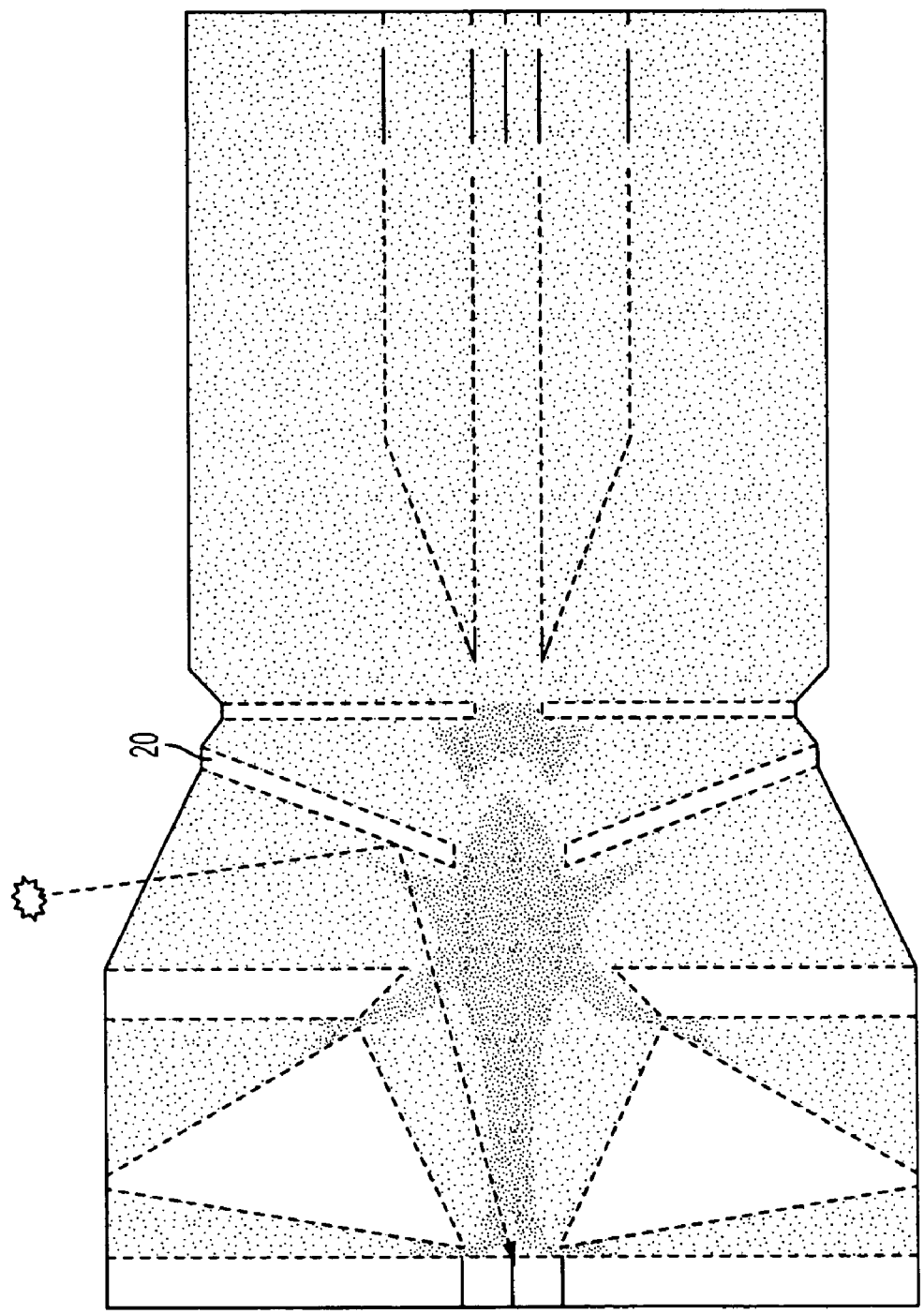
FIG. 11 shows an exemplary laser light path in an axial cross section of a laser desorption ionization embodiment of an ion source device according to the present invention.

In certain laser desorption ionization embodiments of the ion source device of the present invention, the laser is usefully directed to the surface of a laser desorption ionization probe by reflection from a mirrored surface of a pneumatic (optionally, electropneumatic) element 20, as schematized in FIG. 11. A steep incidence angle usefully directs the laser substantially along the device axis, perpendicular to the laser desorption ionization probe, creating highly symmetric initial ion velocities.

In such embodiments, video observation of the laser focal spot and origin of the ions can be achieved using a similar light path, including reflection from a mirrored surface of a pneumatic (optionally, electropneumatic) element 20. In some embodiments of the present invention, the device may include at least two mirrors, wherein the first mirror is used to reflect the incident desorption ionization laser to the probe surface. The second, separate mirror may then be used for video or other optical observation of the laser focal spot on the probe.

As described above, the first ion guidance means are configured to establish ion-guiding pneumatic fields, and optionally electrostatic fields, the ion-guiding pneumatic fields predominating in their effects on ion motion over electrostatic fields during use. The second ion guidance means are configured to establish ion-guiding electrostatic fields and pneumatic fields, the ion-guiding electrostatic fields predominating over pneumatic fields during use.

The pneumatic fields of the first ion guidance means and the second ion guidance means are generated, respectively, by radially inward axisymmetric gas flows and radially outward axisymmetric gas flows. In the embodiment schematically illustrated in FIG. 4B, the radially inward and radially outward axisymmetric gas flows are continuous around the device axis.

In other embodiments of an ion source device according to the present invention, however, the axisymmetric gas flows can be periodic, rather than continuous, with gas flowing through a plurality of channels disposed between element 28 and pneumatic (optionally electropneumatic) elements 6, between adjacent pneumatic (optionally electropneumatic) elements) 6, and between pneumatic elements 20, the plurality of channels arranged with radial symmetry. Such embodiments (not shown) usefully reduce the volume of gas flow required to effect ion collection, collisional cooling, and trajectory collimation, thus reducing pumping needs.

FIGS. 1A-1C, 2 and 3 show various embodiments of an ion source device according to the present invention as optionally coupled to the proximal end of an ion analytical instrument.

In the ion source device embodiments schematized in FIGS. 1A, 1B, 1C and 2, the ion source device is operably coupled to analytical instrument 200 through sealing engagement via partition 16, which partition provides, however, for axial communication of ions between axial trajectory region 22 of ion source device 100 and the proximal region of analytical instrument 200 through ion source ion outlet 18.

In the alternative ion source device embodiment schematized in FIG. 3, ion source device 100 is operably coupled to analytical instrument 200 so as effectively to integrate ion source device 100 into ion analytical instrument 200. In such embodiments, partition 16 is omitted and housing 12 of ion source 100 is made contiguous with a housing of ion analytical instrument 200.

Thus, ion source devices of the present invention can be discrete devices, optionally to be coupled to a subsequent ion analytical instrument, or in alternative embodiments can be integrated with an ion analytical instruments.

Thus, in another aspect, the present invention provides analytical apparatus comprising an ion source device of the present invention operably coupled to an ion analytical instrument.

In some embodiments, the analytical instrument may comprise at least one multipole, typically an RF multipole, often a quadrupole, hexapole, or octapole, positioned proximal to the ion outlet of the ion source device.

In a variety of these latter embodiments, the ion source device can be coupled to the analytical instrument so as to effect little or no gas input into or output from such a proximally disposed multipole, as schematized in the embodiments of FIGS. 1A, 1B, 1C and 2; in others of the multipole-containing embodiments, the ion source device may instead be coupled to the analytical instrument so as to additionally encourage gas withdrawal from such a proximally disposed multipole, as schematized in the exemplary embodiment of FIG. 3.

The ion analytical instrument of the analytical apparatus can, in some embodiments, comprise at least one mass analyzer, and can comprise a plurality of mass analyzers.

The analytical apparatus can, for example, comprise a mass spectrometer, including both single stage and multi-stage mass spectrometers, single quadrupole, single hexapole, multiple quadrupole (q2, q3), multiple hexapole, quadrupole ion trap, linear ion trap, ion trap-TOF, and quadrupole-TOF mass spectrometers, orthogonal quadrupole-quadrupole-TOF (Qq-TOF) including orthogonal quadrupole-quadrupole-TOF (Qq-TOF) with linear quadrupole ion trap, orthogonal hexapole-hexapole-TOF including orthogonal hexapole-hexapole-TOF with linear hexapole ion trap mass spectrometers as well as FTIR and Ion Trap-FTIR mass spectrometers.

In a further aspect, the invention provides methods for increasing the collimated output of unfragmented ions from an ion source device, thus increasing the sensitivity of an ion analytical instrument that may optionally be operably coupled to the ion outlet of the ion source.

The method may comprise guiding ions introduced into or generated within the ion source device along the device axis to an ion outlet using superposed electrostatic and axisymmetric pneumatic fields, the ion-guiding pneumatic fields predominating in their effects on ion motion over electrostatic fields in a first portion of the ion trajectory, and ion-guiding electrostatic fields predominating in their effects on ion motion over pneumatic fields in a second portion of the ion trajectory. In typical embodiments, the pneumatic fields are generated by establishing radially-inward axisymmetric and radially-outward axisymmetric gas flows in axial succession.

Usefully, the methods are practiced using an ion source device of the present invention as above-described.

Using the ion source device of the present invention, the magnitude of the gas flows may be controlled, at least in part, by controlling gas flows into the gas reservoir, as for example by throttling the inward gas flow. In other embodiments, the magnitude of the gas flows may be controlled, at least in part, by controlling gas flows out of the gas sink region, as for example by throttling the outward gas flow and/or by controlling outwardly directed pumping of gas from the gas sink region.

The magnitude of the gas flows may be controlled, at least in part, by controlling both the gas flows into the gas reservoir and gas flow out of the gas sink region.

In some embodiments of methods of the present invention, the electrostatic fields may be generated by applying an electrical potential to each of a plurality of electrically conductive elements in the ion source device.

In some embodiments, the potential applied to at least one of the plurality of electrically conductive elements may change between the time of ion introduction into or generation within the ion source device and ion output from the source. In some of these embodiments, the potential applied to a plurality of electrically conductive elements may change during this period.

The change in electrical potential can facilitate injection of ions into an RF multipole of an analytical instrument coupled to the ion source device, as further described in commonly owned U.S. patent application Ser. No. 11/063,801 entitled "Methods And Apparatus For Controlling Ion Current In An Ion Transmission Device," the disclosure of which is incorporated herein by reference in its entirety. In a variety of such embodiments, the potential applied to at least one of the plurality of the electrically conductive elements may be ramped coordinately with AC potential stepping of an RF multipole of an ion analytical instrument to which the ion source device is operably coupled.

The methods of the present invention may comprise a subsequent step of performing at least one analysis on at least one species of ion output from the ion source device. For example, the analysis can comprise determining the mass to charge (m/z) ratio of at least one species of ion output from the ion source.

If the ion analytical instrument comprises means for performing a plurality of such measurements, either tandem-in-space or tandem-in-time, the methods can usefully comprise the subsequent steps, after guiding ions to the ion source device outlet, of selecting at least one ion species output from the ion source device, often based upon its m/z, fragmenting the at least one selected ion species, and performing at least one analysis on at least one product ion resulting from the fragmented parent ion. In some embodiments, the at least one analysis may comprise a determination of the mass to charge ratio of the product ion. Usefully, the at least one analysis may comprise a product ion scan.

The methods of the present invention comprise a step before the step of guiding ions, of introducing ions into, or generating ions within, the ion source device. Any means of introducing ions into, or generating ions within, the source can be used, such as laser desorption ionization.

In various embodiments, ions may be generated within the source by laser desorption ionization of a sample disposed on at least one surface of a laser desorption ionization probe. The analytical sample can usefully comprise proteins, the ions being generated from one or more proteins in the sample. In some of these embodiments, the method can further comprise the step, before generating ions, of capturing proteins from inhomogeneous admixture onto a surface of a laser desorption ionization probe, such as a surface enhanced laser desorption probe, such as a ProteinChip® Array available commercially from Ciphergen Biosystems, Inc. (Fremont, Calif., USA).

In some embodiments the electro-pneumatic superposition methods and apparatus may be applied to electrospray ion sources, and ion sources as described below controlled liquid injection.

In some embodiments there may be provided a plurality of at least partially electrically conductive elements which simultaneously shape and influence electric fields and gas flow fields. Such elements are termed electro-pneumatic elements In some embodiments of ion sources according to the present invention the electro-pneumatic elements are not exclusively made of electrically conductive material but from a combination of both electrically conductive (such as metals) and electrically non-conductive (such as ceramics), or at least a combination of elements with varying electric conductivity such as different metal, alloys, semiconductors or carbon enabling at least partially separation of the portion of the electro-pneumatic element which controls the electric field generation and the portion of the electro-pneumatic element which controls the pneumatic field generation.

In some embodiments a plurality of axisymmetric electro-pneumatic elements may be used which form a stack and which is held in position by a plurality of rods on or close to the circumference of the electro-pneumatic elements such that the position as well as the distance between the electro-pneumatic elements on the rods is determined (and can be changed) by a plurality of spacers, small tubes, or similar which too are being held in place be said rods, and:

1. the entire stack is compressed by a plurality of springs, and
2. the complete stack can be removed/replaced from the ion source as a single component, and
3. the electro-pneumatic elements are generally electrically isolated from said rods by isolating rings or spacers inside the hole through which said rod run, and
4. individual rods can also serve to provide electric potential to individual electro-pneumatic elements which are not electrically isolated from certain rods Some embodiments of ion sources according to the present invention may contain a stack of axisymmetric electro-pneumatic elements wherein the gaps between them can be adjusted by stepper motors, or other electromagnetic or piezo-electric drives which can be driven during operation of the ion source by outside control circuitry.

In some embodiments axisymmetric electro-pneumatic elements may contain mechanisms which allow adjustments of the inner diameter (aperture) of the elements can be adjusted be (such as in a camera lens).

This aperture adjustment may also be effected by stepper motors, or other electromagnetic or piezo-electric drives.

In some embodiments the gaps between a plurality of electro-pneumatic elements may be replaced by a large number of circumferentially displaced apertures.

In some embodiments of the present invention a plurality of electro-pneumatic elements may be made from a single block of a electrically nonconductive material by milling, etching or other means and electrically conductive components are added after this process by ways of partially coating (such as metal films), or filling cavities or gaps in the electrically nonconductive material with electrically conductive material. Such method/configuration enable inexpensive mass fabrication of stacks of electro-pneumatic elements.

In some embodiments of the present invention a number of electro-pneumatic elements to generate electric and pneumatic fields and to guide ions wherein separate housings (chambers, spaces) may be used, but no clear distinction regarding dominating electric or dominating pneumatic forces can be made.

In some embodiments of the present invention a number of electro-pneumatic elements to generate electric and pneumatic fields and to guide ions may be used, but no clear distinction between separate housings (chambers, spaces) can be made.

In some embodiments of the present invention the electro-pneumatic elements may be shaped such that coaxially inwardly directed jets are created which support ion guidance. The creation of the jet is accomplished by having the strongest constriction (gaps) of the gas flow in the immediate vicinity of the location where high gas flow velocities are desired.

In some embodiments of the present invention the significant gas temperature drop inside said high speed gas jets (which can reach supersonic velocities) may be used to effect and support very rapid collisional ion cooling and/or collisional ion cooling down to temperatures lower than the temperature of the supplied collisional cooling gas at rest.

Ion Source Synchronized to RF Multipole

In apparatus and methods of the present invention, an ion source is in ion communication with an ion transmission device. Applying a set of operating parameters to the ion source can determine the characteristics of the ions generated by the ion source. Similarly, applying a set of operating parameters to the ion transmission device can determine the characteristics of the ions transmitted through the ion transmission device. Applying a set of operating parameters to the foregoing components refers to setting or providing values for one or more of their operating parameters.

In a first aspect, the present invention provides methods for controlling the ion current of an ion transmission device in ion communication with an ion source.

The method may comprise coordinating the operating parameters of an ion transmission device with the operating parameters of an ion source. In some embodiments, the method may involve coordinating values of the operating parameters of the respective components.

Examples of operating parameters of the ion transmission guide source include, without limitation, any characteristics of the potentials applied to one or more of the electrodes of the ion transmission guide, such as the electrodes of a multipole radio-frequency ion guide. Such characteristics include, without limitation and where relevant, the characteristics of applied DC potentials, AC potentials, or any other arbitrarily time-dependent waveform. These include the magnitude of the applied potentials, wherein the magnitude may be determined by absolute value, peak, root-mean-square, average, or the like. These characteristics also include the frequencies and amplitudes of applied waveforms, the magnitudes of phase shifts between two or more applied waveforms, the shapes of applied waveforms, pertinent time intervals between changes in state and other values, and other like characteristics.

Examples of operating parameters of the ion source that can be coordinated with operating parameters of the ion transmission guide include, without limitation, any characteristics of the potentials applied to one or more of the electrodes of the ion source. Such characteristics include, without limitation and where relevant, the characteristics of applied DC potentials, AC potentials, or any other arbitrarily time-dependent waveform. These include the magnitude of the applied potentials, wherein the magnitude may be determined by absolute value, peak, root-mean-square, average, or the like. These characteristics also include the frequencies and amplitudes of applied waveforms, the magnitudes of phase shifts between two or more applied waveforms, the shapes of applied waveforms, pertinent time intervals between changes in state and other values, and other like characteristics.

In some embodiments of the present invention, the operating parameters of the ion source and the ion transmission device may be coordinated such that the characteristics of the ions generated by the ion source are substantially commensurate with the characteristics of the ions transmitted through the ion transmission device. Proper coordination results in improvement of the ion current of the ion transmission device. Coordination of these respective operating parameters may also result in improvements in the measurement and detection of the ions.

In some preferred embodiments, a controller may be configured to coordinate the operating parameters of the ion source and the ion transmission device of the present invention. A controller can thereby coordinate the respective operating parameters of the ion source and the ion transmission device in a manner directed towards control of the ion current of the ion transmission device.

In some embodiments of the present invention, coordination of the respective operating parameters of the ion source and the ion transmission device may require applying or changing values of one or more of the operating parameters. In some embodiments, these changes or applications of operating parameter values to a first component, such as an ion source, may be effected with regard to changes or applications of values to the operating parameters to a second component, such as an ion transmission device. Such values may include characteristics of the electrostatic or electromagnetic properties of electrodes in the components of interest. Such characteristics may include, for example, the properties of the applied AC or DC potentials, the properties of the applied AC or DC currents, the frequencies and amplitudes of applied waveforms, the magnitudes of phase shifts between two or more waveforms, the shapes of applied waveforms, pertinent time intervals between changes in state and other values, and other like characteristics known to affect the operation of ion sources and ion transmission devices of the present invention.

In some embodiments of the present invention, the operating parameters may include either or both of digital and analog values. The operating parameters may include settings for the ion source or ion transmission device that represent or reflect its electric and electronic characteristics, its spatial and physical characteristics, its temporal characteristics, and other characteristics that are known in the art relating to such components.

In some embodiments of the present invention, coordination of the values of these respective operating parameters may involve measuring, calculating, querying, recalling, or other suitable method for determining the values of one or more of the operating parameters on a first component (e.g., ion source, ion transmission device, etc.). Such determination may be made transiently or in real-time. For example, the controller may measure directly values of one or more operating parameters of a component (e.g., applied AC or DC potentials, the AC peak amplitude and frequency, etc.). The controller may also calculate or derive one or more operating parameter values based on other known or measured parameters. The controller may query another controller in closer proximity to the component of interest to obtain the desired values. The controller may also recall the values of the operating parameters that were applied previously to the component, instead of determining anew the values from the component itself. It is also understood that suitable combinations of the foregoing determination methods may also be used.

Concurrent with or following this determination of the operating parameters, suitable operating parameter values may be applied to the second component based on one or more of the parameters determined from the first component. For example, one or more values of the operating parameters of the ion transmission device (such as the amplitude of the applied AC potential) may be measured or otherwise determined by a controller in the apparatus. Based on this determination, one or more suitable values may be applied to the operating parameters of the ion source by the controller, thereby coordinating both sets of operating parameters with respect to each other.

The foregoing coordination method of the present invention may also be performed unidirectionally, reciprocally, or any other suitable combination thereof. For example, one or more operating parameters may be determined on both components, and based on this determination, the controller may apply suitable operating parameters on the other components.

Further to the above, in some embodiments of the present invention, coordination of the respective operating parameters may require monitoring the component for changes to its operating parameter values. Such monitoring may be performed in real-time, at periodic intervals, or at other suitable times or intervals. In these embodiments, changes to one or more of the operating parameter values of a first component may result in a coordinate changes of one or more of operating parameter values of the other component. For example, the controller may monitor one or more of the operating parameter values of the ion transmission device. If the controller determines that the values of one or more of these parameters (e.g., the AC potential applied to the ion transmission device) has changed, the controller may apply a coordinate change in the values of the operating parameters of the other component (e.g., the ion source).

In some embodiments of the present invention, coordination of the respective operating parameters may require applying suitable operating parameter values to both the ion source and the ion transmission device in a coordinate yet independent manner. Such coordination may not require determination of the operating parameter values of one or both components, but instead the respective operating parameter values may be matched prior to their application, and applied to both respective components coordinately. For example, the controller may include a lookup table or other suitable database in which each given set of ion source operating parameters is matched with a corresponding set of ion transmission device parameters. Such operating parameter values may have been predetermined, newly calculated from other values, or other suitable combinations thereof.

In some embodiments of the present invention, one or more values of the operating parameters that are applied to the ion source and ion transmission device may be calculated or derived by other suitable mathematical or logical systems. These calculated operating parameter values may be thus derived from one or more other operating parameter values. For example, to coordinate the respective operating parameters of the ion source and the ion transmission device of the present invention, one or more values of the operating parameters (e.g., the peak amplitude of the applied AC potential) may be determined by querying or measuring the ion transmission device. The controller may then calculate or otherwise derive one or more of values of the ion source operating parameters based on one or more of the values of the ion transmission device operating parameters.

In some embodiments of the present invention, one or more values of the operating parameters applied to the ion source and the ion transmission device may be predetermined. In such embodiments, such predetermined operating parameters may not require real-time calculations or logical transformations by the controller. Predetermined operating parameter values may be generated by calculating the operating parameters in advance, and then pre-loading or storing the values in the controller for subsequent retrieval and application to the component. Other suitable methods for predetermining operating parameter values may include empirical observation of and experimentation with the component in question. Predetermined operating parameter values may be determined based on computer simulations of the components under simulated operating conditions.

It is also within the scope of the present invention that the operating parameter values may be determined by ascertaining a mathematical or other algorithmic relationship between the desired operating parameters and other known operating parameters. It is also within the scope of the present invention that, with respect to any of the foregoing methods, such determination may make determination of operating parameters more efficient by reducing the degrees of freedom among the known operating parameters. Predetermined operating parameters calculated by these methods may then be stored in memory storage of the controller such that the calculated does not need to be performed again.

In some embodiments of the present invention, coordination of the respective operating parameter values may be performed over several intervals. For example, a first set of operating parameter values may be applied to a first component (e.g., the ion transmission device) and a corresponding first set of operating parameter values may be applied to a second component (e.g., the ion source). These first sets may be maintained on each component for a period of time. The length of a period may be fixed or predetermined, or may be conditioned on other events. Following this period, a second set of operating parameter values may then be applied to the first component and a corresponding second set of operating parameters may be applied to the second component. This continued coordination of the respective operating parameters may continue to be maintained for many intervals or periods of time.

In some embodiments, coordination of the respective operating parameters of the first and the second components may involve synchronizing the respective operating parameter values. In some other embodiments, such coordination may be offset by a suitable time period or other criteria. For example, a given set of operating parameter values may be applied to a first component, and a corresponding set of operating parameter values may be applied to a second component following a period of time after the first application. In some embodiments, this temporal order may be reversed. The temporal offset may be predetermined, or may be responsive to the certain parameters. For example, a set of operating parameters may be applied to an ion source to allow ions of a certain mass range to be extracted. After a period of time to allow these ions to travel to the entrance of the ion transmission device, the corresponding set of operating parameter values may then be applied to the ion transmission device, thereby effecting coordination of the respective operating parameter values in accordance with the present invention.

In one embodiment, an apparatus may include an ion source with a plurality of electrodes in ion communication with an ion transmission device, which is an multipole radio-frequency ion guide (RFIG). In this embodiment, coordination of the operating parameter values of an ion source with operating parameter values of the multipole RFIG may include setting one or more values for the AC potentials applied to the multipole RFIG electrodes. Based on these values applied to the RFIG, the potentials applied to one or more of the ion source electrodes may be set. In certain conditions, this coordination of the operating parameter values of the ion source with the operating parameter values of the multipole RFIG results in an improved or increased ion current from the RFIG, compared.

Coordination of the respective values may also include the situation in which one or more of the operating parameter values are changed on the multipole RFIG. For example, the RFIG may be ramped, thereby changing the peak amplitude of the AC potential applied to its electrodes. In response to this change of values in the RFIG, one ore more of the operating parameter values of the ion source may also be changed. For example, the potentials applied to one or more of the ion source electrodes may also be changed in response to the change in values of the RFIG. Therefore, coordination of the respective operating parameter values in this manner in accordance with the present invention may result in changing the respective values in a substantially synchronous manner.

In accordance with methods and apparatus of the present invention, control of the ion current of the ion transmission device may result in useful improvements to the ion current in the ion transmission device compared to prior practices. For example, previously when a predetermined set of operating parameters had been applied to the ion source, these operating parameters were generally not changed during the operation of the apparatus, nor were they changed or coordinated with the operating parameters of other components, such as that of the ion transmission device. Accordingly, improvements of the present invention resulting from coordination of the respective operating parameters may be at least one-and-one-half-fold, at least two-fold, at least three-fold, or at least-five fold over an apparatus or methods in which the ion source operating parameters have not been coordinated with the ion transmission device operating parameters.

Similarly, in some embodiments such improvements in the ion current may also result in commensurate or proportional improvements in the ion-derived signal measured by the apparatus. For example, in an apparatus of the present invention that includes a TOF mass analyzer, improvements in the ion current resulting from the methods and apparatus described herein may also increase the signals and amount of detected ions by the TOF apparatus.

Coordinating respective operating parameters in accordance with the present invention may be used to control other aspects of the ion current, other than improvement of the ion flux. For example, control of the ion current may be used to increase ion flux with respect to one or more selected ion species, to decrease ion flux with respect to one or more selected species, to enrich one or more ion species, to diminish one or more ion species, to control the distribution of velocities (with respect to either or both of the magnitude or directions) of the ion current, and any other suitable properties of the ion current or suitable combinations thereof.

Coordination of the operating parameters of an ion source and an ion transmission device, in accordance with the present invention, has several advantages and differences over previous methods and apparatus. First, in contrast to previous methods, coordinating the respective operating parameters may provide values for the operating parameters that are suitable for controlling the ion current of the ion transmission device. Previously, controlling the ion current of the ion transmission device was not considered when setting the operating parameters of other components, in particular the operating parameters of the ion source.

Second, in contrast to previous methods, coordination of the operating parameters in accordance with the present invention may require setting or providing values for the operating parameters for one component (e.g., the ion source) based on the operating parameters of another component (e.g., the ion transmission device). For example, one or more values of the operating parameters of an ion transmission device may be determined. Based on this determination, a corresponding set of operating parameters may then be applied to the ion source. Previously, operating parameters for one component were usually set to affect functionality of that component, and not necessarily the functionalities of other components.

Third, in contrast to previous apparatus, the present invention includes a controller component suitable for and configured to coordinate the respective operating parameters of the ion source and the ion transmission device. Previous apparatus lacked such a controller, and particularly one configured for coordinating the respective operating parameters of the two components. More particularly, previous apparatus lacked a controller configured to effect such coordination in order to effect control of the ion current in the ion transmission device.

Fourth, in contrast to previous methods and apparatus, operating parameters for one or more components of an apparatus of the present invention may be predetermined and subsequently stored. Accordingly, during coordination of the respective operating parameters, the stored, predetermined operating parameters may be applied to their respective components. Storing and using predetermined operating parameters in the present invention may be particularly useful when mutually coordinated sets of operating parameters may be too complex or time-consuming to calculate in real-time.

In another aspect, the present invention may provide an apparatus for controlling the ion current of an ion transmission device. Such apparatus of the present invention may effect this ion current control by coordinating the operating parameters applied to the ion source with that of the ion transmission guide, both of the present invention.

Figure 15:
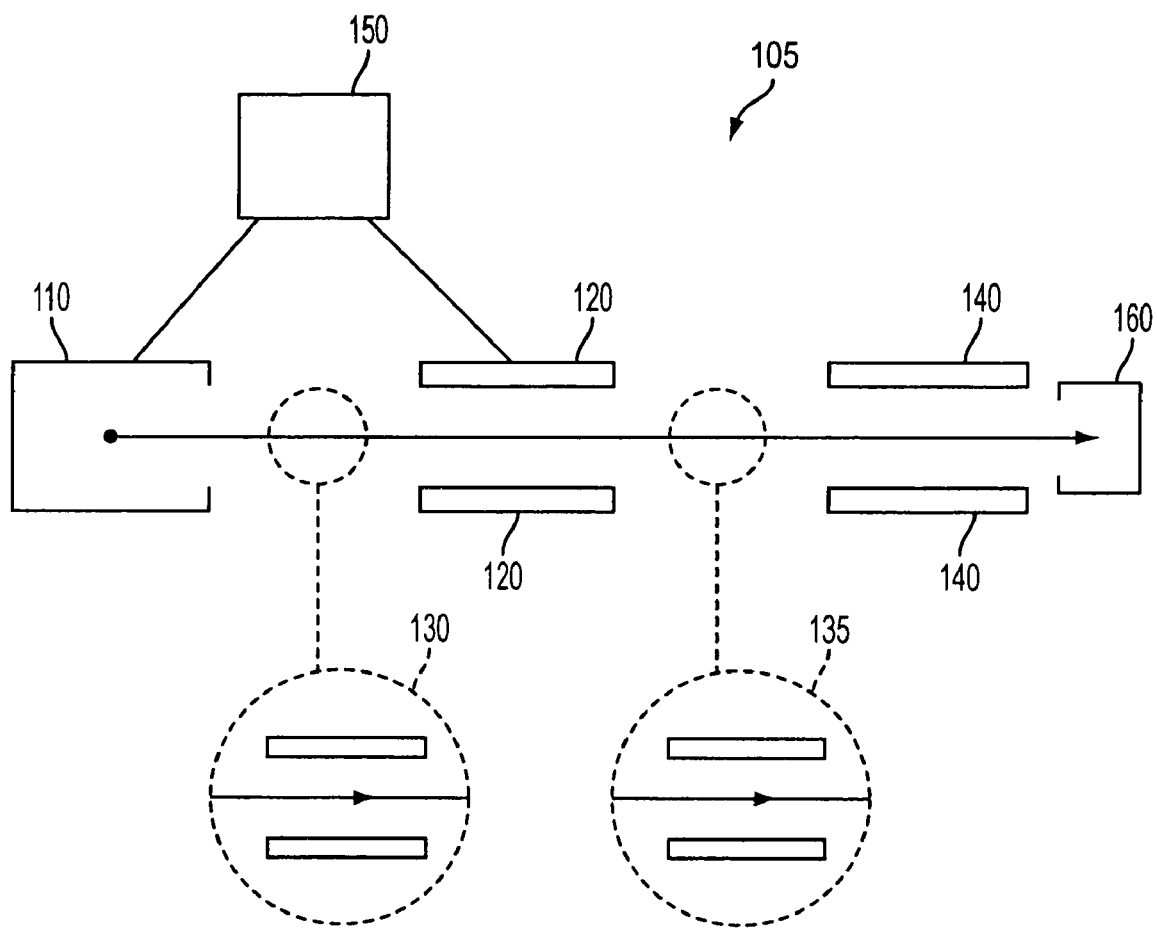
FIG. 15 is a block diagram of an embodiment of the present invention.

Referring to FIG. 15, a block diagram of an embodiment of an apparatus of the present invention is depicted. Apparatus 105 may comprise ion source 110 and ion transmission device 120. Ion source 110 is in ion communication with ion transmission device 120, such that ions may travel from the ion source to the ion communication device.

Apparatus 105 of the present invention may also include optional intervening component 130 disposed between ion source 110 and ion transmission device 120. If present, intervening component 130 is in ion communication with both ion source 110 and ion transmission device 120, thus allowing ions from ion source 110 to enter ion transmission device 120 via intervening component 130. Likewise, optional intervening component 135, if present, may be disposed following ion transmission device 120 in a manner similar to intervening component 130, such that ions may travel from ion transmission device 120 and distal component 140 via intervening component 135.

If either or both are present, intervening components 130 and 135 may include, for example, deflecting electrodes (having static or dynamic applied potentials), electrostatic lenses, apertures, mass filters, ion transmission devices, cooling cells, collision cells, ion fragmentation cells, mass analyzers, multipole devices, ion guides, and other like devices or suitable combinations thereof. Intervening components 130 and 135 may serve to limit or restrict the entry to or exit from components of apparatus 105 to which they are proximately situated. Intervening components 130 and 135 may also serve to affect the potentials or electromagnetic environment of ions. Intervening components 130 and 135 may also effect other changes to the ions, such as mass- or charge-dependent filtration or selection of ions, fragmentation, redirection or deflection, reduction in kinetic energy (i.e., cooling), linear or angular acceleration, and other suitable or necessary functions as are known in the art.

Apparatus 105 of the present invention also includes distal component 140 that is capable of receiving ions from ion transmission device 120, or via intervening component 135, if present. Distal component 140 may include one or more mass analyzers, one or more mass spectrometers, a total ion current measuring device, an ion mobility spectrometer, and other like devices known in the art, as well as suitable combinations thereof. In the present invention, the ion current of the ion transmission device may affect the quantity and distribution of ions that are received by the distal component.

The present invention also embraces embodiments of apparatus 105 in which distal component 140 is optional. In such embodiments, apparatus 105 of the present invention minimally may comprise ion source 110, ion transmission device 120, and controller 150. Such an apparatus may serve as a particularly useful and improved means for generating ions with an improved ion current.

Apparatus 105 of the present invention also includes ion detector 160, which may include an ion detector for detecting ions, and may also include a component for amplifying ion signals, examples of which are known in the art, and thus will not be discussed in detail here. For example, ion detector 160 may include continuous electron multipliers, discrete dynode electron multipliers, scintillation counters, Faraday cups, photomultiplier tubes, and the like. Ion detector 160 may also include a system or component for recording ions detected therein, such as a computer or other electronic apparatus.

In some embodiments of the present invention, apparatus 105 may be a single-stage mass spectrometer apparatus. In such embodiments, mass analysis is performed by a mass analyzer included within distal component 140. Suitable mass analyzers include, for example, a quadrupole mass filter, a reflectron, a time-of-flight mass analyzer, an electric sector time-of-flight mass analyzer, a triple quadrupole apparatus, a Fourier transform ion cyclotron resonance mass analyzer, a magnetic sector mass analyzer, or other suitable mass analyzers known in the art.

In some embodiments of the present invention, apparatus 105 may be a tandem mass spectrometer, whereby apparatus 105 may comprise two or more mass analyzers. In some tandem mass spectrometer embodiments of the present invention, distal component 140 of apparatus 105 may include the one or more mass analyzers. For example, distal component 140 can be selected from the group consisting of a quadrupole-TOF MS, an ion trap MS, an ion trap TOF MS, a TOF-TOF MS, a Fourier transform ion cyclotron resonance MS, with an orthogonal acceleration quadrupole-TOF MS a particularly useful embodiment.

In other embodiments, both ion transmission device 120 and distal component 140 may each include one or more mass analyzers. For example, ion transmission device 120 may include a first mass analyzer and distal component 140 may include a second mass analyzer. In some of such embodiments, the first mass analyzer is ion transmission device 120. In other of such embodiments, ion transmission device 120 may include one or more mass analyzers and one or more ion guides, whereby the mass analyzers and ion guides function together as ion transmission device 120. Control of ion transmission device 120 by controller 150 may be effected by control of one or more of said mass analyzers and ion guides.

In one example of an apparatus of the present invention having multiple mass analyzer components, apparatus 105 may comprise a suitable ion source as ion source 110, one or more multipole (e.g., quadrupole) ion guides and/or mass filters as ion transmission device 120, and a time-of-flight mass analyzer as distal component 140. In another example, apparatus 105 may comprise a suitable ion source as ion source 110, one or more multipole (e.g., quadrupole) ion guides and/or mass filters as ion transmission device 120, and a Fourier transform ion cyclotron resonance mass analyzer as distal component 140.

Apparatus 105 of the present invention also includes controller 150 which is configured to coordinate the operating parameters of ion source 110 and ion transmission device 120. Controller 150 may be in signal communication with ion source 110 and ion transmission device 120. Such signal communication may occur by either or both analog or digital signals. In some embodiments, controller 150 may include one or more digital computers, including a processor and memory storage. Controller 150 may also be configured to store values of operating parameters, such as predetermined operation parameters or those determined from one or more of the components of the apparatus.

In some embodiments of the present invention, controller 150 may be configured to provide one or more values for the operating parameters of ion source 110. Similarly, controller 150 may also be configured to provide one or more values for the operating parameters of ion transmission device 120. In addition, in some embodiments of the present invention controller 150 may also be configured to determine one or more of the operating parameters of either or both of ion source 110 and ion transmission device 120. Such determination may be made by, for example, measuring or otherwise deriving the parameter to be determined from the device or its immediate controller, querying the device or its immediate controller for the desired parameter, determining the desired parameters based on the parameters that were recently provided to the device, and other suitable methods or combinations thereof as are known in the art.

Ion source 110 includes any systems or methods for generating ions that are known in the art. Ions may be generated in ion source 110 in a continuous or pulsed manner. Ion source 110 may include means for producing a plurality of ions within a relatively small volume and within a relatively short time. Also included are any of the systems or methods known in the art for producing a pulse of ions, such that the pulse of ions has the appearance of or behaves as if the ions were produced within a relatively small volume and within a relatively short time. Ion source 110 may also include systems or methods for producing a continuous beam of ions, or by any of the known systems or methods of producing an essentially continuous or extended beam of ions from an initially generated pulse of ions. Ion source 110 may also include systems or methods to concentrate the ions, such as a quadrupole ion trap, a linear ion trap, and other suitable systems or combinations thereof.

Ion source 110 may, for example, include systems or methods that employ a pulsed laser interacting with a solid surface, a pulsed focused laser ionizing a gas within a small volume, or a pulsed electron or ion beam interacting with a gas or solid surface. In another example, ion source 110 may employ systems or methods for generating a pulse of ions that uses a rapidly sweeping, continuous ion beam passed over a narrow slit, in which a brief pulse of ions is produced by the ions passing through the slit when the ion beam passes thereover.

Ion source 110 may employ, but is not limited to use of, electrospray ionization, laser desorption/ionization ("LDI"), matrix-assisted laser desorption/ionization ("MALDI"), surface-enhanced laser desorption/ionization ("SELDI"), surface-enhance neat desorption ("SEND"), affinity capture laser desorption/ionization, fast atom bombardment, surface-enhanced photolabile attachment and release, pulsed ion extraction, plasma desorption, multi-photon ionization, electron impact ionization, inductively coupled plasma, chemical ionization, atmospheric pressure chemical ionization, hyperthermal source ionization, and the like.

Furthermore, ion source 110 may also include systems or methods for selectively providing ions of one or more masses or ranges of masses, or fragments therefrom. Such systems or methods may be accomplished by combining the apparatus of the present invention in tandem fashion with a mass analyzer that is known in the art, wherein the mass analyzer may include components such as magnetic sectors, electric sectors, ion traps, multipole devices, mass filters, TOF devices, and the like. The combined mass analyzer and ion source may be included as part of ion source 110.

Ion source 110 may also include systems or methods for extracting or accelerating ions from the ion source, such as by application of an electric field or voltage pulse. Such systems or methods may be parallel (i.e., coaxial) or orthogonal with respect to the trajectory of the initially-generated ions, such as an ion beam. Extraction or acceleration of the ions may occur subsequent to the formation of the ions. Ion source 110 may also include systems or methods for reducing the initial kinetic energies of the ions that may result from their desorption or ionization, such as by collisional cooling means. Accordingly, ion source 110 may also include a gas flow field, as is known in the art.

Ion source 110 may, in certain embodiments, use superposed electrostatic and gas flow fields, as further described and claimed in the commonly owned patent application, entitled "Ion Source With Controlled Superposition Of Electrostatic And Gas Flow Fields" the disclosure of which is incorporated herein by reference in its entirety. The advantages of the present invention become particularly apparent when such ion sources are used. In these embodiments, ion motion is determined by a multitude of factors, including the initial conditions, the ion mass, the collision cross-section, the spatial distribution of the gas flow velocity vector field, the spatial distribution of the gas flow pressure field, and other like conditions. Accordingly, methods and apparatus of the present invention may allow control and improvement of the total ion current over a wide mass range in these embodiments.

Figure 16:
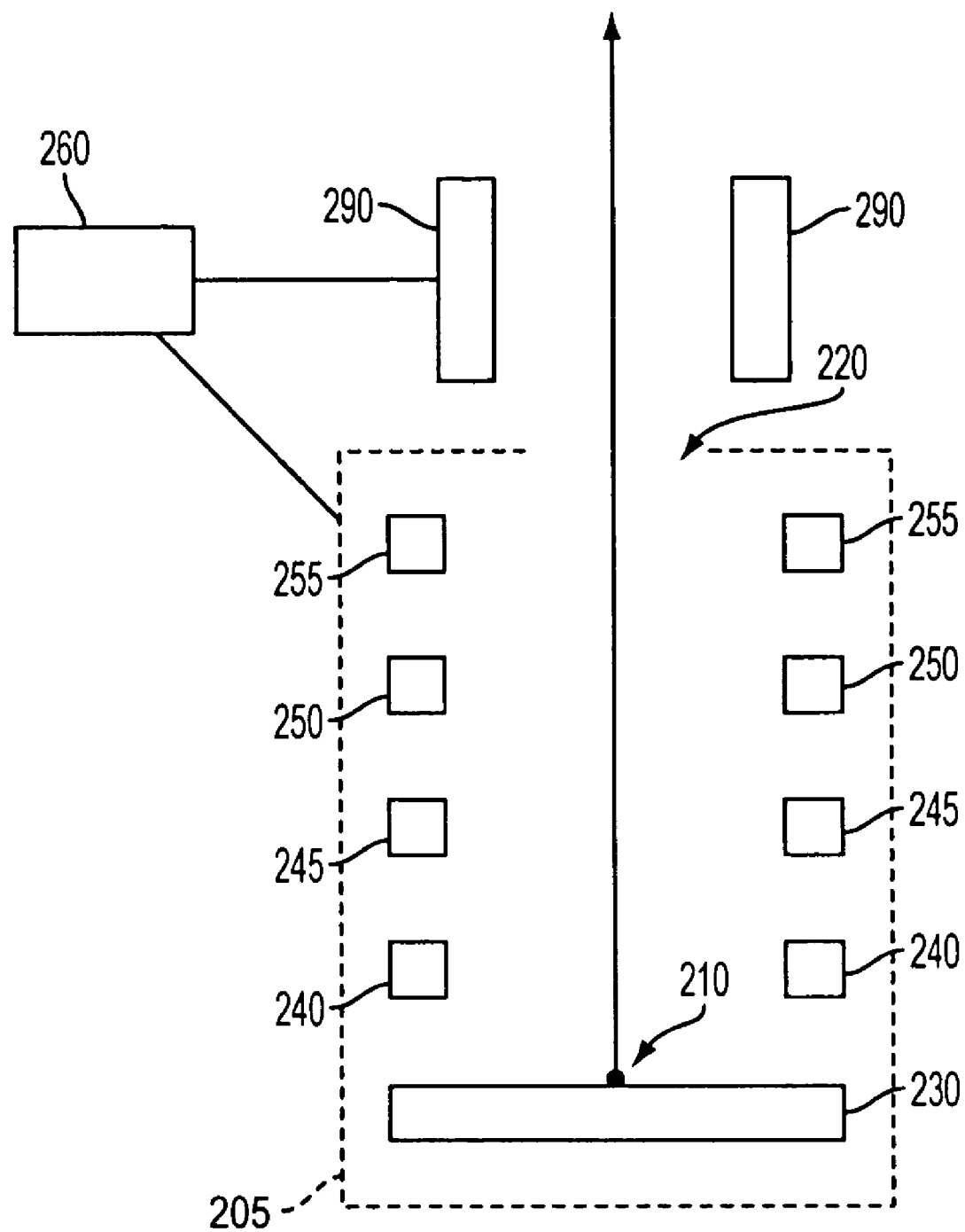
FIG. 16 is a schematic view of an exemplary ion source of an embodiment of the present invention.

Referring to FIG. 16, an exemplary ion source embodiment of the present invention is depicted. Ion source 205 is depicted schematically in cross-sectional view, in which the vertical axis corresponds approximately to the longitudinal ion extraction path. It is understood that the particular number, arrangement, shapes, configuration and other features of the ion source and its electrodes as depicted in ion source 205 and described herein are an exemplary embodiment of the present invention provided for illustrative purposes. Other conceivable ion source configurations, including those known in the art, are envisioned to be included within the scope of the present invention.

Like ion source 105 in FIG. 15, ion source 205 may be in ion communication with ion transmission device 290 via ion source exit 220, either directly or via optional intervening components, such as those described herein. Accordingly, ions that exit via ions source exit 220 may be received by and thereby may enter ion transmission device 290.

In ion source 205, ions are generated at or near ion generation point 210, such as by laser desorption/ionization or other suitable ion generation systems or methods, including those listed herein. Ions generated at point 210 may have initial thermal energies resulting from the desorption, ionization, or other step during or following generation of the ions from the sample.

In the exemplary embodiment of the present invention depicted in FIG. 16, ion source 205 includes basal electrode 230 and electrodes 240-255. Electrodes 230-255 preferably have an axisymmetric configuration, but may also comprise discrete electrode elements. Operating parameters of these electrodes may include, for example, direct current (DC) potentials, alternating current (AC) potentials, or any other arbitrarily time-dependent waveform or suitable combinations thereof may be applied independently to each of these electrodes such that each electrode may have different potential values. Another operating parameter is the waveform of the applied potentials. The applied potentials may also have an arbitrary waveform, such as sinusoidal, square, sawtooth, and other suitable forms. As a result of these applied potentials, each electrode may affect the potential experienced by ions within ion source 205. In preferred embodiments of the present invention, the electric field resulting from electrodes 230-255 is configured to accelerate and direct ions towards ion source exit 220.

In this embodiment, other operating parameters of ion source 205 may include, for example, the magnitude and timing of potentials applied to one or more of electrodes 230-255. Still other operating parameters may include the physical locations of one or more of the electrodes within the ion source, parameters relating to any time-dependent application of potentials to one or more of the electrodes, parameters relating to the generation of the ions or introduction of the sample, and other suitable operating parameters of ion sources that are known in the art.

Control of one or more the foregoing ion source operating parameters may be effected by, for example, controller 260 in signal communication with ion source 205. Controller 260 may thereby apply or set one or more of the operating parameters of ion source 205. Controller 260, or another suitable device, may also be configured to determine one or more of the current operating parameters of ion source 205 (as described above), such as by measuring, querying, or deriving said parameters from ion source 205.

An apparatus of the present invention also includes an ion transmission device, such as ion transmission device 120 and 290 represented in FIGS. 15 and 16, respectively. An ion transmission device of the present invention serves to conduct one or more ions from its entrance to its exit. The entrance of an ion transmission device of the present invention may be in ion communication with an ion source, such as ion source 110. The exit of an ion transmission device of the present invention may be in ion communication with a distal component or mass analyzer, such as distal component 140. Referring to FIG. 15 as an example, ions that exit ion source 110 of the present invention may then enter ion transmission device 120 (either directly or via an optional intervening component). Ion transmission device 120 may then conduct the ions to subsequent distal component 140 (either directly or via an optional intervening component). In some embodiments of the present invention, the distal component includes one or more mass analyzers and ion detectors. As described hereinabove, it is understood that the present invention embraces embodiments in which distal component 140 is optional, such that apparatus 105 minimally may comprise ion source 110, ion transmission device 120, and controller 150.

One operational metric of the ion transmission device is its ion current. Ion current may generally refer to the flux of ions (or other charged species) at a given point or through a given cross-section in an ion path. Ion current can reflect the total flux of all ions, irrespective of ion mass. Under certain circumstances, it may be more useful to determine partial ion current as a function of ion mass. Partial ion currents may be particularly useful to identify and to measure mass-dependent selectivity and preferences within the apparatus.

For example, an ion transmission device in the apparatus according to the present invention may exhibit a mass-dependent selectivity when conducting ions therethrough. To demonstrate such selectivity, a partial ion current can be measured for each mass or range of masses as ions enter and exit the device. Ion masses to which the ion transmission device exhibits either positive or negative selectively may result in a higher or lower corresponding partial ion current at the exit of the device.

The ion current of an ion transmission device in the apparatus according to the present invention reflects the ion flux at the exit of the ion transmission device. Using apparatus 105 in FIG. 15 as an example of the present invention, the ion current of ion transmission device 120 therefore reflects the flux, or amount, of ions exiting ion transmission device 120. Accordingly, this ion current may also reflect the ion flux, or amount of ions, that is entering distal component 140 (either directly or via optional intervening component 135).

The ion current of the ion transmission device may be particularly relevant with respect to components that are distal from the ion transmission device, and thus are capable of receiving ions therefrom. In preferred embodiments, these components may include a mass analyzer and ion detector. Accordingly, the ion current can be an important indicator of the operating performance of the apparatus.

For example, in some embodiments of the present invention, distal apparatus 140 of FIG. 15 may include a time-of-flight (TOF) mass analyzer. A TOF mass analyzer is capable of receiving and measuring individual ions over a broad range of masses, in which the signal strength for each ion may correspond to the amount of that ion received by the analyzer. In such cases, high ion currents are preferable to low ion currents, as the former may result in a stronger signal by the mass analyzer. Therefore, it is desirable in these and other contexts to improve the ion current over all ion masses.

Ion transmission device 120 of FIG. 15 may include any suitable device for conducting or transmitting ions that are known in the art. Examples of ion transmission devices may include ion guides, multipole devices (such as quadrupoles, hexapoles, octopoles, etc.), electrostatic ion guides, electromagnetic ion guides, and other like devices or combinations thereof. Ion transmission device 120 may include a plurality of such devices arranged in serial ion communication. For example, ion transmission device 120 may include a triple-quadrupole device, as is known in the art, in which three quadrupoles (a first mass filter, a collision cell, and a second mass filter) are arranged in series.

In some embodiments of the present invention, ion transmission device 120 may include one or more ion guides, as are known in the art. Ion guides are suitable for conducting one or more ions from its entrance to its exit. In some embodiments, ion guides of the present invention are configured to confine and focus an ensemble of mobile ions within a potential envelope. In this manner, only those ions that can maintain a stable trajectory within the ion guide are then able to exit the ion guide.

In some ion guide embodiments, conduction by the ion guides is performed by reducing or dampening the ion velocity components that are orthogonal to the longitudinal axis of the ion guide, while substantially maintaining the parallel component. In this manner, ions that exit the ion guide are more focused in a single direction. Ion guides of the present invention may include, for example, multipole ion guides, electrostatic ion guides, electromagnetic ion guides, and other suitable ion guides and combinations thereof as are known in the art.

In some preferred embodiments of the present invention, ion transmission device 120 may include one or more multipole ion guides, as are known in the art. Multipole devices are constructed from a plurality of linear electrodes. The linear electrodes are uniformly and circumferentially arranged around a central longitudinal axis. The electrodes are also arranged such that they are parallel with respect to each other and the central axis. The approximately cylindrical shape of a multipole ion guide thereby defines a longitudinal passage through which the ions are conducted. The individual electrodes in multipole ion guides of the present invention may have cylindrical, hyperbolic, or other suitable cross-sectional geometries, as are known in the art.

In some preferred embodiments of the present invention, ion transmission device 120 may include one or more multipole ion guides having four, six, or eight electrodes (known respectively as quadrupoles, hexapoles, and octopoles), as are known in the art. In some embodiments of the present invention, ion transmission device 120 may include one or more segmented multipole devices. Such segmented multipoles may allow the application of different potentials to each segment.

Figure 17:
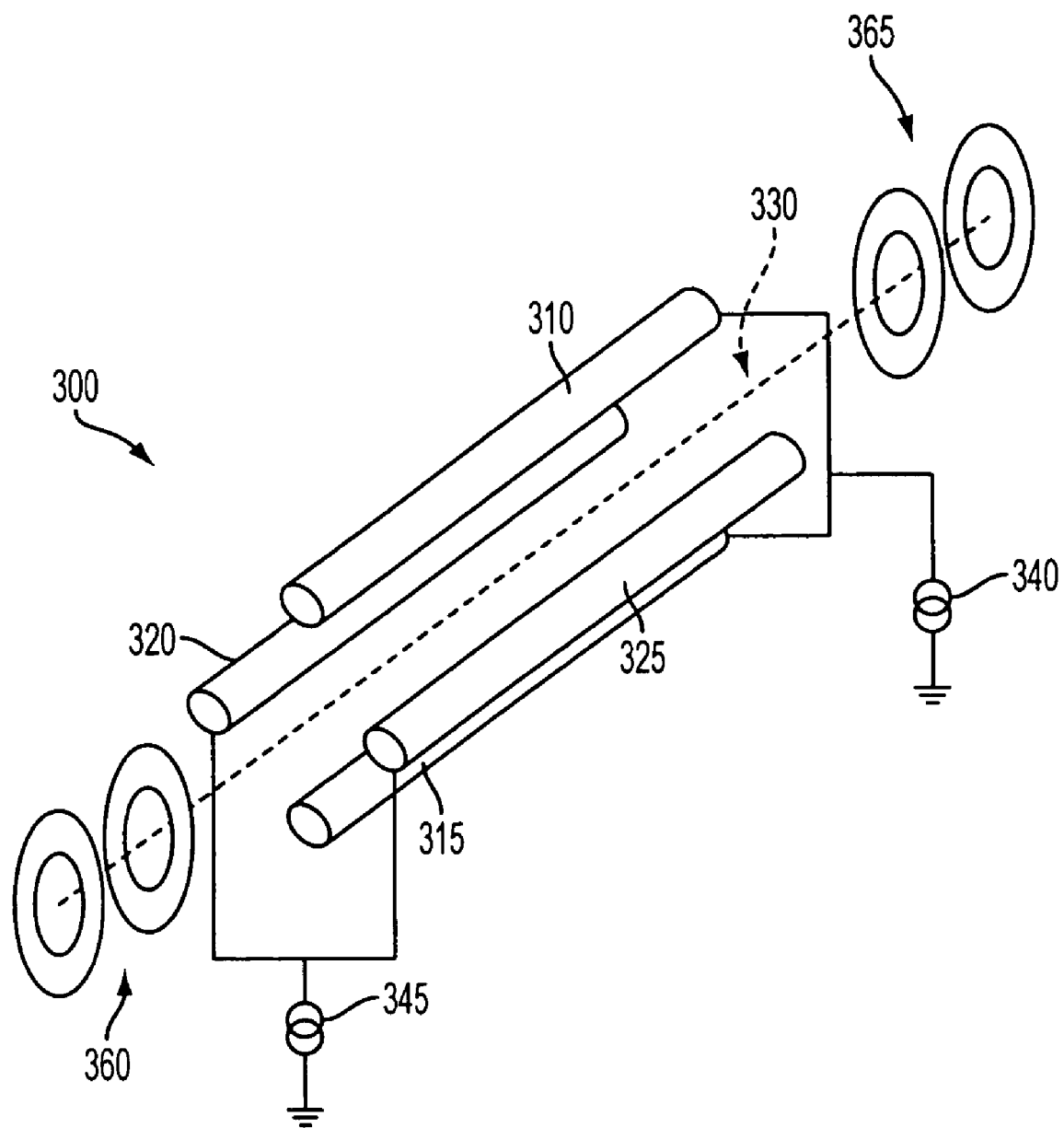
FIG. 17 is a schematic isometric view of an exemplary ion transmission device of an embodiment of the present invention.

In some preferred embodiments of the present invention, ion transmission device 120 may include one or more quadrupole ion guides. Referring to FIG. 17, schematic isometric view of an exemplary quadrupole ion guide is depicted. Quadrupole 300 includes linear electrodes 310-325 arranged substantially in parallel with respect to each other. Electrodes 310-325 are also substantially parallel to and equidistant from longitudinal axis 330. Quadrupole ion guide 300 may also include one or more terminal electrostatic lenses at either or both of openings of ion guide 300, such as lenses 360 and 365. Lenses 360 and 365 may be disposed in a manner and at a location such that they may affect the potential experienced by ions entering or exiting the quadrupole.

In some embodiments of the present invention, quadrupole ion guide 300 may also include potential sources 340 and 345. Potential sources 340 and 345 are configured to apply voltage potentials to one or more of electrodes 310-325. In some preferred embodiments of the present invention, potential source 340 is configured to apply potentials to electrode pair 310 and 315, while potential source is similarly configured to apply potentials to electrode pair 320 and 325. In these embodiments, each potential source applies substantially the same potentials to both members of an electrode pair.

As is known in the art, multipoles, such as quadrupole 300, conduct mobile ions that are able to maintain stable trajectories within its electric field. The potentials applied to the electrodes from potential sources 340 and 345 may consist of a direct current (DC) potential with a superimposed alternating current (AC) potential. In quadrupole ion guide 300 of the present invention, the time-dependent potential of each electrode can be generally defined by the following equations:

$$\Phi_A = +[\Phi_{DC} + \Phi_{AC}\cos(\omega t)] \qquad \text{(Eq. 1)}$$

$$\varphi_B = -[\Phi_{DC} + \Phi_{AC}\cos(\omega t)] \qquad \text{(Eq. 2)}$$

In the above general equations, ΦA (Eq. 1) represents the potential applied to electrodes pairs 310 and 315 by potential source 340. Similarly, ΦB (Eq. 2) represents the potential applied to electrodes pairs 320 and 325 by potential source 345. Application of the potentials to each pair of electrodes in accordance with Eqs. 1 and 2 results in a phase-shift with respect to each other by approximately 180°. The waveform of the applied AC potentials is generally sinusoidal, but may also be sawtooth, square, or any other known waveform or suitable combination thereof. All of the foregoing are examples of operating parameters of an ion transmission device of the present invention The value of ΦDC represents the DC potential applied to the electrodes, while ΦAC represents the peak amplitude of a superimposed AC potential. The AC potential varies periodically as a function of time (t) with a frequency ω. The frequency of the applied AC potential is typically in the radio-frequency (MHz) range. Accordingly, such ion guides are known as radio-frequency ion guides (RFIG). A suitable AC frequency is primarily determined by the ion mass or mass range to be conducted, and the geometry of the multipole device. These and other suitable or relevant variables known in the art may be included in the operating parameters of the ion transmission device of the present invention. Similarly, operating parameters may also include other appropriate values for other suitable ion transmission devices of the present invention.

Control of one or more of the foregoing operating parameters of the ion transmission device may be effected by, for example, controller 350 in signal communication with ion transmission device 300. Controller 350 may thereby apply or set one or more of the operating parameters of ion transmission device 300. Controller 350, or another suitable device, may also be configured to determine the current operating parameters or state of ion transmission device 300, such as by measuring, querying, or deriving said parameters from ion transmission device 300.

The oscillating AC potential applied to the multipole device, such as quadrupole 300, creates a dynamic electric field environment. For a given AC peak voltage, AC frequency, and quadrupole geometry, ions of a certain mass range can maintain stable trajectories and are thereby conducted to the exit of the multipole. Other species, such as those with unstable trajectories or non-charged species, will fail to be conducted to the exit and will exit the multipole at other locations.

In preferred embodiments of the present invention, quadrupole 300 of FIG. 17 functions as a multipole ion guide. In such a multipole ion guide, only the AC potential component is applied to the electrodes, whereas the DC potential component (i.e., ΦA in Eqs. 1 and 2) is essentially zero. Accordingly, for multipole ion guides the generalized equations above may be reduced to the following equations:

$$\Phi_A = +\Phi_{AC}\cos(\omega t) \qquad \text{(Eq. 3)}$$

$$\Phi_B = -\Phi_{AC}\cos(\omega t) \qquad \text{(Eq. 4)}$$

Multipole ion guides still exhibit some mass selectivity, although significantly lower than that of a mass filter, and thereby conduct a broader range of ions masses. In certain embodiments and applications of the present invention, such broad permissibility of ion transmission is preferable and advantageous. For example, a multipole ion guide that provides a broad range of ion masses is preferable when the ions exiting the ion transmission device are subject to subsequent mass analysis, such as by a time-of-flight mass analyzer. Therefore, it is even more preferable under these and other circumstances to have an even broader range of ion masses transmitted by the ion guide. Accordingly, it is desirable to improve upon even the lower mass selectivity of the multipole ion guide.

In some embodiments of the present invention, quadrupole 300 of FIG. 17 functions as a multipole mass filter. In such a mass filter, the applied potential has non-zero DC and AC potential components concurrently applied to the electrodes. In multipole mass filters, in contrast to multipole ion guides described above, only a relatively narrow range of ion masses can achieve stable trajectories within the multipole device. As a result, this narrow range of ion masses is thereby selected for conduction by the multipole mass filter.

In an exemplary apparatus of the present invention, the apparatus includes a RFIG in ion communication with an ion source. The RFIG is a multipole ion guide having properties similar to ion guide 300 depicted in FIG. 17. The ion source includes systems or methods for the electrostatic extraction of ion therefrom, similar to ion source 200 depicted in FIG. 2. As described in further detail below, both the ion source and the ion transmission device of this exemplary apparatus exhibit mass-dependent behavior that may result in selective transmission of the affected ion population. Previous methods and apparatus were significantly limited in their ability to remedy this problem. In contrast, methods and apparatus of the present invention provide improvement and advantages over these earlier approaches.

As a result of this mass-dependent behavior of the RFIG, the population of ions in the ion current exiting the ion transmission device may be less diverse and have lower partial ion currents than the ion population that enters the device. In certain applications of the present invention, such as time-of-flight mass analysis, this diminishment of the ion current may have considerable impact on the mass analysis results. For example, a poorer partial ion current may result in a lower TOF signal.

The foregoing limitation may be partially addressed by "ramping" one or more appropriate parameters of the ion transmission device. In this technique, different sets of operating parameters are applied to the RFIG in sequence. For example, an AC potential having a peak amplitude of $\Phi AC\_1$ is applied to the RFIG over a first period of time. Following this first period, a peak amplitude of $\Phi AC\_2$ is applied in a second period. Other additional intervals in which different operating parameters are applied to the RFIG may follow in a like manner. In each interval, a different range of ion masses may be stably conducted by the RFIG. By allowing the RFIG to operate under multiple operating parameters, the RFIG may cumulatively conduct a broader range of ion masses than would be possible under a single set of operating parameters. As a result, the cumulative ion current of the ion transmission device may be improved accordingly.

FIGS. 18A-D illustrate, in principle, a prophetic example of mass selectivity in a representative RFIG of the present invention. In this example, the distributions of ion masses (i.e., m1, m2, and m3) that are conducted by the RFIG at three different peak AC amplitudes (i.e., $\Phi AC\_1$, $\Phi AC\_2$, and $\Phi AC\_3$) are shown. In FIG. 18A, an exemplary time-course of the peak AC amplitude as applied to an RFIG is shown. In a first time interval, when the peak AC amplitude is $\Phi AC\_1$, the RFIG conducts a mass range of ions distributed around mass m1, as shown in FIG. 18B. Likewise in FIG. 18C, when the RFIG is ramped to $\Phi AC\_2$ during a second time interval, a different mass range, now centered around mass m2, is preferably conducted. At a third time interval, the peak AC amplitude of $\Phi AC\_3$ results in the conduction of the mass range m3 as shown in FIG. 18D. Repeating this ramping cycle, such as by reapplication of the $\Phi AC\_1$ peak amplitude to the RFIG, results again in conduction of mass range m1. As a result, there is no single set of ion guide operating parameters, such as a value for SAC, at which the RFIG can conduct efficiently the entire range of ion masses that are shown in FIGS. 18B-18D.

However, certain heretofore unaddressed shortcomings remain despite the use of ramping. Most significantly, ramping the ion transmission device may not improve partial ion currents if the precedent ion source providing the ions is the limiting factor. For example, if the preceding ion source provides only a narrow range of ion masses to the ion transmission device, ramping the RFIG to allow conduction of ions outside of this narrow range will not result in improved ion current for that mass range.

Moreover, the above limitation of the ion source is particularly apparent because of the demonstrated mass dependence of ion sources. For example, in ion sources in which ions are extracted electrostatically, ions are not extracted with uniform efficiency. Other ion sources may also demonstrate such mass dependence and therefore behave in a similar manner. An example of this ion source behavior is described below.

Figure 19A:
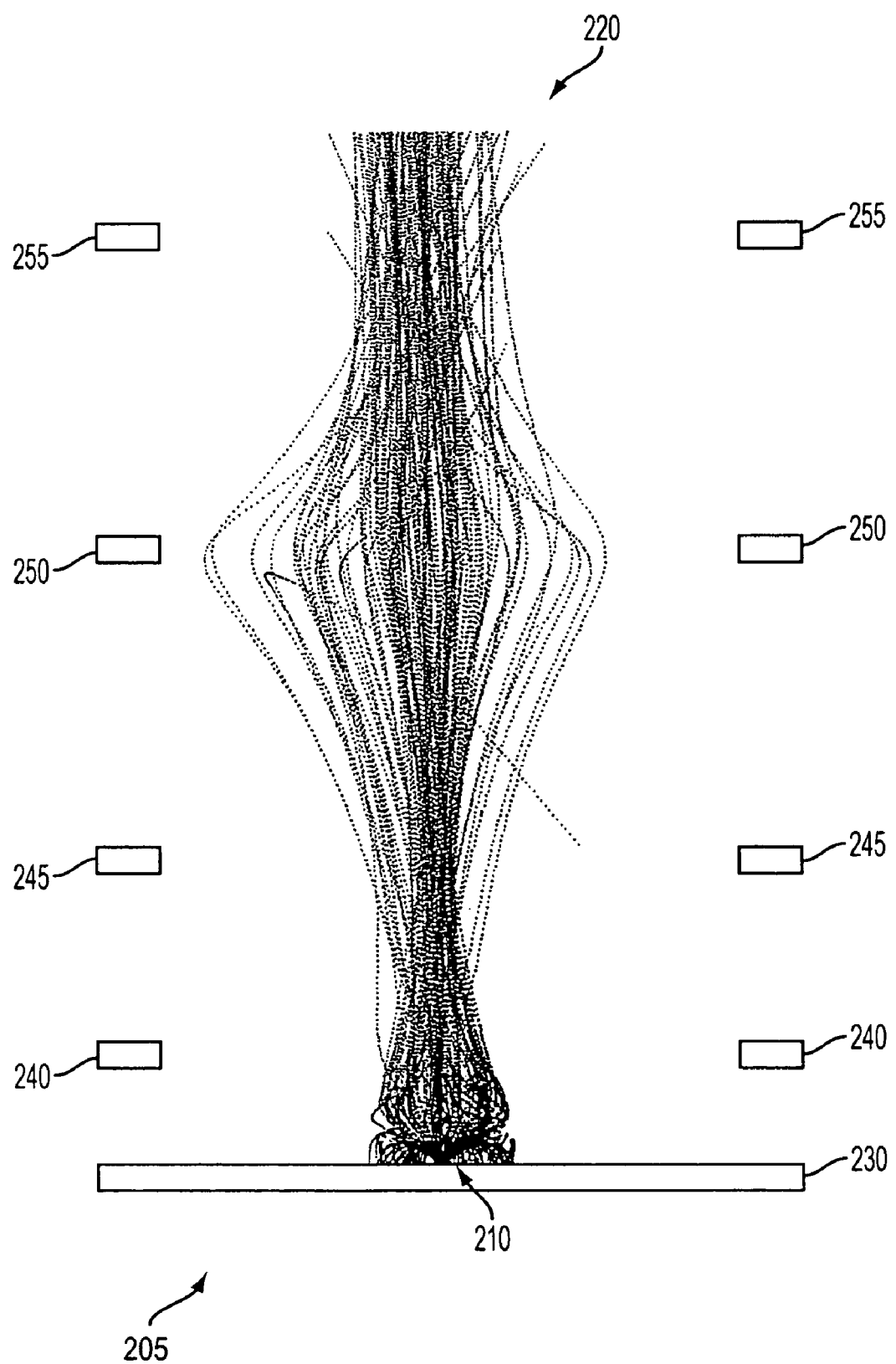
FIGS. 19A-19C are exemplary ion trajectory simulations in an ion source in an embodiment of the present invention.
Figure 19B:
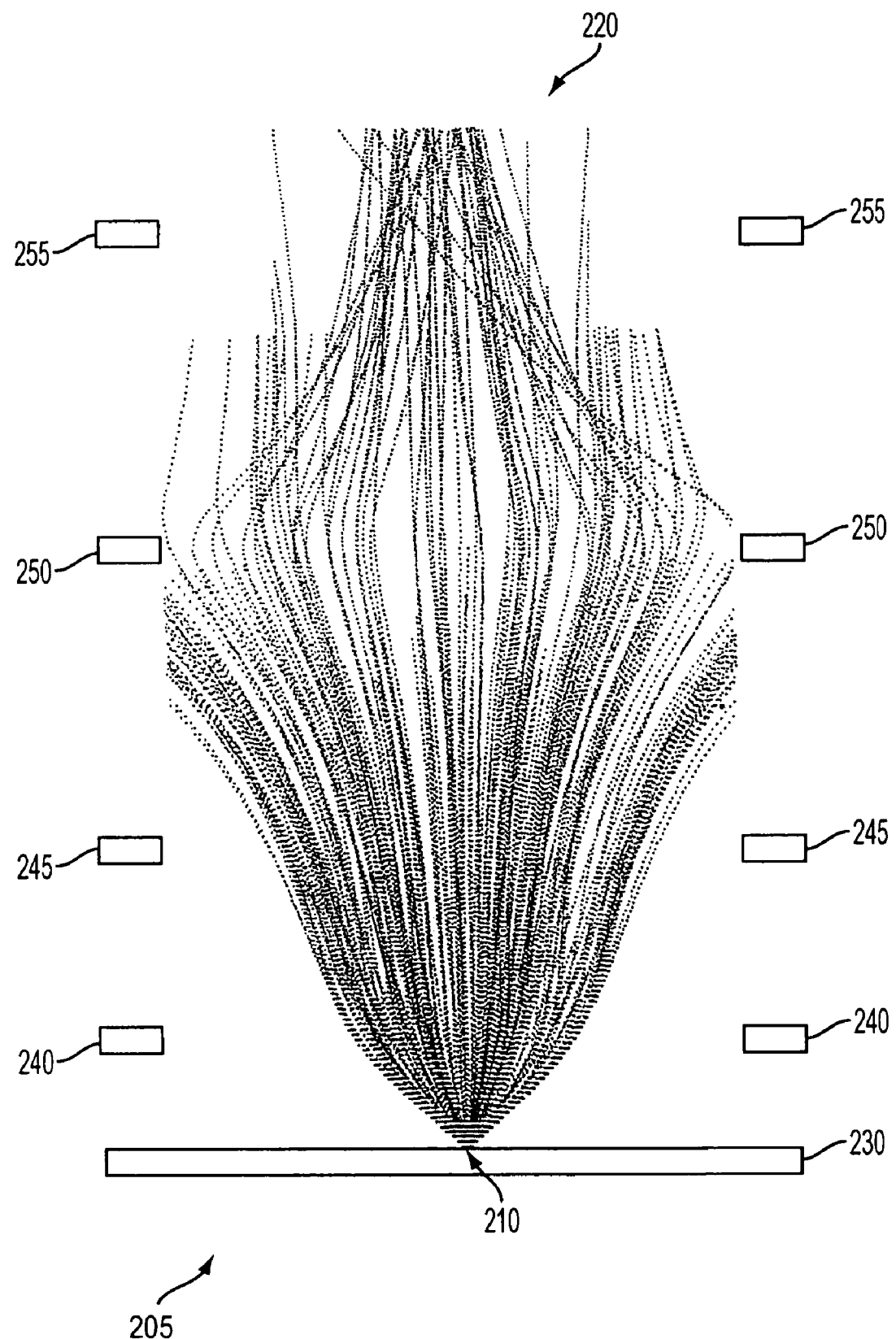
Figure 19C:
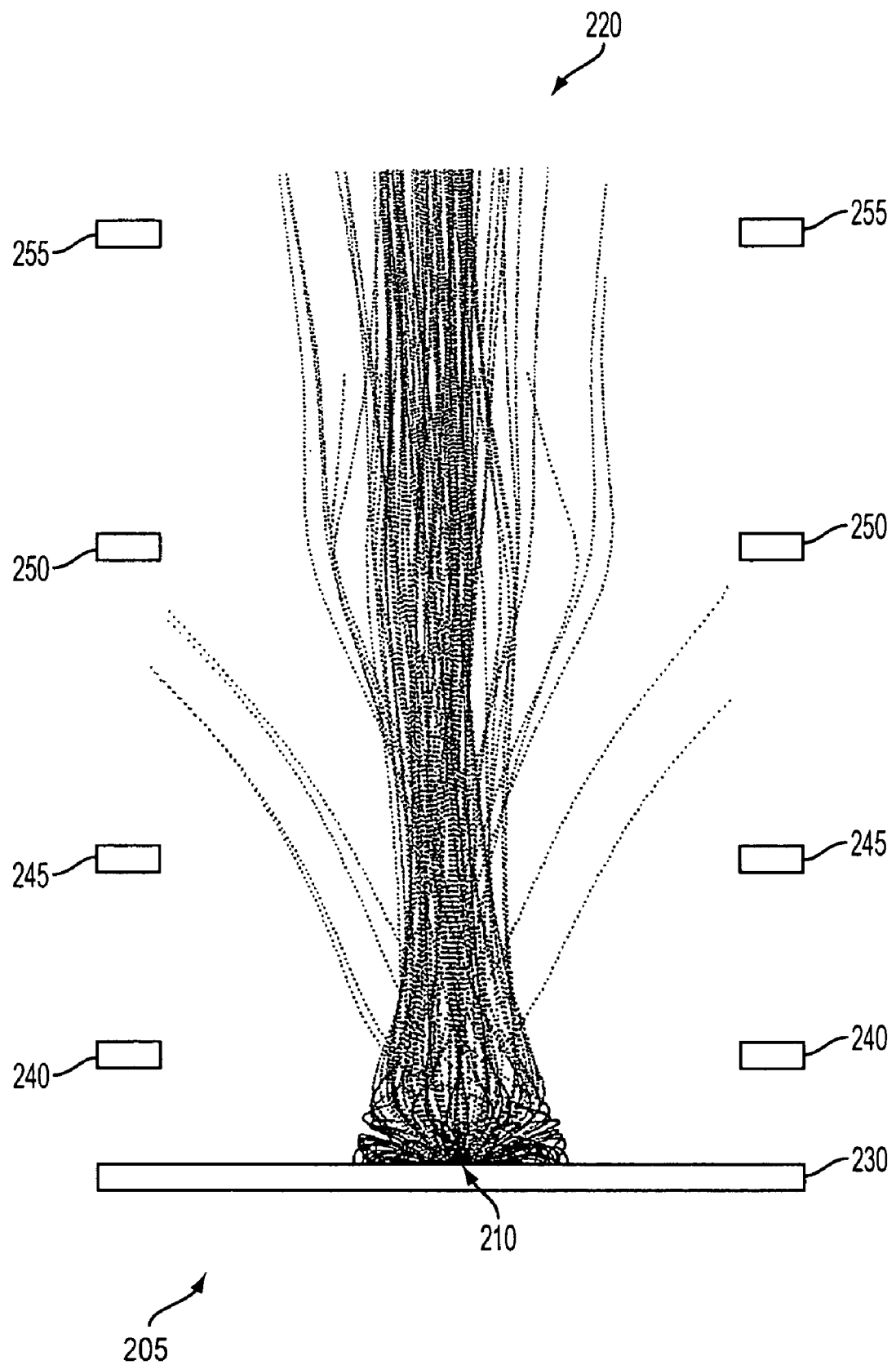

Referring to FIGS. 19A-C, an exemplary ion source of the present invention is depicted. Ion source 205 (as described above in relation to FIG. 16) includes electrodes 230-255. Ions are generated at introduction point 210 and are intended to exit via ion exit 220 in order to proceed to subsequent devices. In certain embodiments of the present invention, an ion transmission device including a RFIG may be positioned to receive ions exiting the ion source.

Each of FIGS. 19A-C depicts simulated ion trajectories within the ion source of the present invention. For the ion source in each figure, a set of operating parameters have been applied to the ion source, specifically a set of DC potentials that have been applied to each of the ion source electrodes. Under these conditions, a plurality of ions are introduced at approximately introduction point 210 and, as a result, undergo deflection and other accelerations subject to the imposed electric field and, if present, collisions with a background gas. In this stochastic model, the efficiency of ion extraction at ion exit 220 can be assessed based on the number of simulated ion trajectories that exit successfully via ion exit 220.

The simulation depicted in FIGS. 19A-C were performed using methods such as those described in the following references: Andreas Hieke, "GEMIOS—a 64-Bit multi-physics Gas and Electromagnetic Ion Optical Simulator", Proceedings of the 51st Conference on Mass Spectrometry and Allied Topics (Jun. 8-12, 2003, Montréal, PQ, Canada); Andreas Hieke "Theoretical and Implementational Aspects of an Advanced 3D Gas and Electromagnetic Ion Optical Simulator Interfacing with ANSYS Multiphysics", Proceedings of the International Congress on FEM Technology, pp. 1.6.13 (Nov. 12-14, 2003, Potsdam, Germany); Andreas Hieke, "Development of an Advanced Simulation System for the Analysis of Particle Dynamics in LASER based Protein Ion Sources", Proceedings of the 2004 NSTI Nanotechnology Conference and Trade Show Nanotech 2004 (Mar. 7-11, 2004, Boston, Mass., U.S.A). Other suitable programs, algorithms, methods, and the like that are known in the art may also be used to perform simulations such as those described herein.

As set forth in Table 1, the simulation was conducted with the listed potential values applied to the corresponding electrodes, while simulating the trajectories of ions having the listed mass.

TABLE I

|  | FIG. 5A | FIG. 5B | FIG. 5C |
|---|---|---|---|
| Ion Mass m | 1000 u | 10000 u | 10000 u |
| Potential φ on Electrode 230 | 40 V | 40 V | 70 V |
| Potential φ on Electrodes 240 | 52 V | 52 V | 122 V |
| Potential φ on Electrodes 245 | 0 V | 0 V | 0 V |
| Potential φ on Electrodes 250 | 40 V | 40 V | 70 V |
| Potential φ on Electrodes 255 | 0 V | 0 V | 0 V |

FIGS. 19A and 19B both depict ion source 205 under the same electrostatic and pneumatic conditions, as shown in Table 1. However, each of these figures illustrates the trajectories of a different ionic species. In FIG. 19A, trajectories of ions having mass m=1000 u are shown. In FIG. 19B, trajectories of ions having mass m=10000 u are shown.

Referring to FIG. 19A, under the operating parameters listed in Table 1, the simulation predicts that nearly all of the ions having mass of 1000 u are expected to exit the ion source at exit 220. In contrast, FIG. 19B depicts that under the same set of operating parameters the ions having a mass of 10000 u are extracted with a significantly lower efficiency. Therefore, under these operational conditions, if a diverse population of ions of varying mass were introduced into ion source 205, those having mass 1000 u are more efficiently extracted than those of mass 10000 u).

As a result of this mass-dependent efficiency of ion extraction at the ion source, such differences may be propagated to later components, such as an RFIG in an ion transmission device. Accordingly, the partial ion current of the heavier ions (i.e., those around 10000 u) is expected to be lower than that of the lighter ions (i.e., those around 1000 u). Furthermore, because this difference originates in the ion source, ramping or otherwise changing the operating parameters of the subsequent RFIG may not significantly improve the partial current.

However, the simulations reveals a different result in FIG. 19C. In this figure, a different set of DC potentials have been applied to ion source 205. Under this different set of operating parameters, ions having a mass of 10000 u are now extracted with a much greater efficiency. These simulations demonstrate that these and other ion sources exhibit a mass dependency during ion extraction. Therefore, if ions of a particular mass range are desired, the yield of such ions can be improved by changing the operating parameters of the ion source.

However, despite this mass dependency of the ion source, ion source operating parameters were not previously changed during its operation of the apparatus. Instead, the operating parameters that were applied to the ion source were maintained regardless of the ion current and the operating parameters of the subsequent ion transmission device. As is evident from the examples provided in FIGS. 19A-C, no single set of operating parameters of the ion source is suitable for all ion masses.

Therefore, even if the RFIG of the ion transmission device were ramped to cover a broader mass range, such practices were not completely effective because the ion source was often not providing ions of suitable masses.

The methods and apparatus of the present invention solves these and other problems. By coordinating the respective operating parameters of both the ion source and the ion transmission device, the present invention may ensure that the ions provided by the ion source are commensurate with the ions conducted by the ion transmission device.

For example, a RFIG included in an ion transmission device of the present invention is configured with operating parameters such that it preferentially conduct ions of a particular mass range. In accordance with the present invention, this set of RFIG operating parameters is coordinated with a set of corresponding operating parameters that are applied to the ion source. As a result of this coordination, the ion source is configured to efficiently extract and thereby provide ions having substantially the same particular mass range as those preferentially conducted by the RFIG. This coordination, therefore, may result in a significantly improved ion current for the particular mass range of ions.

In a further example in accordance with the present invention, a different set of operating parameters may now be applied to the RFIG, thereby resulting in the preferential conduction of a different mass of ions. Such changes occur during the practice of ramping, as described above. To maintain coordination in accordance with the present invention, a second set of operating parameters is now applied to the ion source, whereby the second set corresponds to the second set applied to the RFIG. Under this second set of operating parameters, the ion guide may now provide a different mass range of ions that matches those now being conducted by the RFIG.

Therefore, the present invention provides a significant improvement to the practice of ramping the RFIG of an ion transmission device. For example, at each ramping interval of the RFIG, the ion source may be correspondingly reconfigured with applied operating parameters such that the masses or other characteristics of the ions provided by the ion source match those that are to be conducted by the RFIG. This method of the present invention may therefore increase the ion current over a broad range of masses, particularly when compared to ramping the RFIG alone.

An example of coordinating the operating parameters of different components, in accordance with the present invention, is depicted in FIGS. 18E-J. These FIGS. 18E-J illustrate, in principle, a prophetic example of coordination of a RFIG and an ion source, in conjunction with a prophetic example of resulting mass selectivity. In the example of FIGS. 18G-J, as described above in relation to FIGS. 18A-D, the distributions of ion masses (i.e., m1, m2, and m3) that are conducted by the RFIG at three different peak AC amplitudes (i.e., $\Phi AC\_1$, $\Phi AC\_2$, and $\Phi AC\_3$) are shown. FIG. 18G shows an exemplary time-course of the peak AC amplitude as applied to an RFIG. FIGS. 18E and 18F show concurrent time-courses of representative DC potentials (i.e., $\Phi 1$ and $\Phi 2$) applied respectively to two discrete electrodes within an ion source. In accordance with the present invention, the potentials applied to each of the ion source electrodes (as shown in FIGS. 18E and 18F) are coordinated with the ramping of the RFIG (as shown in FIG. 18G). In this example, when $\Phi AC\_1$ is applied to the RFIG as shown in FIG. 18G, ion source electrodes are coordinated accordingly by the application of DC potentials $\Phi 1\_1$ and $\Phi 2\_1$, as respectively depicted in FIGS. 18E and 18F. In some embodiments, as described herein, the operating parameter values used in this coordination may be predetermined. In each following time interval, the change in $\Phi AC$ resulting from the ramping of the RFIG (as in FIG. 18G) is coordinated by changes to $\Phi 1$ and $\Phi 2$ (FIGS. 18F and 18G, respectively) in the respective ion source electrodes. This exemplary coordination may result in improved ion current for the mass range that are preferably conducted by the RFIG at each time interval.

Figure 20:
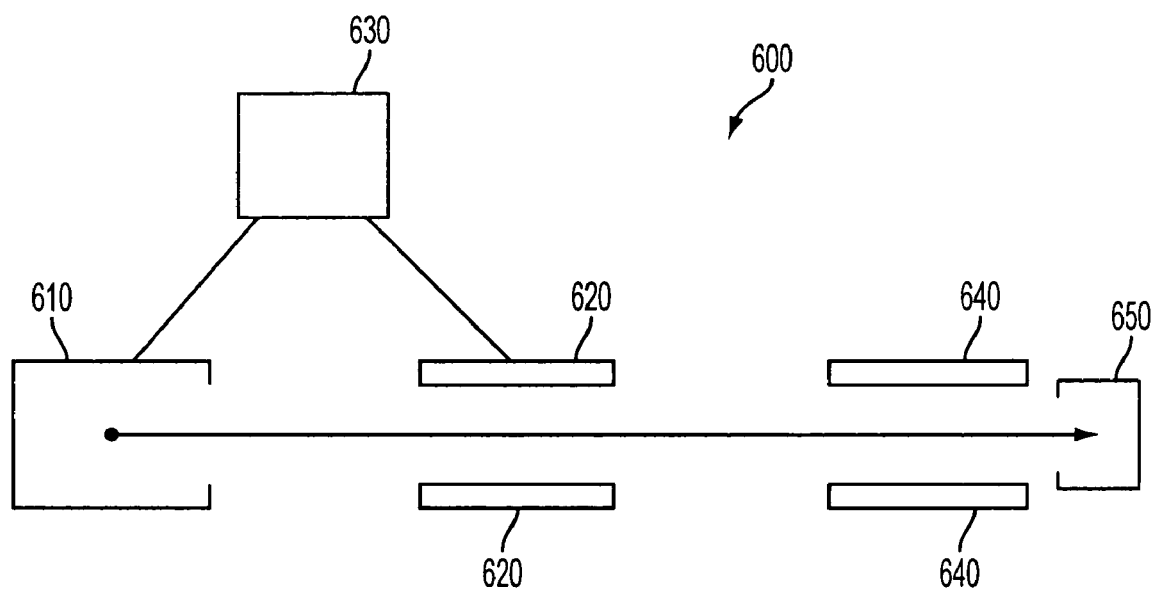
FIG. 20 is a schematic view of an exemplary apparatus of an embodiment of the present invention.

An example apparatus of the present invention is depicted in FIG. 20. Apparatus 600 includes ion source 610, RFIG 620, mass analyzer 640, ion detector 650, and controller 630. The ion source, the RFIG, the mass analyzer, and the ion detector are in sequential ion communication. In certain embodiments of the present invention, mass analyzer 640 may include any suitable mass analyzer, such as a quadrupole mass filter, a reflectron, a time-of-flight mass analyzer, an electric sector time-of-flight mass analyzer, a triple quadrupole apparatus, a Fourier transform ion cyclotron resonance mass analyzer, a magnetic sector mass analyzer, or other suitable mass analyzers known in the art.

Mass analyzer 640 may also be any suitable TOF apparatus known in the art, such as an electric sector TOF apparatus, a multi-electric sector TOF apparatus (such as a quadruple electric sector TOF apparatus), a reflectron, and other known TOF mass analyzers and suitable combinations thereof. RFIG 620 may include any known multipole ion guide known in the art, including quadrupoles, hexapoles, octopoles, and the like. Alternatively, or in addition, RFIG 620 may also include other suitable devices in serial ion communication with the RFIG, such as collision cells, electrostatic lenses, and the like. In some embodiments of the present invention, apparatus 600, like apparatus 105 of FIG. 15, may be a single-stage mass spectrometer apparatus, in which RFIG 620 serves as an ion guide without performing mass analysis.

In some other embodiments of the present invention, apparatus 600, like apparatus 105 of FIG. 15, may be a tandem mass spectrometer, whereby apparatus 600 may comprise two or more mass analyzers. In some of such tandem mass spectrometer embodiments of the present invention, mass analyzer 640 of apparatus 600 may include a tandem mass analyzer. For example, mass analyzer 640 can be selected from the group consisting of a quadrupole-TOF MS, an ion trap MS, an ion trap TOF MS, a TOF-TOF MS, a Fourier transform ion cyclotron resonance MS, with an orthogonal acceleration quadrupole-TOF MS a particularly useful embodiment.

In other tandem mass spectrometer embodiments of the present invention, both RFIG 620 and mass analyzer 640 may each include one or more mass analyzers. For example, RFIG 620 may include a first mass analyzer and mass analyzer 640 may include a second mass analyzer. In some of such embodiments, the first mass analyzer also serves to function as an ion transmission device of RFIG 620.

In other of such embodiments, RFIG 620 further includes one or more mass analyzers and one or more ion guides, whereby said mass analyzers and ion guides function together as RFIG 620. For example, RFIG 620 may include a RFIG in serial communication with a quadrupole mass filter, an ion trap, or other mass analyzers as are known in the art. Alternatively, or in addition, in some embodiments mass analyzer 640 may include more than one mass analyzer components situated in tandem. A suitable tandem mass spectrometer can be selected from the group consisting of a quadrupole-TOF MS, an ion trap MS, an ion trap TOF MS, a TOF-TOF MS, a Fourier transform ion cyclotron resonance MS, with an orthogonal acceleration quadrupole-TOF MS a particularly useful embodiment Ion detector 650 which may include systems or methods for detecting ions and amplifying their signals that are known in the art. For example, ion detector 650 may include continuous electron multipliers, discrete dynode electron multipliers, scintillation counters, Faraday cups, photomultiplier tubes, and the like. Ion detector 650 may also include systems or methods for recording ions detected therein, such as a computer or other electronic apparatus Controller 630 is in signal communication with ion source 610 and RFIG 620. In this example, controller 630 is configured to determine one or more of the operating parameters of RFIG 620 and apply one or more of the operating parameters to ion source 610. In this exemplary embodiment, controller 610 determines, for example, the peak amplitude of the AC potential applied to RFIG 620. This set of operating parameters is thus coordinated with that of the ion source by applying a corresponding set of operation parameters to the ion source including, for example, one or more DC potentials applied to its electrodes.

As described above, other conceivable controller configurations are envisioned to be within the scope of the present invention. For example, controller 630 may also be configured to determine one or more of the operating parameters of ion source 610, as well as apply one or more of the operating parameters to RFIG 620.

In some embodiments, controller 630 may include a digital computer, a microprocessor, and memory storage. In some embodiments, the memory storage may be used to store values for operating parameters, including predetermined values used in coordination. In some embodiments, controller 630 may also include a plurality of such computers, wherein at least one computer is in communication with ion source 610 and at least one other computer is in communication with ion transmission device 620. In some embodiments, one or more of these separately communicating computers may be in communication with each other.

Following this determination of the peak amplitude of the AC potential applied to RFIG 620, controller 630 may coordinate the operating parameters of ion source 610 with that of the RFIG. For example, the controller may coordinate the DC potentials applied to the electrodes of the ion source with the peak AC amplitude on the RFIG. Such coordination may also involve calculation of one or more values for operational parameters based on other operating parameters that have been determine or measured.

In some embodiments, controller 630 may calculate the appropriate ion source operating parameters, use predetermined operating parameters, or suitable combinations thereof. In addition, predetermined operating parameters of ion source 610 may be derived from empirical observations, experimental determinations, computer-based simulations, mathematical calculations, and other suitable methods and combinations thereof.

Figure 21:
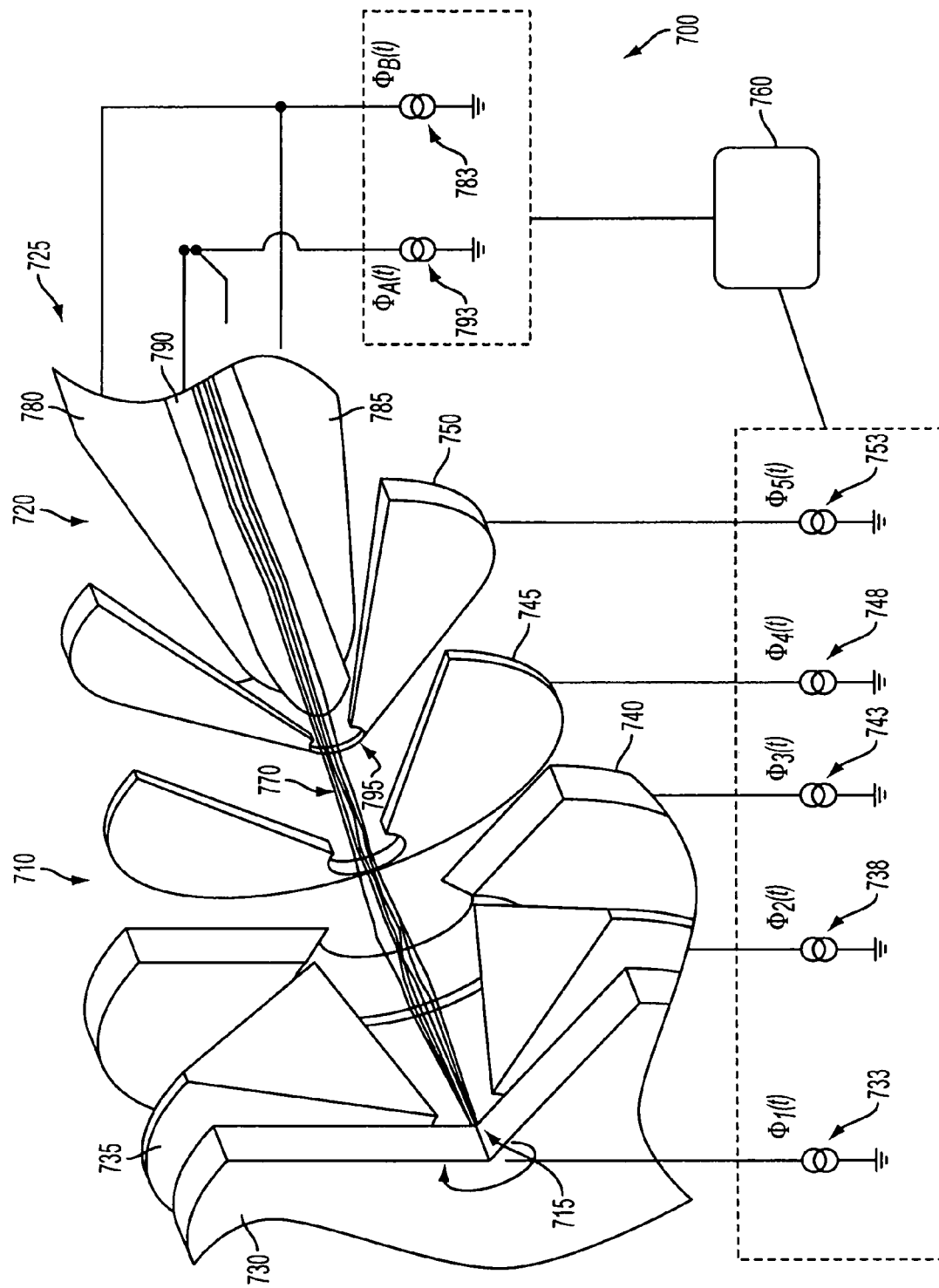
FIG. 21 is a perspective view of an axial cut-away of an embodiment of the present invention, showing an exemplary ion source in operable alignment with an exemplary multipole device, and further showing exemplary simulated ion trajectories.

Referring to FIG. 21, a perspective cut-away view of a preferred embodiment of the present invention is depicted. Apparatus 700 of the present invention includes ion source 710, in which mobile ions are generated. Ion source 710 may include any suitable systems or methods for generating ions known in the art, including those described hereinabove with respect to ion sources 110, 205, and 610. In the configuration depicted in FIG. 7, ions are preferably introduced into or generated in the ion source at a location substantially near ion generation point 715. For example, ion generation point 715 may represent the point at which laser desorption/ionization occurs in suitable ion sources.

Ion source 710 further may comprise basal electrode 730 and axisymmetric electrodes 735, 740, 745, and 750. Voltage potentials may be applied to some or all of these electrodes. The electric field resulting from these electrodes may affect the potentials experienced by the ions within the ion source. For example, potentials may be applied to the electrodes of ion source 710 in a manner such that ions are accelerated and deflected towards ion source exit 795. Voltage potentials on each of the ion source electrodes are applied by potential sources 733, 738, 743, 748, and 753 in the manner depicted. The foregoing potential sources may apply DC potentials, AC potentials, or any other arbitrarily time-dependent waveform or suitable combinations thereof to their respective electrodes.

Apparatus 700 also includes ion transmission device 720 suitable for conducting mobile ions extracted and received from ion source 710 via ion source exit 795. In the preferred embodiment depicted in FIG. 7, ion transmission device 720 includes quadrupole radio-frequency ion guide 725, for which three of its electrodes are depicted (electrodes 780, 785, and 790). The fourth electrode has been omitted for purposes of clarity. Electrodes 780 and 785 are paired such that potential source 783 applies a common potential to both electrodes. Similarly, electrode 790 and the omitted electrode are commonly served by potential source 793.

In accordance with the preferred invention, the respective operating parameters of ion source 710 and ion transmission device 720 are coordinated in order to effect control of the ion current. Such coordination may be performed by controller 760 in signal communication with one or more of the potential sources as shown.

In an example, ions may be generated in ion source 710 at ion generation point 715. Application of a given set of operating parameters to electrodes 730, 735, 740, 745, and 750 can result in acceleration and extraction of ions of a given mass range towards ion source exit 795. Ions that exit in this manner can therefore enter multipole RFIG 725 of ion transmission device 720. Ion transmission device 720, having operating parameters that are coordinated with those of ion source 710, is configured to conduct ions having approximately the same or overlapping mass range. Accordingly, such ions are thereby conducted through multipole RFIG.

Exemplary simulated ion trajectories within the ion source and the ion transmission device, as indicated by reference numeral 770, are depicted.

In some embodiments, ion source 710 may use superposed electrostatic and gas flow fields, as further described and claimed in the commonly owned patent application filed concurrently herewith by Andreas Hieke, entitled "Ion Source With Controlled Superposition Of Electrostatic And Gas Flow Fields", the disclosure of which is incorporated herein by reference in its entirety.

In another aspect of the present invention, existing apparatus may be upgraded, retrofitted, or otherwise modified in accordance with the methods and apparatus of the present invention. For example, a prior or existing apparatus may lack a controller suitable for coordinating the ion source and the ion transmission device. Accordingly, it is envisioned that installing such a suitably configured controller would provide an apparatus in accordance with the present invention.

In another embodiment, an existing apparatus may have a controller that is not configured for coordination operating parameters. In accordance with the present invention, this existing apparatus may thus be properly configured such that it is able to conduct configurations of operating parameters in the manner described above.

In another embodiment, an existing apparatus may have a controller that is not configured for coordination operating parameters. In accordance with the present invention, this existing apparatus may thus be properly configured such that it is able to conduct configurations of operating parameters in the manner described above.

In some embodiments of the present invention the ion source may use a plurality of electro-pneumatic elements and the ion source may be in ion communication with a RF-multipole ion guide and the electro-pneumatic superposition may be stepwise synchronized to the corresponding mass-to-charge ranges at which the RF-multipole ion guide is operating or at which the RF-mass filter is active. In some embodiments coordination/synchronization may involve stepping DC potentials on the electro-pneumatic elements. In some embodiments the synchronization may occur as a continuous function in contrast with step function synchronization.

In some embodiments the ion source may use a plurality of electro-pneumatic elements and the ion source may be in ion communication with an ion trap, and the goal of the coordination/synchronization is to optimize electro-pneumatic superposition inside the ion source such that the mass-to-charge range at which the ion trap is trapping is maximally utilized. The coordination/synchronization may involve stepwise changing or continuous ramping of DC potentials on the electro-pneumatic elements.

Charge Injection

Overview

Aspects of the present invention address a significant problem associated with conventional MALDI, in the rate of ion generation is highly inefficient; the presently described "Charge-Injection" LDI/MALDI (CIN-LDI/CIN-MALDI) ion source technology achieves orders-of-magnitude higher sample ionization efficiency over conventional systems by exposing the ejected neutral sample molecules to a controlled and directed beam of stable, low molecular weight ions originating from an ion beam gun. By way of understanding terminology and usage herein, "CIN" is an acronym referencing "charge injection", and "CIN-ion gun", "CIN-gun", "CIN-ion source", and "CIN-source" all refer to a device that generates low molecular weight ions, typically being a type of duo-plasmatron, radio-frequency (RF), micro-wave, or Penning type ion gun. This approach yields improvements in data sensitivity of up to one or more orders of magnitude from minute amounts of biological macromolecules, with sample amounts as small as the deep sub-atto ($10^{-18}$) mole range. The described CIN-LDI/CIN-MALDI technology can also be used in conjunction with so called collisional (sample) ion cooling and electro-pneumatic superposition which can, in addition, reduce ion fragmentation, thereby addressing the second basic problem of conventional MALDI, that of molecular fragmentation and decay.

Typically a UV laser (sometimes IR) is fired at the crystals in the MALDI spot with typical pulse duration on the order of $t_{LP} \approx 10^{-9}$ to $10^{-8}$ s. The matrix molecules in the spot absorb the electromagnetic laser energy and it is thought that primarily the matrix is ionized by this event. The matrix is then thought to transfer part of their charge to the analyte (e.g. a protein), thus ionizing them while still protecting them from the disruptive energy of the laser. Ions observed after this process are typically ionized by the addition of a proton to [M+H]+ or the removal of a proton [M−H]−. MALDI generally produces singly-charged ions, but multiply-charged ions such as [M+2H]2+ have been observed specifically in conjunction with IR lasers. However, a thorough analysis of the budget of ions in a mass spectrometer shows that the total ionization efficiency of MALDI is very low.

Figure 22:
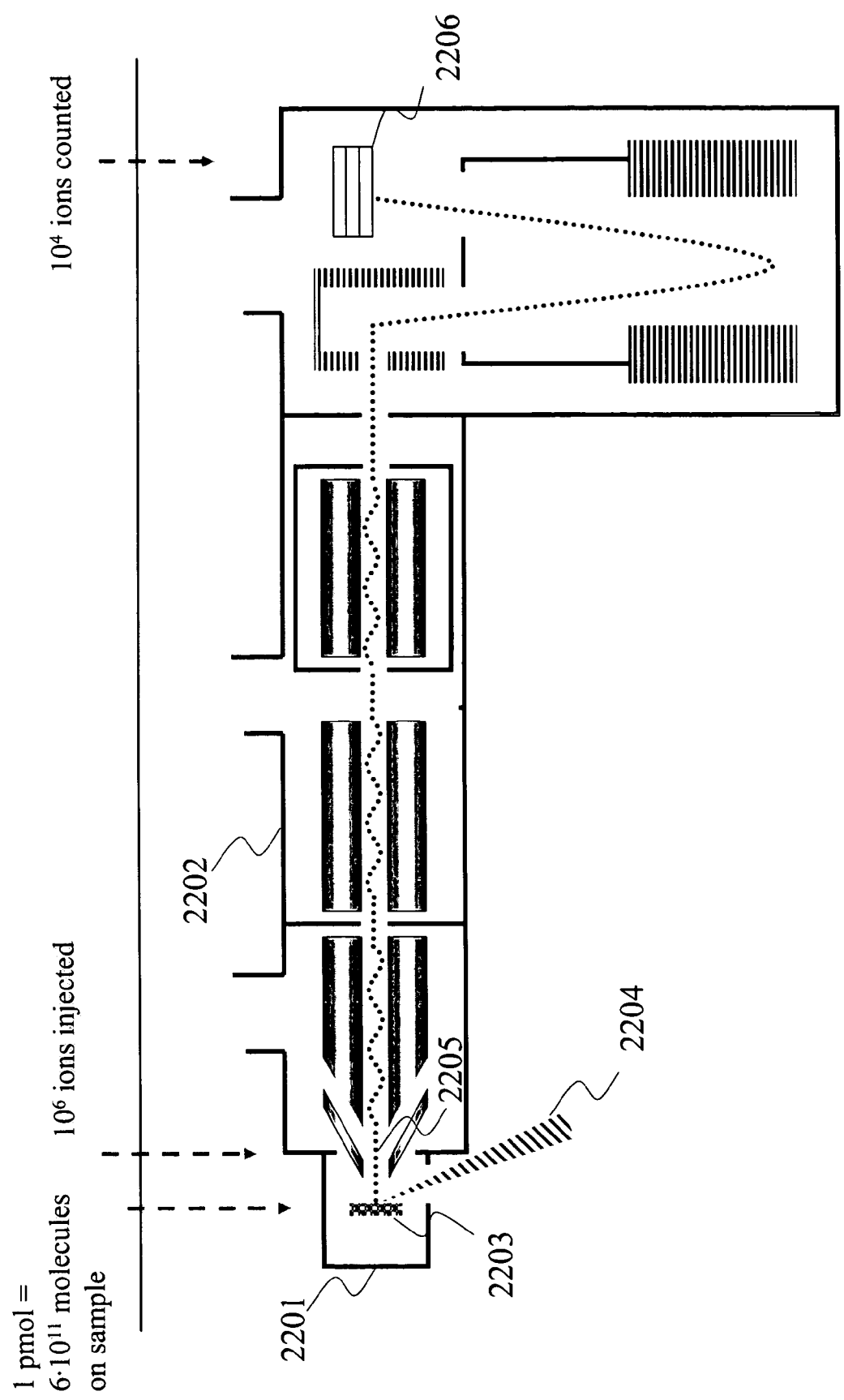
FIG. 22 is a simplified schematic overview of an ion budget in a conventional MALDI ion source connected to a triple-quad TOF mass spectrometer.

FIG. 22 shows a simplified schematic overview of a typical ion budget in a current MALDI ion source 2201 connected to a triple-quad TOF mass spectrometer 2202. The sample 2203 is exposed to pulses of laser radiation 2204 which generates sample ions 2205 which are introduced into the mass spectrometer 2202. After (selectively) passing through the mass spectrometer 2202, the ions 2205 are eventually detected and converted in electrical signals by the ion detector 2206, and electronically counted by connected equipment.

If, for example, in a conventional device as illustrated in FIG. 22, a sample of 1 pmol ($6 \cdot 10^{23} \cdot 10^{-12} = 6 \cdot 10^{11}$) of stable biological macromolecules with a mass on the order of $m=10^3$ u is introduced, an ion count on the order $10^4$ can be expected at the detector 2206. It is known that the total ion transmission efficiency of that particular type of mass spectrometer (including detector efficiency, duty cycle, quadrupole transmission etc.) is on the order of $10^{-2}$. This means that approximately only $10^6$ ions 2205 are transmitted from the MALDI ion source into the mass spectrometer.

Since the sample contains $6 \cdot 10^{11}$ molecules, the ionization efficiency is on the order of $10^6/6 \cdot 10^{11} \approx 1.6 \cdot 10^{-6}$. Thus, approximately only one sample molecule per million becomes an ion and is transmitted into the mass spectrometer. The ionization efficiency depends also on the total sample amount as well as many other more or less difficult to control parameters such as the matrix crystallization process, the matrix chemistry, laser operating parameters etc. However, even if this approximation would underestimate the ionization efficiency by one order of magnitude it is still apparent that a fundamental shortcoming of state-of-the-art MALDI is the lack of ionization efficiency. Further improvements in mass spectrometer performance can be helpful but have by far less potential than improvements on the ion source and its ionization efficiency. The creation and transfer of free charges to sample molecules in a conventional MALDI process can in fact be considered a byproduct.

Aspects of the present inventive CIN-LDI/CIN-MALDI system solve this problem by exposing the ejected neutral sample molecules to a controlled and directed low energy ion beam of stable, low molecular weight (CIN-beam) originating from an ion beam gun and causing a portion of the ions in the CIN-beam to collide-with and attach to the neutral sample molecules, thereby substantially increasing the total ionization efficiency.

In conventional MALDI systems, the samples to be investigated are typically placed on chips with specially prepared surface chemistry in order to support the MALDI/SELDI process—MALDI chips. The samples spots on these chips are arranged either linearly in a single row (1D MALDI chip) or in an orthogonal array of spots (2D MALDI chips). Further, typically, the specific shapes and sizes of 1D and 2D MALDI chips differ between manufacturers. This manufacturer-specific constraints on chips poses yet another shortcoming of conventional systems, whereby a user may not easily mix and match prepared chips with different instruments, and thereby be disallowed from exploiting the technical advantages of various systems.

Thus, embodiments of a larger inventive system of which the inventive LDI ion source is a part, may further include a self-adjusting holder and insertion system that is able to detect and adjust itself to the size, shape and type of inserted chip thereby freeing a user from having to use only one specific type of MALDI chips with a given LDI ion source. This aspect of the larger inventive system will be further described, in detail, in another application.

Detailed View

As noted above, the ionization efficiency of current LDI/MALDI ion sources is very low. A factor underlying this inefficiency, as the applicant has inventively recognized, is the lack of sufficient free charges and insufficient time and probability to transfer existing charges to created neutral sample molecules. In conventional MALDI ion sources, the available time for ionization is approximately only on the order of the duration of the laser pulse or slightly above ($t \approx 10^1$ ns). Thereafter, the plume expands and the few free charges in form of electrons and protons are rapidly extracted from the plume due their substantially lower mass-to-charge ratio m/q compared to sample ions of interest, with a typical $m/q \approx 10^2$ u/e to $10^5$ u/e.

Experimental results have shown that the velocities with which ions and neutrals are ejected from MALDI targets are on the order of $ve=10^2$ m/s to $10^3$ m/s. (See e.g. Volker Bökelmann, Bernhard Spengler and Raimund Kaufmann: "Dynamical parameters of ion ejection and ion formation in matrix-assisted laser desorption/ionization", Eur. Mass Spectrom. 1, 1995, page 81-93). With typical dimensions of MALDI ion sources being on the order of $10^{-2}$ m, the applicant has determined that a time interval of at least $t=10^{-4}$ second to $10^{-5}$ for interaction in certain embodiments with the charge injection beam would be available. Therefore, the inventive CIN-LDI/CIN-MALDI system hugely increases ionization efficiencies by providing a directed high density of free charges (injected CIN-ions) in a manner that increases the collision probability between the CIN-ions and the desorbed sample neutrals.

Figure 23:
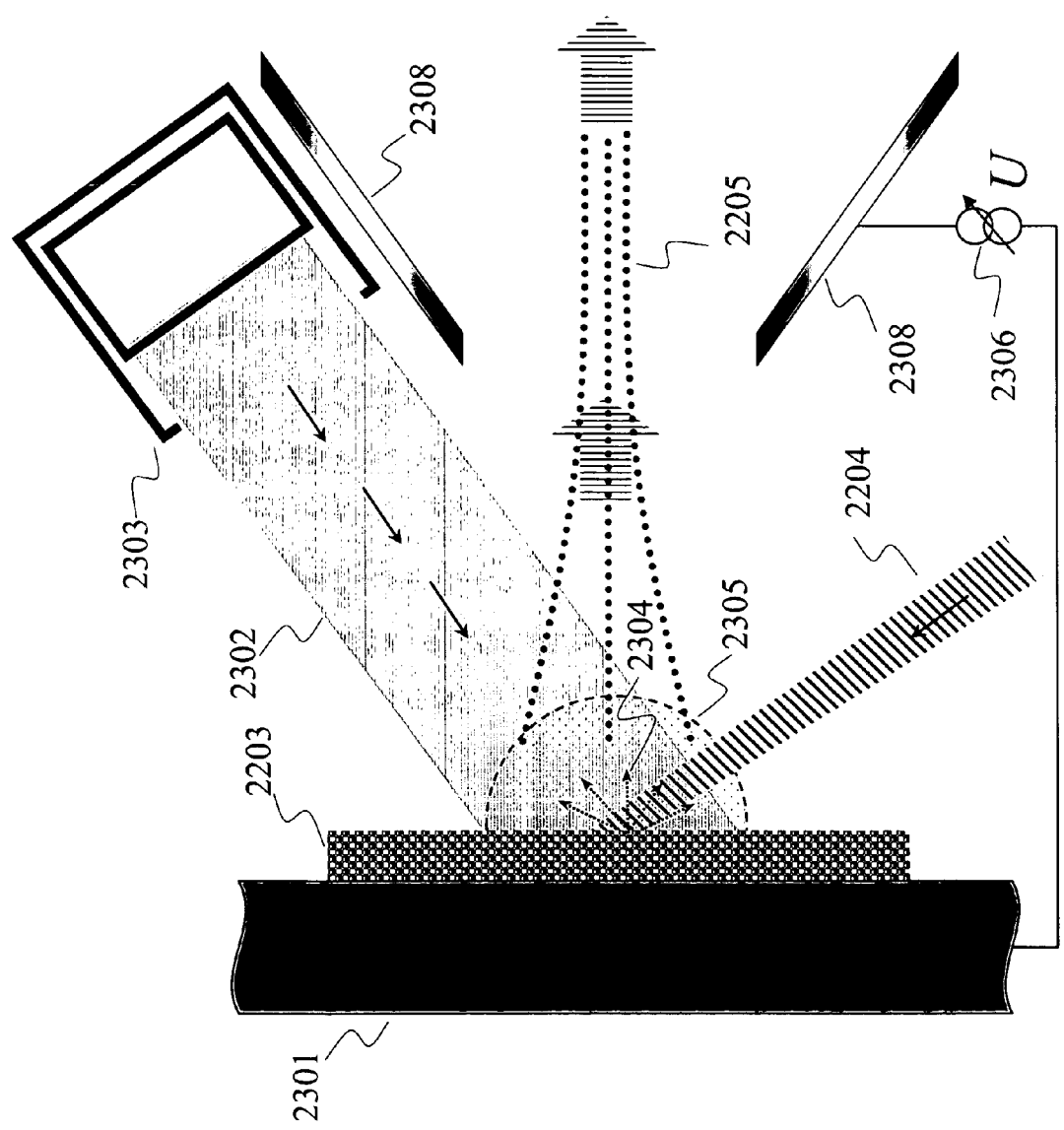
FIG. 23 depicts the design of an embodiment of a CIN-LDI/CIN-MALDI ion source comprising sample, CIN ion beam gun, CIN ion beam, and extraction electrodes.

As shown in FIG. 23 depicting an embodiment of the invention, a CIN-beam 2302 of stable low molecular weight ions (such as H [protons], He, Li, O, Ne, Na, Ar, K, Xe, etc.) originates from a dedicated ion beam gun 2303 (typically a duo-plasmatron, RF, Micro-Wave, or Penning type) which is either an integral part of the CIN-LDI/CIN-MALDI ion source or attached to it in a separable configuration. The ion source is not drawn to scale, and is substantially larger than illustrated. The CIN-beam is directed onto the same sample 2203 spot to which the laser beam 2204 is directed. The sample is typically deposited onto a carrier or chip 2301. The neutrals of the sample 2304 which are desorbed by the pulsed laser beam 2204 expand into the hemisphere 2305 above the chip 2301. Realistically, the expansion is non-isotropic and depends on the angle with which the laser is impinging, hence the illustrative approximation as a hemisphere only serves as simplified explanation. The irradiated sample region is exposed to an electric field generated by a variable voltage source 2306, thereby providing potential U to the at least partially conductive carrier or chip 2301 and typically axi-symmetric electrodes 2308 of appropriate shape enabling the extraction of sample ions 2205. If the carrier or chip 2301 is non conductive, an additional electrode behind the chip may be used to create the electric field. In most embodiments a plurality of electrodes and variable voltage sources will be used to create the required electric fields. These voltage sources may commonly reference to ground or be entirely or partially be stacked and floating on another potential, for example the potential present at the elements of a mass spectrometer into which the sample ions are injected.

An advantage of using a dedicated ion beam gun, per certain embodiments of the present invention, is that it enables (1) the generation and control high space charge densities, (2) spatial and temporal control and guidance of charges/ions with electric and/or magnetic field, and (3) synchronization of the charge injection with the laser operation. Typical achievable CIN-ion beam currents vary over several orders of magnitude (for example, $I=10^{-6}$ to $10^{-2}$ A) and depend on the actual gun design, the operating conditions and the ion type. High beam currents are generally desirable. For example, assuming an ejection velocity of $ve=5 \cdot 10^2$ m/s and in a 1st order, assuming isotropic velocity distribution, and further requiring that the ejected neutrals shall not have traveled more than $r_e=2.5 \cdot 10^{-3}$ m away from the sample surface (approximating the dimension of a CIN-beam diameter of $d=5 \cdot 10^{-3}$ m) a time of $t_i=(2.5 \cdot 10^{-3}$ m$)/(5 \cdot 10^2$ m/s$)=5 \cdot 10^{-6}$ s is interaction time between the neutrals and the CIN-ions is available. The number of charges injected by a current of $I=2 \cdot 10^{-3}$ A in the hemispherical volume 2305 defined by radius $r_e$ is approximately:

$$n \approx 1/e \cdot t_i \cdot I$$
$$\approx (1.6 \cdot 10^{-19} \text{ As})^{-1} \cdot 5 \cdot 10^{-6} \text{ s} \cdot 2 \cdot 10^{-3} \text{ A}$$
$$n \approx 6 \cdot 10^{10}$$

Assuming that 1 fmol ($=6 \cdot 10^{23-15}=6 \cdot 10^8$) of analyte molecules were deposited in the sample and desorbed by the laser pulse predominately as neutrals, the number of available charges exceeds the number of neutrals by two orders of magnitude.

Duo-plasmatron, RF, Micro-Wave, or Penning type ion guns suitable for the CIN-beam injection are commercially available (e.g. 'Oxford Scientific', SPECS, National Electrostatics Corp.) and may be easily modified to satisfy the requirements of this particular application. In certain embodiments, the optimal (kinetic) ion energy is relatively low, typically on the order of some $E_k=10$ to some $10^2$ eV. Since the kinetic energies of many ion guns are higher, in some embodiments ion beam deceleration may be required by means of additional retarding potentials. An example of such modification, if required, is described in Popova, et al.: "Construction and performance of a low energy ion gun", J. Vac. Sci. Technol. A21(2) March/April 2003, pp 401-403.

Figure 24:
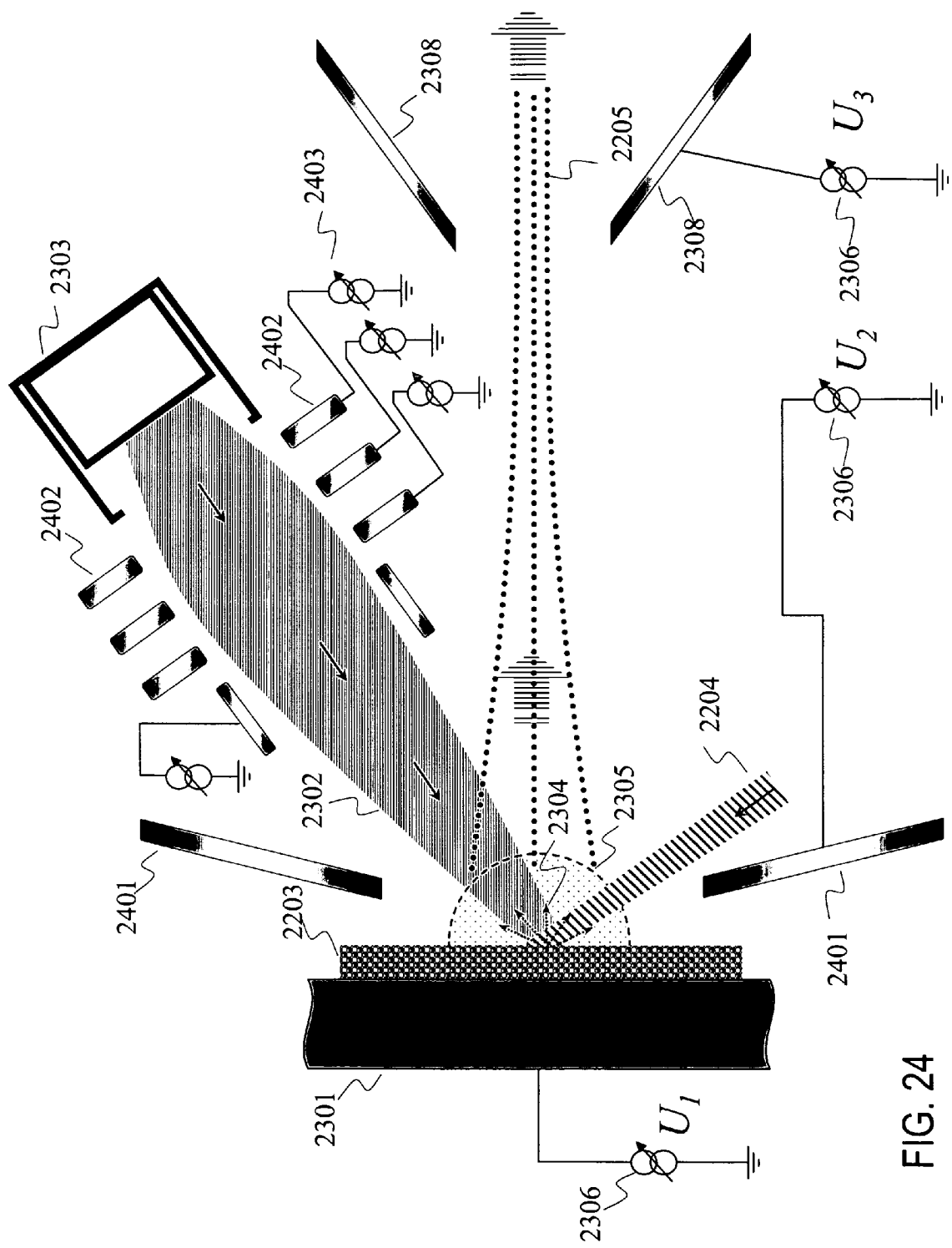
FIG. 24 depicts an example of a more complex configuration of an embodiment of a CIN-LDI/CIN-MALDI ion source with additional control of the CIN-beam in cases where such control may not be effected by the ion beam gun itself. A plurality of additional electrodes and variable voltage sources variously retard, accelerate, focus, modulate, or deflect the CIN-beam.

In FIG. 24, an example of a more complex configuration of an embodiment of the CIN-LDI/CIN-MALDI ion source is shown that enables additional control of the CIN-beam in cases where such control can not be effected by the ion beam gun itself. The example shows two electrodes 2308 and 2401 for sample ion extraction. It also shows a plurality of electrodes 2402 connected to additional variable voltage sources 2403 which can be used to retard or accelerate, focus, modulate, or deflect the CIN-beam.

Figure 25:
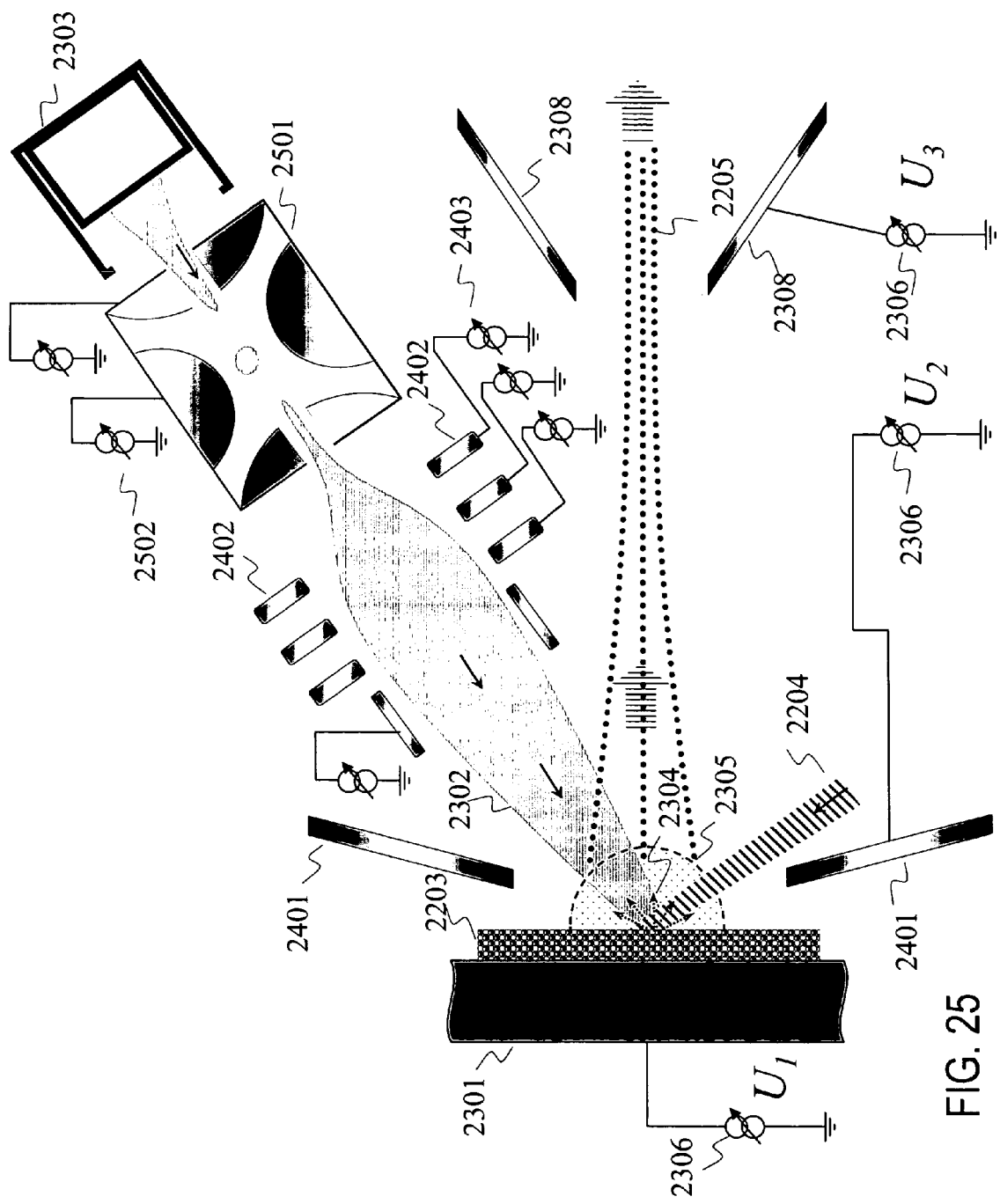
FIG. 25 depicts an embodiment of a CIN-LDI/CIN-MALDI ion source wherein a relatively weak CIN-beam is guided not directly onto the sample but into an 3D RF ion trap to accumulate large amounts of charge. The CIN-ions are then released in bunches from the trap and accelerated into the LDI/MALDI region synchronized with the laser pulses.

In FIG. 25 an embodiment of the present invention is depicted wherein a relatively weak CIN-beam is guided not directly onto the sample, but rather into an 3D RF ion trap 2501 to accumulate large amounts of charge. The ion trap 2501 is connected to a plurality of variable DC and AC voltage supplies 2502. The CIN-ions are then released in bunches from the trap and accelerated into the LDI/MALDI region synchronized with the laser pulses by means of the before mentioned electrodes 2402. Again, in this depiction all potentials on electrodes are referenced to ground which will not be the case in all applications. The potentials voltage supplies may be stacked and/or commonly floating on a supplied potential. The CIN-beam may be continuous, pulsed, or arbitrarily time-dependent modulated, preferably in a manner which is synchronized to the LDI laser(s) pulse(s).

Figure 26:
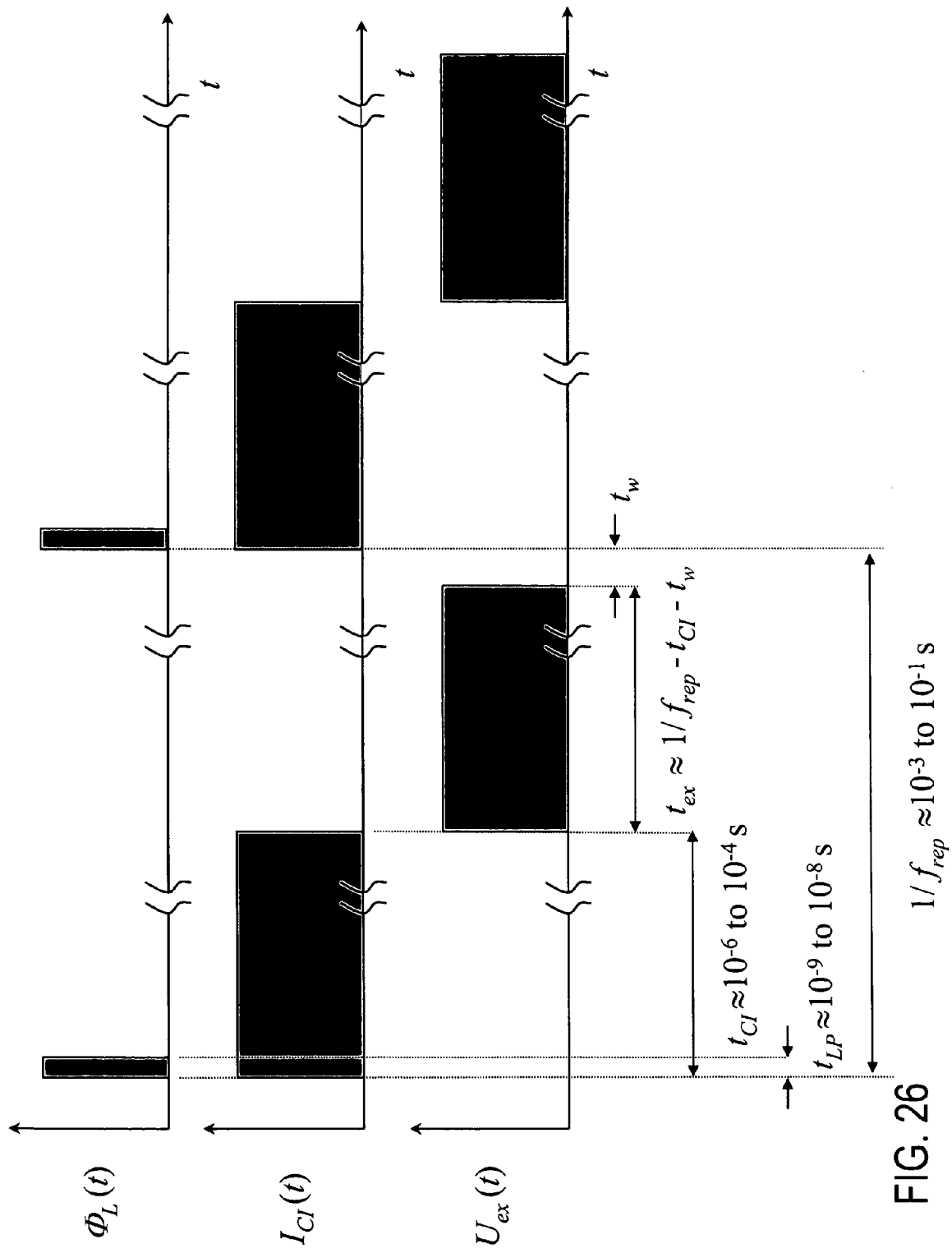
FIG. 26 depicts the timing and synchronization of laser radiant flux $\Phi L(t)$, CIN-beam current ICI(t) and sample ion extraction potential Uex(t).

In another embodiment of the invention, as illustrated in FIG. 26, the CIN-beam current $l_{CI}(t)$ is pulsed or modulated in a pulse-like arbitrarily time-dependent manner, and synchronized with the laser radiant flux $\Phi_L(t)$. As mentioned, typical duration times for the laser flux may be on the order of $t_{LP} \approx 10^{-9}$ to $10^{-8}$ second. The charge injection ($t_{CI}$) depends on the chosen velocity of the CIN-ions and a characteristic dimension of the plume region; typical values are on the order of $t_{CI} = 10^{-6}$ to $10^{-4}$ second.

In addition, the potentials on the sample and the sample ion extraction electrodes 2401 and 2308 in the CIN-LDI/CIN-MALDI ion source are synchronized. During the CIN ion injection the potentials on the sample and the electrodes, here referred to as $U_{ex}(t)$, are turned off, or floated, or changed such that the CIN-ion trajectories are preferable or at least not disturbed by the electric field normally created by the sample ion extraction electrodes during extraction. After the CIN-ion injection pulse is completed, the potentials $U_{ex}(t)$ return to values optimal for the sample ion extraction. The duration $t_{ex}$ of the extraction is primarily dominated by the laser repetition rate $f_{rep}$, typically on the order of $f_{rep} \approx 10^1$ to $10^3$ Hz, and to a lesser extent on an optional wait time $t_w$. The sequence repeats the according to the laser repletion.

Figure 27:
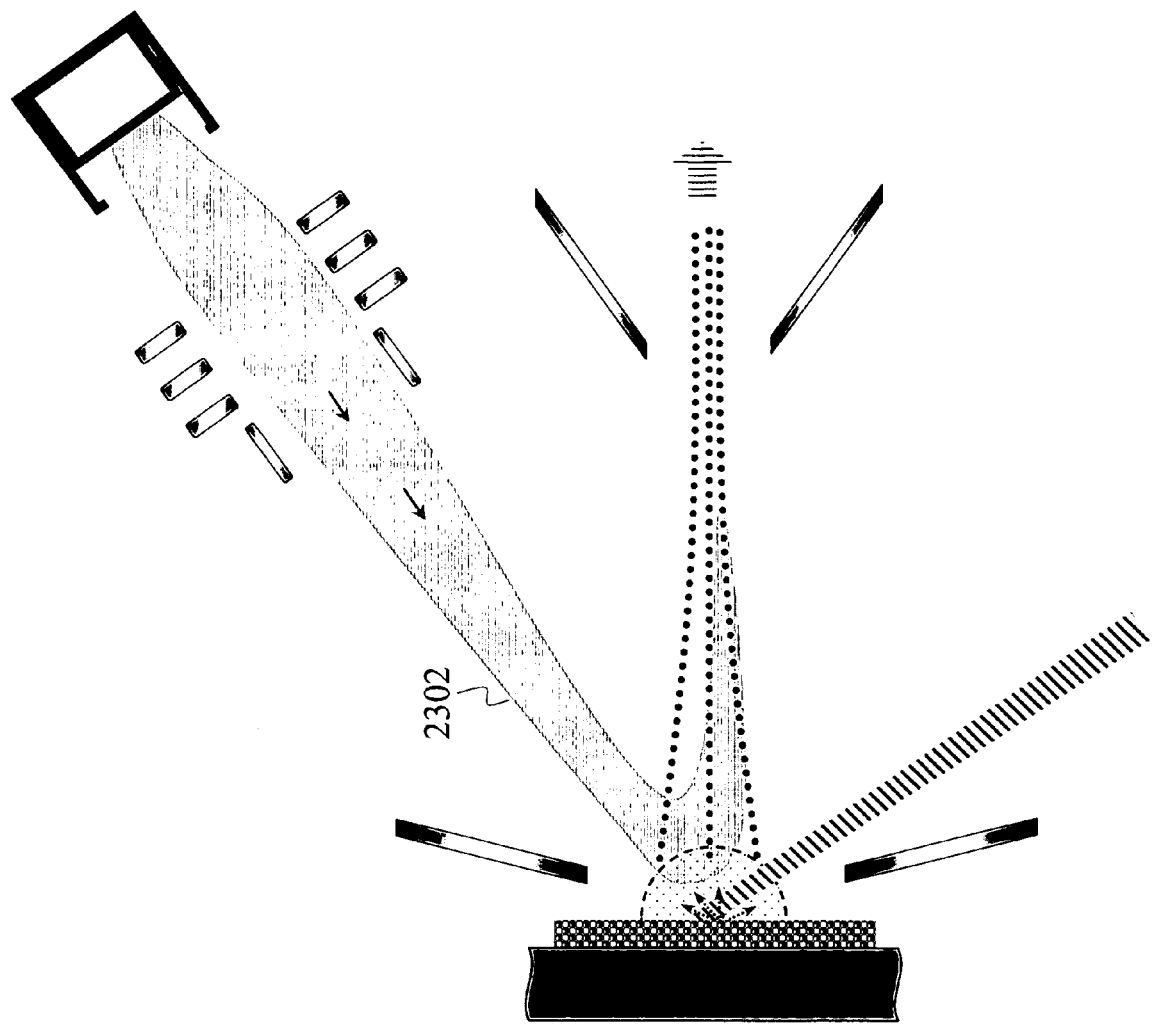
FIG. 27 depicts a basic operating mode wherein the kinetic energy of the CIN-ions is insufficient to reach the sample target, thus causing the CIN-beam to reverse direction and the ionization of the neutral sample molecules to occur in a region adjacent to the sample.

In one basic operating mode of certain embodiments of the invention, the kinetic energy of the CIN-ions is sufficient to reach the sample target. As a result the CIN-ion—sample interaction predominately occurs on the sample surface or its immediate proximity where the plume of neutrals expands. In a second basic operating mode, depicted in FIG. 27, the kinetic energy of the CIN-ions insufficient to reach the sample target causing the CIN-beam 2302 to reverse direction; this increases the collision probability with neutrals thereby having most of the ionization of the neutral sample molecules occurring in a region adjacent to the sample. However, the total achievable space charge density is smaller in this embodiment.

Figure 28:
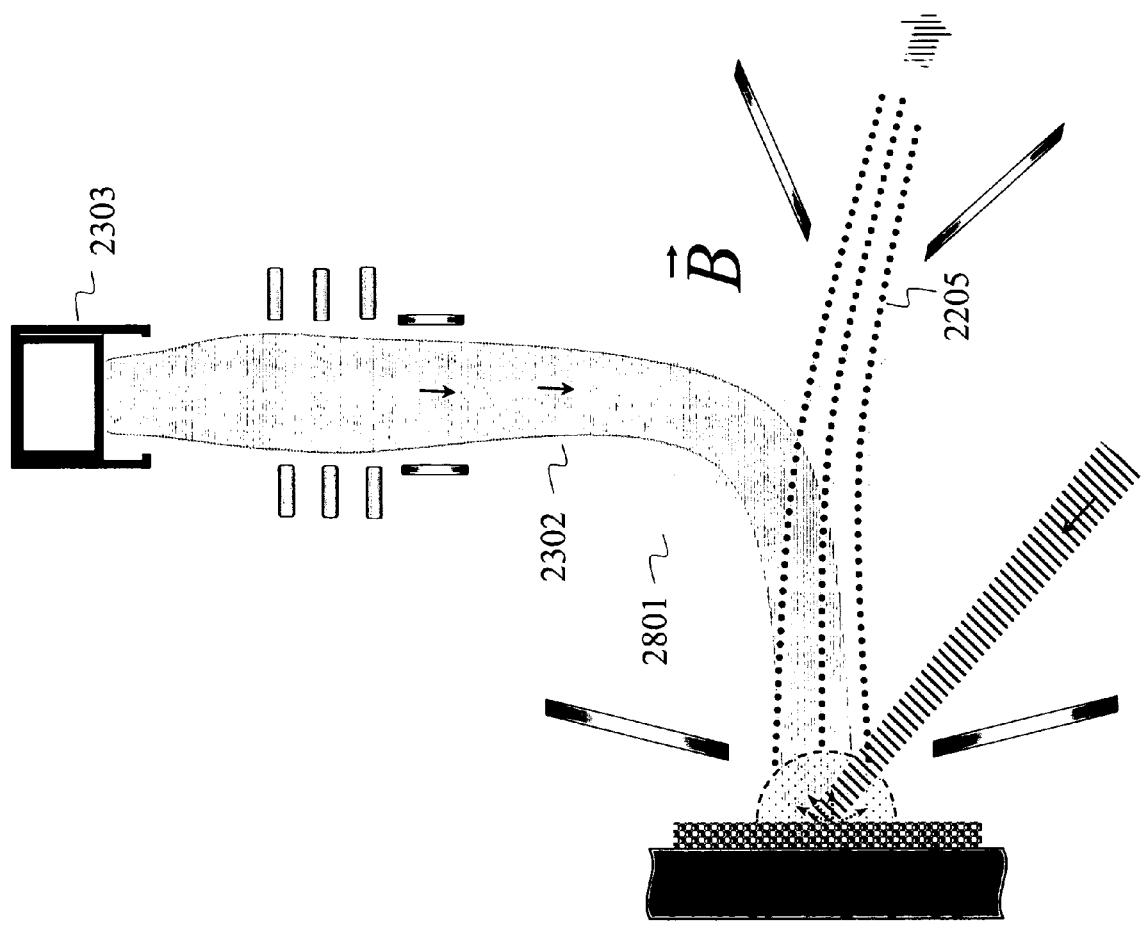
FIG. 28 depicts an embodiment similar to that of FIG. 6 with an additional magnetic field configured orthogonally with respect to the plane of the drawing.

Another embodiment of the invention is shown in FIG. 28, wherein an additional magnetic field, orthogonal to the plane of the drawing, is generated in region 2801. (The depiction is rendered in an oversimplified manner, as magnetic field has no sharp boundaries). This embodiment allows better sample access for the CIN-beam and more desirable arrangements of the ion beam gun 2303 since the CIN-beam 2302 is deflected by the magnetic field. The magnetic field also influences the trajectories of the extracted sample ions, however significantly weaker. This configuration utilizes the effect that Lorenz forces in magnetic field depend linearly on the velocity of a charged particle. Since the mass if the CIN-ions is orders of magnitude lower than typical sample ion masses, their velocity and hence the Lorenz force acting on them is significantly larger for a given kinetic energy. As a result, the bending radius is smaller.

Figure 29:
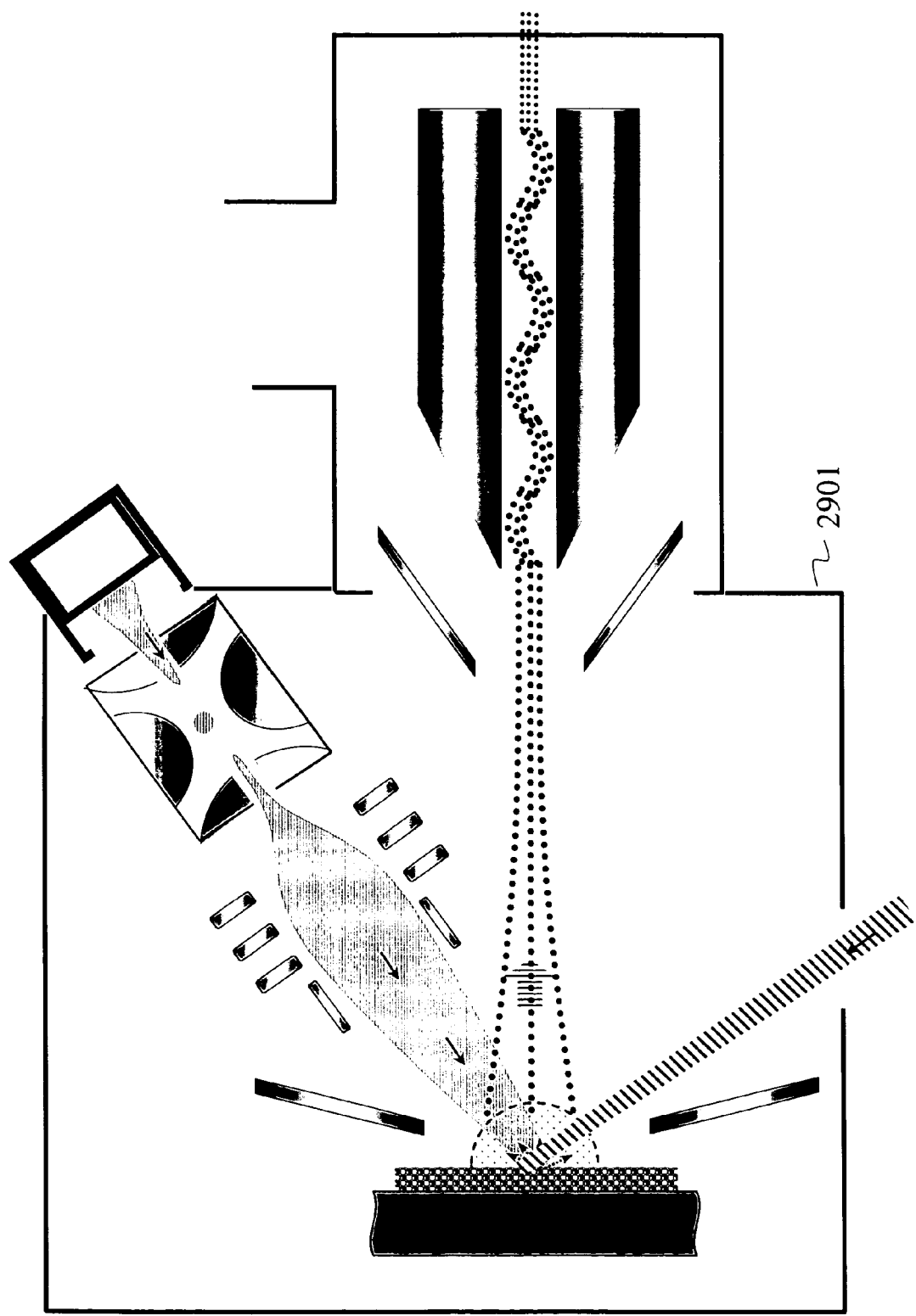
FIG. 29 depicts an embodiment of a CIN-LDI/CIN-MALDI ion source (configuration as depicted in FIG. 4) connected to a RF quadrupole.

FIG. 29 shows an embodiment of the inventive CIN-LDI/CIN-MALDI ion source, such as the configuration depicted in FIG. 25, which is connected to further ion-optical elements, in this particular case to a RF quadrupole, which can be operated as ion guide or as mass/charge filter. The CIN-LDI/CIN-MALDI ion source, here shown as a separate unit 2901 from the RF quadrupole, may be also connected to any other type of ion guide or trap.

Figure 30:
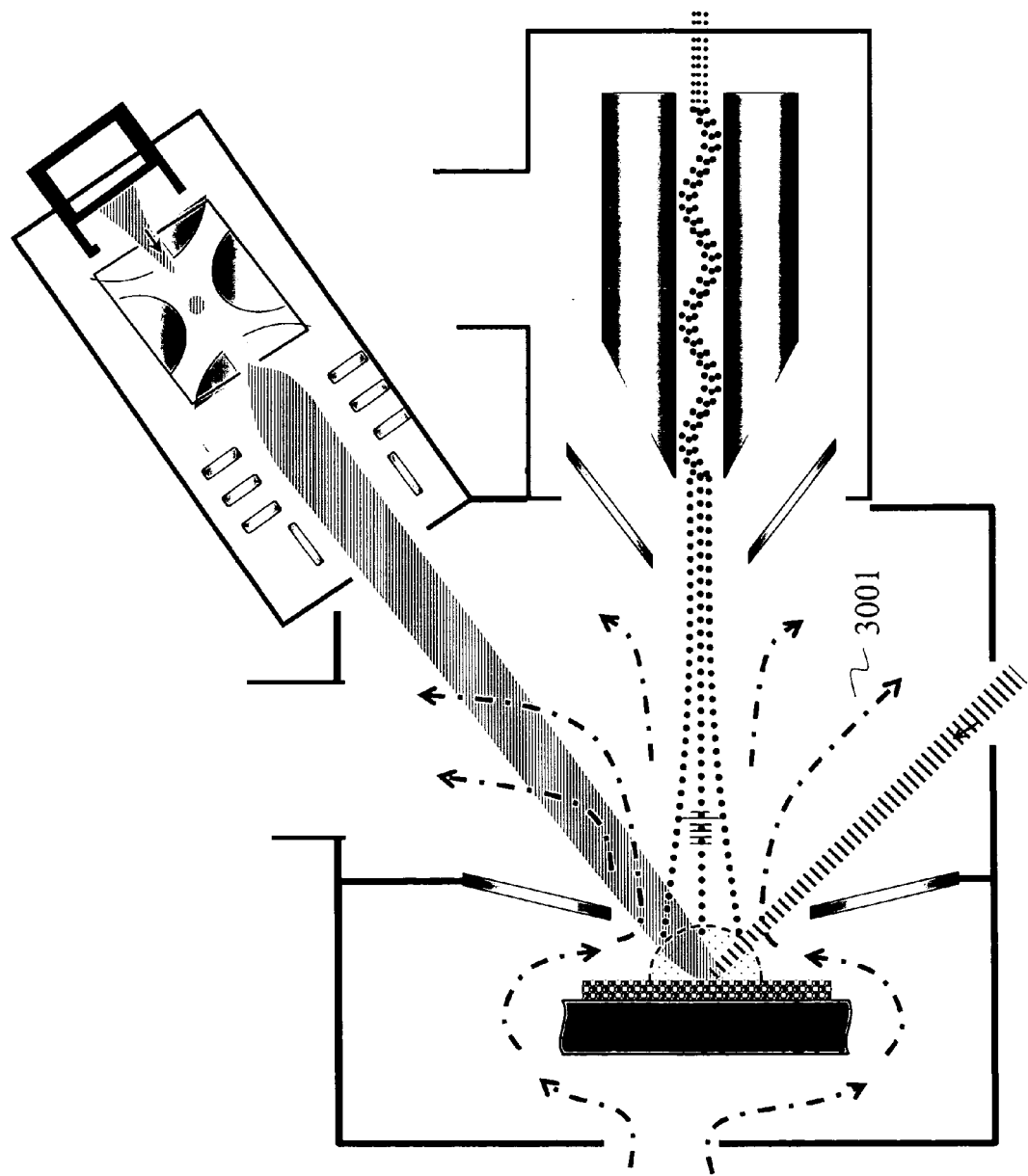
FIG. 30 depicts the same configuration as in FIG. 8 with the addition of preferably axisymmetric gas flow for collisional cooling of sample ions.
Figure 31:
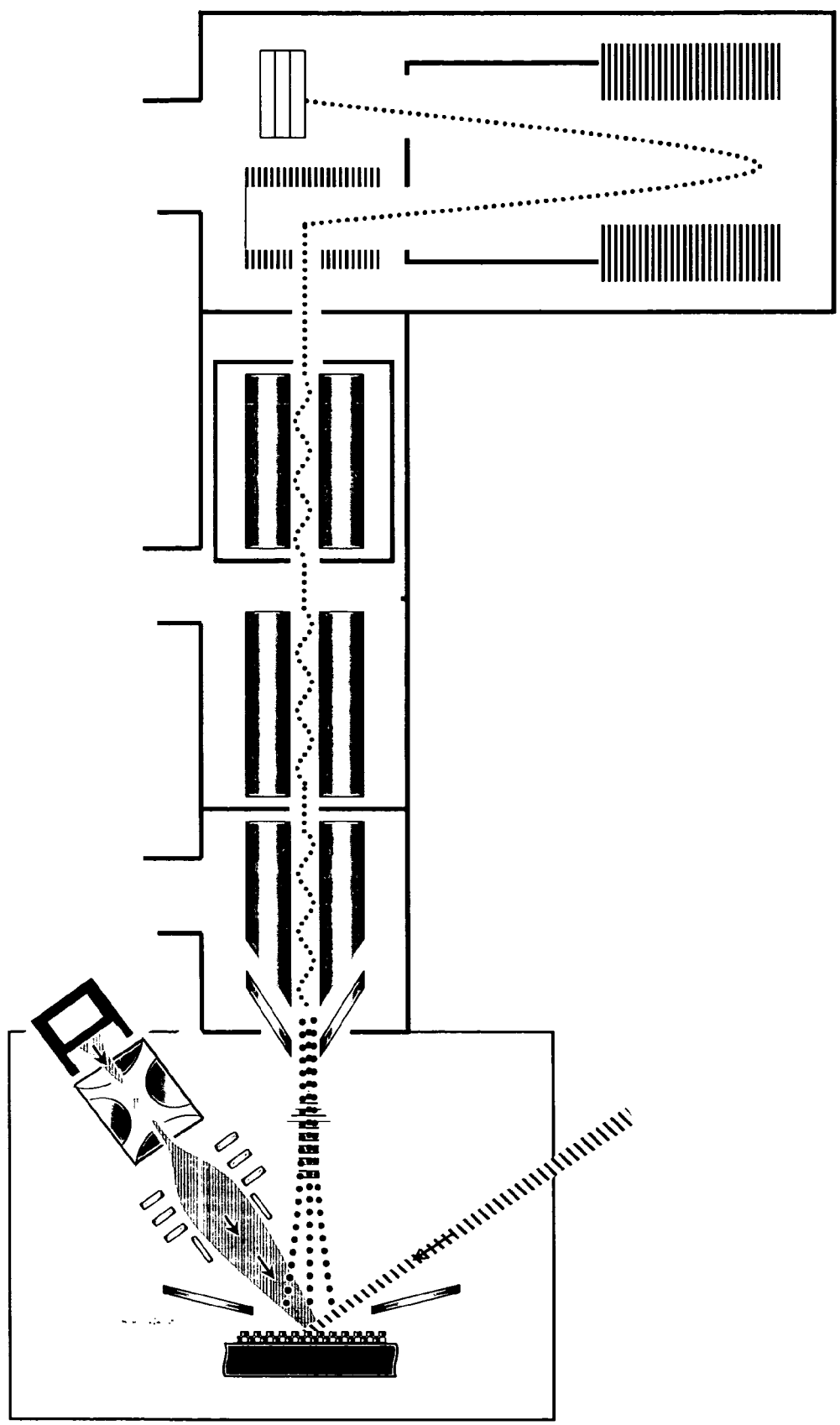
FIG. 31 depicts an embodiment of a CIN-LDI/CIN-MALDI ion source connected to a high-end triple-quadrupole-Time-of-Flight (TOF) instrument.

FIG. 30 shows the same configuration of the invention as seen in FIG. 29 with the addition of preferably axisymmetric gas flow 3001 for collisional cooling of sample ions. FIG. 31 depicts an embodiment of the inventive CIN-LDI/CIN-MALDI ion source connected to a high-end triple-quadrupole—Time-of-Flight (TOF) instrument.

Optimized Control

The subsequently described embodiments of an active feedback and control system for ion sources and applies to both LDI and ES technology in conjunction with electropneumatic superposition. The following patent applications of Hieke are related to the presently described embodiments of the invention, and are included by this reference: "Ion source with controlled superposition of electrostatic and gas flow fields" (WO05081944A2 and US2005194542A1, both filed on Feb. 22, 2005); and "Methods and apparatus for controlling ion current in an ion transmission device" (US2005194543A1 and WO05081916A2, both filed on Feb. 22, 2005). Provisional U.S. applications that are related and included by this reference are "Laser desorption ionization ion source with charge injection" (U.S. App. No. 60/798,377, filed on May 5, 2006) and "Laser desorption ionization ion source with self-adjusting holder and insertion system for one and two-dimensional sample chips" (U.S. App. No. 60/802, 941, filed on May 23, 2006.

Figure 32:
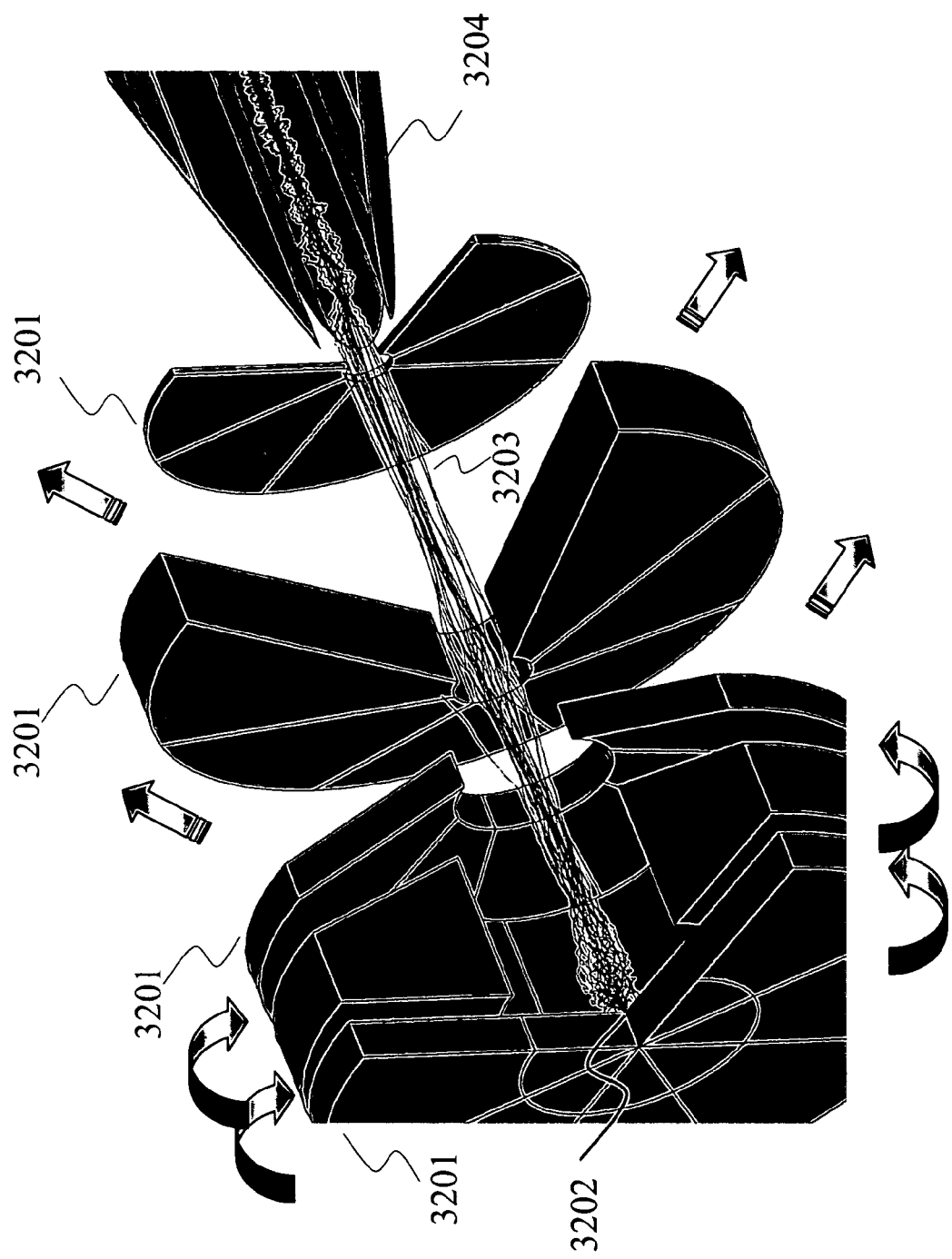
FIG. 32 is a simplified schematic 3D overview of the electro-pneumatic elements in a LDI ion source with controlled electro-pneumatic superposition. The tips of a RF quadrupole ion guide are visible.

As illustrated in FIG. 32 the functionality of advanced ion sources employing electro-pneumatic superposition, per aspects of this invention, depends on shape and arrangement of a number of so-called electro-pneumatic elements 3201. The sample ions originate from a small spatial area, typically a sample spot, 3202 and form a continuous or pulsed beam 3203 which is, in this example, injected in a RF multipole ion guide 3204. Gas flows through this structure as indicated by the arrows.

Figure 33:
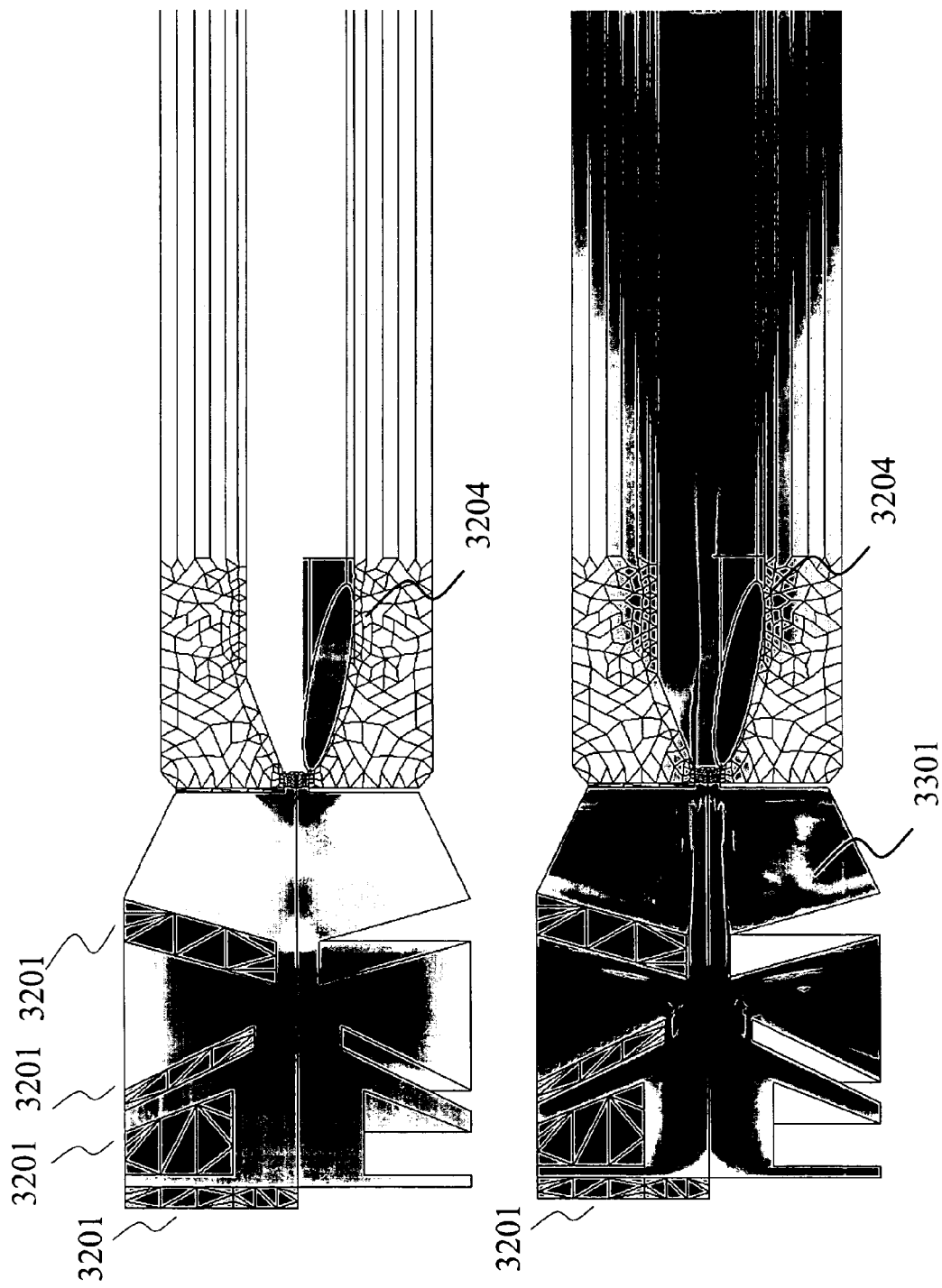
FIG. 33 is a numerical solution of gas pressure (top) and gas flow velocity magnitude (bottom) for configuration depicted for the configuration shown in FIG. 1 at one particular operational point.

To understand the operation of such ion sources, per aspects of this invention, the visualization of the electric fields and pneumatic flow fields created by the electric-pneumatic elements and the computation of ion trajectories are helpful. FIG. 33 shows one such example. The numerical solution of gas pressure (top) and gas flow velocity magnitude (bottom) for configuration depicted for the configuration shown in FIG. 32 at one particular operational point. Besides the gas pressure, the spatial distribution of the gas flow velocity magnitude 3301 is of particular interest.

Figure 34:
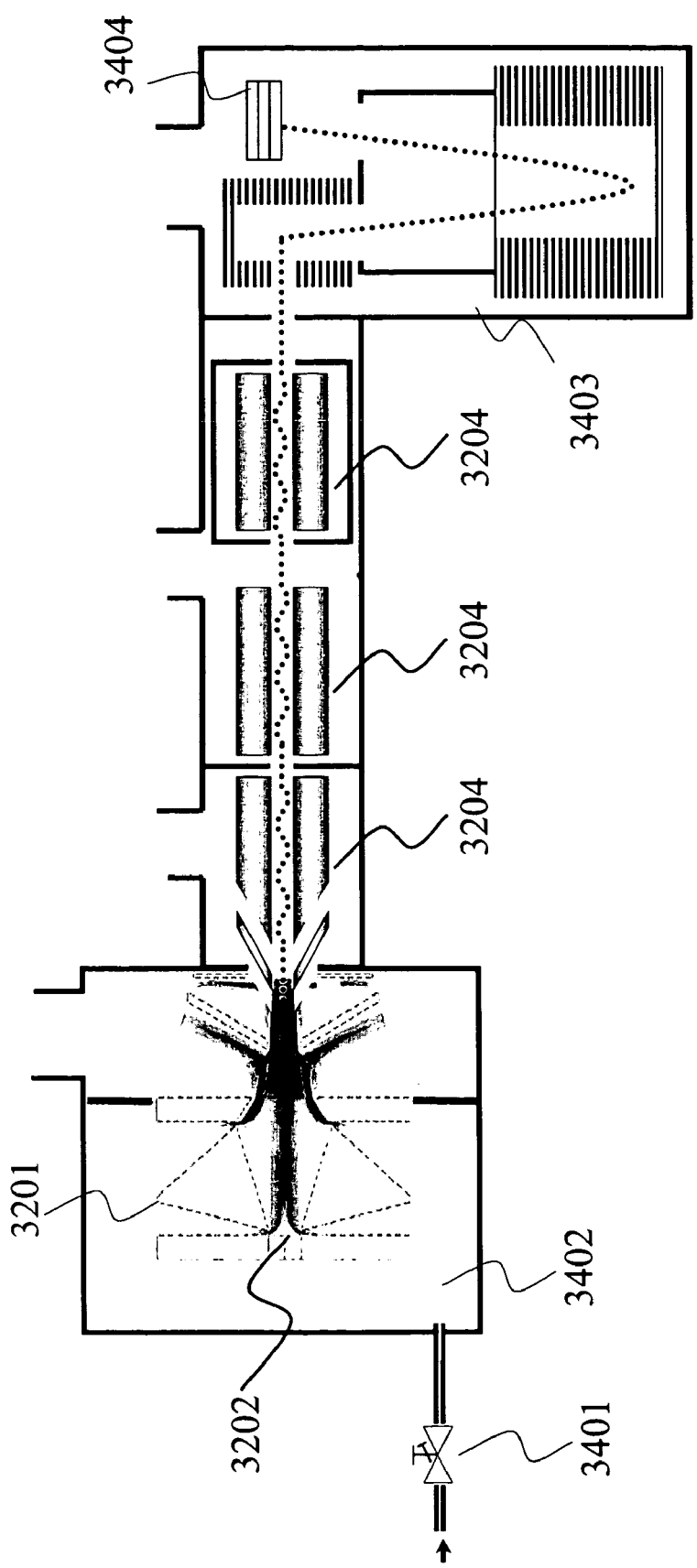
FIG. 34 is a simplified schematic overview of a LDI ion source with controlled electro-pneumatic superposition connected to a triple-quad time-of-flight (TOF) mass spectrometer.

In practical applications, electro-pneumatic ion sources are contained in housings and connected to mass spectrometers. In some particular embodiments of the invention, as shown in the FIG. 34, the electro-pneumatic elements 3201 are supplied with gas via a reservoir 3402. The gas is supplied to the reservoir via one or more adjustable valves 3401. FIG. 34 also shows an ion source connected to a high-end triple-quadrupole time-of-flight (TOF) instrument that contains a series of RF multipoles 3204, a time-of-flight region 3403, including ion detector 3404.

Figure 35:
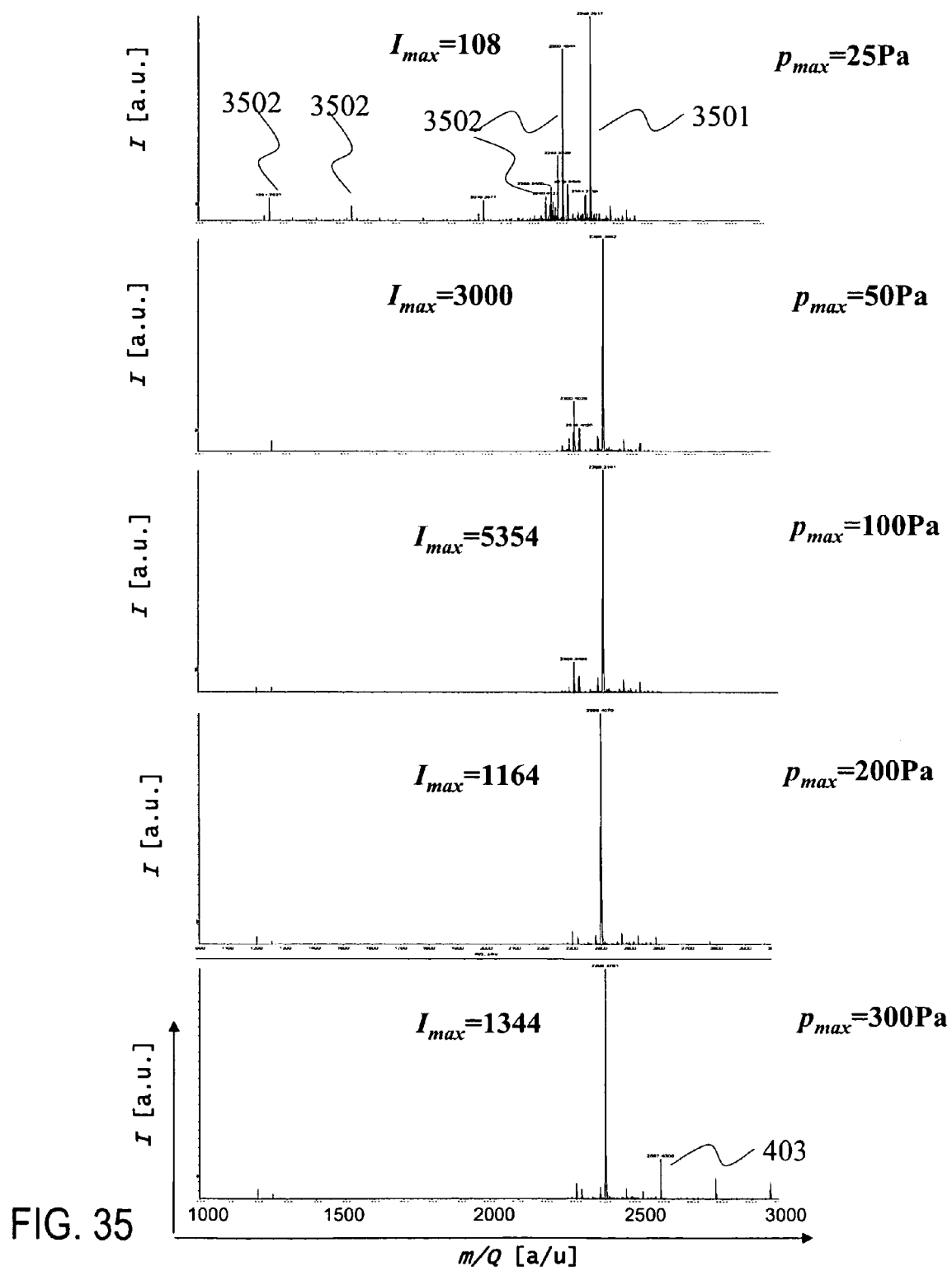
FIG. 35 is a typical mass spectrum obtained from an electro-pneumatic LDI ion source for a single labile compound as test sample at different operational points (gas reservoir pressures).

Mass spectra obtained with such configurations can exhibit many artifacts such as ion fragmentation, ion clustering, or insufficient ion transmission due to superposition breakdown if the ion source is not operating at optimal conditions. An example is shown in FIG. 35 that provides mass spectra obtained from a single labile compound at different reservoir pressures $p_{max}$ of an electric-pneumatic LDI ion source. Since only a single compound is used the expected true signal is a single peak in the mass spectrum. Also indicated are the obtained intensities for the true peak 3501 at m≈2398μ. At $p_{max}$=25 Pa substantial ion fragmentation occurs which results in numerous peaks 3502 which do not represent the original composition of the sample. In addition, the total ion in intensity is a relatively low.

At $p_{max}$=100 Pa the maximum ion count for the true peak has been reached, however, ion fragments are still observed. The highest signal to noise ratio is reached at $p_{max}$=200 Pa, although the total ion count is now reduced for this particular electro-pneumatic design. At $p_{max}$=300 Pa the signal to noise ratio decreases again due to the appearance of cluster ions 3503. In addition to varying the reservoir pressure the electric potential on the electric-pneumatic elements thereby the electric field inside the ion source has to be modified in order to maintain sufficient ion transmission.

The actual optimal values for gas reservoir pressure and various electric potentials typically depend on the design of the electro-pneumatic elements, sample composition, surface chemistry of the chip as well as laser operation parameters in case of LDI. Further, it is apparent that the optimization can have different goals, such as improving the maximum ion count or the maximum signal to noise ratio.

Figure 36:
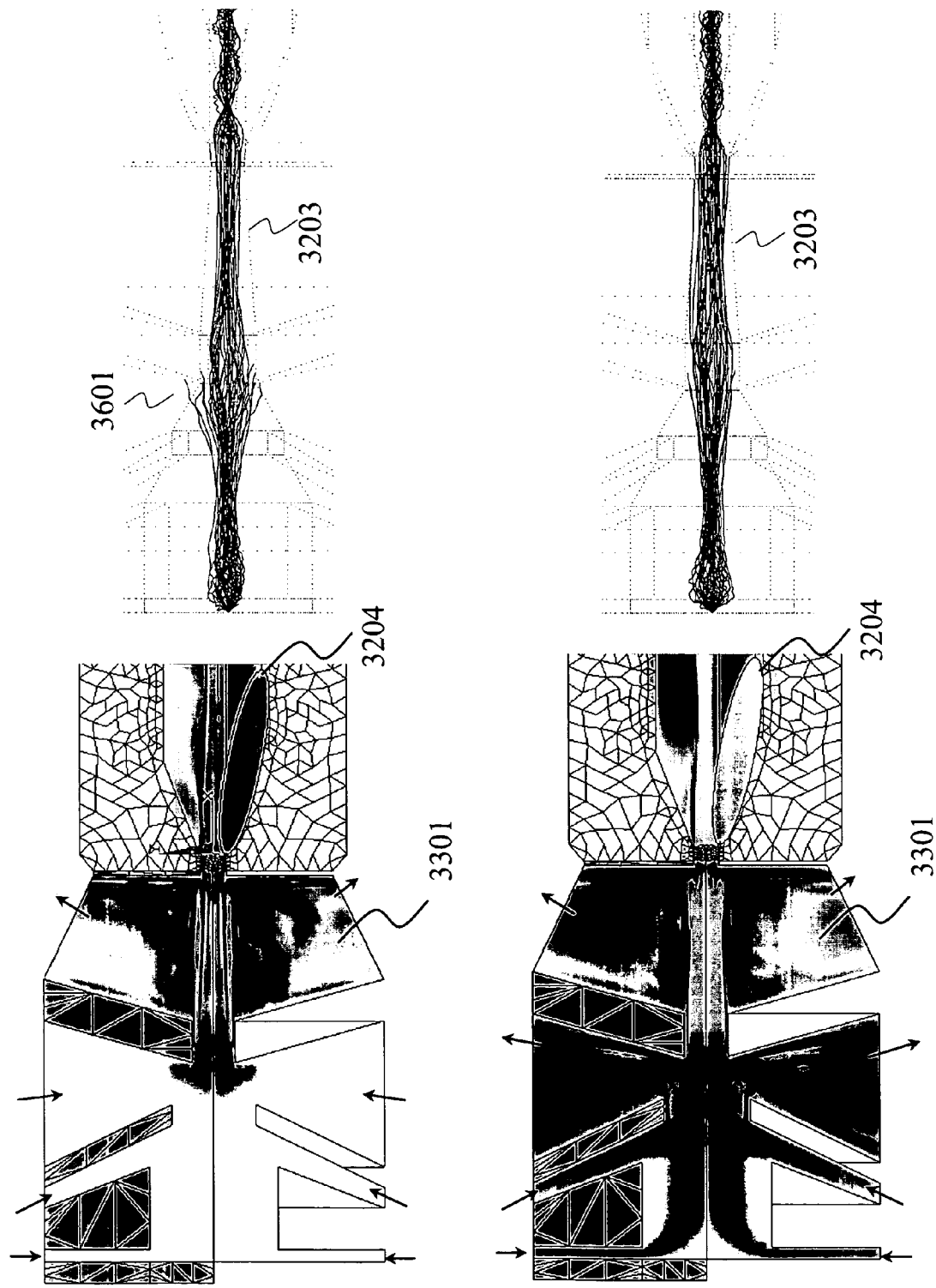
FIG. 36 is a numerical solution of gas flow velocity magnitude (left) resulting ion trajectories (right) for two operational points (gas reservoir pressure and inlet distribution) for an electro-pneumatic LDI ion source (top vs. bottom) exhibiting ion losses at the operational point shown at the top.

FIG. 36 illustrates an example, per embodiments of the invention, as to how variations in the gas supply may influence the spatial distribution of gas flow velocity magnitude 3301 and thereby the guidance of ions and the total available ion high-end count. On the left side, the numerical solutions of the gas flow velocity magnitude are shown, and on the right side, the resulting ion trajectories for two operational points. At the top of FIG. 36 an electric-pneumatic configuration is supplied from the surrounding gas reservoir (not shown) through three of the four existing channels. The fourth channel is used to evacuate the gas from the system. At the bottom of FIG. 36 the same electro-pneumatic configuration is used, however, gas is supplied only through two of the four channels and evacuated via the remaining two. The configuration on top shows more ion losses 3601.

Figure 37:
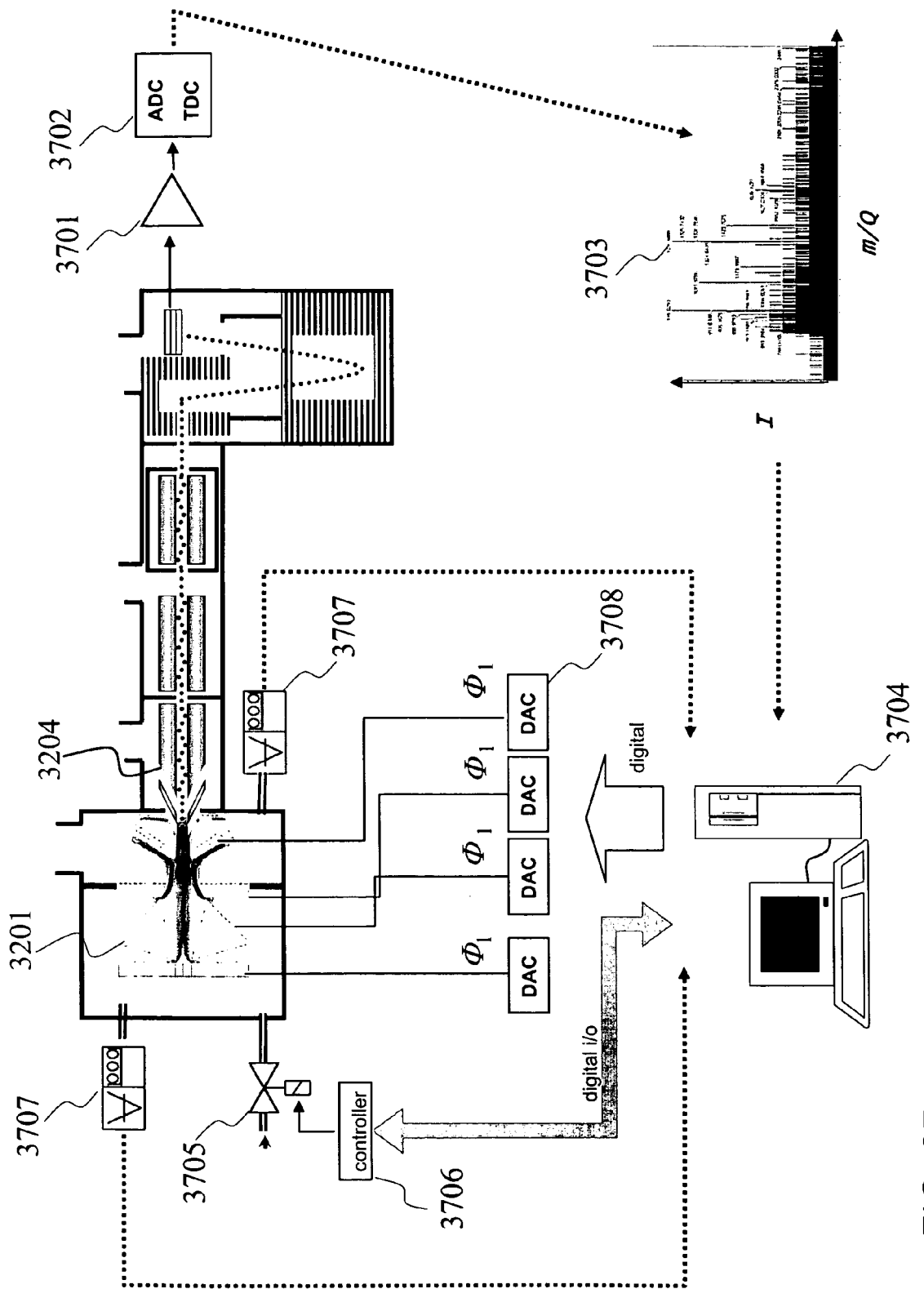
FIG. 37 is a principle design ion source with an active control and feedback system. A plurality of digital and/or analog inputs and outputs, such as variable voltage sources, enable a control computer to keep the ion source at optimal operational conditions.

The aforementioned difficulties may be eliminated by implementing an active control and feedback system, per aspects of some embodiments, as shown in FIG. 37. The signal current from the ion detector is amplified 3701 and digitized 3702 to make the information contained in the mass spectrum processable by computer 3703. According to aspects of the present invention, this computer (or one communicating with it) can also measure various operational conditions of the ion source and actively control and set parameters. For example, the variable gas inlet valve 3705 may be driven, by a stepper motor or electromagnetically. The information required is provided to the valve controller by computer 3703. Various pressure values that are, as a result, established inside the ion source are measured by digital pressure gauges which, in turn, provide these values to computer 3703. In addition, computer 3703 can set potentials (D on the electro-pneumatic elements 3201 via a plurality of digital to analog converters (DACs) 3707.

Figure 38:
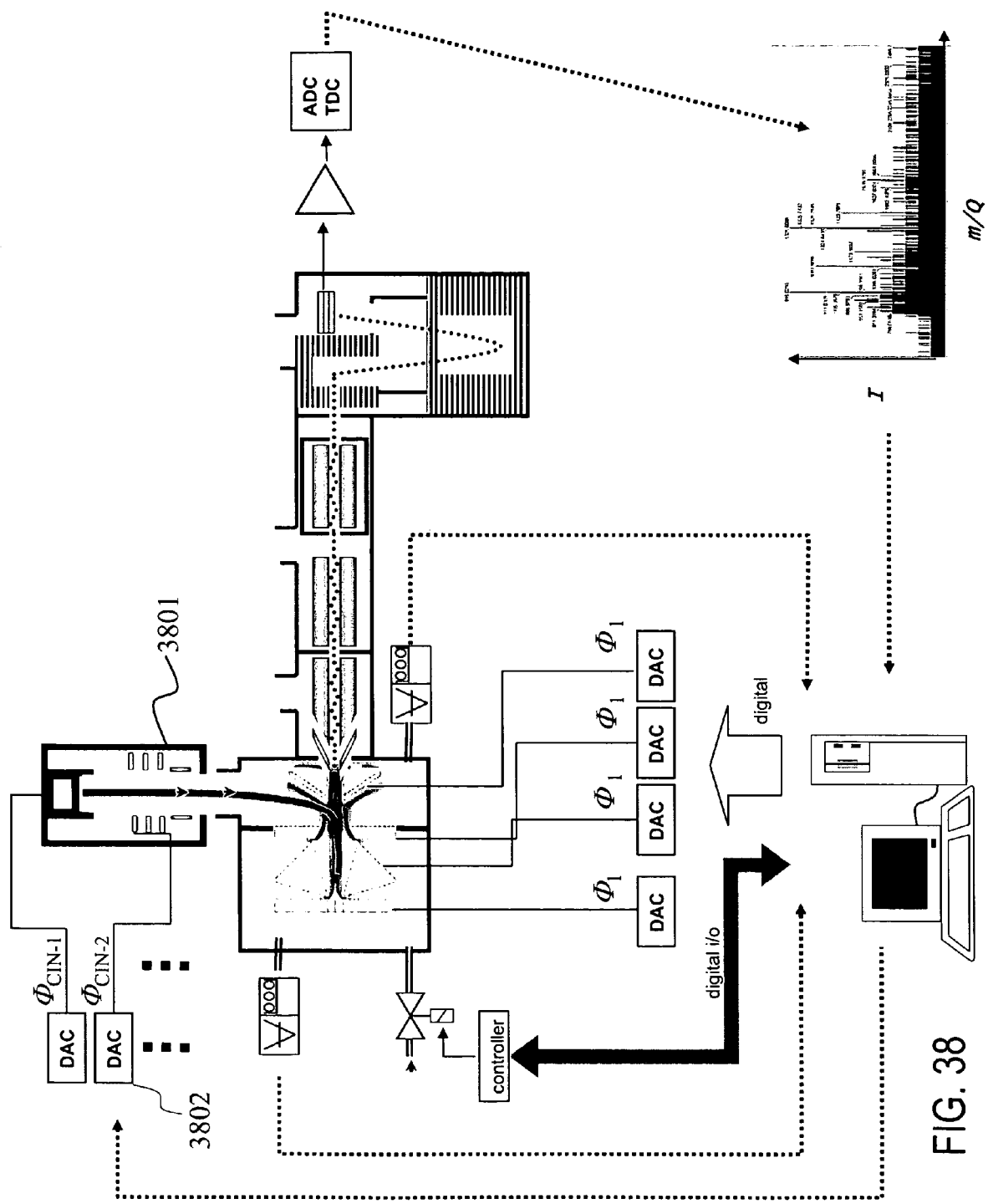
FIG. 38 is a simplified design a LDI ion source with an active control and feedback system and additionally employing controlled charge injection (CIN-LDI/CIN-MALDI) by means of a separate the ion beam gun connected to a high-end triple-quadrupole-Time-of-Flight (TOF) instrument

Another embodiment is shown in FIG. 38 wherein (in addition to the active feedback system for electric-pneumatic components) a charge-injection ion gun creating a CIN-beam is used to increase the ionization efficiency of the LDI ion source as disclosed by above-referenced application of Hieke (U.S. App. No. 60/798,377, filed on May 5, 2006). The shown configuration will also require an additional magnetic field, orthogonal to the plane of the drawing. In some embodiments of the invention, the active control and feedback system may now also set values on the Charge-injection gun to optimize total system performance.

Radiation Supported Charge-Injection Liquid Spray

Figure 39:
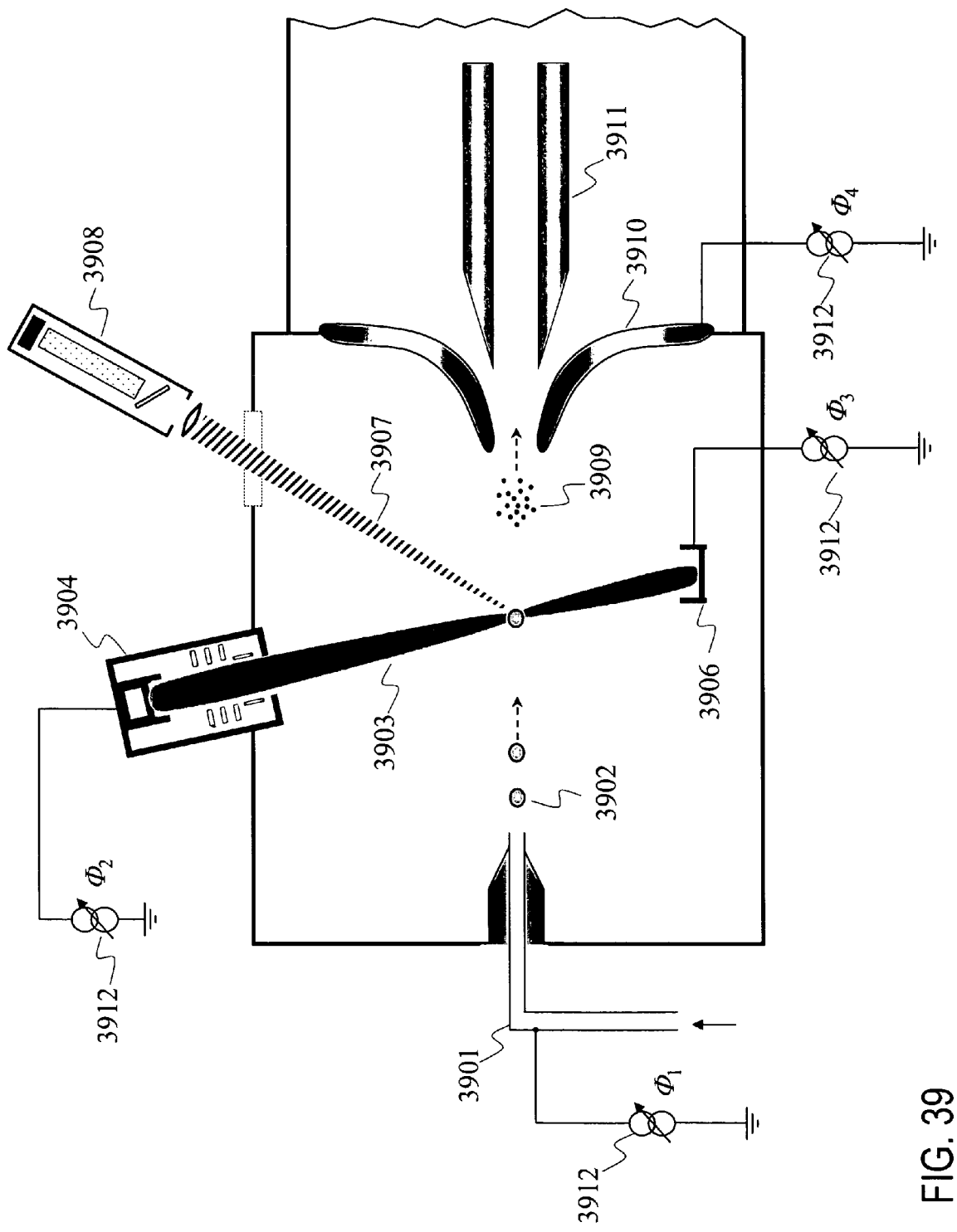
FIG. 39 depicts an analyte-containing sample of liquid or liquid crystals being introduced into a capillary, dispersed as droplets, and exposed to a CIN-ion current and laser photon flux.

FIG. 39 shows a liquid or liquid crystals containing sample molecules being introduced into a capillary 3901 or similar structure and dispersed as droplets 3902. A charge injection beam ("CIN-beam") 3903 of stable low molecular weight ions (such as H [protons], He, Li, O, Ne, Na, Ar, K, Xe, etc.) originates form a dedicated charge injection ion beam gun 3904 is directed with specific, typically low energy ($10^{-1}$ to $10^2$ eV) and current onto a single or plurality of droplets 3902. The charge injection ion beam gun is either integral part of the RCIN-LS ion source or attached to it in a separable configuration. The CIN ions which are not absorbed in droplets maybe collected by a grounded cup or a similar electrically conductive object 3906 at an arbitrary potential favorable to achieve desired CIN-ion beam trajectories.

Also directed at a single or a plurality of droplets is a beam of electromagnetic radiation 3907 (EM beam), typically from a IR, UV, or visible Laser 3908. Radiation sources may further include any of known variants of solid state or gas phase lasers, OPO lasers, semiconductor lasers such as laser-diodes or arrays thereof, intense incandescent lamps, arc, glow discharges etc. Further possibilities include exposure to microwave or Terahertz electromagnetic radiation.

The fundamental advantage of this configuration is that it allows to substantially increase the net charge state of the droplet(s) as well as their temperature/evaporation rate, effectively independent of an energy transfer with a optionally present background gas.

Suitable ion beam guns for the CIN-beam injection (such as Duo-plasmatron, RF, Micro-Wave, or Penning type ion guns) may either be commercially available models (as provided, for example, by, Oxford Scientific, SPECS, or National Electrostatics Corp.) that may optionally easily be modified to satisfy certain specific requirements of this particular application or be integral part of the disclosed RCIN-LS ion source. The following references are relevant to this subject: M. R. Cleland and R. A. Kiesling: "Dynamag Ion Source with Open Cylindrical Extractor", IEEE Transactions on Nuclear Science, June 1967; Stanley Humphries: "Charged Particle Beams", Wiley-Interscience, April 1990, and Horst W. Loeb: "Plasma-based ion beam sources" 2005 Plasma Phys. Control. Fusion 47 B565-B576.

The optimal (kinetic) ion energy is relatively low, typically on the order of Ek=$10^{-1}$ to some $10^2$ eV. Since the kinetic energies of many ion guns are higher, ion beam deceleration may be required by means of additional retarding potentials. An example of such modification is described in Popova, et al.: "Construction and performance of a low energy ion gun", J. Vac. Sci. Technol. A21(2) March/April 2003, pp 401-403.

The released ions 3909 are attracted by an electrode 3910 at appropriate electric potential. The electrode may further provide pressure decoupling between the two spaces on each side of it. The electrode may, for example, be followed by a RF multipole ion guide 3911 or any other ion trapping or analyzing configuration. Many of the depicted components are being held at electric potential by means of adjustable voltage sources 3912 such that favorable ion trajectories result.

Various embodiments and aspects of the invention may vary from the depiction of FIG. 1. There may be differences in scale among embodiments, for example, either one of the beams (CIN and EM) may be larger or smaller in diameter than a typical droplet. There may further be a single or a plurality of CIN-beams, and there may be a single or a plurality of EM-beams. The process will typically occur at considerably less than atmospheric gas pressures to limit disturbance of the CIN beam.

Figure 40:
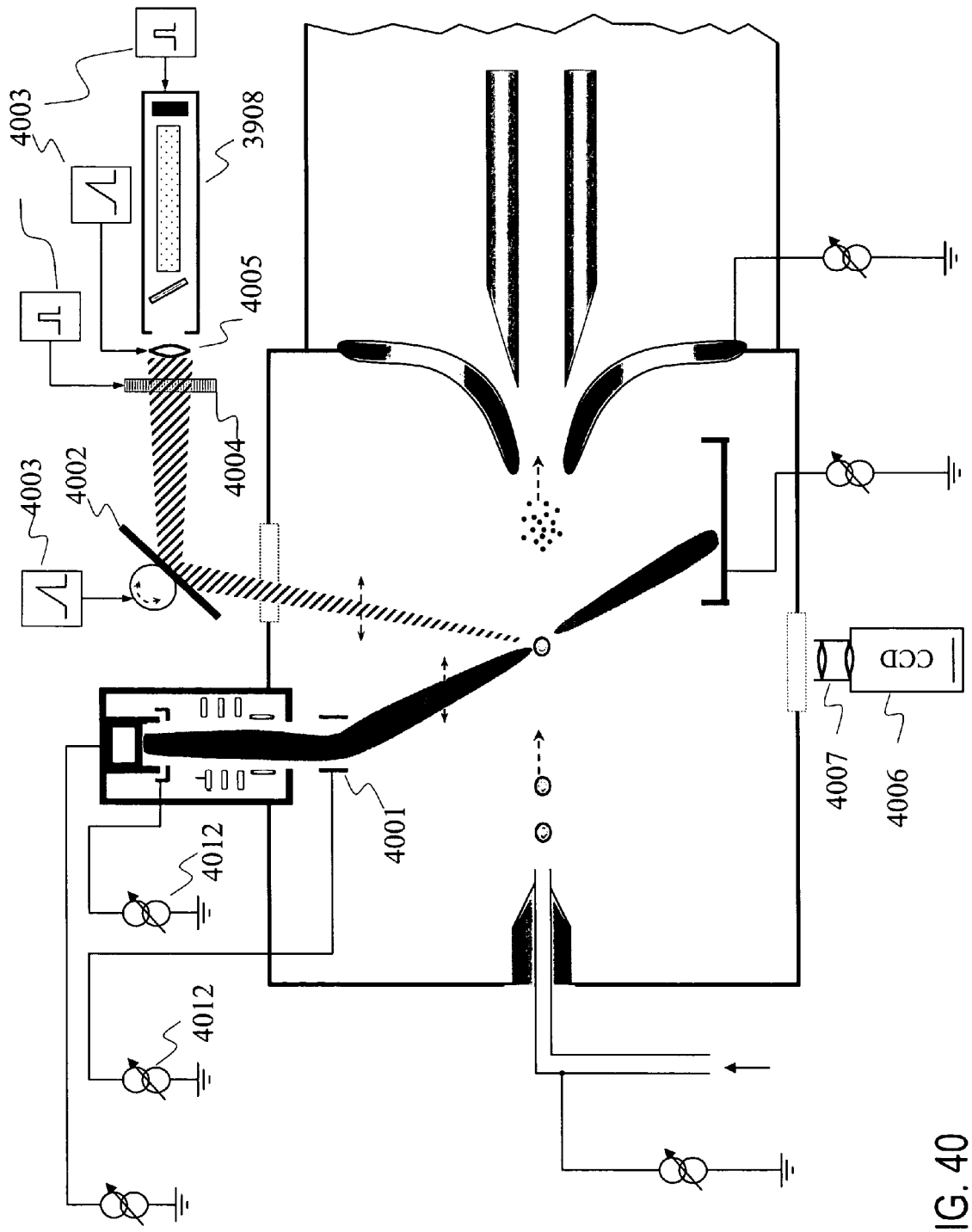
FIG. 40 shows an embodiment of the invention in which both CIN-ion current and laser photon flux may be arbitrarily modulated in time as well as spatially scanned and focused in one, two, or three dimensions.

FIG. 40 shows a particular embodiment in which both CIN-ion current and laser photon flux may be arbitrarily modulated in time as well as spatially scanned and focused in one, two, or three dimensions. Additional voltage or current sources 4012 are connected to the CIN-ion gun to control beam current as well as to electrical or magnetic deflection systems 4001. The EM beam is deflected by a single or several pivoting mirrors 4002 which can be controlled in their position by electronic means such as signals from a pulse generator 4003 or, in general, driven by computer controlled DACs. The laser itself maybe pulsed or continuous. Pulsed lasers may receive synchronizing signals from other, typically computer controlled, pulse generators. Further, the EM beam intensity may, in case of optical or near-optical wavelength, be modulated by means of Kerr cells or LCDs 4004 or similar devices which are also controlled by electronics means. Further still, the EM beam may be focused by an electronically controllable lens or lens system 4005. Additionally, a video camera, typically high-resolution high speed CCD, 4006 in conjunction with a microscopic optical arrangement 4007 may be used to observe droplets and also to derive control signals for the CIN and/or EM beam.

Figure 41:
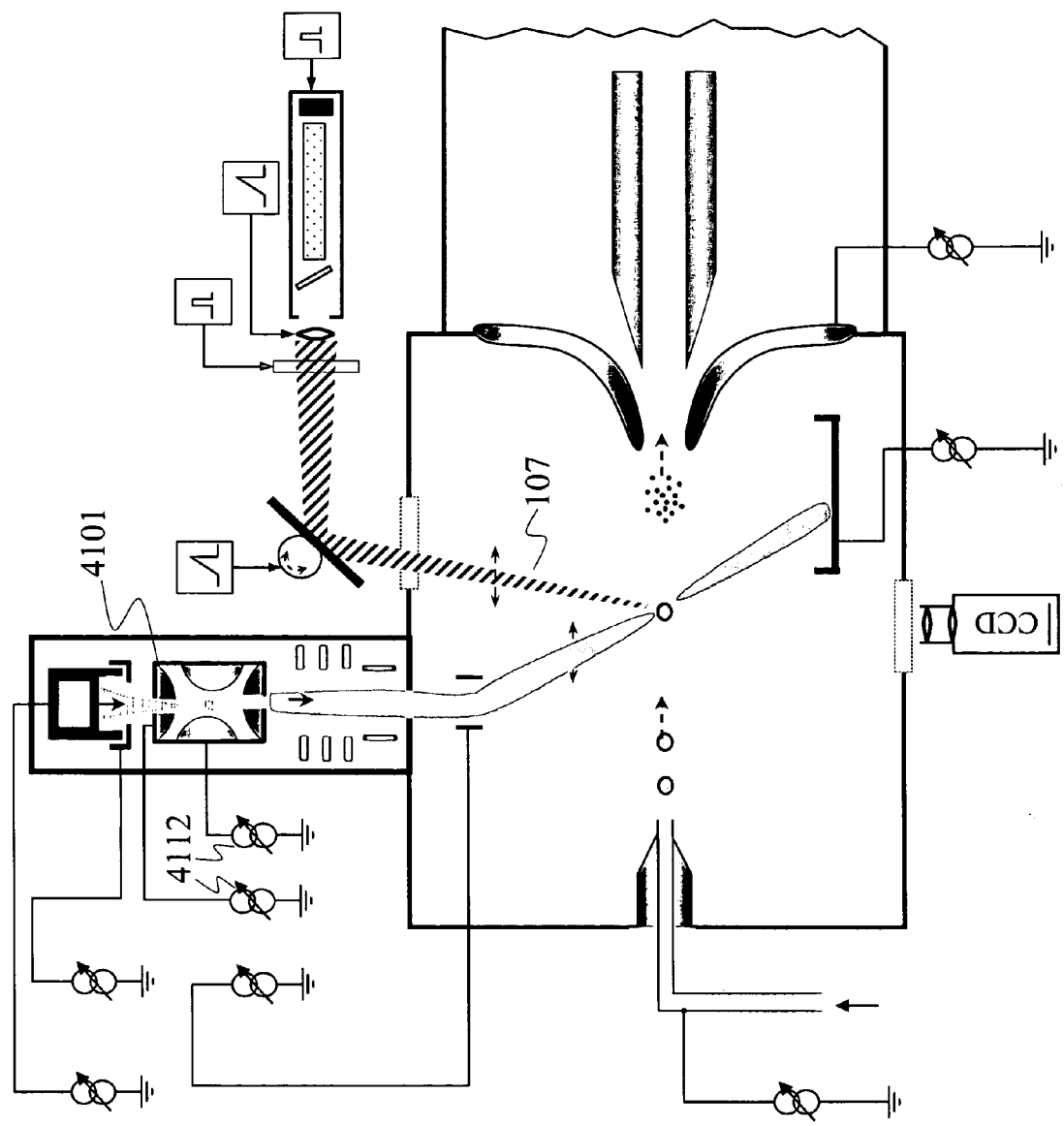
FIG. 41 shows an embodiment wherein a relatively weak CIN-beam is guided not directly onto the droplet(s) but into an 3D RF ion trap to accumulate large amounts of charge.

FIG. 41 shows an embodiment wherein a relatively weak CIN-beam is guided not directly onto the droplet(s) but into a 3D RF ion trap 4101 to accumulate large amounts of charge. The ion trap 4101 is connected to a plurality of variable DC and AC voltage supplies 4112. The CIN-ions are then released in bunches from the trap and accelerated and guided onto the droplet(s). Again, in this depiction all potentials on electrodes are referenced to ground; this will not be the case in all applications. The potentials voltage supplies may be stacked and/or commonly floating on a supplied potential. The CIN-beam may be continuous, pulsed, or arbitrarily time-dependent modulated, preferably in a manner which is synchronized with the EM beam 3907.

Figure 42A:
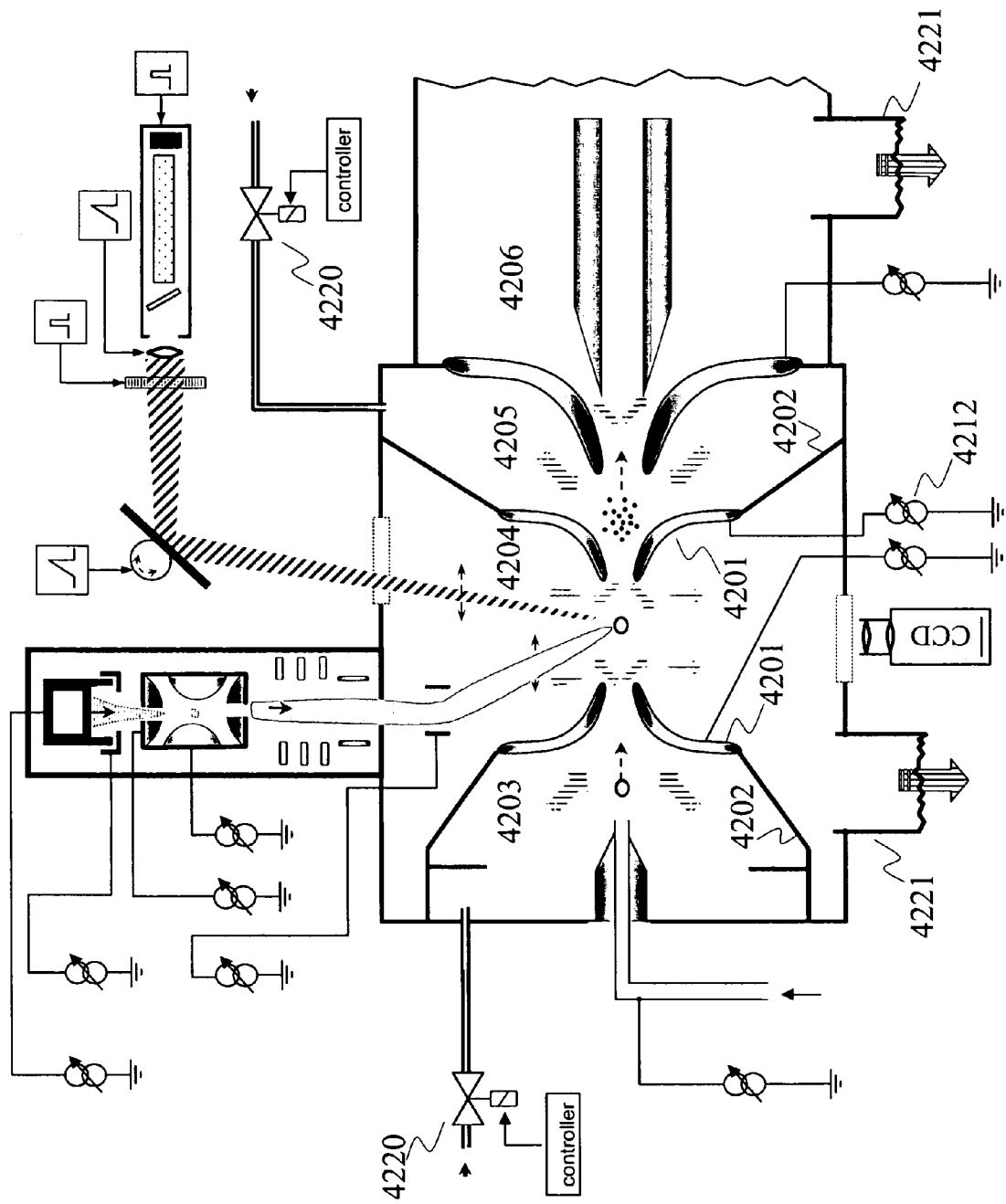
FIG. 42A shows various aspects of embodiments in which additional electro-pneumatic elements are used to create spatially controlled gas flow velocity fields, gas pressure fields, and gas temperature fields as well as electric fields.

FIG. 42A shows an embodiment wherein additional electro-pneumatic elements 4201 are used to create spatially controlled gas flow velocity fields, gas pressure fields, and gas temperature fields as well as electric fields. The electro-pneumatic elements 4201 are held at electric potentials by means of additional voltage sources 4212. The superposition of said fields preferably supports droplet guidance, solvent evaporation, sample ion—solvent separation, ion guidance. Usually the fields will also influence the CIN-beam. Additional deflective means and/or modifications in the way the existing CIN-beam deflection system(s) are driven may be required to compensate such effects.

The potentials on the electro-pneumatic elements 4201 may be any arbitrary function of time including pulsed and synchronized, including synchronized and delayed etc., with respect to any other operation of any other component such as the CIN-beam and/or the EM beam.

Furthermore, by means of additional walls 4202 the interior may be divided into a number of domains 4203, 4204, and 4205 some of which may act as gas reservoirs. Said domains may be supplied with gas via typically electronically driven gas flow controllers 4220 or gas may be evacuated from them through openings 4221 of sufficiently low gas flow resistance.

In the configuration shown in FIG. 42A, gas is supplied to domain 4203 which initially supports the guidance of droplets. Gas is also supplied to domain 4205 which (a) creates a counter flow with respect to the sample ions which supports removal of remaining neutrals and (b) creates a gas flow stagnation point in the center of domain 4204 which can be advantageous with respect to effecting charge injection and temperature control by means of the CIN-beam and EM-beam. Gas is evacuated from domain 4204 and 4206 through openings 4221.

Figure 42B:
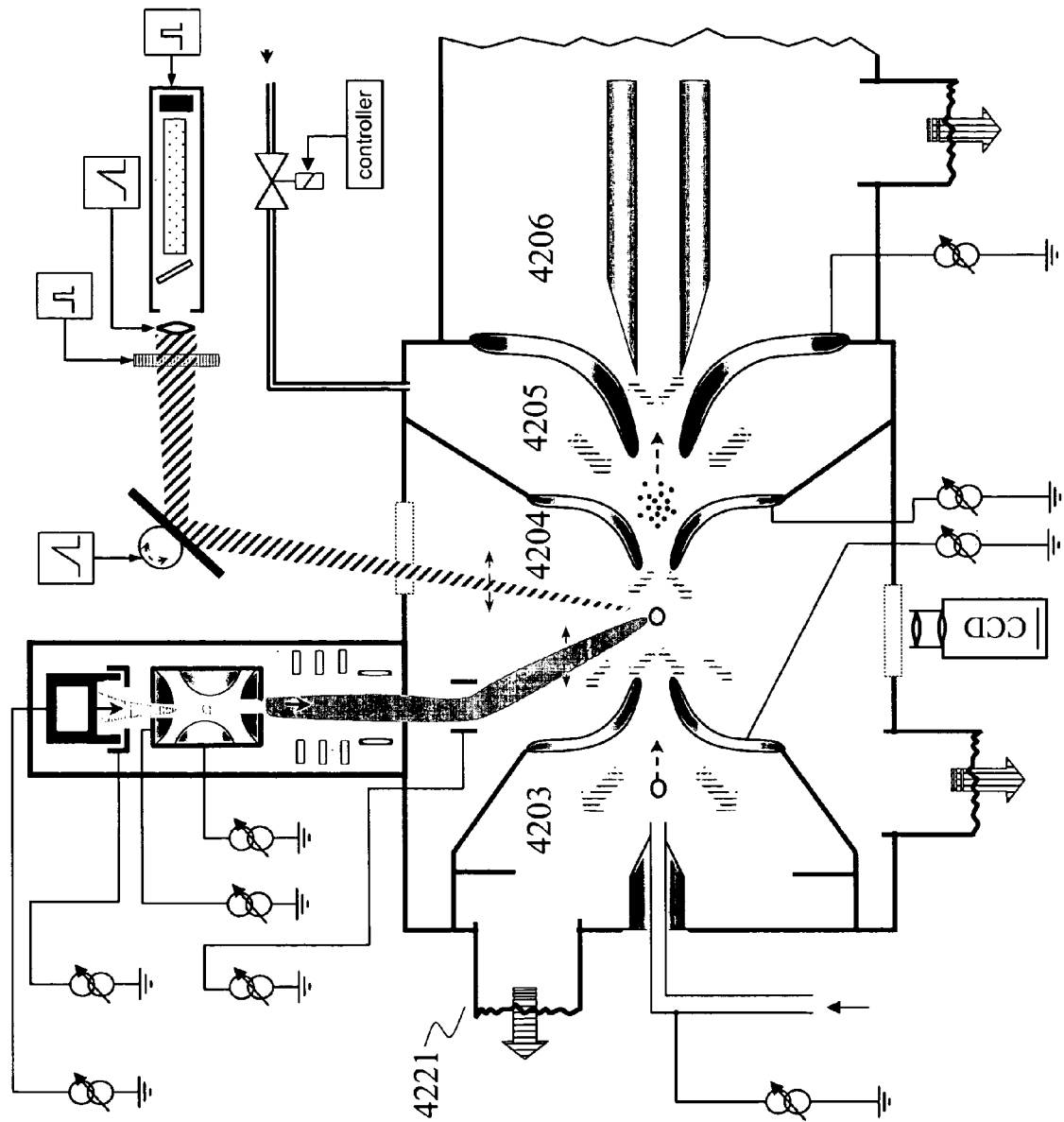
FIG. 42B shows an embodiment wherein only one domain is supplied with gas, and other domains are evacuated, and the gas flow is predominantly counter to droplet and sample ion motion.

FIG. 42B shows an embodiment wherein only domain 4205 is supplied with gas and all other domains are evacuated. As a result, the gas flow is predominately counter to the droplet and sample ion motion.

Figure 42C:
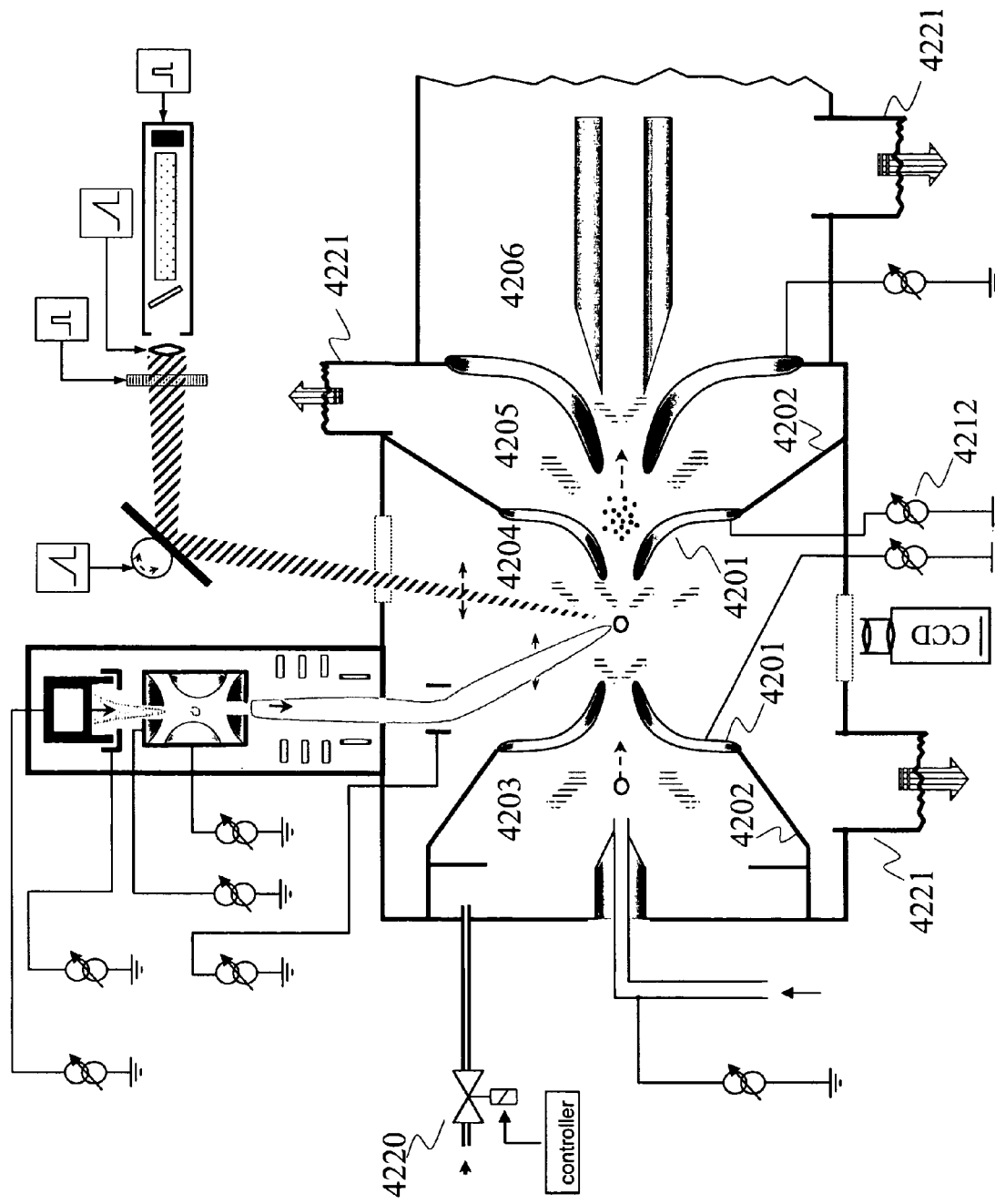

FIG. 42C shows an embodiment wherein only domain 4203 is supplied with gas and all other domains are evacuated. As a result, the gas flow is, at least on the axis of the system, predominately in the same direction as the droplet and sample ion motion.

Figure 43A:
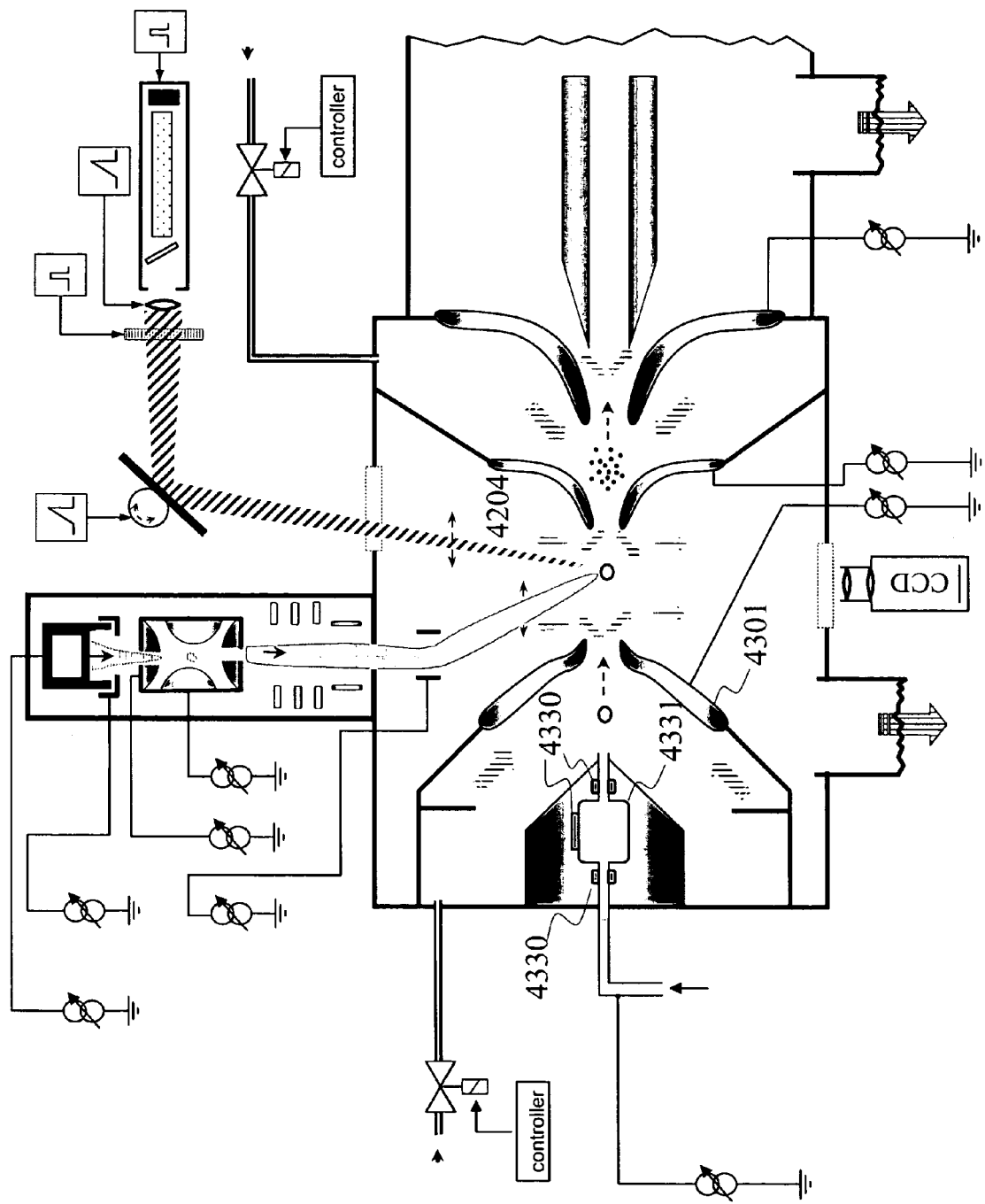
FIG. 43A shows an embodiment wherein the liquid containing the sample molecules is delivered to reservoir, from which it is ejected as droplets in a controlled manner.
Figure 43B:
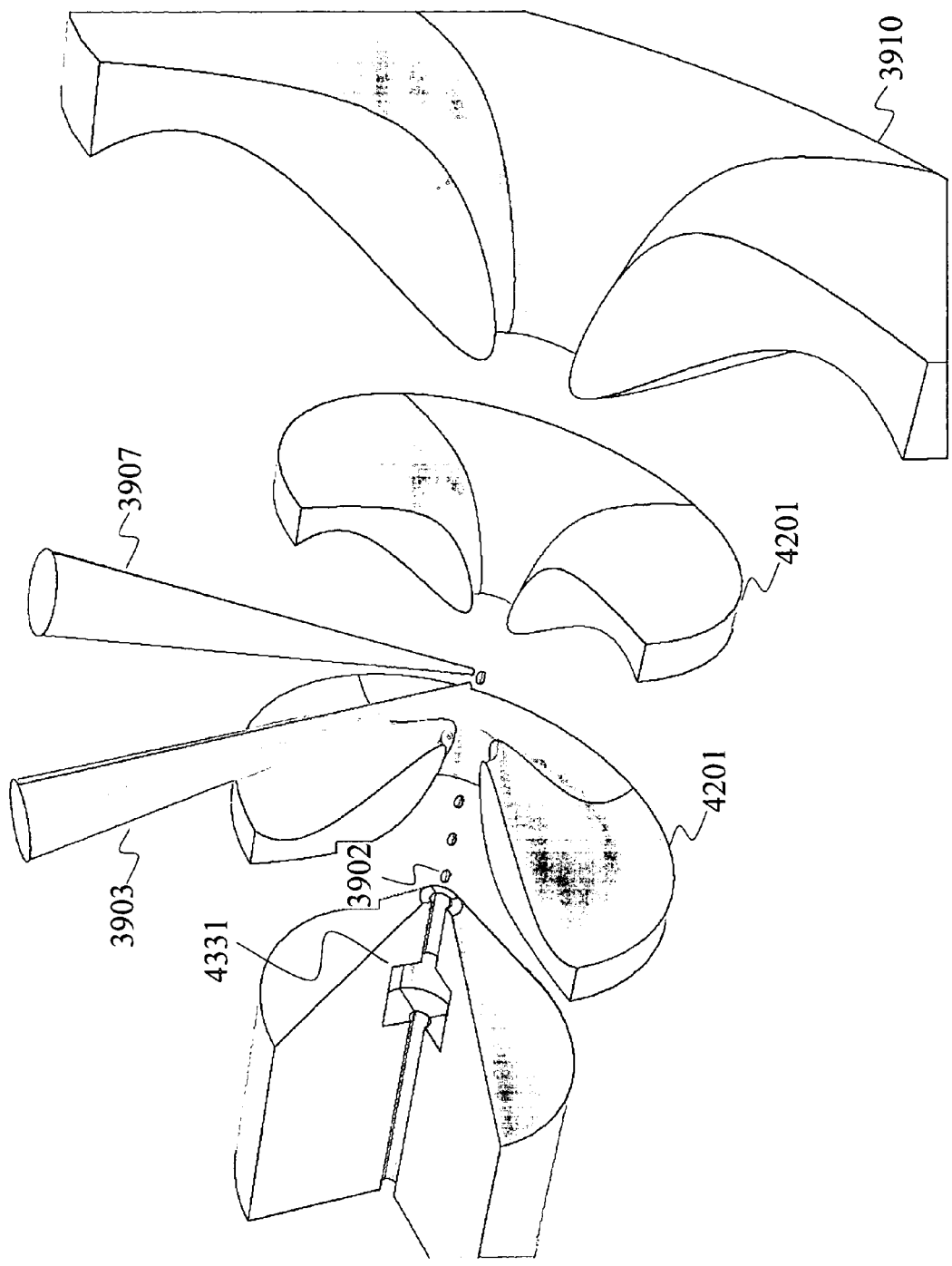
FIG. 43B shows a three dimensional representation of various components of FIG. 43A.

FIG. 43A shows an embodiment wherein the liquid containing the sample molecules is delivered to reservoir 4331. On the reservoir itself or in its proximity on the capillaries leading to and from the reservoir, electrically driven means 4330 to exert pressure on the liquid containing structure and thereby the liquid itself are mounted. Such means may be based on piezoelectric, electrostatic, electromagnetic, electro-optically and similar effects. Such an arrangement enables that single droplets or a plurality of droplets of predominantly specific size is/are formed and ejected with a specific velocity at times determined by the driving electric signal. Currently known designs of such droplet ejection mechanisms enable minimal droplet volumes on the order of $10^{-7}$ m$^3$ to $10^{-8}$ m$^3$ and ejection frequencies of several $10^4$ Hz. In general small droplet volumes and high repetition rates are desirable although optimal values will depend on various conditions.

The advantage of utilizing such mechanisms is that the droplet formation is largely independent of the pressure and rate with which the liquid is supplied, the degree of dissociation of the sample molecules, the electric conductivity of the liquid, and (specifically important) the electric field at the capillary tip from which the droplets are released. Specifically, the electric potentials on the droplet ejection mechanism/the capillary and the first electro-pneumatic element 4301 may be such that the electric field is small or zero in the space in between into which the droplets are initially injected.

Optionally, and in addition to the CIN-beam and EM-beam exposure, the droplets may be exposed to very strong (pulsed) electric fields inside domain 4204, preferably in a manner synchronized/delayed to the CIN-beam and EM-beam exposure (since strong electric fields would influence the CIN-beam).

FIGS. 42A-43A may not convey a particular feature of these embodiments of the electro-pneumatic system, which is that they are axisymmetric as far as is practical given other physical and design constraints. The symmetrically arranged arrows illustrating the gas may serve as a simplified illustration. To illustrate this concept FIG. 43B shows a 3D representation of the electro-pneumatic elements (3 quadrants are actually shown) including some droplets as well as the CIN-beam and the EM-beam.

Figure 44:
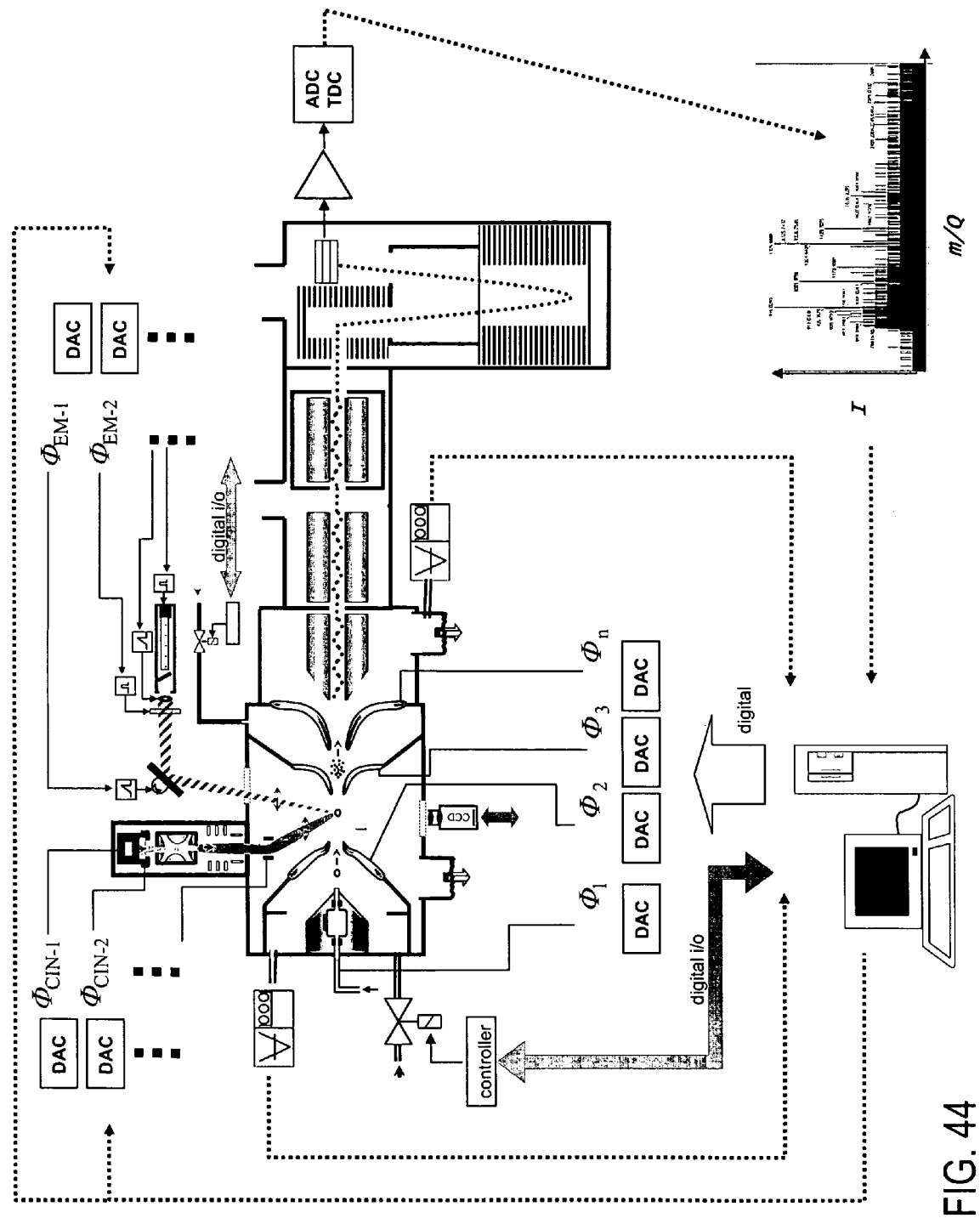
FIG. 44 shows the principle design wherein active control and feedback system analyzes obtained mass spectrometric data to derive signals which are sent to the ion source.

FIG. 44 shows the principle design wherein active control and feedback system analyzes obtained mass spectrometric data to derive signals that are sent to the ion source. A plurality of digital and/or analog inputs and outputs, such as, by way of example, variable voltage sources, ADC, DAC, computer controlled pulse generators, enable a main control computer to keep the ion source at optimal operational conditions. The parameters the computer can modify may include any one or more of (1) the potentials on the electro-pneumatic elements, (2) gas pressures and gas flow rates, (3) control potentials/currents for the CIN-gun and resulting CIN-beam energy, current, deflection, timing, and/or (4) control signals for the EM-beam including deflection, focus, intensity, timing. The computer may also utilize digitized video images of the droplets to control the CIN-beam and EM-beam.

Ion Source with Controlled Liquid Injection

Figure 45:
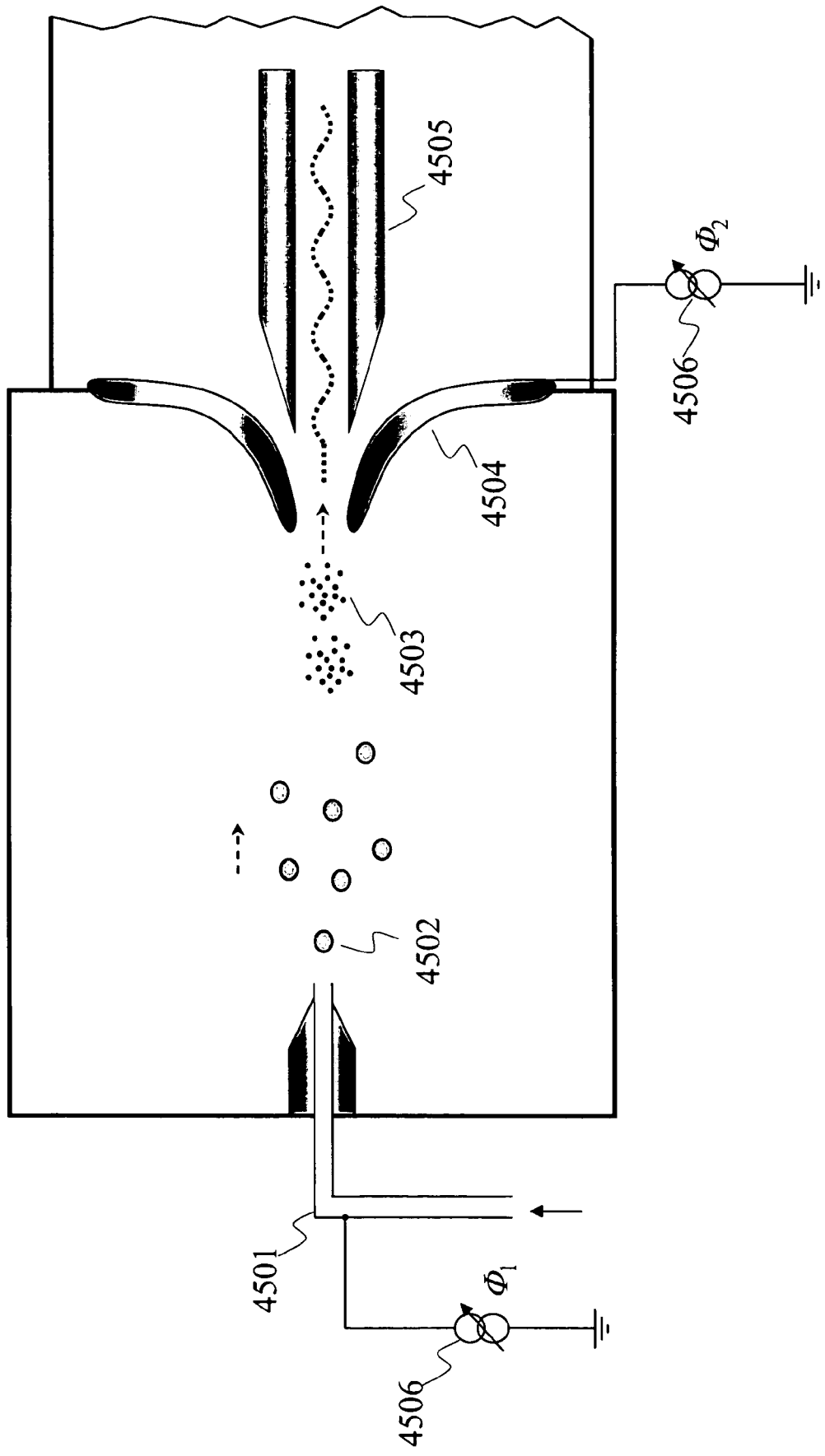
FIG. 45 shows the principle configuration for a liquid based ionization techniques such as electrospray.

FIG. 45 shows the principle configuration for a liquid based ionization techniques such as electrospray. A liquid containing sample molecules is introduced into a capillary 4501 or similar structure and dispersed as mist made up of a large number of droplets 4502. The droplets, and the sample ions 4503 which are eventually released from them, are moving towards an electrode 4504. Also shown, as an example, is a RF multipole-ion guide 4505 to which the ion source may provide ions. Some applications may also include means to effect additional gas flow, which can be helpful in separating neutrals from ions.

In general, it is commonly difficult to actually achieve the formation of droplets, nebulization, and finally sample ionization, as this process depends on large number of parameters, including, for example, variables associated with sample concentration, degree of dissociation, liquid flow rate, liquid conductivity, liquid surface tension, capillary diameter, liquid pressure, electric field, gas flow fields, gas temperature fields, gas pressure fields.

Figure 46:
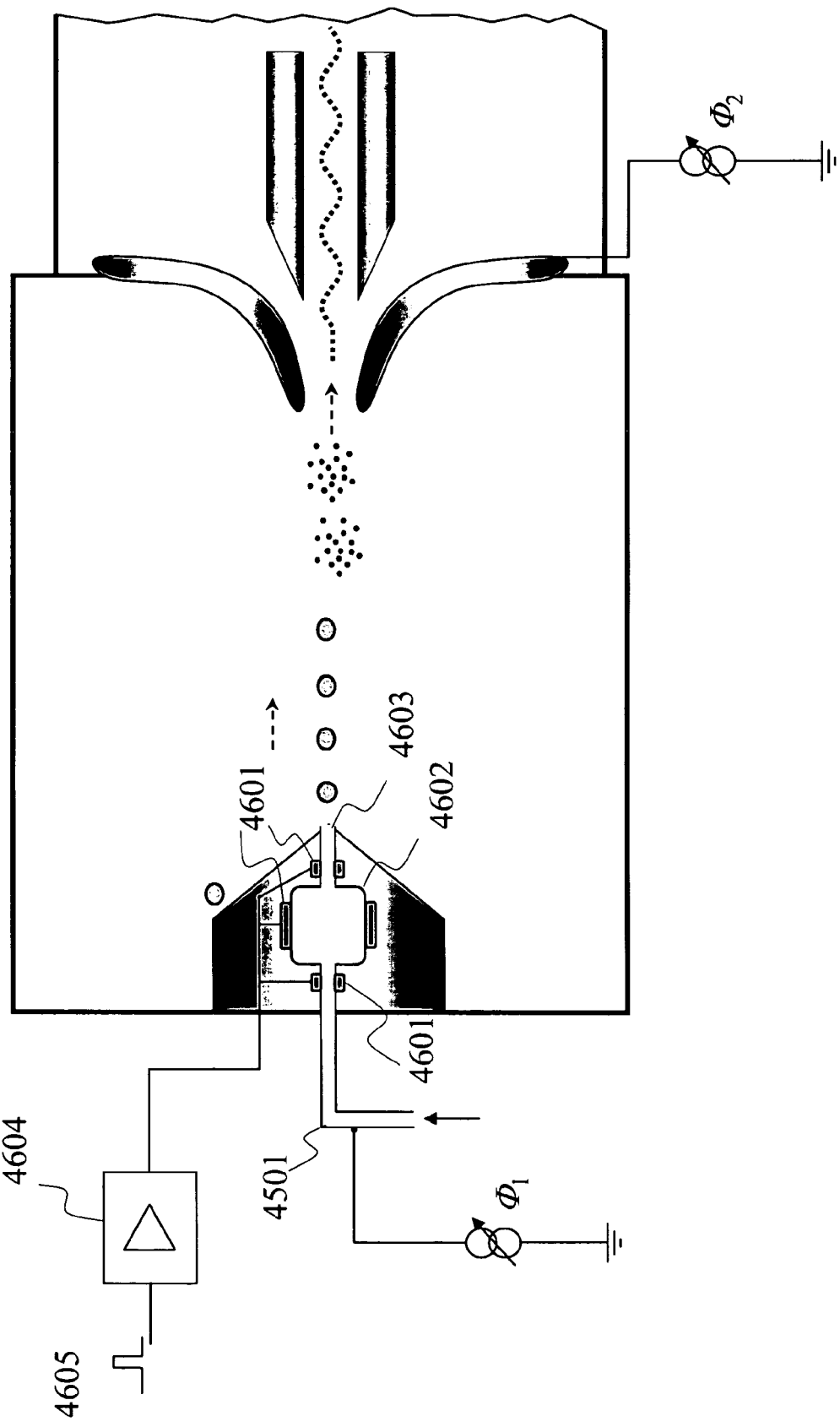
FIG. 46 shows a basic embodiment of the invention where the analyte-containing liquid or liquid crystal is delivered into a thin tube that extends into a reservoir in proximity to the exit nozzle of the liquid.

FIG. 46 shows a basic embodiment of the disclosed invention wherein the liquid or liquid crystal containing the sample molecules is delivered into a capillary or thin tube 4501 and said capillary extends into a reservoir 4602 relative proximity to the exit nozzle 4603 of the liquid. On the reservoir itself or the capillaries leading to and from the reservoir, typically electrically driven actuators 4601 to exert pressure on the liquid containing structure, and thereby the liquid itself, are mounted. Such mechanisms may be based on piezoelectric, electrostatic, electromagnetic, electro-optically and similar effects. Furthermore pressure wave inside the liquid may be utilized including reflection and/or scattering effects of such waves.

Such an arrangement enables that single droplets or a plurality of droplets of predominantly specific size is/are formed and ejected with a specific velocity at times determined by the driving electric signal 4605 which is typically applied to the actuator(s) 4601 via amplifier(s) 4604. Somewhat comparable arrangements for dispensing liquid ink are commonly used today in inkjet printer heads.

Currently known designs of such droplet ejection mechanisms enable minimal droplet volumes on the order of $10^{-7}$ $m^3$ to $10^4$ $m^3$ and ejection frequencies of several 104 Hz. In general, small droplet volumes and high repetition rates are desirable although optimal values will depend on various conditions. The advantage of utilizing such mechanisms is that the droplet formation is largely independent of the pressure and rate with which the liquid is supplied, the degree of dissociation of the sample molecules, the electric conductivity of the liquid, and particularly, the electric field at tip of the exit nozzle 4603 from which the droplets are released.

FIGS. 47A-D show several schematically-rendered examples of different configurations for the capillaries 4501, reservoirs 4602 and pressure actuators 4601.

Figure 48A:
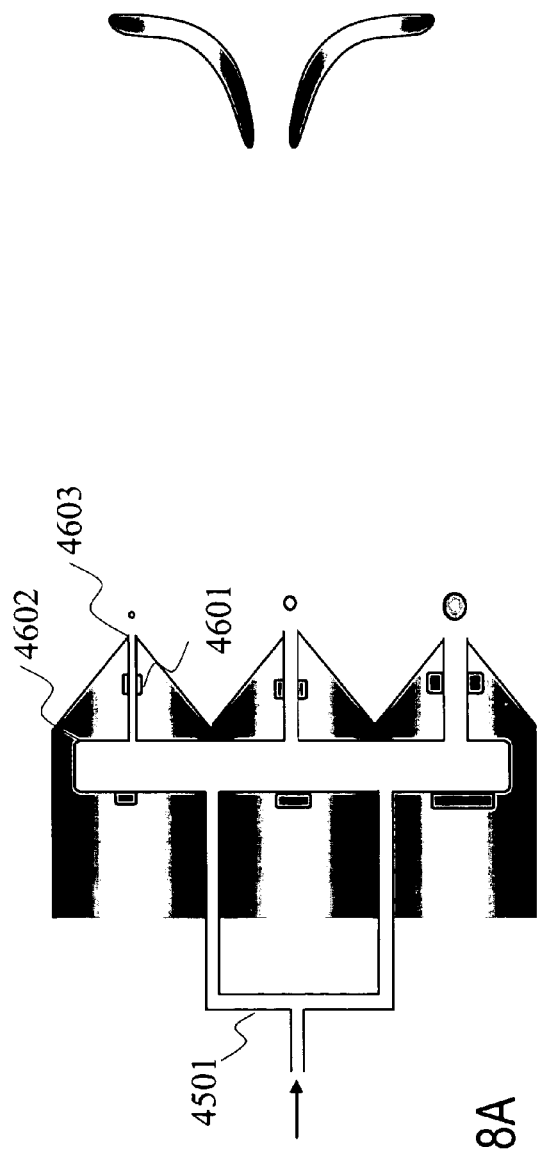
FIG. 48A shows an embodiment in which from one reservoir a plurality of exit nozzles of different diameter is fed.

FIG. 48A shows a further embodiment in which from one reservoir a plurality of exit nozzles of different diameter is fed. This allows an ion source control system to vary the released droplet diameter (which will influence the ionization process) in order to optimize various aspects of the ion source performance such as, for example, total ion yield, spectral fidelity, or dominance of a certain preferred charge state.

Figure 48B:
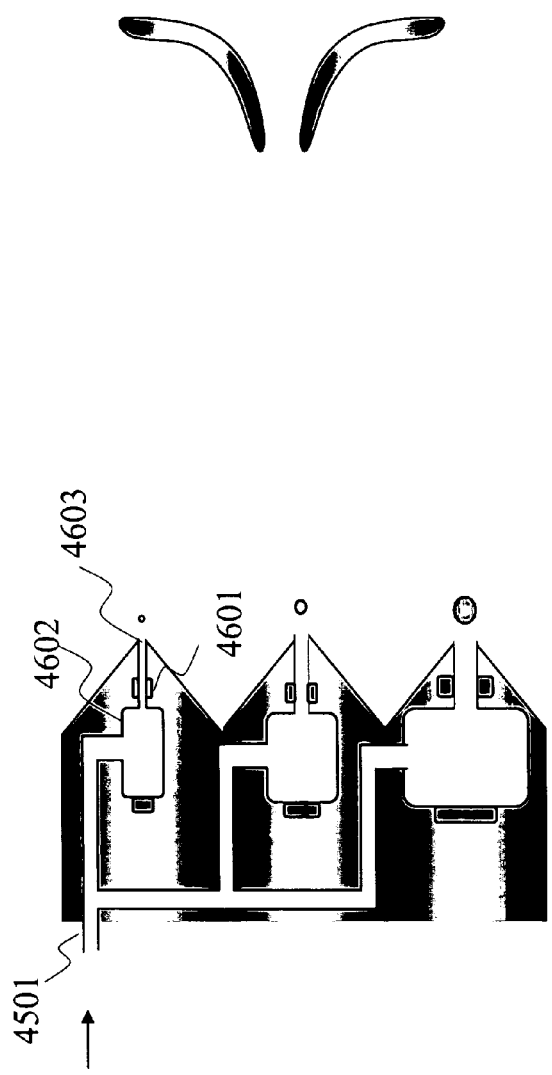
FIG. 48B shows another embodiment in which from a plurality of reservoirs a plurality of exit nozzles of different diameter is fed.

FIG. 48B shows a further variation of the embodiments shown in FIG. 48B wherein a plurality of reservoirs each feeds into a single exit nozzles of different diameter is fed. The fluid dynamic decoupling in such a configuration is stronger than in the one shown in FIG. 48B. Such a configuration allows an ion source control system to vary the released droplet diameter (which will influence the ionization process) in order to optimize various aspects of the ion source performance such as, for example, total ion yield, spectral fidelity, or dominance of a certain preferred charge state.

Configuration 48A and 48B allow also the simultaneous release droplets of different sizes. Configuration 48B can also enable ejection of different liquid if additional feed-in capillaries 4501 are provided. A plurality of liquid ejection units may also be used to increase droplet ejection repetition rate by driving them in a time-staggered manner. Although the depictions in FIGS. 48A and 48B are simplified 2D renderings, the actual arraignment of the plurality of exit nozzles may assume various 3D shapes such as 1D linear, 2D linear, or concentric.

Figure 49:
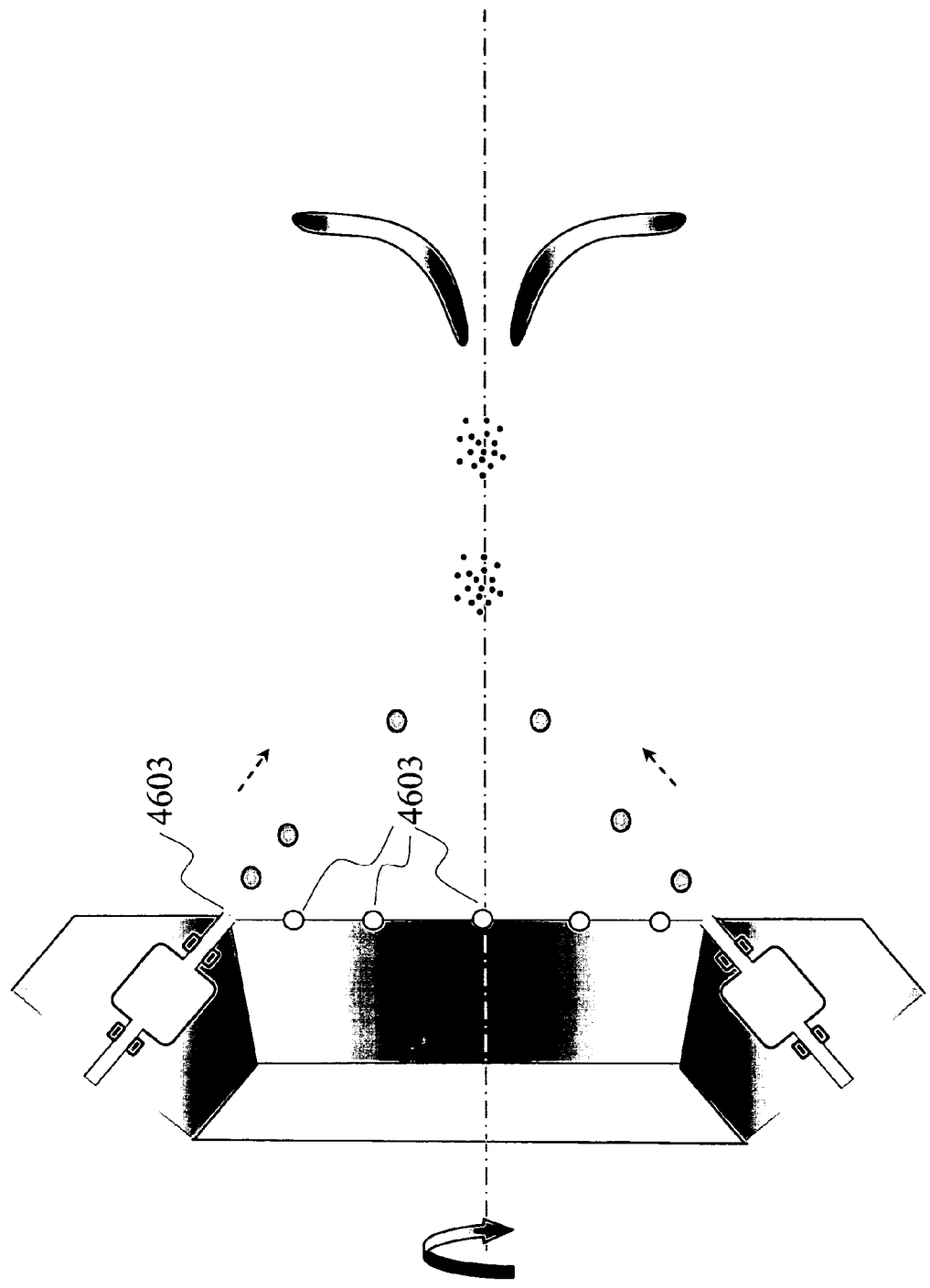
FIG. 49 shows such an embodiment where a plurality of liquid ejection units is arranged in an axisymmetric fashion.

FIG. 49 shows such an example where a plurality of liquid ejection units is arranged in an axisymmetric fashion.

Figure 50:
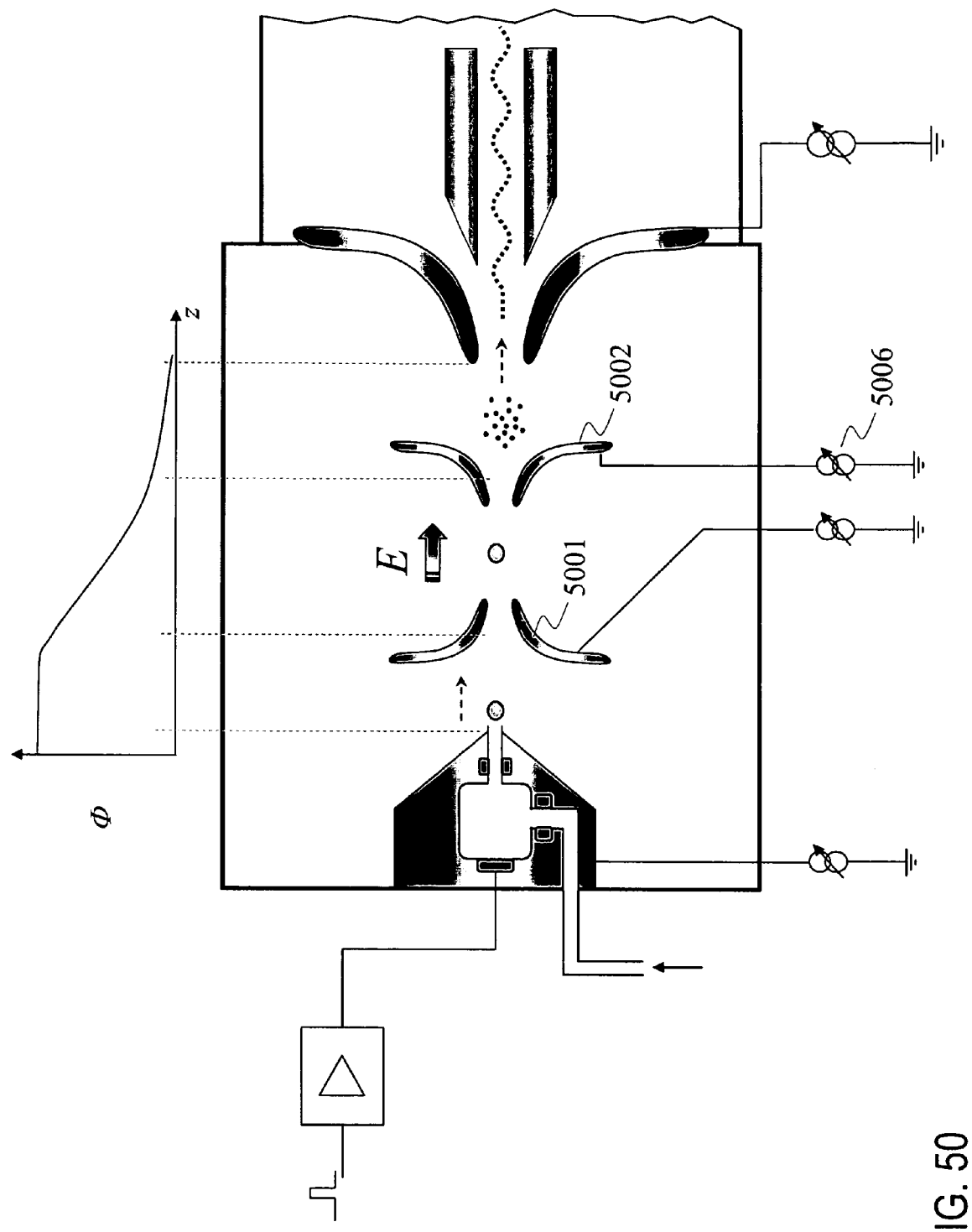
FIG. 50 shows an advanced embodiment with typically axisymmetric electrodes that are held at certain additional electric potentials by additional voltage sources creating a high electric field region.

FIG. 50 shows an advanced embodiment wherein additional, typically axisymmetrical electrodes 5001 and 5002 are used, and which are held at certain electric potentials by additional voltage sources 5006. In one particular mode of operation, the electric potentials on the liquid ejection unit and the opposing electrode 5001 may be such that the electric field is small or zero in the space in which the droplets are initially injected but very high between electrode 5001 and 5002. In some modes of operation the value of the electric field may be sufficiently strong to extract ions from the droplets. In this depiction, again, all potentials on electrodes are referenced to ground; this will not be the case in all applications. The voltage supplies may be stacked and/or commonly floating on a supplied potential.

Figure 51A:
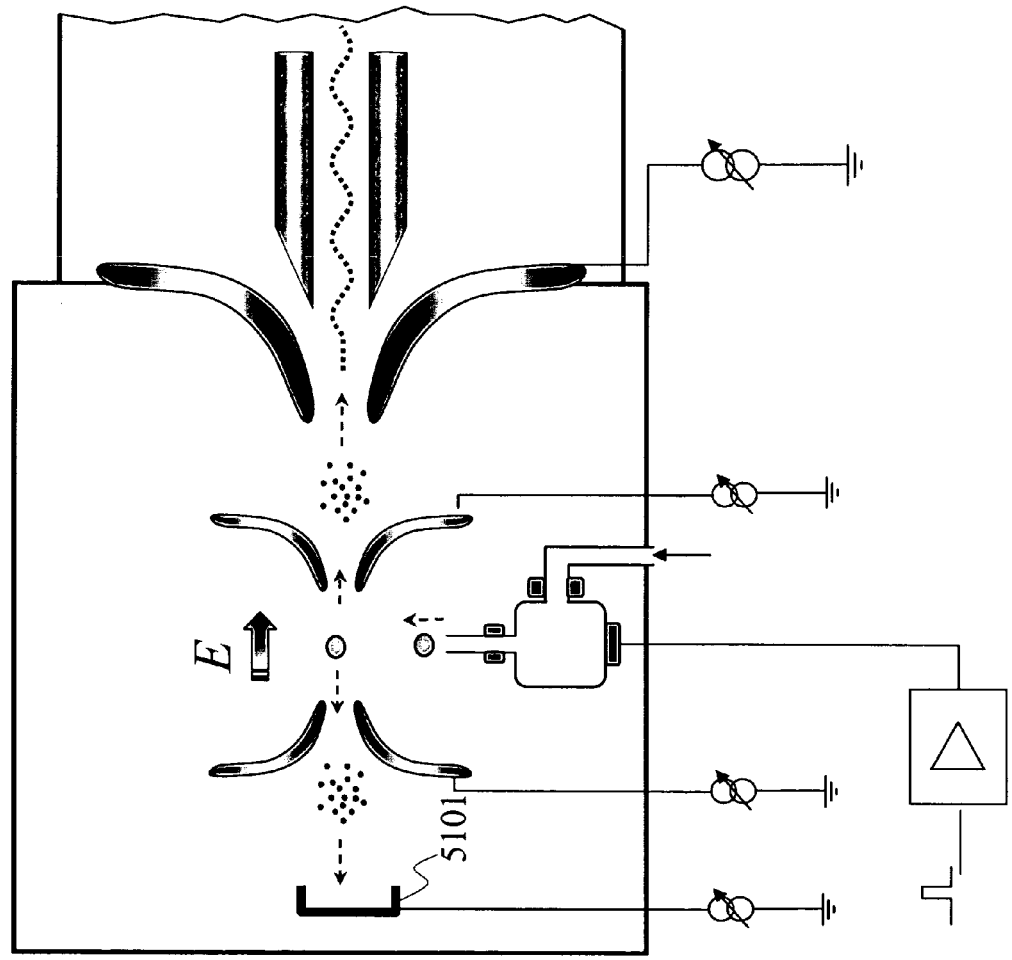
FIG. 51A shows a configuration wherein the droplets are injected radially into the high electric field region.

FIG. 51A shows a configuration wherein the droplets are injected radially (not axially) into the high electric field region. In some modes of operation the value of the electric field may be sufficiently strong to extract ions from the droplets. The electric field is aligned such that those of desired polarity are then moving towards an ion-analytical instrument, here exemplified by the RF multipole. Ions of opposite polarity may be collected by means of a grounded cup or a similar electrically conductive object 5101 at an arbitrary potential favorable to achieve desired ion trajectories.

Figure 51B:
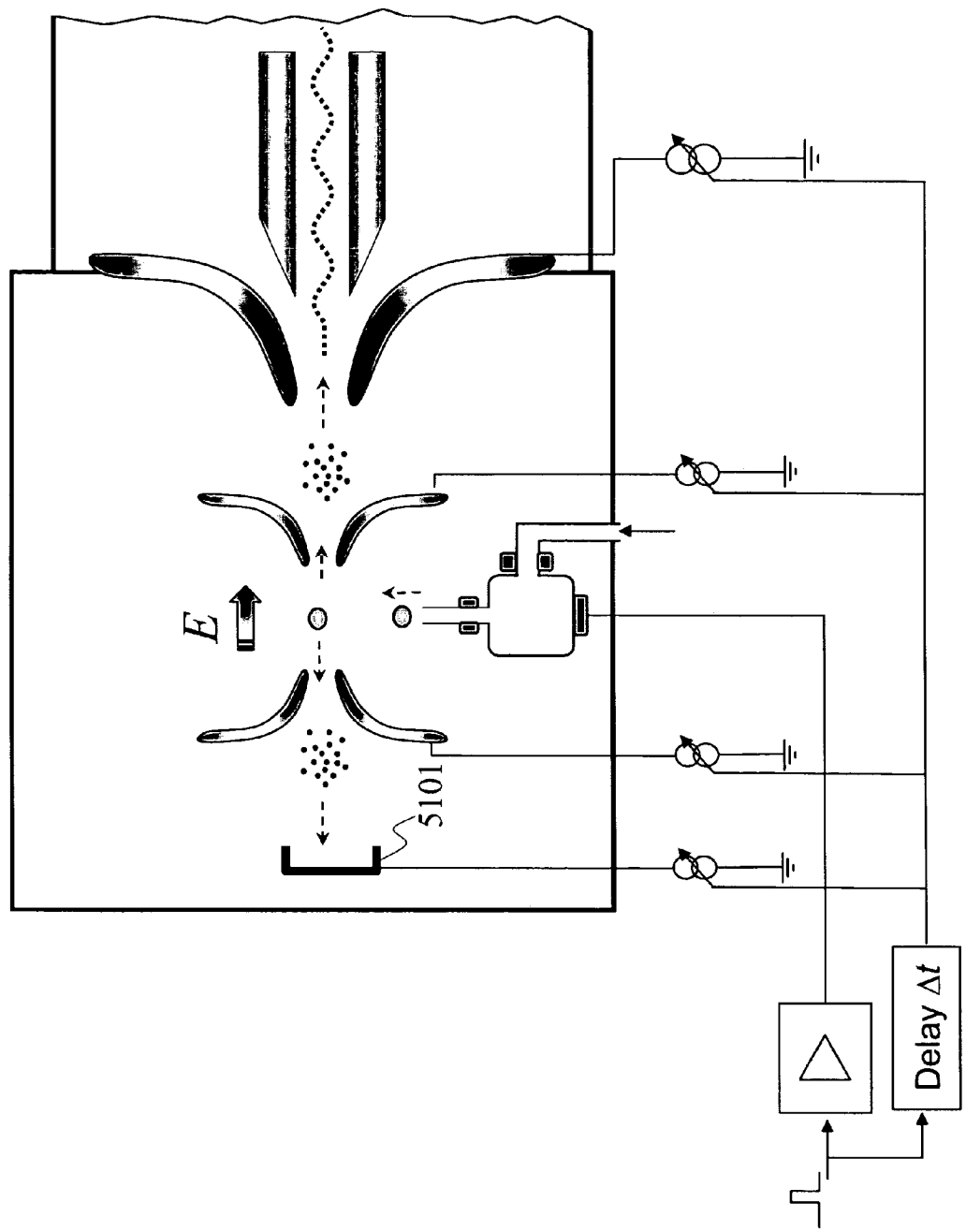
FIG. 51B shows schematically a particular embodiment and mode of operation of the configuration shown in FIG. 51A.

FIG. 51B shows schematically a particular embodiment and mode of operation of the configuration shown in FIG. 51B. The potential which are applied to the electrodes are synchronized to the droplet injection such that a droplet is injected into a field free region and only when it reaches the axis of the system the appropriate potentials are applied. Such mode of operation may be achieved by utilizing a computer controlled system which utilizes a plurality of digital and/or analog inputs and outputs, such as, by way of example, computer controlled pulse generators, programmable delay units, variable voltage sources, ADC, DAC, etc. The actual duration of the pulse which initiates the droplet ejection and the time length during which the potentials in the electrodes are applied are in general not identical. Similar synchronization may also be applied in case of axial droplet injection.

Figure 52A:
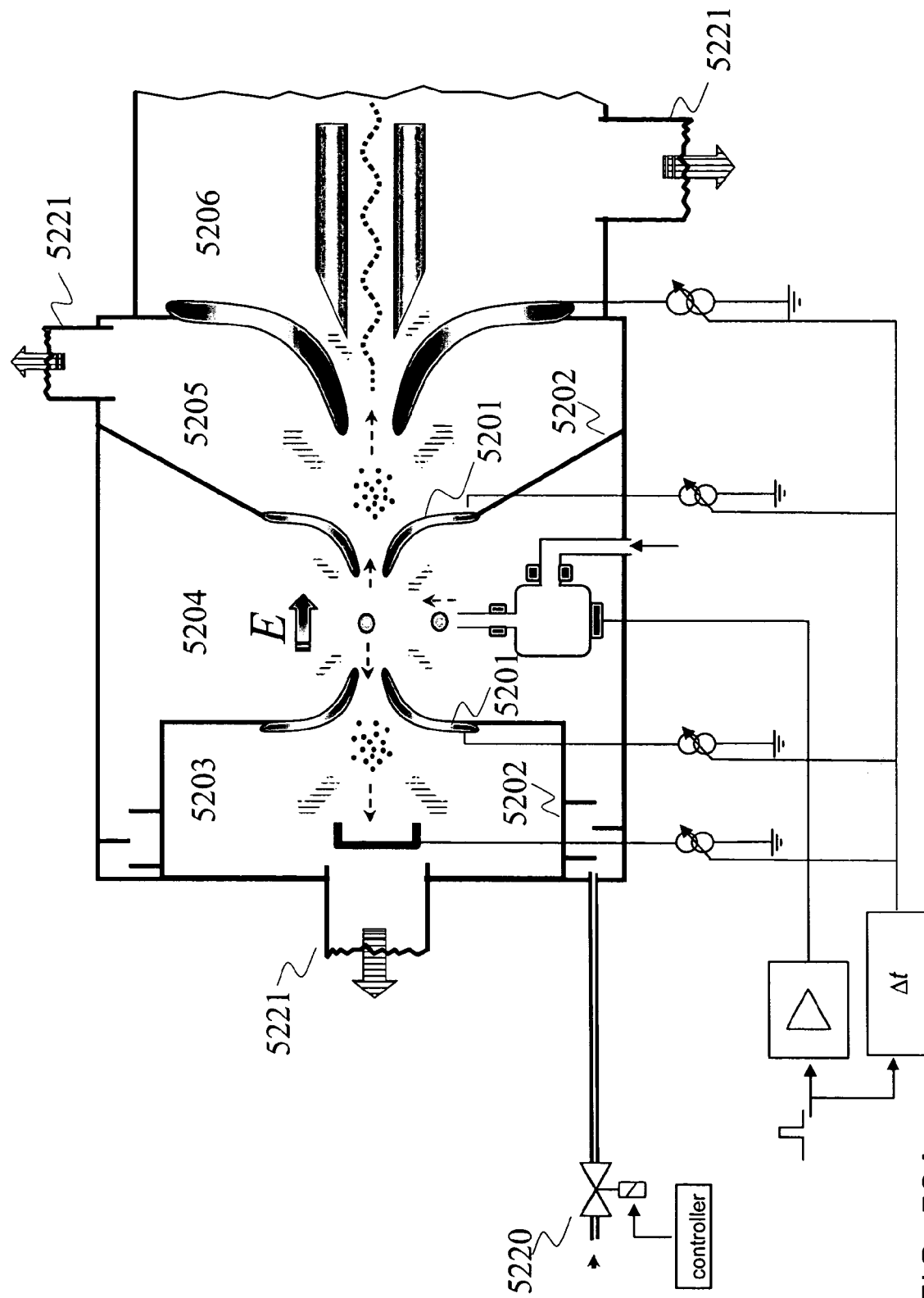
FIG. 52A shows an embodiment employing electrodes that are shaped and manufactured so as to act as electro-pneumatic elements that establish spatially controlled gas flow velocity fields, gas pressure fields, gas temperature fields and electric fields.

FIG. 52A shows an additional refinement by employing electrodes which are shaped and manufactured such that they at as electro-pneumatic elements 5201 which permits to establish spatially controlled gas flow velocity fields, gas pressure fields, and gas temperature fields as well as electric fields. The electro-pneumatic elements 5201 are held at electric potentials by means of before mentioned voltage sources. The superposition of said fields preferably supports droplet guidance, solvent evaporation, sample ion—solvent separation, ion guidance.

The potentials on the electro-pneumatic elements 5201 may be any arbitrary function of time including pulsed and synchronized, including synchronized and delayed etc., with respect to any other operation of any other component such as droplet injection. Furthermore, by means of additional walls 5202 the interior may be divided into a number of domains 5203, 5204, and 5205 some of which may act as gas reservoirs. Said domains may be supplied with gas via typically electronically driven gas flow controllers 5220 or gas may be evacuated from them through openings 5221 of sufficiently low gas flow resistance.

In the particular configuration shown in FIG. 52A, gas is supplied to domain 5204 and evacuated from domain 5203, 5204, and 5205 through openings 5221. This particular gas flow regime may serve only as an example, optimal gas flow configuration will depend on a number of design parameters and operational conditions.

Figure 52B:
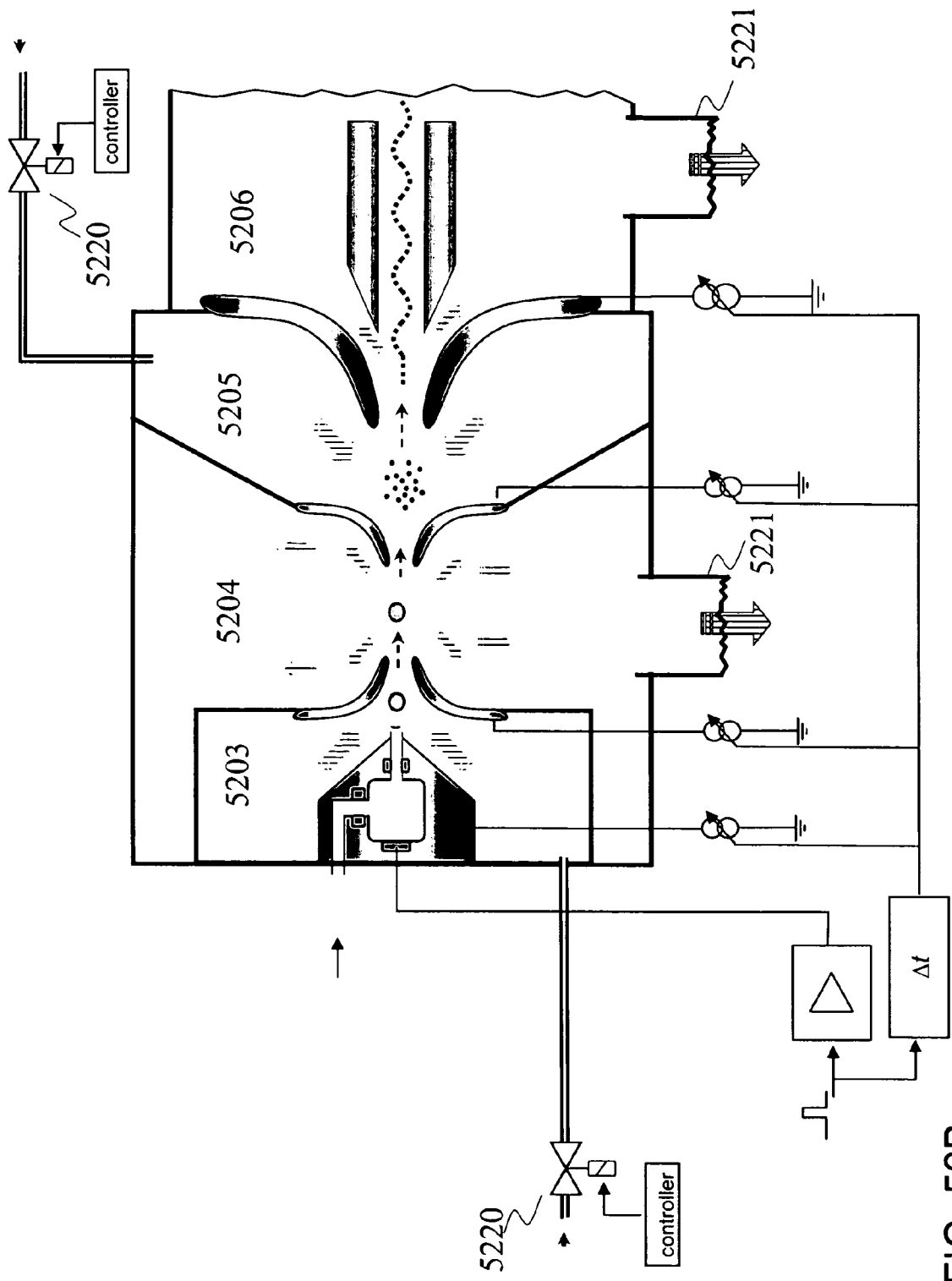
FIG. 52B shows a similar configuration to that of FIG. 52A except that droplet injection is axially again and the gas flow regime has been modified.

FIG. 52B shows a similar configuration except that droplet injection is axially-oriented, and the gas flow regime has been modified to such that gas is supplied to domain 5205 and also to domain 5203. This configuration creates (1) a counter flow with respect to the sample ions which supports removal of remaining neutrals and (2) a gas flow stagnation point in the center of domain 5204 which can be advantageous with respect to effecting charge separation on the droplets as well as to effect any additional physical operation on droplets such as controlled charge injection and/or temperature control e.g., by means additional beams directed at droplets. It should be understood that any feasible combination of such gas flows (direction) and droplet injections are included as embodiments of this invention.

As a general comment on FIGS. 52A-54, it should be noted that although not apparent per se in the drawings, the entire electro-pneumatic system is generally constructed axisymmetrically, as far as practically possible. The symmetrically arranged arrows illustrating the gas may serve as a simplified illustration.

Figure 53:
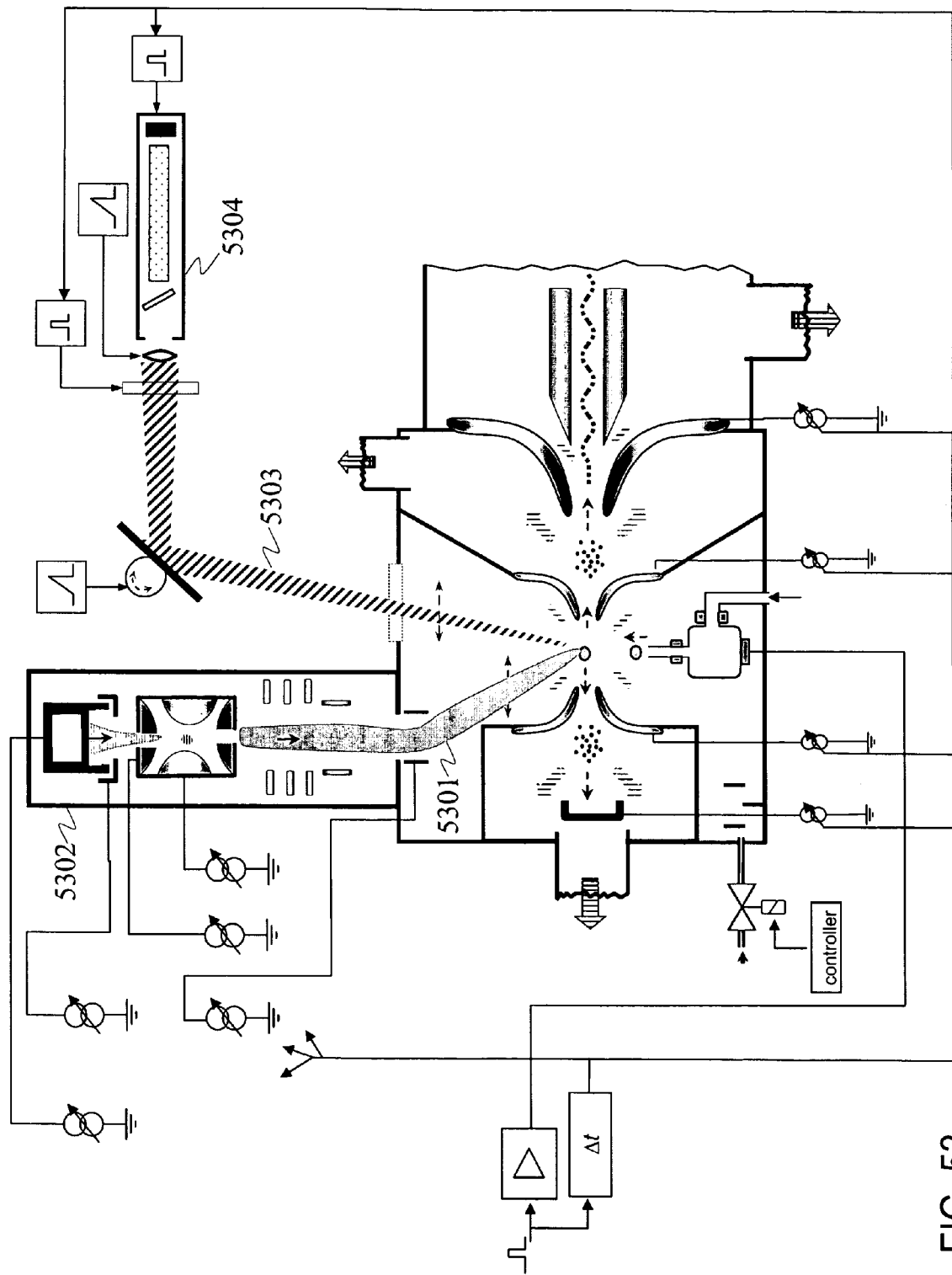
FIG. 53 shows the configuration from FIG. 52A including an additional charge injection beam ("CIN-beam") of stable low molecular weight ions which originates from a dedicated charge injection ion beam gun, and which is directed with specific, typically low energy and current onto a single or a plurality of droplets.

FIG. 53 shows the configuration from FIG. 52A including an additional charge injection beam ("CIN-beam") 5301 of stable low molecular weight ions (such as H [protons], He, Li, O, Ne, Na, Ar, K, Xe, etc.) which originates from a dedicated charge injection ion beam gun 5302 is directed with specific, typically low energy ($10^{-1}$ to $10^2$ eV) and specific current onto a single or plurality of droplets. The CIN-beam may be applied as a continuous beam or as a series of charge packets. Also directed at a single or a plurality of droplets is a beam of electromagnetic radiation 5303 (EM beam), typically from a IR, UV, or visible Laser 5304. Such a configuration allows a substantial increase in the net charge state of the droplet(s) as well as control of their temperature/evaporation rate, effectively independent of an energy transfer with any optionally present background gas. Various parameters of the CIN-beam (direction, focus, current, energy, timing) as well as EM-beam (flux, direction, focus, timing) can be electronically controlled.

In a particular embodiment of such a configuration a plurality of digital and/or analog inputs and outputs, such as, by way of example, variable voltage sources, ADC, DAC, computer controlled pulse generators, programmable delay units, etc., enable a main control computer to control the ion source and to synchronize various operations with the droplet ejection.

Figure 54:
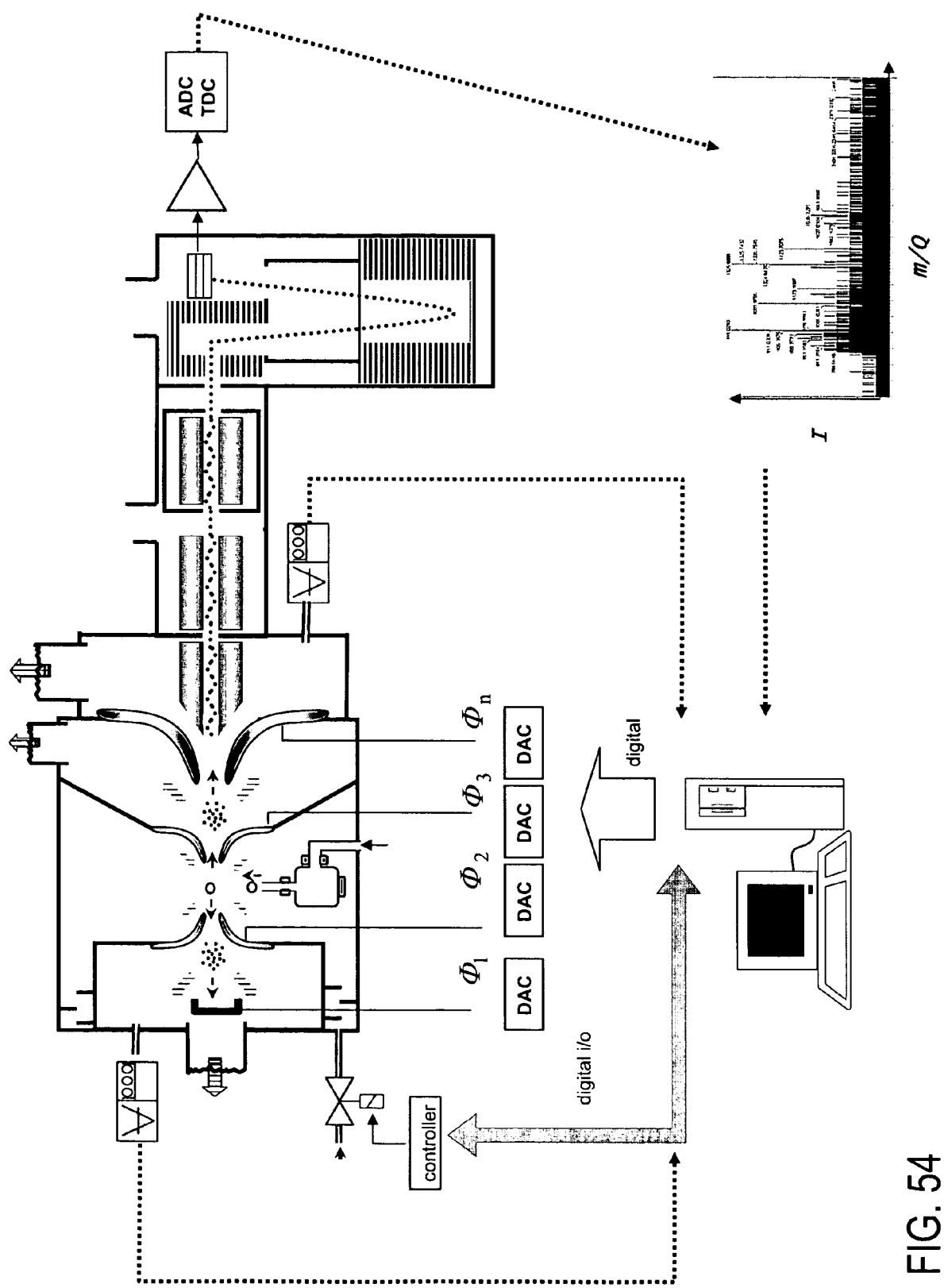
FIG. 54 shows a general design wherein an active control and feedback system analyzes obtained mass spectrometric data to derive signals that are sent to the ion source based on controlled liquid ejection in combination with controlled superposition of electro-pneumatic fields.

FIG. 54 shows a general design for embodiments of the invention wherein an active control and feedback system analyzes obtained mass spectrometric data to derive signals which are sent to the ion source based on controlled liquid ejection in combination with controlled superposition of electro-pneumatic fields. The control computer is equipped to control effectively all operational parameters of an ion source.

The parameters the computer can modify may include any one or more of (1) the potentials on the electro-pneumatic elements, (2) gas pressures and gas flow rates, (3) control potentials/currents for the CIN-gun (if present) and resulting CIN-beam energy, current, deflection, timing, and/or (4) control signals for the EM-beam (if present), including deflection, focus, intensity, and/or timing. The computer may also utilize digitized video images of the droplets to control the CIN-beam and EM-beam. The goal of the optimization may be for example be any one or more of total ion yield, spectral fidelity, dominance of a certain charge state, or yield of a certain molecular mass.

REFERENCES, CLAIM ELEMENTS, AND EQUIVALENTS OF THE INVENTION

All patents, patent publications, and other published references mentioned herein are hereby incorporated by reference in their entireties as if each had been individually and specifically incorporated by reference herein. By their citation of various references in this document, applicants do not admit that any particular reference is "prior art" to their invention.

An element in a claim is intended to invoke 35 U.S.C. §112 paragraph 6 if and only if it explicitly includes the phrase "means for," "step for," or "steps for." The phrases "step of" and "steps of," whether included in an element in a claim or in a preamble, are not intended to invoke 35 U.S.C. §112 paragraph 6.

While particular embodiments of the invention and variations thereof have been described in detail, other modifications and methods of using the disclosed self-adjusting holder and insertion system for LDI will be apparent to those of skill in the art. Accordingly, it should be understood that various applications, modifications, and substitutions may be made of equivalents without departing from the spirit of the invention or the scope of the claims. Various terms have been used in the description to convey an understanding of the invention; it will be understood that the meaning of these various terms extends to common linguistic or grammatical variations or forms thereof. It will also be understood that when terminology referring, for example to physical equipment, hardware, or software has used trade names or common names, that these names are provided as contemporary examples, and the invention is not limited by such literal scope. Terminology that is introduced at a later date that may be reasonably understood as a derivative of a contemporary term or designating of a subset of objects embraced by a contemporary term will be understood as having been described by the now contemporary terminology. Further, it should be understood that the invention is not limited to the embodiments that have been set forth for purposes of exemplification, but is to be defined only by a fair reading of claims that will be appended to the non-provisional patent application, including the full range of equivalency to which each element thereof is entitled.

What is claimed:

1. A method of generating sample ions comprising:
Introducing at an injection site a liquid containing at least one sample molecule into a sample ion generating device which is operably connected to an ion analytical device;
Causing the at least one sample molecule to travel generally along a first axis from the injection site to the ion analytical device;
While the at least one sample molecule is traveling generally along the first axis, subjecting the at least one sample molecule to a spacially sequential gas flow that is in one instance generally axisymmetrically radially inwardly flowing in relation to the first axis and in another instance generally axisymmetrically radially outwardly flowing in relation to the first axis; and
at a point at which the at least one sample molecule is subjected to the spacially sequential gas flow, subjecting the at least one sample molecule to an electrostatic field such that the electrostatic field is superposed on a pneumatic field representing the spacially sequential gas flow in a controlled manner such that the electrostatic and pneumatic fields collectively substantially determine the transport of the at least one sample molecule along the first axis.

2. The method of claim 1, further comprising:
After introduction of the liquid, subjecting the at least one sample molecule to electromagnetic radiation such that at least one of the at least one sample molecule and the liquid containing the at least one sample molecule absorbs energy from the electromagnetic radiation.

3. The method of claim 1 wherein the liquid is introduced in the form of at least one droplet of liquid containing at least one sample molecule.

4. The method of claim 1, further comprising:
After introduction of the liquid, subjecting at least one of the at least one sample molecule and the liquid containing the at least one sample molecule to a beam of relatively low molecular weight ions.

5. The method of claim 4 wherein the net charge of at least one of the at least one sample molecule and the liquid containing the at least one sample molecule is increased by being subjected to the beam of relatively low molecular weight ions.

6. The method of claim 4 wherein the net charge of a droplet of liquid containing the at least one sample molecule is increased by the droplet being subjected to the beam of relatively low molecular weight ions.

7. The method of claim 5 wherein the step of subjecting at least one of the at least one sample molecule and the liquid containing the at least one sample molecule to a beam of relatively low molecular weight ions results in an increase in ionization efficiency of sample molecules compared to the same method without the step of subjecting to a beam of relatively low molecular weight ions.

8. The method of claim 1 further comprising:
after introduction of the liquid, subjecting the at least one sample molecule to electromagnetic radiation such that at least one of the at least one sample molecule and the liquid containing the at least one sample molecule absorbs energy from the electromagnetic radiation, and
after introduction of the liquid, subjecting at least one of the at least one sample molecule and the liquid containing the at least one sample molecule to a beam of relatively low molecular weight ions.

9. The method of claim 1 wherein at some point along the first axis the liquid is subjected to an intermediate low gas pressure environment that has a higher pressure than that of the ion analytical device and wherein the majority of the ionization of the sample molecules occurs in the intermediate low pressure environment.

10. The method of claim 9 wherein the liquid is subjected to the intermediate low gas pressure environment at generally the time of introduction.

11. The method of claim 10 wherein the average pressure of the intermediate low gas pressure environment is less than one atmosphere.

12. The method of claim 3 wherein the liquid is introduced by an electrically driven mechanism.

13. The method of claim 3 wherein the electrically driven mechanism comprises a piezoelectric device.

14. The method of claim 12 wherein the electrically driven mechanism comprises a electromagnetic actuator.

15. The method of claim 3 wherein a plurality of predominately equally sized droplets are introduced.

16. The method of claim 12 wherein liquid is introduced as predominately equally sized droplets.

17. The method of claim 4, wherein the beam of low molecular weight ions is synchronized with the motion of the droplet.

18. The method of claim 17, wherein the introduction of at least some of the droplets is synchronized with a modulation of the current of the beam of low molecular weight ions such that the droplets are subjected to the generally high current values of the modulation.

19. The method of claim 3 further comprising:
after introduction of the liquid, subjecting the at least one sample molecule to electromagnetic radiation such that at least one of the at least one sample molecule and the droplet containing the at least one sample molecule absorbs energy from the electromagnetic radiation, and
after introduction of the liquid, subjecting at least one of the at least one sample molecule and the droplet containing the at least one sample molecule to a beam of relatively low molecular weight ions.

20. The method of claim 19, wherein the net charge of a droplet of liquid containing the at least one sample molecule is increased by the droplet being subjected to the beam of relatively low molecular weight ions.

21. The method of claim 20, wherein at some point along the first axis the liquid is subjected to an intermediate low gas pressure environment that has a higher pressure than that of the ion analytical device and wherein the majority of the ionization of the sample molecules occurs in the intermediate low pressure environment.

22. The method of claim 21, wherein the liquid is subjected to the intermediate low gas pressure environment at generally the time of introduction and wherein the average pressure of the intermediate low gas pressure environment is less than one atmosphere.

23. The method of claim 19, wherein a plurality of predominately equally sized droplets are introduced.

24. The method of claim 3, wherein after introduction of the droplet electrostatic fields along the first axis are modulated.

25. The method of claim 4, wherein the liquid is introduced in the form of at least one droplet of liquid containing at least one sample molecule and wherein a local electrostatic field is modulated at the location of the subjection of the droplet to the beam.

26. The method of claim 25 wherein the modulation serves to facilitate the subjection of the droplet to the beam.

27. The method of claim 25, wherein the introduction of the droplet and the modulation of the electrostatic fields and introduction of the beam of relatively low molecular weight ions is synchronized.

28. The method of claim 24, wherein the modulation of the electrostatic fields results in local electrostatic fields at the general location of subjection of the droplet to the beam which facilitate subjection of the droplet to the beam.

29. The method of claim 25, wherein the electrostatic fields are modulated by changes to the potentials applied to electro-pneumatic elements that are partially conductive and partially nonconductive and that serve to both establish electrostatic fields and maintain pneumatic fields superposed along the first axis.

* * * * *